(12) United States Patent
Su et al.

(10) Patent No.: US 11,843,105 B2
(45) Date of Patent: Dec. 12, 2023

(54) ELECTRODE SURFACE ENGINEERING IN LITHIUM ION BATTERIES

(71) Applicant: Carnegie Mellon University, Pittsburgh, PA (US)

(72) Inventors: Laisuo Su, Pittsburgh, PA (US); Baby Reeja-Jayan, Pittsburgh, PA (US)

(73) Assignee: CARNEGIE MELLON UNIVERSITY, Pittsburgh, PA (US)

( * ) Notice: Subject to any disclaimer, the term of this patent is extended or adjusted under 35 U.S.C. 154(b) by 206 days.

(21) Appl. No.: 16/886,948

(22) Filed: May 29, 2020

(65) Prior Publication Data

US 2021/0218028 A1    Jul. 15, 2021

Related U.S. Application Data

(60) Provisional application No. 62/921,054, filed on May 29, 2019.

(51) Int. Cl.
| | |
|---|---|
| H01M 4/04 | (2006.01) |
| H01M 4/525 | (2010.01) |
| H01M 10/0525 | (2010.01) |
| H01M 4/505 | (2010.01) |
| C23C 16/44 | (2006.01) |
| C23C 16/00 | (2006.01) |
| H01M 4/36 | (2006.01) |
| H01M 4/62 | (2006.01) |
| H01M 4/1391 | (2010.01) |

(52) U.S. Cl.
CPC .......... *H01M 4/0471* (2013.01); *C23C 16/00* (2013.01); *C23C 16/44* (2013.01); *H01M 4/0428* (2013.01); *H01M 4/1391* (2013.01); *H01M 4/366* (2013.01); *H01M 4/505* (2013.01); *H01M 4/525* (2013.01); *H01M 4/624* (2013.01); *H01M 10/0525* (2013.01)

(58) Field of Classification Search
None
See application file for complete search history.

(56) References Cited

U.S. PATENT DOCUMENTS

2015/0236372 A1*  8/2015  Yushin ................. H01M 4/366
                                                                429/126

OTHER PUBLICATIONS

Frisch, M. J. et al., Gaussian 16 Rev. C.01. Release Notes (2016).*
Liu, J. et al., Improved Electrochemical Performance of the 5 V Spinel Cathode LiMn1.5Ni0.42Zn0.0804 by Surface Modification, Journal of The Electrochemical Society, 156(1): A66-A72, 2009.
Liu, Jun et al., Conductive Surface Modification with Aluminum of High Capacity Layered Li [Li0.2Mn0.54Ni0.13Co0.13]O2 Cathodes, J. . Phys. Chem. C 2010, 114, 9528-9533.

(Continued)

*Primary Examiner* — Laura Weiner
(74) *Attorney, Agent, or Firm* — Dentons Cohen & Grigsby P.C.

(57) ABSTRACT

A method to form a coated cathode material may generally include forming, via chemical vapor deposition, an interfacial layer coating on an exterior surface of a cathode active material, wherein the interfacial layer comprises an organic polymer; and wherein the interfacial layer is substantially uniform on and conformal to the exterior surface of the cathode active material. The polymer may include poly(3,4-ethylenedioxythiophene) (PEDOT). Methods of making and using the same are also described.

16 Claims, 86 Drawing Sheets

(56) References Cited

OTHER PUBLICATIONS

Sun, Yang-Kook et al., Role of AIF3 Coating on LiCoO2 Particles during Cycling to Cutoff Voltage above 4.5 V, Journal of The Electrochemical Society, 156(12): A1005-A1010, 2009.
Yano, Akira et al., LiCoO2 Degradation Behavior in the High-Voltage Phase Transition Region and Improved Reversibility with Surface Coating, Journal of The Electrochemical Society, 164 (1) A6116-A6122 (2017).
Liu, Lijun et al., Electrochemical and In Situ Synchrotron XRD Studies on Al2O3-Coated LiCoO2 Cathode Material, Journal of The Electrochemical Society, 151(9): A1344-1351, 2004.
Ha, Hyung-Wook et al., Effects of surface modification on the cycling stability of LiNi0.8Co0.2O2 electrodes by CeO2 coating, Electrochimica Acta 50 (2005) 3764-3769.
Hirayama, Massaaki et al., Dynamic Structural Changes at LiMn2O4/Electrolyte Interface during Lithium Battery Reaction, J. Am. Chem. Soc. 2010, 132, 15268-15276.
Mao, Fangxin et al, Research progress on design strategies, synthesis and performance of LiMn2O4-based cathodes, RSC Adv. ,2015, 5,105248.
Dubarry, Matthieu et al., Identify capacity fading mechanism in a commercial LiFePO4 cell, Journal of Power Sources 194 (2009) 541-549.
Ohzuku, Tsutomu et al., Electrochemistry of Manganese Dioxide in Lithium Nonaqueeous Cell, J. Electrochem. Soc., vol. 137, No. 3, Mar. 1990, 769-775.
Albertus, Paul et al., Experiments on and Modeling of Positive Electrodes with Multiple Active Materials for Lithium-Ion Batteries, Journal of The Electrochemical Society, 156(7): A606-A618, 2009.
Huang, Jun et al., Analytical Solution to the Impedance of Electrode/Electrolyte Interface in Lithium-Ion Batteries, Journal of The Electrochemical Society, 162 (13) A7037-A7048 (2015).
Zhang, Yakun et al., Lithium Plating Detection and Quantification in Li-Ion Cells from Degradation Behaviors, ECS Transactions, 75 (23) 37-50 (2017).
Xu, Kang et al., Electrolytes and Interphases in Li-Ion Batteries and Beyond, Chem. Rev. 2014, 114, 11503-11618.
Hu, Guohe et al., Study of the electrochemical performance of spinel LiMn2O4 at high temperature based on the polymer modified electrode, Electrochemistry Communications 7 (2005) 383-388.
Pan, Qinmin et al., Ionic conductive copolymer encapsulated graphite as an anode material for lithium ion batteries, Solid State Ionics 149 (2002) 193-200.
Lei, Jinglei et al., Characterization of SEI Layers on LiMn2O4 Cathodes with In Situ Spectroscopic Ellipsometry, Journal of The Electrochemical Society, 152(4): A774-777, 2005.
Coclite, Anna Maria et al., 25th Anniversary Article: CVD Polymers: A New Paradigm for Surface Modification and Device Fabrication, Adv. Mater. 2013, 25, 5392-5423.
Raghunathan, Vivek et al., Co-polymer clad design for high performance athermal photonic circuits, Optics Express, vol. 20, No. 19, Sep. 10, 2012.
Zhan, Chun et al., Mn(II) deposition on anodes and its effects on capacity fade in spinel lithium manganate-carbon systems, Nature Communications, Jan. 9, 2013.
Arumugam, Manthiram et al., A perspective on nickel-rich layered oxide cathodes for lithium-ion batteries, Energy Storage Materials 6 (2017) 125-139.
Petruczok, Christy D. et al., Controllable Cross-Linking of Vapor-Deposited Polymer Thin Films and Impact on Material Properties, Macromolecules 2013, 46, 1832-1840.
Jung, Yoon Seok et al., Ultrathin Direct Atomic Layer Deposition on Composite Electrodes for Highly Durable and Safe Li-Ion Batteries, Adv. Mater. 2010, 22, 2172-2176.
Jung, Yoon Seok et al., Enhanced Stability of LiCoO2 Cathodes in Lithium-Ion Batteries Using Surface Modification by Atomic Layer Deposition, Journal of The Electrochemical Society, 157 (1): A75-A81, 2010.

Woo, Jae Ha et al., Nanoscale Interface Modification of LiCoO2 by Al2O3 Atomic Layer Deposition for Solid-State Li Batteries, Journal of The Electrochemical Society, 159 (7) A1120-A1124 (2012).
Cheng, Ho-Ming et al., Enhanced Cycleabity in Lithium Ion Batteries: Resulting from Atomic Layer Depostion of Al2O3 or TiO2 on LiCoO2 Electrodes, J. Phys. Chem. C 2012, 116, 7629-7637.
Kim, Yoongu et al., A Perspective on Coatings to Stabilize High-Voltage Cathodes: LiMn1.5Ni0.5O4 with Sub-Nanometer Lipon Cycled with LiPF6 Electrolyte, Journal of The Electrochemical Society, 160 (5) A3113-A3125 (2013).
Kim, M.C. et al., Ultrathin Polyimide Coating for a Spinel LiNi0.5Mn1.5O4 Cathode and Its Superior Lithium Storage Properties under Elevated Temperature Conditions, Journal of The Electrochemical Society, 160 (8) A1003-A1008 (2013).
Patel, Rajankumar L. et al., Ultrathin Conductive CeO2 Coating for Significant Improvement in Electrochemical Performance of LiMn1.5Ni0.5O4 Cathode Materials, Journal of The Electrochemical Society, 164 (1) A6236-A6243 (2017).
Liu, Lijun et al., Electrochemical and In Situ Synchrotron XRD Studies on Al2O3-Coated LiCoO2 Cathode Material, Journal of The Electrochemical Society, 151(9): A1344-51, 2004.
Mauger, A. et al., Surface modifications of electrode materials for lithium-ion batteries: status and trends, Ionics 20: 751-87, 2014.
Verma, Pallavi et al., A review of the features and analyses of the solid electrolyte interphase in Li-ion batteries, Electrochimica Acta 55 (2010) 6332-6341.
Lau, Kenneth K.S. et al., Initiated Chemical Vapor Deposition (iCVD) of Poly(alkyl acrylates): An Experimental Study, Macromolecules 2006, 39, 3688-3694.
Manthiram, Arumugam, Materials Challenges and Opportunities of Lithium Ion Batteries, J. Phys. Chem. Lett. 2011, 2, 176-184.
Zhang, Jianbo et al., The Evolution of Lithium-Ion Cell Thermal Safety with Aging Examined in a Battery Testing Calorimeter, Batteries 2016, 2, 12.
Manthiram, Arumugam, An Outlook on Lithium Ion Battery Technology, ACS Cent. Sci., Jul. 5, 2017.
Manthiram, Arumugam, A perspective on nickel-rich layered oxide cathodes for lithium-ion batteries, Energy Storage Materials 6 (2017) 125-139.
Xia, H. et al., Phase Transitions and High-Voltage Electrochemical Behavior of LiCoO2 Thin Films Grown by Pulsed Laser Deposition, Journal of The Electrochemical Society, 155, 4:A337-A342, 2007.
Angell, C.A., Mobile Ions in Amorphous Solids, Annu. Rev. Phys. Chem. 1992, 43:693-717.
Zhang, X. et al., Direct Observation of Li-Ion Transport in Electrodes under Nonequilibrium Conditions Using Neutron Depth Profiling, Adv. Energy Mater. 2015, 5, 1500498.
Weaver, Jamie L. et al., Natural alteration of 6Li alumino-silicate glass, Journal of Nuclear Materials 512 (2018) 56-64.
Smith, Phil M. et al., Thermal conductivity of poly(3,4-ethylenedioxythiophene) films engineered by oxidative chemical vapor deposition (oCVD), RSC Adv.,2018, 8, 19348.
Paxson, Adam T. et al., Stable Dropwise Condensation for Enhancing Heat Transfer via the Initiated Chemical Vapor Deposition (iCVD) of Grafted Polymer Films, Adv. Mater. 2014, 26, 418-423.
Im, Sung Gap et al., Systematic control of the electrical conductivity of poly(3,4-ethylenedioxythiophene) via oxidative chemical vapor deposition (oCVD),Surface & Coatings Technology 201 (2007) 9406-9412.
Yang, Zhixiong et al., A deep study of the protection of Lithium Cobalt Oxide with polymer surface modification at 4.5 V high voltage, Scientific Reports, 8:863, 2018.
Seong, Won Mo et al., Unveiling the Intrinsic Cycle Reversibility of a LiCoO2 Electrode at 4.8-V Cutoff Voltage through Subtractive Surface Modification for Lithium-Ion Batteries, Nano Letters, Sep. 25, 2018.
Su, Laisuo et al., Surface Engineering of a LiMn2O4 Electrode Using Nanoscale Polymer Thin Films via Chemical Vapor Deposition Polymerization, ACS Appl. Mater. Interfaces 2018, 10, 27063-27073.

(56) References Cited

OTHER PUBLICATIONS

Chen, Nan et al., Nanoscale, conformal polysiloxane thin film electrolytes for three-dimensional battery architectures, The Royal Society of Chemistry, 2015.
Reeja-Jayan, B. et al., A Group of Cyclic Siloxane and Silazane Polymer Films as Nanoscale Electrolytes for Microbattery Architectures, Macromolecules, Jul. 7, 2015.
Zie, Jin et al., Engineering the surface of LiCoO2 electrodes using atomic layer deposition for stable high-voltage lithium ion batteries, Nano Research, Mar. 12, 2017.
Kalluri, Sujith et al., Surface Engineering Strategies of Layer LiCoO2 Cathode Material to Realize High-Energy and High-Voltage Li-Ion Cells, Adv. Energy Matter, 2017, 7: 1601507.
Wang, Xinran et al., Chemical vapor deposition and atomic layer deposition for advanced lithium ion batteries and supercapacitors, Energy Environ. Sci. 2015, 8: 1889.
Wang, Kai-Xue et al., Surface and Interface Engineering of Electrode Materials for Lithium-Ion Batteries, Adv. Mater. 2015, 27: 527-545.
Xie, Yingying et al., Identifying Active Sites for Parasitic Reactions at the Cathode-Electrolyte Interface, J. Phys. Chem. Lett. 2019, 10, 589-594.
Li, Yiyang et al., Fluid-enhanced surface diffusion controls intraparticle phase transformations, Nature Materials, vol. 17: 915-922, Oct. 2018.
Gauthier, Magali et al., Electrode-Electrolyte Interface in Li-Ion Batteries: Current Understanding and New Insights, J. Phys. Chem. Lett. 2015, 6, 4653-4672.
Castro, V. Di et al., XPS Study of MnO Oxidation, Journal of Electron Spectroscopy and Related Phenomena, 48 ( 1989) 117-123.
Samba, Ramona et al., Is the Enhanced Adhesion of PEDOT Thin Films on Electrodes Due to Sulfur—Gold Interaction?—An XPS Study, The Open Surface Science Journal, 2013, 5:17-20.
Jin, Yang et al., Thermal Stability Investigation of PEDOT Films from Chemical Oxidation and Prepolymerized Dispersion, Electrochemistry 81(10): 801-803, 2013.
Nowak, Sascha et al., The Role of Cations on the Performance of Lithium Ion Batteries: A Quantitative Analytical Approach, Acc. Chem. Res., Oct. 24, 2017.
Bai, Ying et al., Coating Material-Induced Acidic Electrolyte Improves LiCoO2 Performances, Electrochemical and Solid-State Letters, 9(12):A552-A556, 2006.
Blyr, A. et al., Self-Discharge of LiMn2O4/C Li-Ion Cells in Their Discharged State Understanding by Means of Three-Electrode Measurements, J. Electrochem. Soc., vol. 145(1): 194-209, 1998.
Amatucci, G.G. et al., Surface treatments of Li Mn O spinels for improved elevated temperature performance, Solid State Ionics 104 (1997) 13-25.
Jow, T. Richard et al., Factors Limiting Li+ Charge Transfer Kinetics in Li-Ion Batteries, Journal of The Electrochemical Society, 165 (2) A361-A367 (2018).
Pinson, Matthew B. et al., Theory of SEI Formation in Rechargeable Batteries: Capacity Fade, Accelerated Aging and Lifetime Prediction, Journal of The Electrochemical Society, 160 (2) A243-A250 (2013).
Wang, Li-Fang et al., Study of Mn Dissolution from LiMn2O4 Spinel Electrodes Using Rotating Ring-Disk Collection Experiments, Journal of The Electrochemical Society, 150(7): A905-A911, 2003.
Jang, Dong H. et al., Dissolution of Spinel Oxides and Capacity Losses in 4 V Li/LixMn2O4 Cells, J. Electrochem. Soc., vol. 143, No. 7, Jul. 1996, 2204-2211.
Thackeray, M.M. et al., Electrochemical Extraction of Lithium From LiMn2O4, Mat. Res. Bull., vol. 19, pp. 179-187, 1984.
Su, Laisuo et al., Path dependence of lithium ion cells aging under storage conditions, Journal of Power Sources 315 (2016) 35-46.
Fang, Shuyu et al., Anode-originate SEI migration contributes to formation of cathode-electrolyte interphase layer, Journal of Power Sources, 373: 184-192, 2018.
Huang, Jun et al., Graphical analysis of electrochemical impedance spectroscopy data in Bode and Nyquist representations, Journal of Power Sources 309 (2016) 82-98.
Feng, Zhang-Qi et al., Highly aligned poly(3,4-ethylene dioxythiophene) (PEDOT) nano- and microscale fibers and tubes, Polymer 54 (2013) 702-708.
Aldalbahi, Ali et al., A Strategy to Enhance the Electrode Performance of Novel Three-Dimensional PEDOT/RVC Composites by Electrochemical Deposition Method, Polymers 2017, 9, 157.
Im, Sung Gap et al., Systematic Control of the Electrical Conductivity of Poly(3,4-ethylenedioxythiophene) via Oxidative Chemical Vapor Deposition, Macromolecules 2007, 40, 6552-6556.
Tarascon, J.M. et al., The Li1 +xMn2O4/C Rocking-Chair System: A Review, Electrochimica Acta, vol. 38, No. 9, pp. 1221-1231, 1993.
Reeja-Jayan, B. et al., A Route Towards Sustainability Through Engineered Polymeric Interfaces, Adv. Mater. Interfaces 2014, 1, 1400117.
Chen, Nan et al., Nanoscale, conformal polysiloxane thin film electrolytes for three-dimensional battery architectures, Mater. Horiz. ,2015, 2, 309.
Xu, Kang, Electrolytes and Interphases in Li-Ion Batteries and Beyond, Chem. Rev. 2014, 114, 11503-11618.
Guan, Dongsheng et al., Ultrathin surface coatings to enhance cycling stability of LiMn2O4 cathode in lithium-ion batteries, Ionics 19:1-8, 2013.
Vidu, Ruxandra et al., A Group of Cyclic Siloxane and Silazane Polymer Films as Nanoscale Electrolytes for Microbattery Architectures, Ind. Eng. Chem. Res. 2004, 43, 3314-3324.
Arbizzani, Catia et al., Characterization and electrochemical performance of Li-rich manganese oxide spinel/poly (3,4-ethylenedioxythiophene) as the positive electrode for lithium-ion batteries, Journal of Electroanalytical Chemistry 553 (2003), 125-133.
Liu, Jun et al., Understanding the Improvement in the Electrochemical Properties of Surface Modified 5 V LiMn1.42Ni0.42Co0.16O4 Spinel Cathodes in Lithium-ion Cells, Chem. Mater. 2009, 21, 1695-1707.
Zhan, C.; Wu, T.; Lu, J.; Amine, K. Dissolution, Migration, and Deposition of Transition Metal Ions in Li-ion Batteries Exemplified by Mn-Based Cathodes—A Critical Review. Energy Environ. Sci. 2018, 11, 243-257.
Zhang, J., et al., Unraveling the multiple effects of Li2ZrO3 coating on the structural and electrochemical performances of LiCoO2 as high-voltage cathode materials. Electrochimica Acta, 2016. 209: p. 102-110.
Zhao, F., et al., Vapor-assisted synthesis of Al2O3-coated LiCoO2 for high-voltage lithium ion batteries. Electrochimica Acta, 2015. 174: p. 384-390.
Zhuang, Q.; Xu, J.; Fan, X.; Dong, Q.; Jiang, Y.; Huang, L.; Sun, S. An electrochemical impedance spectroscopic study of the electronic and ionic transport properties of LiCoO2 cathode. Chinese Science Bulletin 2007, 52, 1187-1195.
Ziegler, J. F.; Biersack, J. P.; Ziegler, M. D. SRIM, a version of the TRIM program. The Stopping and Range of Ions in Matter 2008.
Zuo, D., Comparative Study of the Electrochemical Behaviors for LiCoO2 Electrode Coated with Two Different Al2O3 Coating Layer. International Journal of Electrochemical Science, 2017: p. 5044-5057.
Amatucci, G. G.; Tarascon, J. M.; Klein, L. C. Cobalt dissolution in LiCoO 2-based non-aqueous rechargeable batteries. Solid State Ionics 1996, 83, 167-173.
Bai, Y., et al., New concept of surface modification to LiCoO2. Journal of Power Sources, 2007. 174(1): p. 328-334.
Bai, Y., et al., Performance improvement of LiCoO2 by MgF2 surface modification and mechanism exploration. Electrochimica Acta, 2014. 134: p. 347-354 .
Becke, A. D. Density-functional exchange-energy approximation with correct asymptotic behavior. Physical review A 1988, 38, 3098.
Bogdan, M.; Ghosh, J. K.; Doerge, R. W. Modifying the Schwarz Bayesian information criterion to locate multiple interacting quantitative trait loci. Genetics 2004, 167, 989-999.

(56) References Cited

OTHER PUBLICATIONS

Burke, K.; Emzerhof, M.; Perdew, J. P. Generalized Gradient Approximation Made Simple [Phys. Rev. Lett. 77, 3865 (1996)]. Physical Review Letters 1997, 78, 1396-1396.

Cai, L.; An, K.; Feng, Z.; Liang, C.; Harris, S. J. In-situ observation of inhomogeneous degradation in large format Li-ion cells by neutron diffraction. Journal of Power Sources 2013, 236, 163-168.

Chebiam, R. V.; Kannan, A. M.; Prado, F.; Manthiram, A. Comparison of the chemical stability of the high energy density cathodes of lithium-ion batteries. Electrochemistry Communications 2001, 3, 624-627.

Chen, G., et al., On electrochemistry of Al2O3-coated LiCoO2 composite cathode with improved cycle stability. Ionics, 2016. 22(5): p. 629-636.

Chen, L.; Venkatram, S.; Kim, C.; Batra, R.; Chandrasekaran, A.; Ramprasad, R. Electrochemical Stability Window of Polymeric Electrolytes. Chemistry of Materials 2019, 31, 4598-4604.

Chen, Z.; Dahn, J. R. Improving the Capacity Retention of LiCoO[sub 2] Cycled to 4.5 V by Heat-Treatment. Electrochemical and Solid-State Letters 2004, 7, A11.

Jow, T. R.; Delp, S. A.; Allen, J. L.; Jones, J.; Smort, M. C.; The Electrochemical Society: 2017, p. 215-215.

Ju, S. H.; Kang, I.-S.; Lee, Y.-S.; Shin, W.-K.; Kim, S.; Shin, K.; Kim, D.-W. Improvement of the Cycling Performance of LiNi0.6-Co0.2Mn0.2O2 Cathode Active Materials by a Dual-Conductive Polymer Coating. ACS Appl. Mater. Interfaces 2014, 6, 2546-2552.

Kienzle, P. A.; Maranville, B. B.; O'Donovan, K. V.; Ankner, J. F.; N. F. Berk, C. F. M. Reflectometry Software. https://www.nist.gov/ncnr/reflectometry-software 2017.

Kim, D. K.; Muralidharan, P.; Lee, H.-W.; Ruffo, R.; Yang, Y.; Chan, C. K.; Peng, H.; Huggins, R. A.; Cui, Y. Spinel LiMn2O4Nanorods as Lithium Ion Battery Cathodes. Nano Lett. 2008, 8, 3948-3952.

Kresse, G.; Furthmuller, J. Efficiency of ab-initio total energy calculations for metals and semiconductors using a plane-wave basis set. Computational materials science 1996, 6, 15-50.

Lee, C.; Yang, W.; Parr, R. G. Development of the Colle-Salvetti correlation-energy formula into a functional of the electron density. Phys Rev B Condens Matter 1988, 37, 785-789.

Lenz, A.; Kariis, H.; Pohl, A.; Persson, P.; Ojamäe, L. The electronic structure and reflectivity of PEDOT:PSS from density functional theory. Chemical Physics 2011, 384, 44-51.

Lepró, X.; Ehrmann, P.; Menapace, J.; Lotscher, J.; Shin, S.; Meissner, R.; Baxamusa, S. Ultralow Stress, Thermally Stable Cross-Linked Polymer Films of Polydivinylbenzene (PDVB). Langmuir 2017, 33, 5204-5212.

Li, Y.; Cheng, X.; Zhang, Y.; Zhao, K. Recent advance in understanding the electro- chemo- mechanical behavior of lithium-ion batteries by electron microscopy. Materials Today Nano 2019, 7, 100040.

Liu, J.; Manthiram, A. Kinetics Study of the 5 V Spinel Cathode LiMn[sub 1.5]Ni[sub 0.5]O[sub 4] Before and After Surface Modifications. J. Electrochem. Soc. 2009, 156, A833.

Moni, P.; Lau, J.; Mohr, A. C.; Lin, T. C.; Tolbert, S. H.; Dunn, B.; Gleason, K. K. Growth Temperature and Electrochemical Performance in Vapor-Deposited Poly (3, 4-ethylenedioxythiophene) Thin Films for High-Rate Electrochemical Energy Storage. ACS Applied Energy Materials 2018, 1, 7093-7105.

Nobili, F.; Dsoke, S.; Croce, F.; Marassi, R. An ac impedance spectroscopic study of Mg-doped LiCoO2 at different temperatures: electronic and ionic transport properties. Electrochimica Acta 2005, 50, 2307-2313.

Peled, E. Film Forming Reaction at the Lithium/Electrolyte Interface. J. Power Sources 1983, 9, 253-266.

Qi, R.; Shi, J.-L.; Zhang, X.-D.; Zeng, X.-X.; Yin, Y.-X.; Xu, J.; Chen, L.; Fu, W.-G.; Guo, Y.-G.; Wan, L.-J. Improving the Stability of LiNi0.80Co0.15Al0.05O2 by AlPO4 Nanocoating for Lithium-Ion Batteries. Sci. China: Chem. 2017, 60, 1230-1235.

Raman Band Correlation Table. http://www.utsc.utoronto.ca/?traceslab/raman%20correlation%20table.pdf, (accessed Jan. 2018).

Schulz, N.; Hausbrand, R.; Dimesso, L.; Jaegermann, W. XPS-Surface Analysis of SEI Layers on Li-Ion Cathodes: Part I. Investigation of Initial Surface Chemistry. Journal of The Electrochemical Society 2018, 165, A819-A832.

Schwarz, G. Estimating the dimension of a model. The annals of statistics 1978, 6, 461-464. Lamaze, G.; Downing, R.; Langland, J.; Hwang, S. The new cold neutron depth profiling instrument at NIST. Journal of radioanalytical and nuclear chemistry 1992, 160, 315-325.

Shi, J.-L.; Qi, R.; Zhang, X.-D.; Wang, P.-F.; Fu, W.-G.; Yin, Y.-X.; Xu, J.; Wan, L.-J.; Guo, Y.-G. High-Thermal- and Air-Stability Cathode Material with Concentration-Gradient Buffer for Li-Ion Batteries. ACS Appl. Mater. Interfaces 2017, 9, 42829-42835.

Su, L.; Jha, S. K.; Phuah, X. L.; Xu, J.; Nakamura, N.; Wang, H.; Okasinski, J. S.; Reejan-Jayan, B. Engineering Lithium Ion Battery Cathodes for High Voltage Applications Using Electromagnetic Excitation. Journal of Materials Science (under review) 2020.

Sun, L. et al. Realization of Ti Doping by Electrostatic Assembly to Improve the Stability of LiCoO2 Cycled to 4.5 V. Journal of The Electrochemical Society 166, A1793-A1798 (2019).

Suresh, P.; Shukla, A. K.; Munichandraiah, N. Temperature dependence studies of ac impedance of lithium-ion cells. Journal of applied electrochemistry 2002, 32, 267-273.

Wang, L.; Chen, B.; Ma, J.; Cui, G.; Chen, L. Reviving lithium cobalt oxide-based lithium secondary batteries-toward a higher energy density. Chemical Society Reviews 2018, 47, 6505- 6602.

Wang, Z., et al., Synthesis of Li2MnO3-stabilized LiCoO2 cathode material by spray-drying method and its high-voltage performance. Journal of Alloys and Compounds, 2015. 626: p. 228-233.

Weppner, W. and R.A. Huggins, Determination of the kinetic parameters of mixed-conducting electrodes and application to the system Li3Sb. Journal of The Electrochemical Society, 1977. 124(10): p. 1569-1578.

Wu, F.; Liu, J.; Li, L.; Zhang, X.; Luo, R.; Ye, Y.; Chen, R. Surface Modification of Li-Rich Cathode Materials for Lithium-Ion Batteries with a PEDOT:PSS Conducting Polymer. ACS Appl. Mater. Interfaces 2016, 8, 23095-23104.

Xu, G.; Liu, Q.; Lau, K. K. S.; Liu, Y.; Liu, X.; Gao, H.; Zhou, X.; Zhuang, M.; Ren, Y.; Li, J.; Shao, M.; Ouyang, M.; Pan, F.; Chen, Z.; Amine, K.; Chen, G. Building ultraconformal protective layers on both secondary and primary particles of layered lithium transition metal oxide cathodes. Nature Energy 2019.

Xu, Y.; Hu, E.; Zhang, K.; Wang, X.; Borzenets, V.; Sun, Z.; Pianetta, P.; Yu, X.; Liu, Y.; Yang, X.; Li, H. In situ Visualization of State-of-Charge Heterogeneity within a LiCoO2 Particle that Evolves upon Cycling at Different Rates. ACS Energy Letters 2017, 2, 1240-1245.

Yabuuchi, N., et al., Electrochemical properties of LiCoO2 electrodes with latex binders on high-voltage exposure. Journal of the electrochemical society, 2015. 162(4): p. A538-A544.

Choi, K., et al., Electrochemical performance and thermal stability of LiCoO2 cathodes surface-modified with a sputtered thin film of lithium phosphorus oxynitride. Journal of Power Sources, 2010. 195(24): p. 8317-8321.

Cramer, C. J. Essentials of computational chemistry, theories and models; Wiley: Chichester, England, 2002; vol. 43.

Cramer, C. J. Essentials of Computational Chemistry: Theories and Models, John Wiley & Sons Ltd. New York 2002, 542.

DeCaluwe, S. C.; Kienzle, P. A.; Bhargava, P.; Baker, A. M.; Dura, J. A. Phase segregation of sulfonate groups in Nafion interface lamellae, quantified via neutron reflectometry fitting techniques for multi-layered structures. Soft Matter 2014, 10, 5763-5776.

Dudarev, S. L.; Botton, G. A.; Savrasov, S. Y.; Humphreys, C. J.; Sutton, A. P. Electron-energy-loss spectra and the structural stability of nickel oxide: An LSDA+ U study. Physical Review B 1998, 57, 1505.

Dura, J. A.; Pierce, D. J.; Majkrzak, C. F.; Maliszewskyj, N. C.; McGillivray, D. J.; Lösche, M.; O Donovan, K. V.; Mihailescu, M.; Perez-Salas, U.; Worcester, D. L.; White, S. H. and/R: Advanced neutron diffractometer/reflectometer for investigation of thin films and multilayers for the life sciences. Review of Scientific Instruments 2006, 77, 074301.

(56) References Cited

OTHER PUBLICATIONS

Gao, X.-W.; Deng, Y.-F.; Wexler, D.; Chen, G.-H.; Chou, S.-L.; Liu, H.-K.; Shi, Z.-C.; Wang, J.-Z. Improving the Electrochemical Performance of the LiNi0.5Mn1.5O4 Spinel by Polypyrrole Coating as a Cathode Material for the Lithium-Ion Battery. J. Mater. Chem. A 2015, 3, 404-411.

Grimme, S. Semiempirical GGA-type density functional constructed with a long-range dispersion correction. Journal of computational chemistry 2006, 27, 1787-1799.

Han, B., et al., Understanding the Role of Temperature and Cathode Composition on Interface and Bulk: Optimizing Aluminum Oxide Coatings for Li-Ion Cathodes. ACS Applied Materials & Interfaces, 2017. 9(17): p. 14769-14778.

Infrared Tables (Short Summary of Common Absorption Frequencies). http://www.cpp.edu/?psbeauchamp/pdf/spec_ir_nmr_spectra_tables.pdf (accessed Jan. 2018).

\* cited by examiner $\Delta G(Li^*) = -2.17$ eV $\Delta G(Li^*) = -3.15$ eV

ΔG(Li*)= -3.92 eV $\Delta G(PF_6^-) = -0.65$ eV $\Delta G(PF_6^-) = -0.06$ eV

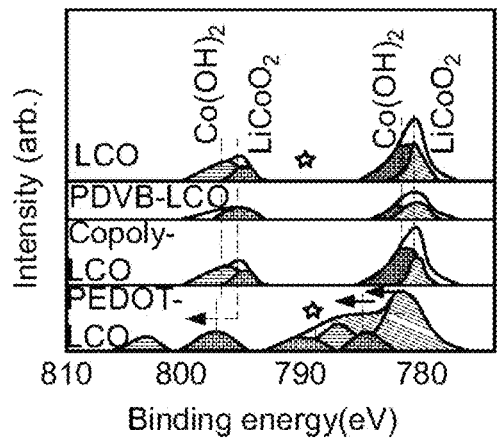
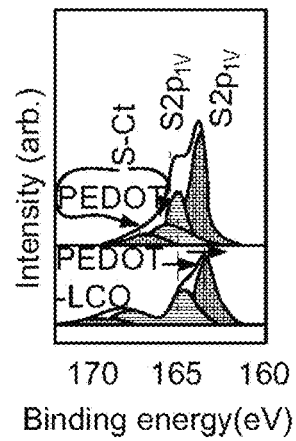
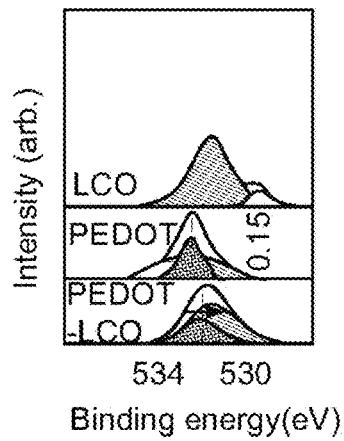
FIG. 54A          FIG. 54B          FIG. 54C
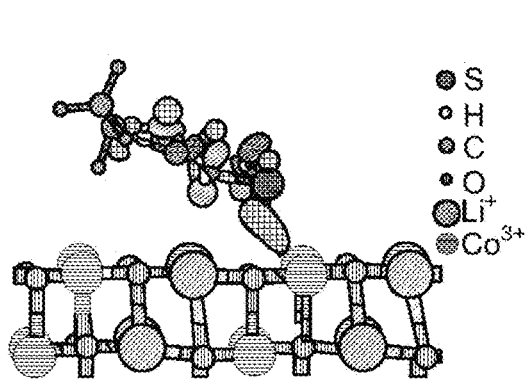
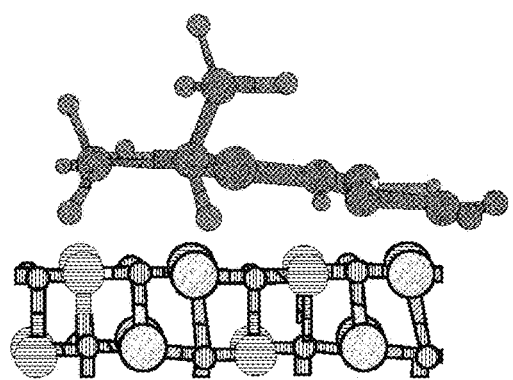
FIG. 54D          FIG. 54E
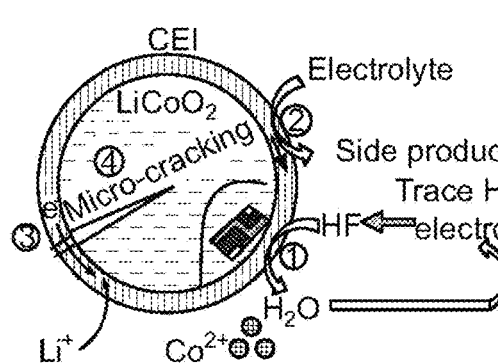
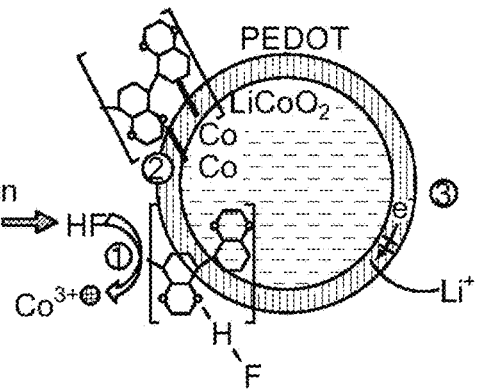
FIG. 54F          FIG. 54G

ELECTRODE SURFACE ENGINEERING IN LITHIUM ION BATTERIES

CROSS REFERENCE TO RELATED APPLICATION

This application claims the benefit of U.S. Provisional Application No. 62/921,054, filed May 29, 2019, the entire contents of which is incorporated herein by reference.

GOVERNMENT RIGHTS

This invention was made with government support under National Science Foundation (NSF) CAREER Award (CMMI1751605). The U.S. government has certain rights in the invention.

TECHNICAL FIELD

This disclosure generally relates to lithium ion battery electrodes as well as methods of making and using the same.

BACKGROUND

Due to their high energy density, high voltage, and long lifespan, lithium ion batteries (LIBs) may show tremendous potential for powering plug-in electric vehicles and lowering carbon emissions. However, the widespread adoption of this technology may be hampered by unwanted chemical reactions occurring at the electrode-electrolyte interfaces inside LIBs. These reactions may produce an insulating solid-electrolyte interphase (SEI) layer (1-30 nanometers thick) on the surface of electrodes, which may reduce the overall energy efficiency and/or result in poor cyclability, rate capability, and/or operational safety. Accordingly, more efficient and/or cost-effective LIB electrodes as well as methods of making the same may be desirable.

SUMMARY

The present invention is directed to more efficient and/or cost-effective LIB electrodes as well as methods of making and using the same.

The present invention is directed to a process to engineer a surface of an electrode for a lithium ion battery (LIB). In contrast to conventional methods, the process according to the present invention may provide precise thickness and compositional control of a thin film polymer coating while retaining underlying morphologies of substrate structures. The thin film may act as a physical barrier between electrode and electrolyte. Thus, the surface engineering may extend the lifespan of LIBs by stabilizing the electrode. In addition, the protection provided by the surface engineering may enable the application of certain electrode materials having high energy capacity, excellent rate capability, and/or improved safety. The electrode materials may be useful for applications ranging from electric vehicles and aerospace to stationary grid-level storage of electricity produced by renewable energy sources. The process according to the present invention may be applied to an intercalation electrode (i.e., cathode or anode) used for lithium, sodium, and/or potassium ion batteries.

The present invention is directed to improving the performance and/or stability of lithium ion batteries (LIBs) relating to charge transfer and reactions at electrode-electrolyte interfaces (EEI). The process according to the present invention may be used to engineer this interface using conformal, functional polymer nanolayers via a vapor-based deposition process. For example, a poly(3,4-ethylenedioxythiophene) (PEDOT) nanolayer may double the capacities of $LiCoO_2$ at high rates (>5 C) and extend its 4.5 V cycling life at C/2 by over 1700%. The improved rate performance may relate to the fast transport channels for both $Li^+$ and electrons provided by the PEDOT coating. Such behavior may be characterized using density functional theory (DFT) calculations. The extended cycling stability may come from strong interactions between PEDOT and Co atoms, as shown by X-ray photoelectron spectroscopy and DFT calculations. Additionally, in-situ synchrotron X-ray diffraction shows that PEDOT increases current homogeneity in $LiCoO_2$ during cycling. The process according to the present invention may be used to design the EEI for advanced LIBs.

The present invention is directed to a process to manufacture an electrode, such as a lithium-manganese dioxide ($LiMn_2O_4$) cathode electrode, having an extension in cycle-life and/or electrode stabilization when engineered to comprise a nanoscale polymer thin film. The surface engineering may facilitate precise thickness control of the polymer thin film. The electrode may comprise a cathode material selected from lithium-manganese dioxide ($LiMn_2O_4$), lithium cobalt oxide ($LiCoO_2$), $LiNi_xCo_yMn_zO_2$ (in which x+y+z=1), $LiNi_{0.8}Co_{0.15}Al_{0.05}O_2$, and/or lithium iron phosphate ($LiFePO_4$). The electrode may comprise an anode material selected from carbon, graphite, and/or silicon. The polymer coating may comprise a thickness up to 100 nanometers, such as 10-100 nanometers, for example. The upper limit of the thickness of the polymer coating may comprise 100 nanometers, 75 nanometers, 60 nanometers, and 50 nanometers. The lower limit of the thickness of the polymer coating may comprise 10 nanometers, 25 nanometers, 50 nanometers, 60 nanometers, and 75 nanometers. The thickness of the polymer film may be characterized by transmission electron microscopy (TEM), ellipsometry and neutron reflectometry.

The present invention is directed to lithium ion batteries (LIBs) comprising electrode-electrolyte interfaces (EEIs) having desirable rate capability, cycling stability, and/or thermal safety. A method of engineering EEIs for $LiCoO_2$ electrodes may comprise chemical vapor deposition polymerization processes. Poly(3,4-ethylenedioxythiophene) (PEDOT) may double the specific capacity of $LiCoO_2$ at high rates (>5 C) and increase its 4.5 V cycle life by over 1700%. The 4.5 V capacity fade rate at C/2 may be reduced from 1.33% per cycle to 0.073% per cycle by applying a 60 nm thick PEDOT coating. In comparison, poly(divinylbenzene) may have negligible effects and poly(1H,1H,2H,2H-perfluorodecyl acrylate-co-divinylbenzene) may have negative effects on $LiCoO_2$ performance. The PEDOT coating may improve the transport of electrons at the surface of $LiCoO_2$ and $Li^+$ between electrolyte and the electrode, mitigate current inhomogeneity in the $LiCoO_2$ electrode, block deleterious reactions of the electrolytes, and/or stabilize the $LiCoO_2$ surface. LIBs comprising the EEIs according to the present invention may have improved power density and/or cycle life.

BRIEF DESCRIPTION OF THE FIGURES

The devices and processes described herein may be better understood by considering the following description in conjunction with the accompanying drawings; it being understood that this disclosure is not limited to the accompanying drawings.

(FIG. 1A) schematic of the initiated chemical vapor (iCVD) deposition process. The monomer is divinylbenzene (DVB) is used as monomer and tert-butyl peroxide (TBPO) is the initiator. Vapors of both monomer and initiator flow into a chamber containing an array of heated filaments. The initiators are cracked and form radicals when they encounter the filaments. These radicals subsequently initiate the polymerization process of monomer on the substrate which is maintained at room temperature. (FIG. 1B) Chemical structures of the monomer (DVB), initiator (TBPO), and polymer poly(divinylbenzene) (PDVB).

(FIG. 2A) a comparison of discharge curves at 0.1 C, 0.5 C, 1 C, and 2 C for the two types of cells; (FIG. 2B) the variation of charge and discharge capacities with respect to cycling number, in which the top diagram shows the movement of Li+ during charge and discharge process; (FIG. 2C) the number of side reactions as a function of cycling number from 1 to 100 for pristine $LiMn_2O_4$ and PDVB coated $LiMn_2O_4$ electrode; and (FIG. 2D) a proposed mechanism that describes the protection of $LiMn_2O_4$ cathode electrode by the PDVB polymer coating.

(FIG. 3A) the variation of cell capacities with respect to equivalent cycling number; (FIG. 3B) EIS results for the two types of cell before and after the cycling test; (FIG. 3C) the enlarged plot in the selected zone in FIG. 3B, and a third-order equivalent circuit model to simulate the EIS data, where $R_0$ represents ohmic resistance inside a cell, $R_1$ and $Q_1$ represent resistance from SEI component, $R_2$ and $Q_2$ represent the charge transfer resistance on the surface of anode electrode, and $R_3$ and $Q_3$ represent those on surface of cathode electrode, and $Z_w$ represents the Warburg impedance that describes $Li^+$ diffusion inside electrode particles.

(FIG. 4A) discharge curves of the Cell-P (pristine) and Cell-C (coated) cells at 0.1 C during high temperature cycling; and (FIG. 4B) the corresponding incremental capacity analysis results.

(FIG. 6F) Cross-sectional image of a $LiMn_2O_4$ electrode and (FIG. 6G) S elemental mapping in the selected rectangular area in (FIG. 6F); the points represent the detected S element.

(FIG. 9A) Discharge curves of the coin cells using a pristine $LiMn_2O_4$ electrode, (FIG. 9B) PDVB-coated $LiMn_2O_4$ electrode, and (FIG. 9C) PEDOT-coated $LiMn_2O_4$ electrode. (FIG. 9D) Statistical data summary of cell capacities with respect to C-rates at room temperature, (FIG. 9E) at low temperature (0° C.), and (FIG. 9F) at high temperature (50° C.). The statistical results are calculated from three coin cells in each case. These results indicate that the PEDOT coating improves the rate capability in a wide temperature range from 0 to 50° C., whereas the PDVB coating has little effect.

(FIG. 11A) specific capacity with respect to the number of cycles and (FIG. 11B) capacity remaining with respect to the number of cycles. The tests were conducted at 50° C. using 1 C as the charging and discharge rates.

(FIG. 12B) Capacity remaining fit from the equation based on the proposed aging mechanisms. Experimental data are shown at every five points for clarity.

(FIG. 13A) EIS of four types of cells tested at room temperature with a 4.1 V open-circuit voltage and (FIG. 13B) capacity degradation of these cells during cycling at 50° C. and 1 C.

(FIG. 21C) $LiCoO_2$ particle size distribution analyzed from 420 particles. The inserted image shows $LiCoO_2$ particles from a cross section electrode. (FIG. 21D) XPS spectra of S 2p spectrum for PEDOT films. Measurement data (dots) are fitted by several individual spectra. The combined spectra from these regions are shown as an envelope that matches well with the experimental data (dots). (FIG. 21E) High resolution TEM image of a copolymer coated $LiCoO_2$ particle. (FIG. 21F) TEM images in a larger scale of $LiCoO_2$ particles with (top) PEDOT coating, (middle) PDVB coating, and (bottom) copolymer coating. (FIG. 21G) SEM image of silicon trench (left) and 100 nm thick PDVB-coated silicon trench (right). (FIG. 21H) Cross-section of a $LiCoO_2$ electrode with PEDOT coating and EDS S elemental mapping in the selected region.

(FIG. 23A) The S 2p spectrum for PEDOT with Cl doped. (FIG. 23B) The C 1s spectrum for PPFDA. (FIG. 23C) The C 1s spectrum for P(PFDA-co-DVB). Measurement data (dots) are filled by several individual spectra (shaded regions). The combined spectra from these shaded regions are shown as an envelope that matches well with the experimental data (dots).

(FIG. 24D) Cumulative binding energy between $Li^+$ and different monomers with respect of the number of $Li^+$.

(FIG. 25A) The cumulative binding energy between $Li^+$ and three monomers (DVB, EDOT, and PFDA). (FIG. 25B) The cumulative binding energy between $Li^+$ and PDVB and PEDOT oligomers. Each oligomer has eight monomer units.

(FIG. 26A) EIS of $LiCoO_2$ with different polymer coatings measured at 4.0 V. The inserted figure (top left) zooms in the rectangular area of the total EIS data. (FIG. 26B) Comparison the diffusion coefficient of Li in $LiCoO_2$ with different polymer coatings at different potentials. The details for calculating $D_{Li}$ can be found in FIG. 27C. Comparison of discharge curves at 2 C for different $LiCoO_2$ electrodes. (FIG. 26D) Statistical comparison of cell capacities (3 samples in each case) with respect to C-rate at room temperature tested within 3.0-4.2 V. The symbol w/T stands for with PEDOT coating, w/B with PDVB coating, and w/Co with copolymer coating.

FIGS. 27A and 27 B show diffusion coefficient of Li in $LiCoO_2$ electrodes calculated from GITT technique. (FIG. 27A) The schematic of GITT curve as a function of capacity. The inserted figures show the method to extract parameters $\Delta E_s$ and $\Delta E_t$ for calculating Li diffusion coefficient.

(FIG. 28A) Capacity degradation of $LiCoO_2$ electrodes during the cycling test. Three cells are tested for each case and their results are presented via error bars. (FIG. 28B) The decrease of Li diffusion coefficient in different $LiCoO_2$ electrodes during the cycling test. The values are averaged for all D values at 4.0-4.5 V (FIG. 28C). (FIG. 28D) The evolution of charge transfer resistance ($R_{ct}$), ohmic resistance ($R_o$), and passive film resistance ($R_{CEI}$) of different $LiCoO_2$ electrodes. The symbol P represents the pristine $LiCoO_2$, w/T the PEDOT-coated $LiCoO_2$, w/B the PDVB-coated $LiCoO_2$, and w/Co the copolymer-coated $LiCoO_2$.

(FIG. 29B) The evolution of lithium diffusion coefficient in a pristine $LiCoO_2$ electrode measured via GITT. (FIGS. 29C and D) The variation of electrochemical impedance spectroscopy of a pristine $LiCoO_2$ electrode during the cycling test. Two different scales are shown due to the different amplitude of the two semi-circles. The symbol P stands for the pristine $LiCoO_2$, w/T stands for the PEDOT-coated $LiCoO_2$, w/B stands for the PDVB-coated $LiCoO_2$, and w/Co stands for the copolymer-coated $LiCoO_2$.

(FIG. 33A) The voltage profile (at C/2) and the corresponding contour plot of XRD pattern evolution during one cycle for a pristine $LiCoO_2$ electrode, and (FIG. 33B) a PEDOT-coated $LiCoO_2$ electrode. The intensity of a peak is represented by different shaded regions. Some transitions are aligned by dash lines. (FIG. 33C) The evolution of c lattice parameters of a $LiCoO_2$ unit cell calculated from (003) peaks for a pristine electrode and (FIG. 33D) for a PEDOT-coaled electrode.

(FIG. 35A) The transport of $Li^+$ from electrolyte to a $LiCoO_2$ electrode. (FIG. 35B) Different aging mechanisms that may lead to capacity degradation of $LiCoO_2$ electrodes.

(FIG. 36B) The cross section SEM image of a $LiCoO_2$ electrode to show the $LiCoO_2$ secondary particle. (FIG. 36C) $LiCoO_2$ particle size distribution measured from 420 $LiCoO_2$ primary particles based on SEM images ((FIG. 36A). ImageJ is utilized to analyze the $LiCoO_2$ particle size. The primary particle size is 2.1 μm (mean) and 1.7 μm (median) diameter. (FIG. 36D) X-ray diffraction pattern of commercial $LiCoO_2$ powder used in this study, with selected peaks labelled.

FIGS. 37A and 37B show a schematic of initiated CVD (iCVD) polymerization (FIG. 37A) and oxidative CVD (oCVD) polymerization (FIG. 37B). These two CVD systems may deposit polymer thin films on casted electrodes by a one-step process. FIGS. 37C and 37D show high resolution TEM images show 10-20 nm thick polymer thin films were uniformly deposited on the surface of $LiCoO_2$ particles via the CVD polymerization techniques. The 0.472 nm shows the (003) d spacing in $LiCoO_2$. FIG. 37E SEM image shows that the CVD process may engineer uniform coatings on complex structure (like a silicon trench). Such conformal coatings cannot be realized by solution-based methods due to surface tension and dewetting effects. FIG. 37F shows EDS mapping of sulfur element for the cross-section of a $LiCoO_2$ electrode, where sulfur was uniformly distributed along the selected area.

(FIG. 38A) The reflectivity with respect to scattering vector. The points represent experimental data, the curve is the fitted results using the best-fit-model. The bottom subplot shows the residuals of the model. The top right subplot shows the scattering length density (SLD) of our samples at different thickness. (FIG. 38B) The histograms of the probability density function for each parameter. The histogram range represents the 95% credible interval, and the lighter region represents the 68% credible interval. The line shows the highest probability observed given that the parameter value is restricted to that bin of the histogram.

(FIG. 39A) The reflectivity with respect to scattering vector. The points represent experimental data, the curve is the fitted results using the best-fit-model. The bottom subplot shows the residuals of the model. The top right subplot shows the scattering length density (SLD) of our samples at different thickness. (FIG. 39B) The histograms of the probability density function for each parameter. The histogram range represents the 95% credible interval, and the lighter region represents the 68% credible interval. The line shows the highest probability observed given that the parameter value is restricted to that bin of the histogram.

FIG. 41A shows a schematic of lithiation process for a polymer thin film on Si wafer. All polymers are immersed in electrolyte for three days to uptake as much $Li^+$ as possible. FIG. 41B shows a schematic of the NDP experimental setup. Triton (3H) recoil particle profiles are analyzed to estimate the distribution of $Li^+$ in polymer thin films. FIGS. 41C-E show lithium concentration distribution in a 75 nm thick PEDOT film (FIG. 41C), a 75 nm thick PDVB film (FIG. 41D), and a 75 nm thick P(PFDA-co-DVB) film (FIG. 41E) after the lithiation treatment. The uncertainties are reported to 2 sigma.

FIG. 42A show statistical comparison of cell capacities tested at 3.0 V to 4.2 V. Four samples are measured in each case. FIG. 42B shows the effect of polymer coatings on the electrochemical impedance of the $LiCoO_2$ electrode measured at room temperature. An equivalent circuit model is inserted for fitting. FIG. 42C shows a schematic illustrates the $Li^+$ transport process from electrolyte to a $LiCoO_2$ particle, including ① $Li^+$ de-solvation process, ② $Li^+$ diffusion within CEI, ③ e-transport in $LiCoO_2$, ④ $Li^+$ combines with electron and form $Li^+$-e-pair, and ⑤ Li atom diffusion in the $LiCoO_2$ particle.

FIGS. 44A-D show the interaction between $Li^+$ and PEDOT (Cl doped) (FIG. 44A), PDVB (FIG. 44B), P(PFDA-co-DVB) (FIG. 44C), PEDOT ($PF_6$-doped) (FIG. 44D). The formation energy is −2.17, −3.15, −3.92, and −2.21 eV for system a, b, c, and d, respectively. Polymers with four repeating units are used for DFT calculation. FIG. 44E shows cumulative binding energy between $Li^+$ and different polymer repeating units (monomers). Each monomer may bind at most 2, 2, and 3 $Li^+$ for DVB, EDOT, and PFDA, respectively.

FIGS. 46A and B show the voltage profile and the corresponding contour plot showing XRD peaks evolution for a pristine $LiCoO_2$ electrode (FIG. 46A) and a 10 nm PEDOT-coated $LiCoO_2$ electrode (FIG. 46B) during one cycle at C/2 (1 C=145 mA/g) with cut-off voltage at 4.5 V. The intensity of a peak is represented by different shading, with dark shading indicating lower intensity and light shading indicates higher intensity. FIGS. 46C and 46 E show selected ED-XRD patterns of the pristine $LiCoO_2$ (FIG. 46C) and the PEDOT-coated $LiCoO_2$ electrode (FIG. 46E), with peak shifts denoted by the dashed black curves. FIGS. 46D and 46F show the evolution of d-spacing in (003) peak during cycling. The marker size represents the intensity of the corresponding peak. The arrows point to axis for different curves.

FIGS. 50A and 50B show the capacity retention of different $LiCoO_2$ electrodes tested at C/2 in voltage range of 3.0 V to 4.5 V. The coating thicknesses are 10 nm in (FIG. 50A) for different polymers, and three different thicknesses are tested in (FIG. 50B). FIG. 50C shows the capacity retention of different $LiCoO_2$ electrodes tested at 5 C in voltage range of 3.0 V to 4.5 V. FIG. 50D shows the comparison of 4.5 V high voltage cycling performance of $LiCoO_2$ with different particle sizes. Data is listed in Table 18. FIG. 50E shows the comparison of EIS for different types of $LiCoO_2$ electrodes after 60 cycles. The polymer thicknesses are 10 nm. The insert the figure shows the $R_{CEI}$.

FIG. 51A show the capacity degradation of $LiCoO_2$ electrodes with different polymer coatings tested at C/2. The coating thicknesses for different polymers are around 10 nm. FIG. 51B show the capacity degradation of $LiCoO_2$ with and without PEDOT coatings tested at 5 C.

FIGS. 52A, B show the variation of electrochemical impedance spectroscopy of a pristine $LiCoO_2$ electrode during the cycling test. FIGS. 52C, D show the evolution of charge transfer resistance (FIG. 52C), ohmic resistance, and cathode-electrolyte-interphase resistance (FIG. 52D) for the four types of $LiCoO_2$ electrodes.

FIG. 53A shows the schematic of GITT curve as a function of capacity. The inserted figures show the method to extract parameters $\Delta E_s$ and $\Delta E_t$ for calculating Li diffusion coefficient. FIG. 53B show the comparison of diffusion coefficient of Li during charging and discharging process in a pristine $LiCoO_2$ electrode.

FIGS. 54A-G show the interaction between polymers and $LiCoO_2$. FIGS. 54A-C show XPS data for the Co 2p (FIG. 54A), S 2p (FIG. 54B), and O 1s (FIG. 54C) in different samples. Measurement data (dots) are fitted by several individual Lorentzian/Gaussian functions (shaded regions). The combined spectra from these shaded regions is shown as an envelope that matches well with experimental data (dots). FIGS. 54D and 54E show electron density difference plots for EDOT (FIG. 54D) and DVB (FIG. 54E) binding to the $LiCoO_2$ surface calculated with DFT and displayed using an isovalue of 0.01. Lighter regions correspond to an electron density gain and darker regions correspond to an electron density loss. FIG. 54F and G show schematics to summarize the degradation mechanism of a pristine $LiCoO_2$ (FIG. 54F) and the effect of the PEDOT coating on the $LiCoO_2$ degradation (FIG. 54G).

(FIG. 55A) The reflectivity with respect to scattering vector. The points represent experimental data, the curve is the fitted results using the best-fit-model. The bottom subplot shows the residuals of the model. The top right subplot shows the scattering length density (SLD) of our samples at different thickness. (FIG. 55B) The histograms of the probability density function for each parameter. The histogram range represents the 95% credible interval, and the lighter region represents the 68% credible interval. The line shows the highest probability observed given that the parameter value is restricted to that bin of the histogram.

DETAILED DESCRIPTION

Figure 1A:
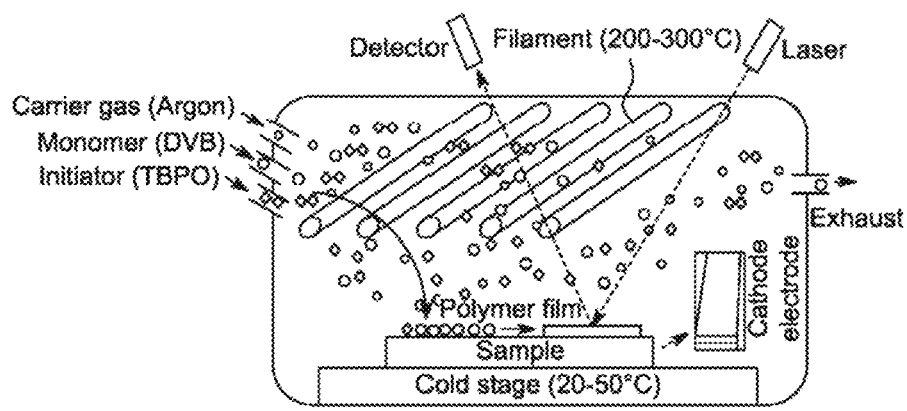
FIGS. 1A and 1B include.

This disclosure generally describes lithium ion battery electrodes as well as methods of making and using the same. It is understood, however, that this disclosure also embraces numerous alternative features, aspects, and advantages that may be accomplished by combining any of the various features, aspects, and/or advantages described herein in any combination or sub-combination that one of ordinary skill in the art may find useful. Such combinations or sub-combinations are intended to be included within the scope of this disclosure. As such, the claims may be amended to recite any features, aspects, and advantages expressly or inherently described in, or otherwise expressly or inherently supported by, this disclosure. Further, any features, aspects, and advantages that may be present in the prior art may be affirmatively disclaimed. Accordingly, this disclosure may comprise, consist of, consist essentially or be characterized by one or more of the features, aspects, and advantages described herein. As used herein, the term "and/or" includes any and all combinations of one or more of the associated listed items.

All numerical quantities stated herein are approximate, unless stated otherwise. Accordingly, the term "about" may be inferred when not expressly stated. The numerical quantities disclosed herein are to be understood as not being strictly limited to the exact numerical values recited. Instead, unless stated otherwise, each numerical value stated herein is intended to mean both the recited value and a functionally equivalent range surrounding that value. At the very least, and not as an attempt to limit the application of the doctrine of equivalents to the scope of the claims, each numerical value should at least be construed in light of the number of reported significant digits and by applying ordinary rounding processes. Typical exemplary degrees of error may be within 20%, 10%, or 5% of a given value or range of values. Alternatively, and particularly in biological systems, the terms "about" refers to values within an order of magnitude, potentially within 5-fold or 2-fold of a given value. Notwithstanding the approximations of numerical quantities stated herein, the numerical quantities described in specific examples of actual measured values are reported as precisely as possible. Any numerical values, however, inherently contain certain errors necessarily resulting from the standard deviation found in their respective testing measurements.

All numerical ranges stated herein include all sub-ranges subsumed therein. For example, a range of "1 to 10" or "1-10" is intended to include all sub-ranges between and including the recited minimum value of 1 and the recited maximum value of 10 because the disclosed numerical ranges are continuous and include every value between the minimum and maximum values. Any maximum numerical limitation recited herein is intended to include all lower numerical limitations. Any minimum numerical limitation recited herein is intended to include all higher numerical limitations.

All compositional ranges stated herein are limited in total to and do not exceed 100 percent (e.g., volume percent or weight percent) in practice. When multiple components may be present in a composition, the sum of the maximum amounts of each component may exceed 100 percent, with the understanding that, and as those skilled in the art would readily understand, that the amounts of the components may be selected to achieve the maximum of 100 percent.

In the following description, certain details are set forth in order to provide a better understanding of various features, aspects, and advantages the invention. However, one skilled in the art will understand that these features, aspects, and advantages may be practiced without these details. In other instances, well-known structures, methods, and/or processes associated with methods of practicing the various features, aspects, and advantages may not be shown or described in detail to avoid unnecessarily obscuring descriptions of other details of the invention.

The terminology used herein is for the purpose of describing particular examples only and is not intended to be limiting. As used herein, the singular forms "a", "an", and "the" may be intended to include the plural forms as well, unless the context clearly indicates otherwise. The terms "comprises", "comprising", "including", "having", and "characterized by", are inclusive and therefore specify the presence of stated features, elements, compositions, steps, integers, operations, and/or components, but do not preclude the presence or addition of one or more other features, integers, steps, operations, elements, components, and/or groups thereof. Although these open-ended terms are to be understood as a non-restrictive term used to describe and claim various aspects set forth herein, in certain aspects, the term may alternatively be understood to instead be a more limiting and restrictive term, such as "consisting of" or "consisting essentially of" Thus, for any given embodiment reciting compositions, materials, components, elements, features, integers, operations, and/or process steps, described herein also specifically includes embodiments consisting of, or consisting essentially of, such recited compositions, materials, components, elements, features, integers, operations, and/or process steps. In the case of "consisting of", the alternative embodiment excludes any additional compositions, materials, components, elements, features, integers, operations, and/or process steps, while in the case of "consisting essentially of", any additional compositions, materials, components, elements, features, integers, operations, and/or process steps that materially affect the basic and novel characteristics are excluded from such an embodiment, but any compositions, materials, components, elements, features, integers, operations, and/or process steps that do not materially affect the basic and novel characteristics can be included in the embodiment.

Any method steps, processes, and operations described herein are not to be construed as necessarily requiring their performance in the particular order discussed or illustrated, unless specifically identified as an order of performance. It is also to be understood that additional or alternative steps may be employed, unless otherwise indicated.

When a component, element, or layer is referred to as being "on", "engaged to", "connected to", or "coupled to" another element or layer, it may be directly on, engaged, connected or coupled to the other component, element, or layer, or intervening elements or layers may be present. In contrast, when an element is referred to as being "directly on", "directly engaged to", "directly connected to", or "directly coupled to" another element or layer, there may be no intervening elements or layers present. Other words used to describe the relationship between elements should be interpreted in a like fashion (e.g., "between" versus "directly between", "adjacent" versus "directly adjacent", etc.).

Although the terms first, second, third, etc. may be used herein to describe various steps, elements, components, regions, layers and/or sections, these steps, elements, components, regions, layers and/or sections should not be limited by these terms, unless otherwise indicated. These terms may be only used to distinguish one step, element, component, region, layer or section from another step, element, component, region, layer or section. Terms such as "first", "second", and other numerical terms when used herein may not imply a sequence or order unless clearly indicated by the context. Thus, a first step, element, component, region, layer or section discussed below may be termed a second step, element, component, region, layer or section without departing from the teachings herein.

Spatially or temporally relative terms, such as "before", "after", "inner", "outer", "beneath", "below", "lower", "above", "upper", and the like, may be used herein for ease of description to describe one element or feature's relationship to another element(s) or feature(s) as illustrated in the figures. Spatially or temporally relative terms may be intended to encompass different orientations of the device or system in use or operation in addition to the orientation depicted in the figures. As used herein, "top" means furthest away from the substrate, while "bottom" means closest to the substrate. Where a first layer is described as "disposed over", "provided over", or "deposited over" a second layer, the first layer is disposed further away from substrate. There may be other layers between the first and second layer, unless it is specified that the first layer is "in contact with", "disposed on", "provided on", or "deposited on" the second layer.

The terms "on", "appended to", "affixed to", "bonded to", "adhered to", or terms of like import means that the designated item, e.g., a coating, film or layer, is either directly connected to (superimposed on) the object surface, or indirectly connected to the object surface, e.g., through one or more other coatings, films or layers (superposed on).

The term "transparent", as used for example in connection with a substrate, film, material and/or coating, means that the indicated substrate, coating, film and/or material has the property of transmitting light without appreciable scattering so that objects lying beyond are entirely visible.

The phrase "an at least partial film" means an amount of film covering at least a portion, up to the complete surface of the substrate. A "film" or a "coating" is defined as a thin, substantially continuous layer of material that may be formed by a sheeting type of material or a coating type of material.

"Substantially uniform coating" describes a film or coating formed on a surface of a substrate in which at least 80%, at least 90%, at least 95%, at least 98%, and at least 99% of the surface is covered.

"Substantially uniform thickness" describes a film or coating formed on a surface of a substrate having thickness variation in at least one direction is less than 20%, less than 10%, less than 5%, less than 2% and less than 1%.

Surface modification of LIB electrodes by coating with an artificial SEI layer may enhance LIB performance and/or safety. The coatings may improve the stability of the electrode, particularly at high voltages, protect against unwanted reactions with the electrolyte, suppress dissolution of transition metal elements from the electrode, and/or increase electronic and ionic conductivity of the electrode. In some cases, the surface coating may be made by solution processing, which may offer poor control over film composition and functionality, and thus, may produce limited inhibition of side reactions in LIBs. Along with solution based processes, some vapor phase deposition methods, such as atomic layer deposition (ALD) and chemical vapor deposition (CVD), may be used to modify surface of electrodes. However, these processes may be utilized to grow inorganic materials, such as metal oxides, that may reduce the movement of $Li^+$ between electrolyte and electrode and increase overpotential during cell cycling.

Surface and interface engineering may be useful to extend cycle-life of lithium ion batteries. The present invention is directed to an initiated chemical vapor deposition (iCVD) polymerization process that may increase battery lifespan by modifying the surface of battery electrodes and/or creating an artificial solid electrolyte interphase (SEI) layer as a barrier between electrode and electrolyte. The vapor phase process according to the present invention may facilitate precise thickness and compositional control provided by iCVD relative to conventional solution based methods, which may also suffer from surface tension and/or dewetting effects. For example, the process according to the present invention may produce a 28 nanometer thick thin film of an electrically insulating but ionically conducting poly(divinylbenzene) (PDVB) directly onto the surface of $LiMn_2O_4$ electrodes via the iCVD method. The process according to the present invention may be used to fabricate coin cells. The coin cells may have improved battery performance. Without wishing to be bound to any particular theory, it is believed that the PDVB coating does not reduce the kinetic ability of $LiMn_2O_4$ electrodes when the $Li^+$ move through the coating without encountering significant resistance. The PDVB coating may also inhibit side reactions on cathode electrode at room temperature (e.g., 25° C.) cycling, and slow impedance increase and/or capacity degradation of cells during high temperature (e.g., greater than room temperature, such as 60° C.) cycling.

The present invention may be characterized by one or more of the following: an initiated chemical vapor deposition (iCVD) polymerization process than may be used for interface engineering for battery electrodes; nanoscale PDVB films having a 10-100 nanometer thickness uniformly coated on the surface of $LiMn_2O_4$ electrodes; PDVB coatings that may inhibit side reactions on $LiMn_2O_4$ electrode surface during room temperature cycling; and/or PDVB coatings that may extend the cycle-life of $LiMn_2O_4$ electrode during high temperature cycling.

The initiated chemical vapor deposition (iCVD) polymerization according to the present invention may comprise a vapor phase process to deposit polymer thin films having a thickness from 1 micrometer to 10 nm. iCVD may directly convert gas phase monomers into solid films through polymerization of reactive bonds (e.g., vinyl or acetylene) present on the monomer such that the polymerization and coating processes comprise a single step. The non-line-of-sight arrival of monomeric precursors may produce coatings having uniform thickness and/or uniform composition, and/or complete "conformal" coverage of planar and complex electrode surfaces, all while retaining the underlying morphology of these structures. The polymeric coatings may provide flexibility to tune the functionality of the SET layer by selecting monomers having the desired functional moieties. The present invention may comprise vapor phase processes for surface modifying electrodes in LIBs, such as iCVD and oCVD processes.

The iCVD process described herein may show the effect of nanoscale coatings of the polymer poly(divinylbenzene) (PDVB) on the performance of $LiMn_2O_4$ electrodes. The mechanical properties of the PDVB may relate to its cross-linking. In addition to PDVB, other polymers having monomers including double (vinyl) or triple (acetylene) bonds capable of polymerization by free radical polymerization mechanism in the iCVD process may be used. The process may comprise oxidative CVD (oCVD). Polymers capable of being synthesized by the oxidative polymerization mechanism in oCVD process may also be used in the present invention. For example, coin cells made according to the present invention may be used to compare the kinetic performance and cycle-life of $LiMn_2O_4$ electrode having and lacking the polymer coating. As a crosslinking polymer, PDVB may be sufficient mechanical stability to withstand deformation of electrode materials during $Li^+$ insertion and de-insertion. $LiMn_2O_4$ may have sufficient spinel structure suitable for high voltage and high capacity materials. A person having ordinary skill in the art will appreciate that many electrodes may be used because this process may be applied to any intercalation electrode (i.e., cathode or anode) used for lithium or sodium or potassium ion batteries, including, but not limited to, $LiCoO_2$, $LiMn_{1/3}Ni_{1/3}Co_{1/3}O_2$, $LiNi_{0.8}Co_{0.15}Al_{0.05}O_2$, $LiMPO_4$ (where M is a metal, such as Mn, Fe, Co, and Ni, for example).

EXAMPLES

The lithium ion battery electrodes as well as methods of making and using the same described herein may be better understood when read in conjunction with the following representative examples. The following examples are included for purposes of illustration and not limitation.

Figure 1B:
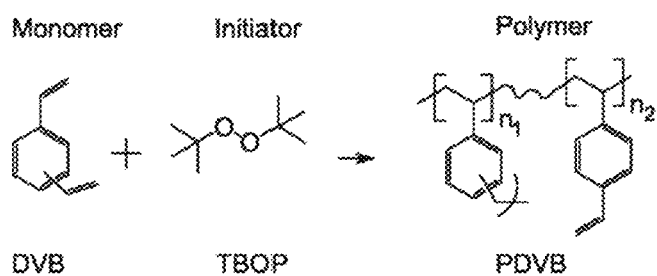
Figure 15:
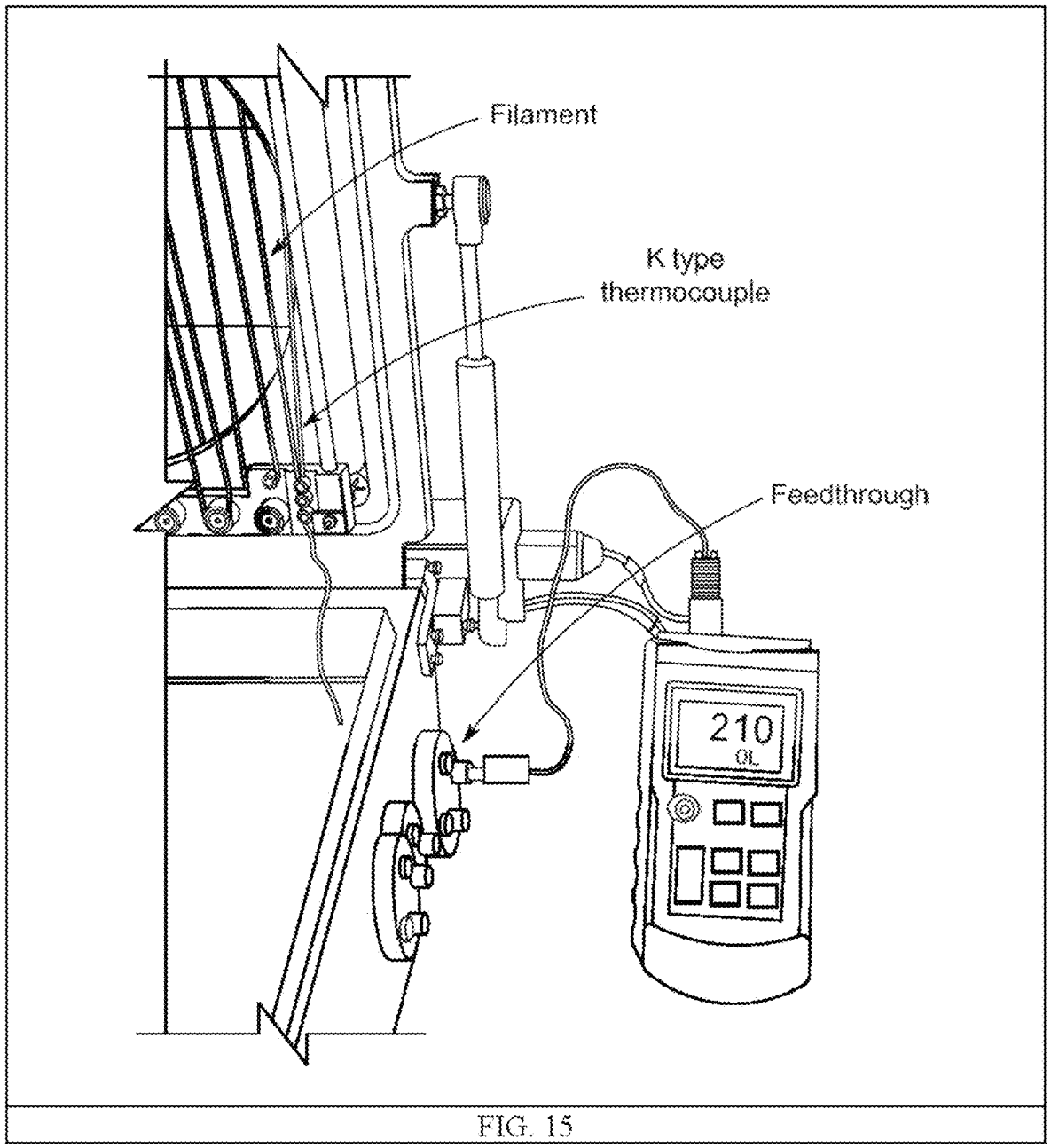
FIG. 15 includes a temperature measurement device for the nichrome filaments, in which a K-type thermocouple contacts one of the filament wires and it is connected to a thermometer through a feedthrough.

Example 1 iCVD Polymerization. The polymerization process according to the present invention may carried out inside an iCVD system. FIG. 1A includes the schematic of the iCVD chamber, in which polymerization may occur. Monomer divinylbenzene (DVB) and initiator tert-butyl peroxide (TBPO) were purchased from Sigma-Aldrich and used without further purification. The chemical structures of DVB and TBPO are shown in FIG. 1B. Details about the iCVD polymerization of PDVB have been and the deposition conditions are summarized in Table 4. Briefly, the monomer DVB was heated in a stainless-steel jar at 65° C. and its vapors along with vapors of TBPO (at room temperature) were delivered into the reactor at flow rates of 2.7 sccm and 2.6 sccm, respectively. Argon gas at 9.2 sccm was additionally used to control the film deposition rate. The labile peroxide bond of the initiator was thermally cleaved by resistively heated nichrome filaments inside the CVD reactor to produce free radicals that attack vinyl bonds on DVB and initiate free-radical polymerization. iCVD is a substrate-independent process as the substrate temperature remains close to room temperature. Here, the reactor pressure, substrate temperature, and filament temperature were maintained at 0.7 Torr, 27.3° C., 197.6° C., respectively. A thermocouple was used to calibrate the temperature of the filament, as shown in FIG. 15.

Figure 16:
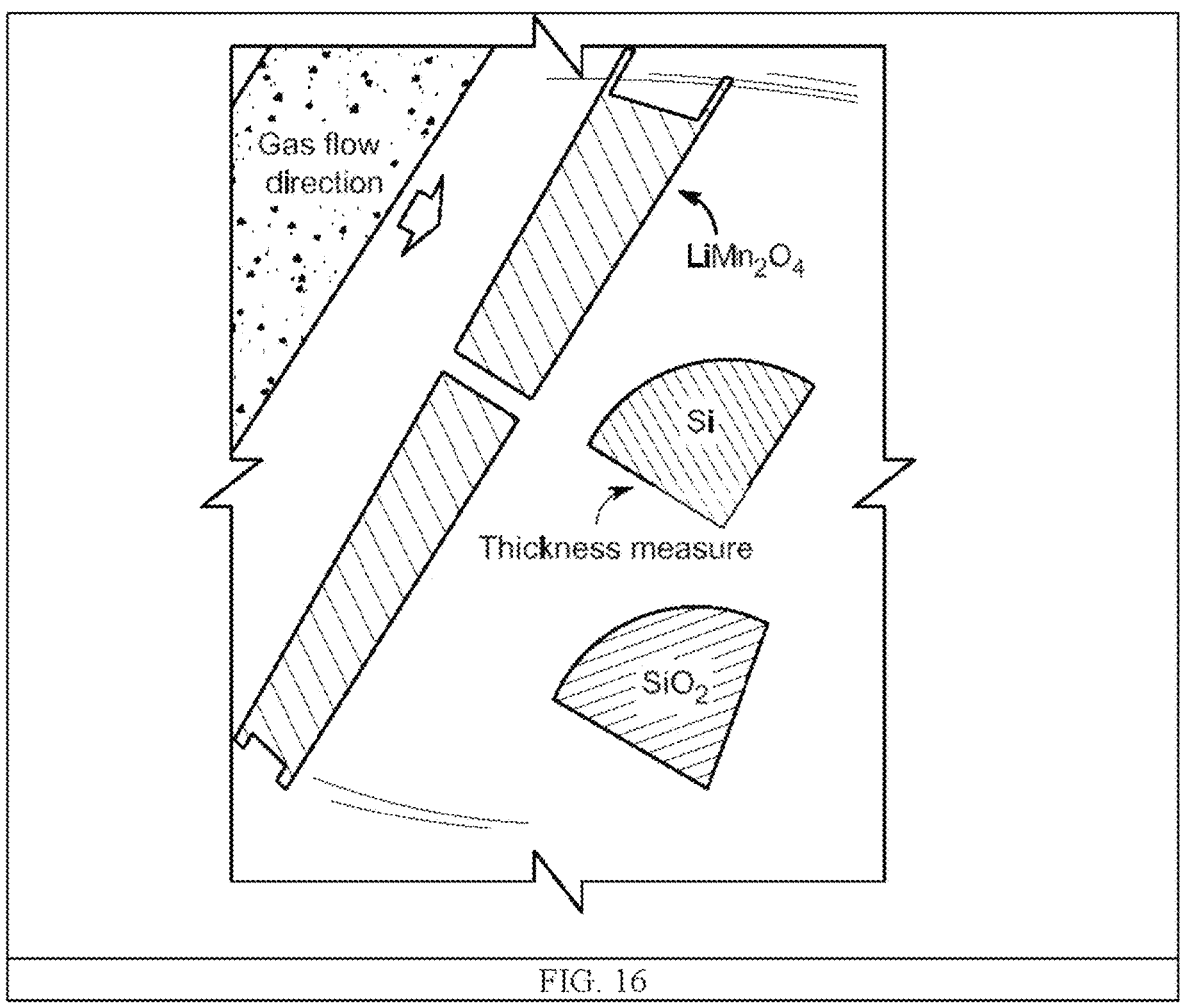
FIG. 16 includes an iCVD polymerization process in which a $LiMn_2O_4$ electrode, silicon wafer, thin glass, and lacey carbon with $LiMn_2O_4$ particles are positioned inside a chamber, a laser having a wavelength of 632.8 nm) is projected onto the silicon wafer (control) to monitor the thickness of thin film during the deposition. The silicon wafer may also used for thickness measurement using elliposometer.
Figure 17:
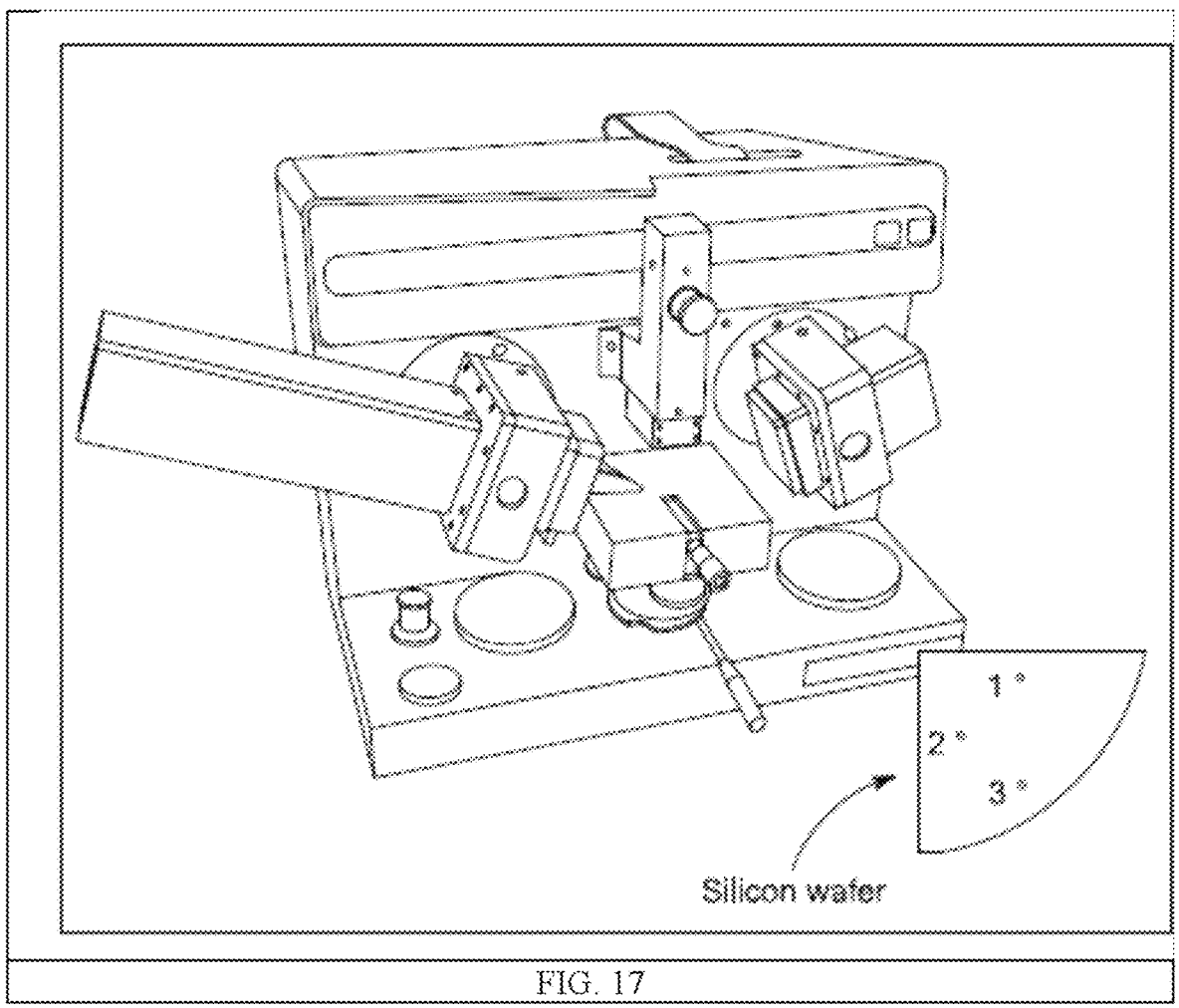
FIG. 17 shows an ellipsometer for nanoscale thickness measurements, in which a beam of He—Ne laser is circularly polarized by a compensator and then incident on to the surface of sample at 70° C. The relative phase and amplitude change of s and p polarized light may be analyzed to calculate the film thickness and refractive index. This device is capable of measuring film thickness varying from several tens of nm to 10 micrometers accurate to 1 nm. The inserted picture in the right bottom zone shows the points where thickness measurements were made on the silicon wafer.

FIG. 16 includes the experimental setup. PDVB films were deposited on silicon wafer (WaferPro, LLC) and $LiMn_2O_4$ electrodes. The thickness of the coating was monitored during the deposition using laser interferometry, and further verified using an ellipsometer purchased from Rudolph Technologies, Inc, as shown in FIG. 17.

Coin Cell Fabrication. $LiMn_2O_4$ electrodes, Celgard separators, electrolytes, and lithium foils were purchased from MTI cooperation. The electrolyte used was ethylene carbonate (EC)/dimethyl carbonate (DMC) (1:1 v/v) containing 1 M $LiPF_6$. CR2016 type coin cells were made using PDVB coated $LiMn_2O_4$ electrode as the cathode and lithium foil as the anode. For comparison, cells with pristine $LiMn_2O_4$ electrode were also made. The former is referred to Cell-C (coated), while the latter is referred to Cell-P (pristine) herein.

Electrochemical Characterization. Cells were cycled 3 times at 0.1 C at room temperature (25° C.) to form a stable SEI on the surface of the anode electrode. Then, reference performance test (RPT) was conducted at room temperature to calibrate the performance of new cells. The RPT included a rate test and an electrochemical impedance spectroscopy (EIS) test. In the rate test, cells were subsequently cycled at 0.1 C, 0.5 C, 1 C, and 2 C for 3 times. In the EIS test, impedance spectra were potentiostatically measured by applying an AC voltage of 10 mV amplitude over the frequency range 1-100 MHz. The EIS tests were conducted at fully discharged state for cells. After that, cells were cycled by 0.5 C at both room temperature and high temperature (60° C.). These tests were terminated when the cell capacity degraded to 50% or a cycle number of 100 was attained. Finally, RPT was conducted again to calibrate the performance of the aged cells.

The cycling and EIS tests were carried out with an Arbin tester (Arbin Instruments) and a Biologic VMP3 (Bio-Logic Science Instruments) respectively. Zsimpwin software was utilized to simulate the EIS data. The cycling tests were carried out by constant current charge-constant current discharge protocol, and in the voltage range of 3.5-4.3 V.

Characterization of iCVD Polymer Coatings. To obtain the coating thickness, three points on the silicon wafer were measured using ellipsometry, as shown in FIG. 17. The results are listed in Table 6. The refractive index of the PDVB thin film was 1.61±0.1. The thickness was 28.7±0.1 nm for all the three measured points. In other words, the coating on the silicon control wafer was uniform. The PDVB average coating thickness on the $LiMn_2O_4$ electrode was 28 nm.

Figure 2A:
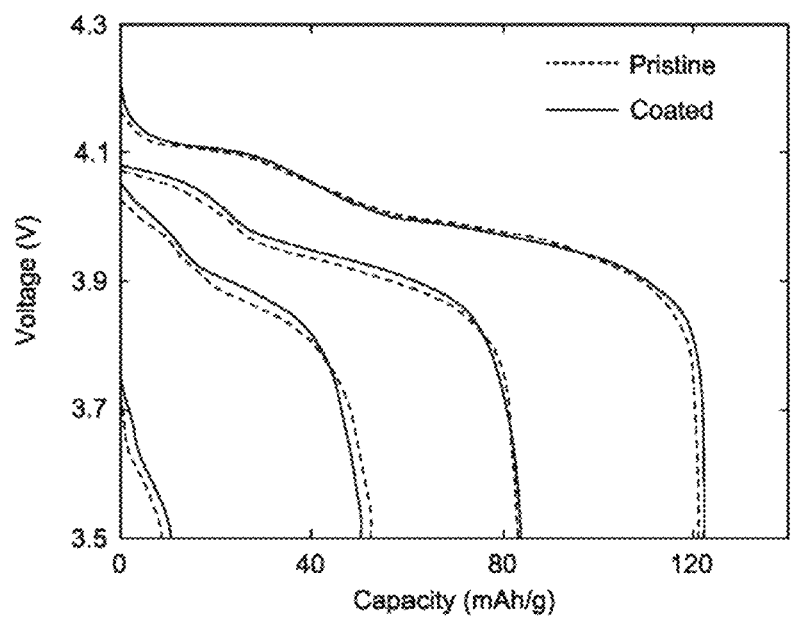
FIGS. 2A-D includes: test results of the Cell-P (pristine) and Cell-C (coated) cells at room temperature.

Room Temperature Cycling. Referring to FIG. 2A, the PDVB coating does not limit the kinetic performance of the $LiMn_2O_4$ electrode. The discharge curves for the two types of cells almost overlay each other at different rates. iCVD grown nanoscale polymer films may conduct $Li^+$ at levels comparable to that of polymeric electrolytes, such as poly (ethylene oxide). Without wishing to the bound to any particular theory, it is believed that this surprising demonstration of ionic conductivity may be attributed to diffusion of these ions through the ultra-thin films. The ultra-thin film may have a thickness of less than 50 nanometers. Similarly, the $Li^+$ ions may move through the thin PDVB coating without encountering significant resistance. The iCVD process according to the present invention may be characterized by better nanoscale thickness control relative to conventional process comprising solution processing.

During the cycling test, side reactions may occur on the $LiMn_2O_4$ electrode surface and consume $Li^+$. Therefore, the discharge capacity may be higher than the following charge capacity, and the amount of side reactions happening on electrode may be obtained from the disparity between them, as represented by the following equation:

$$SR_i = D_i - C_{i+1} \qquad \text{Equation 1}$$

where $D_i$ represents the amount of $Li^+$ that is inserted into $LiMn_2O_4$ electrode during the $i^{th}$ cycle, and $C_{i+1}$ represents the number of $Li^+$ that is removed from $LiMn_2O_4$ in the following cycle.

Figure 2B:
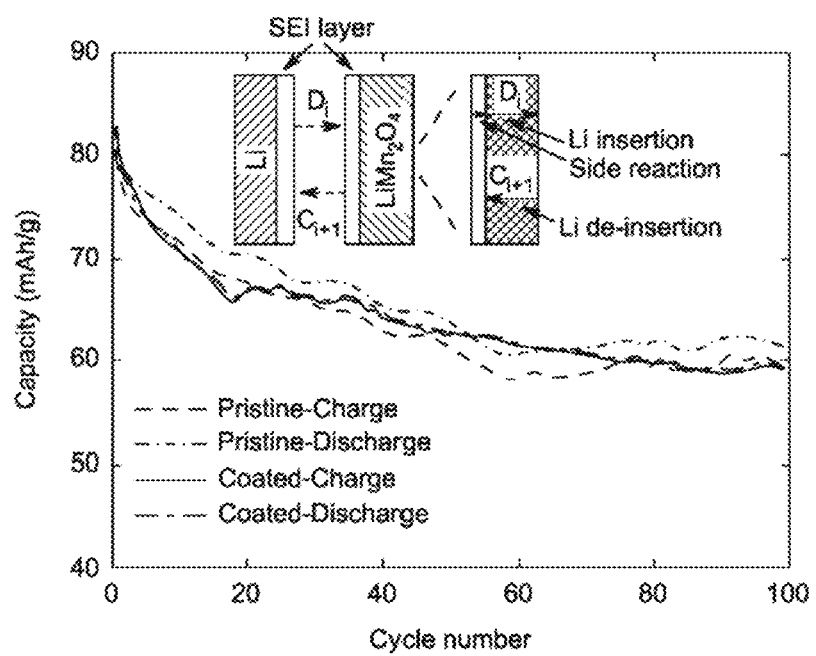
Figure 2C:
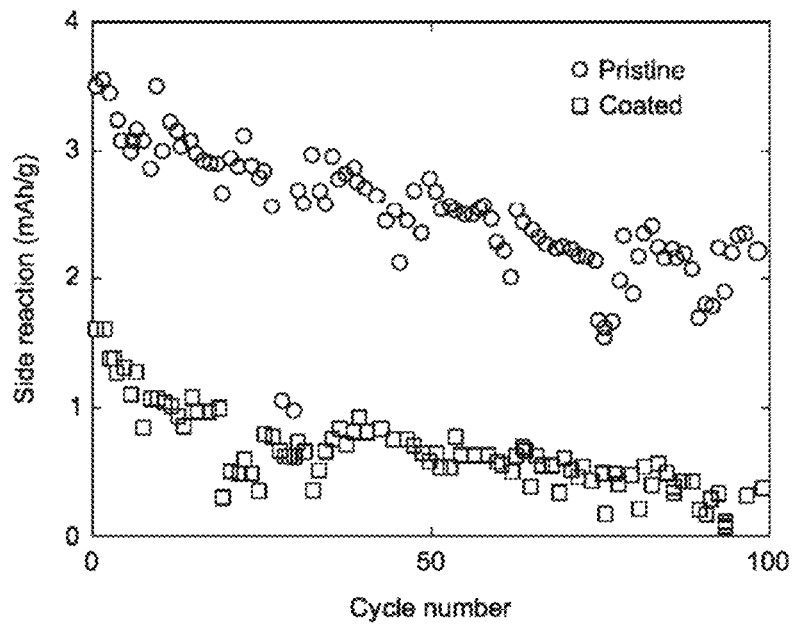
Figure 2D:
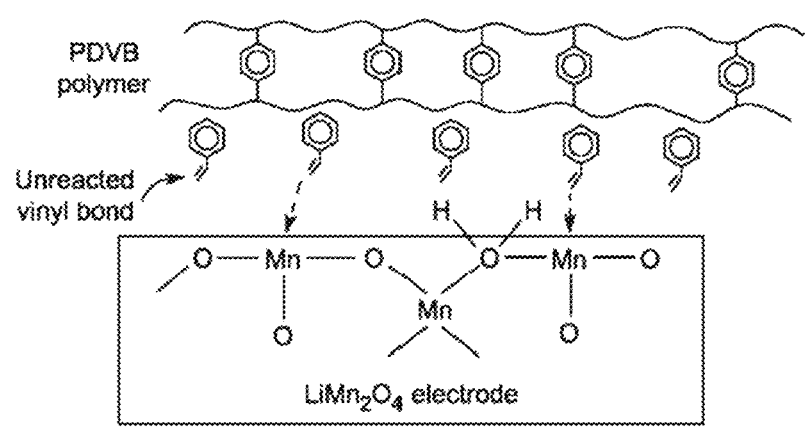

FIG. 2B shows the differences between discharge and charge capacity for the coated cell (Cell-C) is much smaller than that of uncoated cell (Cell-P), although they both show similar capacity degradation. FIG. 2C compares the amount of side reactions for the two types of cells during the test. Capacity of both cells gradually decreased with cycle number. However, the side reactions that occurred on the pristine $LiMn_2O_4$ electrode were more than three times the amount that occurred on the PDVB coated $LiMn_2O_4$ electrode.

High Temperature Cycling. A cause of the $LiMn_2O_4$ degradation, which may be accelerated at high temperature, may relate to the dissolution of $Mn^{2+}$. When 60° C. was applied, the cells suffered both calendar aging and cycling aging. The equivalent cycle number ($N_{eq}$) may be used to measure whether all cells experience the same amount of storage time when they go through the same number of cycling. The $N_{eq}$ may be defined in equation:

$$(N_{eq})_i = \frac{(Ah\text{-throughput})_i}{2 \times Q_{normal}} \qquad \text{Equation 2}$$

where (Ah-throughput) represents the capacity that a cell has gone through at the $i^{th}$ cycle, and $Q_{normal}$ represents the normal capacity of a cell.

Figure 3A:
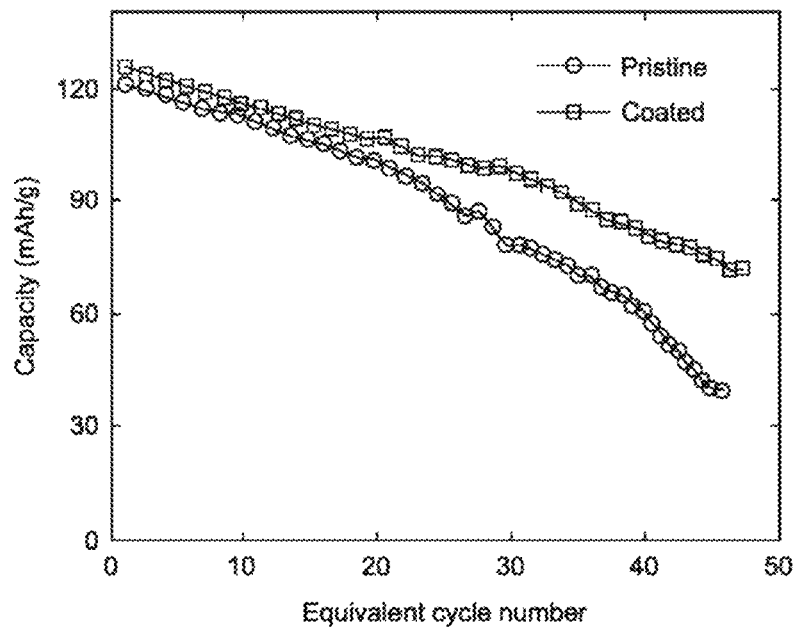
FIGS. 3A-C include test results of the Cell-P (pristine) and Cell-C (coated) cells at high temperature.
Figure 3B:
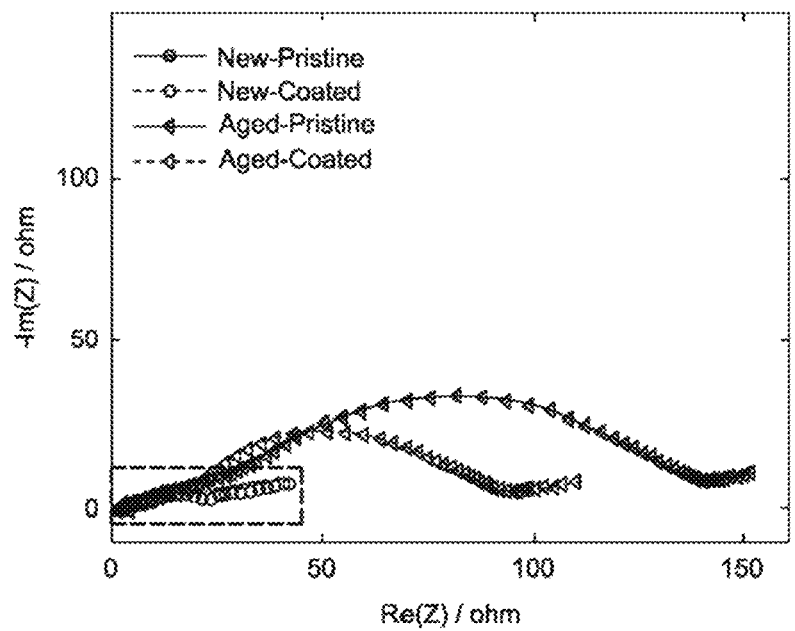
Figure 3C:
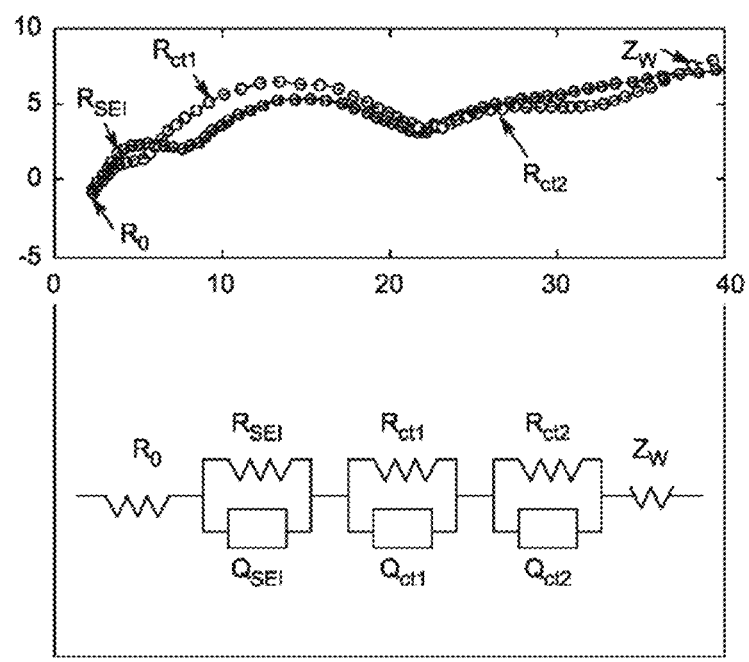
Figure 4A:
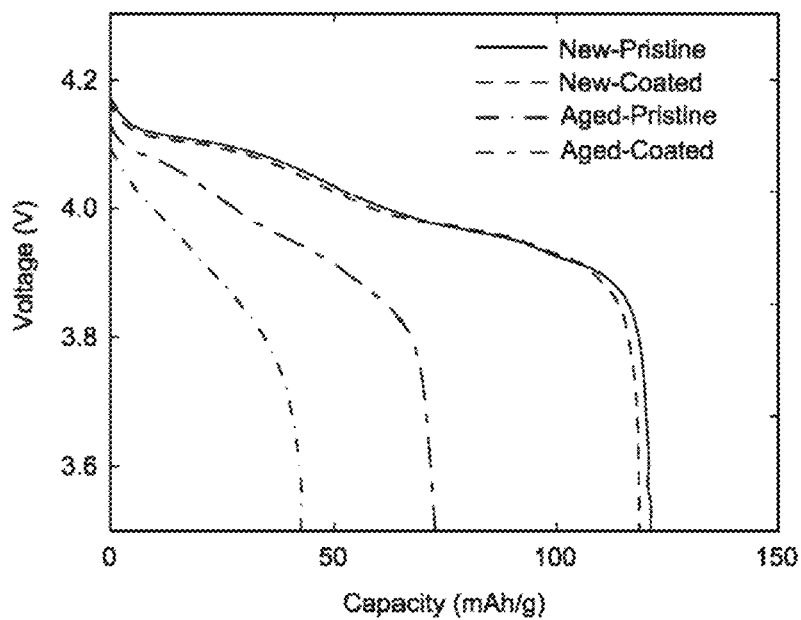
FIGS. 4A and 4B include.
Figure 4B:
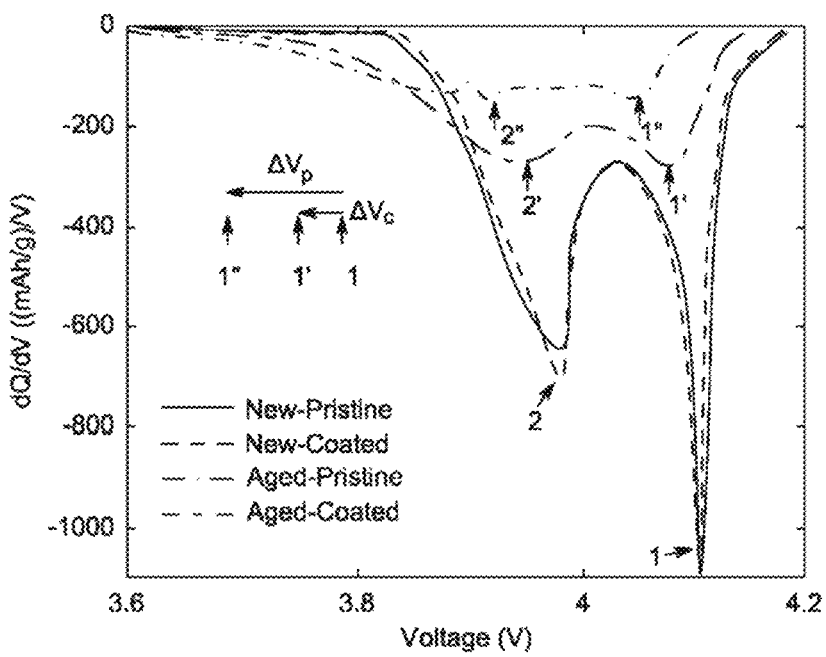

Referring to FIGS. 3A-C, test results of the Cell-P (pristine) and Cell-C (coated) cells at high temperature as shown, in which FIG. 3A shows the variation of cell capacities with respect to equivalent cycling number, FIG. 3B shows EIS results for the two types of cell before and after the cycling test, and FIG. 3C shows the enlarged plot in the selected zone in FIG. 3B, and a third-order equivalent circuit model to simulate the EIS data, where $R_0$ represents ohmic resistance inside a cell, $R_1$ and $Q_1$ represent resistance from SEI component, $R_2$ and $Q_2$ represent the charge transfer resistance on the surface of anode electrode, and $R_3$ and $Q_3$ represent those on surface of cathode electrode, and $Z_w$ represents the Warburg impedance that describes Li$^+$ diffusion inside electrode particles. Referring to FIGS. 4A and 4B, show discharge curves of the Cell-P (pristine) and Cell-C (coated) cells at 0.1 C during high temperature cycling, and the corresponding incremental capacity analysis results, respectively.

The iCVD polymerization process according to the present invention may be useful in the fields of surface coating and interface engineering for battery materials. The iCVD polymerization process may extend the lifespan of intercalation electrode (e.g., cathode or anode) used for lithium or sodium or potassium ion batteries, including cathode materials, such as high voltage and high capacity density cathode materials, for example $LiNi_{1.5}Mn_{0.5}O_2$ and $LiNi_xCo_{1-x}O_2$ (x>0.8).

Example 2

Surface engineering may be a useful process for improving the performance of lithium-ion batteries (LIBs). The present invention is directed to a vapor-based process comprising chemical vapor deposition polymerization to engineer nanoscale polymer thin films having controllable thickness and composition on the surface of battery electrodes. The CVD process may be used to produce a conducting poly(3,4-ethylenedioxythiophene) (PEDOT) polymer and an insulating poly(divinylbenzene) (PDVB) polymer for a $LiMn_2O_4$ electrode in LIBs. The conducting PEDOT coatings may improve both the rate and the cycling performance of $LiMn_2O_4$ electrodes. The insulating PDVB coatings may have little effect on these performances. The PEDOT coating may increase 10 C rate capacity by 83% at 25° C. (from 23 mA h/g to 42 mA h/g) and by 30% at 50° C. (from 64 mA h/g to 83 mA h/g). The PEDOT coating may extend the high-temperature (50° C.) cycling life of $LiMn_2O_4$ by over 60%. The present invention may characterize the capacity degradation exhibited by the different types of cells based on the aging mechanisms of Mn dissolution and solid-electrolyte interphase growth. X-ray photoelectron spectroscopy shows that chemical or coordination bonds form between Mn in $LiMn_2O_4$ and O and S in the PEDOT film. These bonds may stabilize the surface of $LiMn_2O_4$ and thus improve the cycling performance. In contrast, no bonds form between Mn and the elements in the PDVB film. The vapor-based process may be used for other cathodes for advanced LIBs.

Research on rechargeable lithium-ion batteries (LIBs) may be aimed at extending the lifespan, increasing the energy and power density, and/or improving the safety. Compared with anode materials, cathode materials may have significantly lower specific capacities, thus limiting the overall performance of LIBs. Additionally, the poor stability of cathode materials in the presence of electrolytes may be a major contribution to the fast capacity degradation of LIBs during cycling, especially at high cutoff voltages and/or high temperatures.

Modifying the surface of cathode electrodes by coating with an artificial solid-electrolyte interphase (SEI) layer may enhance the overall battery performance. The coating may improve the stability of the electrodes, suppress the dissolution of the transition-metal elements from the cathode electrodes, and/or increase the electronic and ionic conductivity of the electrodes. Many types of coatings may be used, such as, oxides, fluorides, phosphates, and polymers.

The cycling performance of cathode electrodes may be enhanced using organic polymer coatings. However, the polymer coatings made by solution processing may provide poor control over the film composition, thickness, and/or functionality. This may limit the repeatability, reliability, and optimization of the coating processes. Moreover, solution-processing methods may use a large amount of solvent and precursor, and take a long time post-heat treatment to obtain the desired coating, which may increase the complexity of making a battery. Accordingly, other coating processes for organic (e.g., polymeric) surface engineering of LIB electrodes may be desirable.

Chemical vapor deposition (CVD) polymerization is a vapor-phase process that may deposit polymer thin films ranging in thickness from a few nanometers to tens of micrometers. CVD directly converts gas-phase monomers into solid films through the polymerization of reactive bonds (e.g., vinyl or acetylene) present on the monomer, combining the polymerization and coating processes into an efficient single step. The non-line-of-sight arrival of precursors may produce coatings having uniform thickness and composition, as well as a complete "conformal" coverage of planar and complex surfaces, while retaining the underlying morphology of these structures. Polymeric coatings may further provide the flexibility to tune the functionality of the coatings by selecting monomers with the desired functional moieties.

The CVD polymerization process may be used to synthesize a conducting polymer (e.g., poly(3,4-ethylenedioxythiophene) (PEDOT)) and an insulating/dielectric polymer (e.g., poly(divinylbenzene) (PDVB)) thin film on the surface of a $LiMn_2O_4$ electrode. The thin film according to the present invention may be used as artificial SEI layers. Spinel $LiMn_2O_4$ may be characterized as nontoxic and environmentally friendly. $LiMn_2O_4$ may have high output voltages (3.5-4.3 V) and a specific capacity (120 mA h/g). The CVD process may comprise an all-dry, solvent-free, low-temperature process to grow multifunctional polymer films on the electrodes in LIBs. By tailoring the composition of these polymers, CVD may change their functionality (e.g., insulating and conducting), thereby altering the rate and cycling performance of the $LiMn_2O_4$ electrode. Such fundamental insights may not be achieved from conventional solution-based methods, which suffer from poor control over film composition, thickness, and functionality.

Figure 5A:
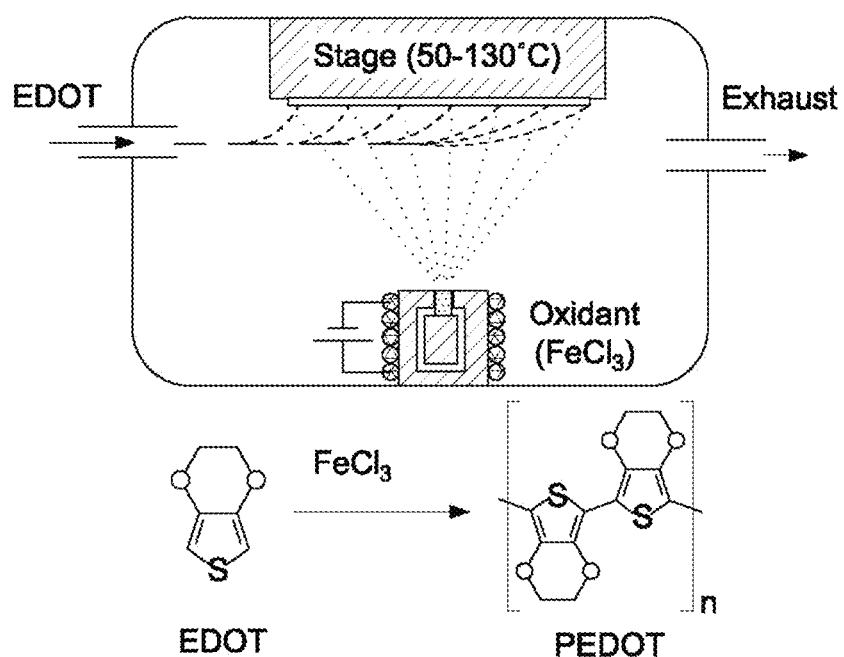
FIGS. 5A and 5B shows schematics and polymerization mechanisms of (FIG. 5A) oCVD and (FIG. 5B) iCVD processes. Precursors are vaporized by heating or reducing the pressure and then introduced into the vacuum chamber where polymerization happens, resulting in a thin film on the surface of the samples (e.g., LIB cathode). The insets show the chemical structures of the various monomers (EDOT and DVB) and the initiator (TBPO) used in this study to synthesize nanoscale polymer films of PEDOT and PDVB.

CVD Polymerization. The present invention is directed to two types of CVD polymerization processes to synthesize polymers, namely oxidative CVD (oCVD) and initiated CVD (iCVD). The oCVD may be applied for growing a conducting PEDOT film and the iCVD may be applied for growing an insulating PDVB film. FIG. 5 shows the schematics of the two types of CVD chambers and the corresponding polymerization mechanisms. The procedure for depositing the oCVD PEDOT films may comprise an oxidant (e.g., $FeCl_3$) sublimed by heating and spontaneously reacting with the heated monomer vapors that flow into the oCVD reactor (see FIG. 5A). Polymerization and thin-film growth may happen simultaneously on the surface of a temperature-controlled substrate placed inside an oCVD reactor. The monomer, EDOT, oxidant, and iron chloride ($FeCl_3$) may be purchased from Sigma-Aldrich and used as received. The monomer jar is heated to 130° C., and the vapor is introduced into the reactor via feed lines. The solid oxidant is placed in a crucible within the reactor and sublimed at 200° C. The chamber pressure is held constant at 50 mTorr, whereas the stage (and thereby the electrode positioned on the stage) is controlled at temperatures ranging from 70-130° C. Argon may be introduced into the reactor as a carrier gas for the reactants. The deposition may be continued until the desired thickness is achieved. The films are rinsed in methanol for 5 minutes to remove any residual monomer and oxidant.

Figure 18:
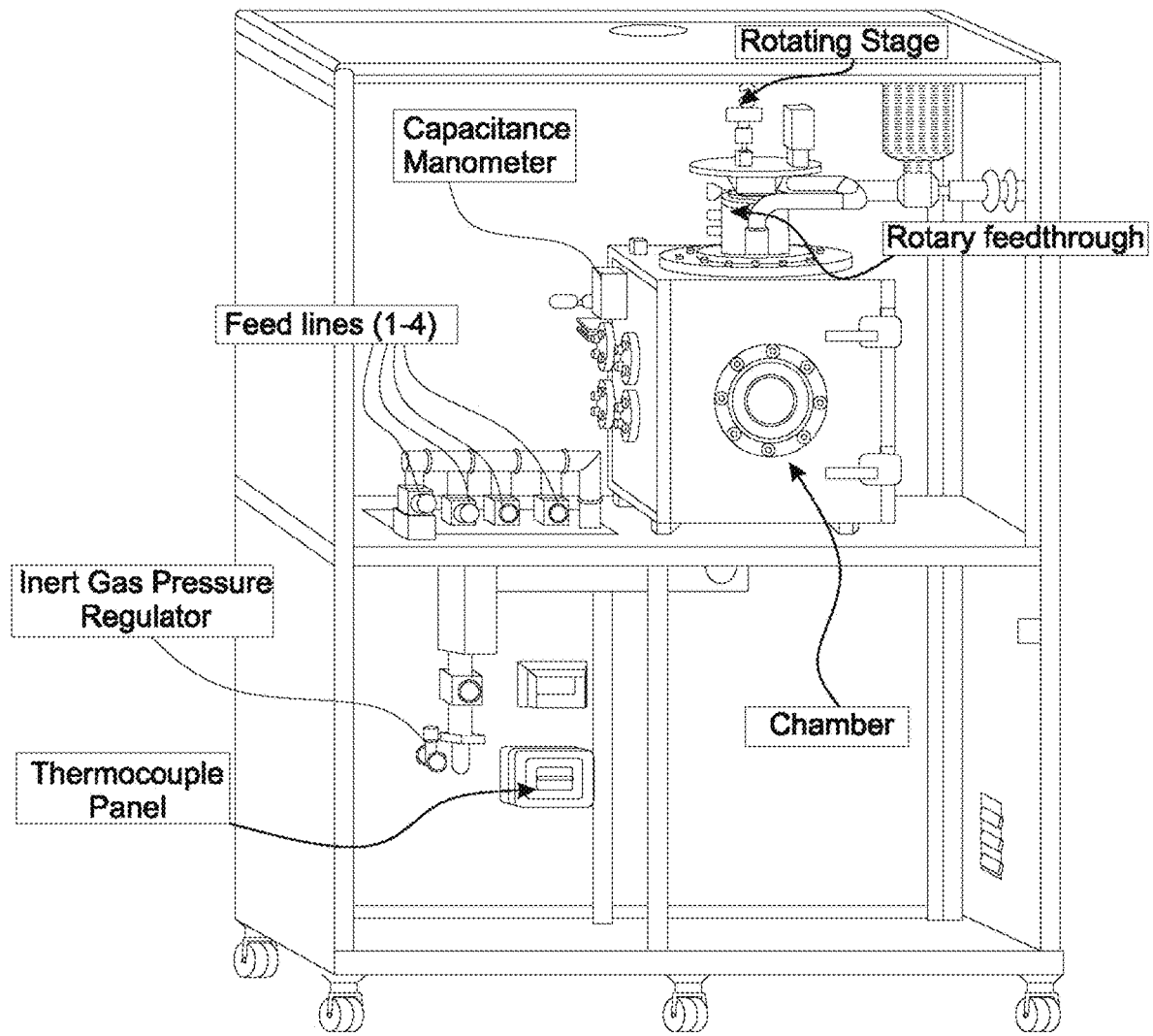
FIG. 18 includes a oCVD reactor system according to the present invention.

Referring to FIG. 18, the oCVD reactor may comprise a vacuum reactor comprising a 316L stainless steel ISO-250 two-piece chamber having feed ports and fittings, a front door having an ISO-100 viewport, and removable stainless steel liners. The reactor may comprise a rotating substrate stage that may be heated/cooled with recirculating heater/chiller. The speed of the rotating stage may be controlled via computer. The rotary feedthrough used with the rotating stage may have cooling water flowing through it to reduce/prevent exposure to high temperature. The reactor may comprise a mass flow controller for the automatic flow control of inert gas. The reactor may comprise a heated mass flow controller to provide automatic flow control for low-volatility precursors. For example, the heated mass flow controller may be calibrated for EDOT, heated to 115° C. The reactor may comprise a pump isolation valve to isolates the chamber from the vacuum pump. The reactor may comprise a throttle valve to provide automatic control of chamber pressure via control loop with a capacitance manometer. The reactor may comprise a foreline trap comprising activated carbon filter elements to trap volatile organics. The reactor may comprise a dry pumping system and a vacuum pump exhaust check valve. The reactor may comprise a capacitance manometer to measure chamber pressure. The reactor may comprise at least one thermocouple to measure the temperature of source jars, feed lines, chamber, evaporators, and filaments (in the case of iCVD). The reactor may comprise a vent valve to vent the chamber with room air through orifice. The reactor may comprise at least one heater to provide automatic temperature control of feed lines, the feed line manifold, the precursor/monomer source jars. The reactor may comprise a recirculating heater/chiller to provide substrate stage temperature control from −25-150° C. The reactor may comprise a chamber heater to heat the chamber using an embedded thermocouple.

Figure 19:
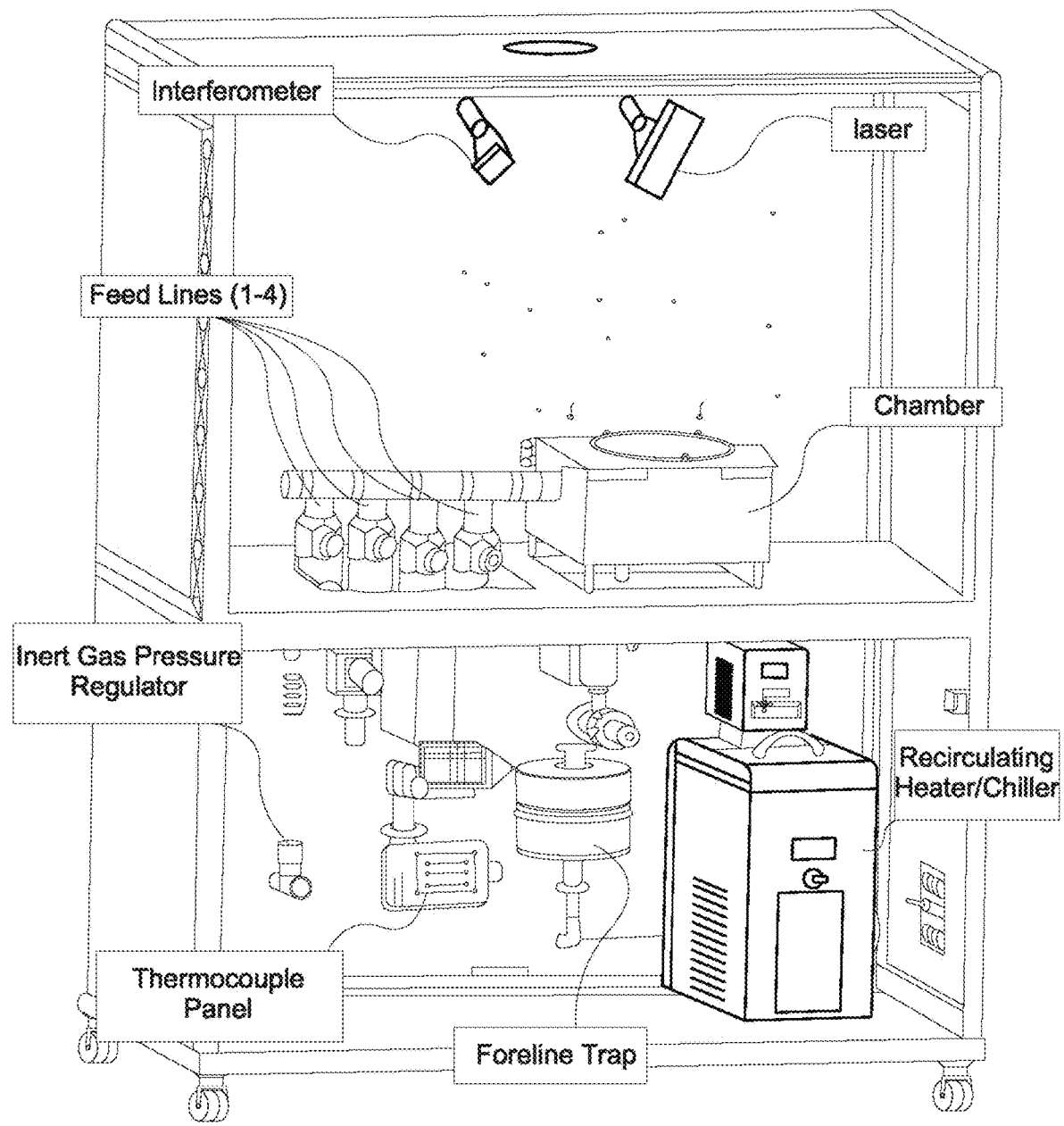
FIG. 19 includes a iCVD reactor system according to the present invention.

Referring to FIG. 19, the iCVD reactor may comprise a vacuum reactor (R-1) comprising a 316L stainless steel chamber, feed ports and fittings, and a substrate stage. The substrate stage may comprise a heated/cooled stage having a recirculating heater/chiller (HE-1). The substrate stage may comprise a hinged lid having borosilicate viewport. The reactor may comprise a mass flow controller (FC-1) for automatic flow control of inert gas. The reactor may comprise a mass flow controller (FC-2) for automatic flow control of initiator. The reactor may be configured for high volatility liquids. The reactor may be calibrated for tert-butyl peroxide. The mass flow controller may have a temperature rating up to 50° C. The reactor may comprise a heated mass flow controller (FC-3) to provide automatic flow control for low-volatility precursors. The reactor may comprise a metering Valve (BSV-8) to provide manual flow control of precursors. The reactor may comprise an isolation valve (BSV-1-6). The reactor may comprise a pump isolation valve (BSV-7) to isolate chamber (R-1) from vacuum pump (VP-1). The reactor may comprise a throttle valve (TV-1) to provides automatic control of chamber pressure via control loop with capacitance manometer (PT-1). The reactor may comprise a foreline Trap (F-1) comprising activated carbon filter elements to trap volatile organics. The reactor may comprise a dry pumping system (VP-1) to provide vacuum for the chamber. The reactor may comprise a vacuum pump exhaust check valve (CKV-1) to limit backflow of air into pump. The reactor may comprise an Inficon CDG100D (PT-1) comprising a capacitance manometer to measure chamber pressure and communicate with TV-1 to automatically control chamber pressure. The reactor may comprise a thermocouple (TC-(1-11) to measure the temperature of source jars, feed lines, chamber base, viewport, substrate state, and filament. The reactor may comprise a thermocouple feedthrough (FT-1) to transmit filament thermocouple (TC-11) and stage thermocouple (TC-10) signal to control panel. The reactor may comprise a chamber vent valve (BSV-6) to vent the chamber with room air through orifice. The reactor may comprise a power feedthrough to transmit power from the DC Power Supply (PSU-1) to filament array. The reactor may comprise a programmable DC power supply (PSU-1) to provide digital power control for filament wire. The reactor may comprise a line heater (H-2,4,6) to provide automatic temperature control of feed lines. The reactor may comprise a manifold heater (H-7) to provide automatic temperature control of feed line manifold. The reactor may comprise a source heater (H-1,3,5) to provide temperature control of source jars. The reactor may comprise a precursor/monomer source jar (S-2,3,4) to provide the precursor evaporation source. The reactor may comprise a recirculating heater/chiller (HE-1) to provide substrate stage temperature control. The stage may have a temperature range from −25-150° C. The reactor may comprise a heater/chiller flow switch (FSL-1) to detect loss of fluid flow to substrate stage. The reactor may comprise a tensioned filament array (FA-1) to provide heat or initiation source for polymerization when strung with filament wire and energized by DC Power Supply. The reactor may comprise a control panel (CP-1) comprising a controller to control the components of the reactor. The reactor may comprise a chamber base heater (H-8) to heat base of chamber to volatilize heavy compounds that condense below substrate stage. The reactor may comprise a viewport heater (H-9) to heat the lid of the chamber before and/or during run. The reactor may comprise a baffle plate (BP-1) to distribute gases and facilitate mixing of precursors to prior to entering deposition area. The reactor may comprise a computer (PC-1) in communication with the control panel to control the reactor and/or components thereof. The reactor may comprise an interferometer (IF-1) to provide real-time thickness measurement by measuring laser power reflected off of witness sample. The reactor may comprise a helium/neon laser (LSR-1) to provide light that reflects off of the witness sample, serving as a source for thickness measurement.

Figure 5B:
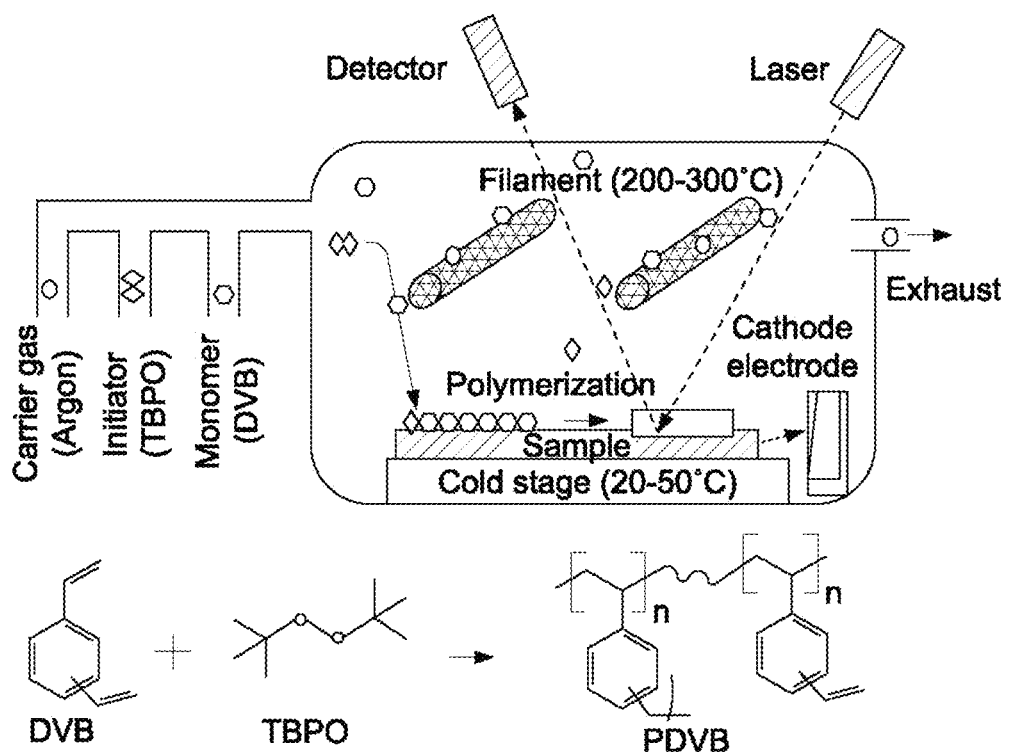

Referring to FIG. 5B, as for the iCVD process, the DVB monomer and the t-butylperoxide (TBPO) initiator may be purchased from Sigma-Aldrich and used without further purification. The iCVD polymerization of PDVB is summarized in Table 4. Briefly, the monomer DVB is heated in a stainless-steel jar at 65° C., and its vapors along with the vapors of TBPO (at room temperature) are delivered into the reactor at flow rates of 2.0 sccm and 1.3 sccm, respectively. Argon gas at 8.5 sccm is additionally used to control the film deposition rate. The labile peroxide bond of the initiator may be thermally cleaved by resistively heated nichrome filaments inside the CVD reactor to produce free radicals that attack vinyl bonds on the DVB and initiate free-radical polymerization. iCVD may be a substrate-independent process as the substrate temperature remains close to room temperature. For example, the reactor pressure, substrate temperature, and filament temperature are maintained at 0.5 Torr, 25, and 230° C., respectively. A thermocouple is used to calibrate the temperature of the filament, as shown in FIG. 15, and the calibration results are listed in Table 5.

Material Characterization. The synthesized polymers may be characterized by at least one of the following: scanning electron microscopy (SEM), energy-dispersive X-ray spectroscopy (EDS), transmission electron microscopy (TEM), Fourier transform infrared (FTIR) spectroscopy, Raman spectroscopy, and X-ray photoelectron spectroscopy (XPS). SEM and EDS are conducted on Philips XL-30 FEG using a 5.0 kV accelerating voltage, and the spot size is 5.0 nm (diameter). Silicon trenches having and lacking a polymer coating may be imaged to demonstrate conformality. The trench is 6-7 μm deep and 1-2 μm wide with an 8 μm spacing between the trenches. A 2 nm thick platinum is coated on the surface of the samples to reduce the surface charging during SEM imaging. TEM is carried out on a JEOL 2000EX electron microscope operating at 200 kV in a bright field.

FTIR measurements are conducted using a PerkinElmer Frontier spectrometer equipped with an attenuated total reflection attachment and a germanium crystal. Baseline-corrected spectra are collected over 700-4000 $cm^{-1}$ at a 1 $cm^{-1}$ resolution and averaged over four scans. Spectra are processed using the Spectrum software package (PerkinElmer). In comparison, the FTIR spectra of the DVB monomer may be also measured with the same settings. Raman spectroscopies of a $LiMn_2O_4$ electrode, a PEDOT film, and a PEDOT-coated $LiMn_2O_4$ electrode are measured using the NT-MDT Spectra AFM/Raman system equipped with a visible Raman microscope and a CCD detector. The excitation wavelength is 532 nm, and the spectra were obtained over 60 s at a 1.0 $cm^{-1}$ resolution.

XPS measurements are carried out using monochromatized Al Kα radiation (1486.7 eV) as the X-ray source with a base pressure of $10^{-8}$ Pa. The spot diameter is 600 μm during all the measurements. XPS is performed with a pass energy of 50.0 eV, and high-resolution scans with a step size of 0.1 eV are collected after a survey scan with a step size of 1.0 eV, for carbon 1s, oxygen 1s, sulfur 2p, and manganese 2p. All the binding energies are calibrated from the C 1s hydrocarbon peak (284.8 eV). The obtained XPS spectra are analyzed by AVENTAGE software with the following parameters: full width at half-maximum (eV)=0.5:3.5 and Lorentzian/Gaussian=30%.

Electrode Preparation and Coin Cell Assembly. CR2016-type coin cells with lithium metal as the anode may be used to study the effect of polymer coating on the performance of the $LiMn_2O_4$ cathode electrode. Celgard separators, electrolytes, and lithium foils may be purchased from MTI Corporation. The electrolyte is ethylene carbonate/diethyl carbonate (1:1 v/v) comprising 1 M $LiPF_6$. The entire assembly process may be carried out in a glovebox with an $O_2$ and $H_2O$ level maintained below 0.5 ppm. To make $LiMn_2O_4$ cathode electrodes, an electrode slurry is made of a 70:20:10 wt. % mixture of $LiMn_2O_4$, carbon black, and polyvinylidene fluoride in N-methyl pyrrolidone. The slurry is then spread on an aluminum foil, which is used as the current collector. This foil is vacuum-dried at 110° C. overnight. These foils are placed in the CVD reactor to obtain surface-engineered $LiMn_2O_4$ electrodes. Cathode disks of 14 mm diameter having and lacking a polymer coating are punched and collected in glass bottles, with a typical mass loading of 2-3 mg. The PDVB-coated electrode disks are utilized directly, whereas the PEDOT-coated disks are rinsed by immersing them in methanol for 5 minutes to remove residual monomers and oxidants. These disks are vacuum-dried overnight at 110° C. again to get rid of trace water in the electrodes. Then, the mass of each disk is measured before being transferred to an argon-filled glovebox for coin-cell fabrication.

Electrochemical Characterization. The electrochemical performances of the cells are tested using a Biologic VMP3 (Bio-Logic Science Instruments) and LAND battery cyclers (LAND Electronics Co., Ltd.). The cells are first cycled three times at 0.1 C at room temperature (25° C.) before conducting other tests. The voltage range is 3.5-4.3 V, and the protocol is a constant-current (CC) charge and a CC discharge. These settings are kept the same unless otherwise stated. The rate capabilities of the cells are then tested via C/3 charging followed by different discharging rates, including C/10, C/3, 1 C, 2 C, 5 C, and 10 C. To study the effect of temperature on the conductivity of PEDOT thin films, the rate capacity of coin cells comprising PEDOT-coated $LiMn_2O_4$ electrodes is tested at 0° C. and 50° C. in a TestEquity model 106 temperature chamber (TestEquity LLC). Then, electrochemical impedance spectroscopy (EIS) is performed at room temperature for all the cells. The cells are charged to 4.1 V before measuring the EIS using a CC-constant-voltage charging with C/100 as the cutoff current. EIS is potentiostatically measured by applying an ac voltage of 10 mV amplitude over the frequency range of 100 kHz to 50 mHz. Finally, the cells are cycled by 1 C at 50° C. 150 times, during which the temperature is controlled by a Lindberg Blue M furnace (Thermo Scientific). The temperature of the coin cells is calibrated using a thermistor from the U.S. Sensor Corp.

Figure 6A:
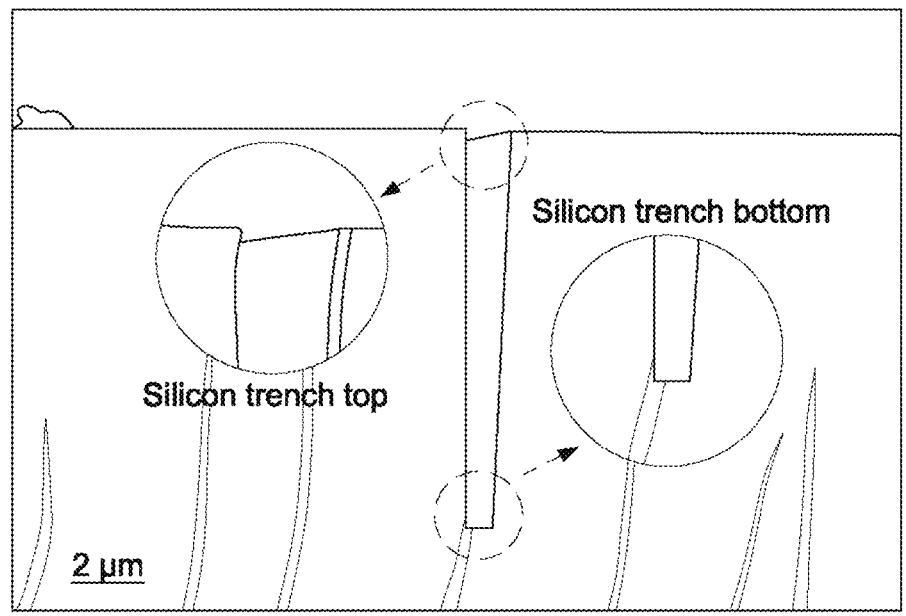
FIGS. 6A-G show polymer thin films uniformly coated on the surface of complex structures. SEM images of an (FIG. 6A) uncoated silicon trench and a (FIG. 6B) 100 nm thick PDVB-coated silicon trench. TEM image of a (FIG. 6C) pristine $LiMn_2O_4$ particle, (FIG. 6D) 10 nm thick PDVB coated on a $LiMn_2O_4$ particle, and (FIG. 6E) 20 nm thick PEDOT coated on a $LiMn_2O_4$ particle.
Figure 6B:
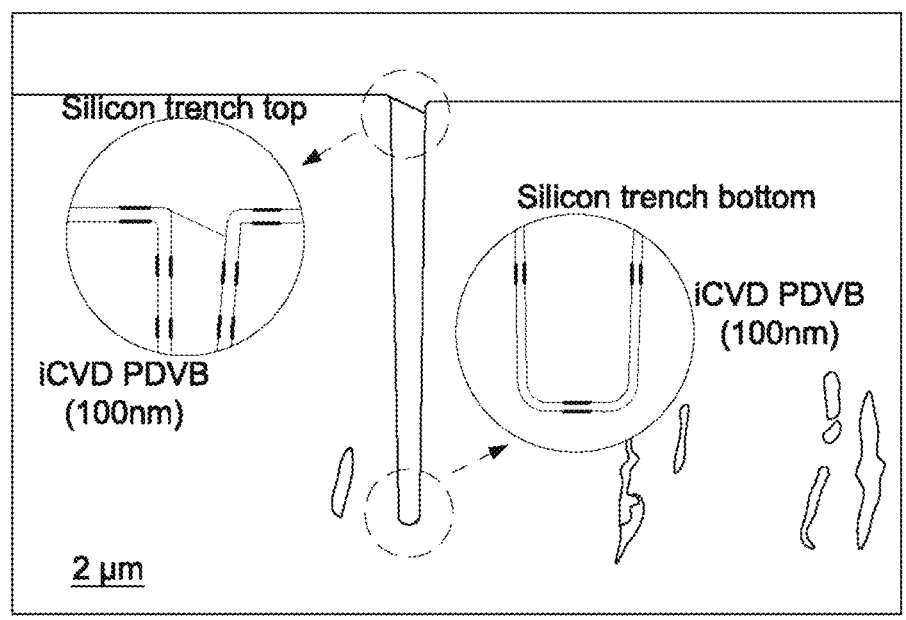
Figure 6C:
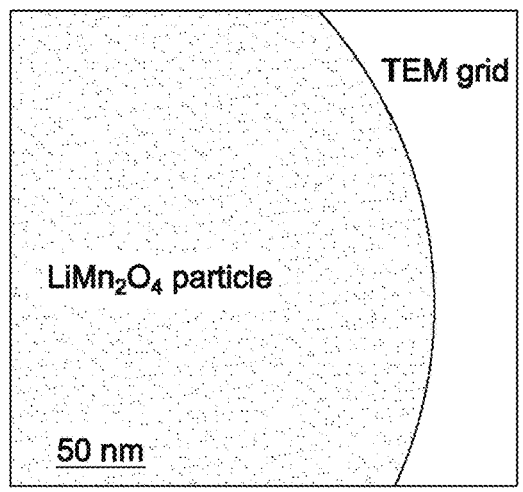
Figure 6D:
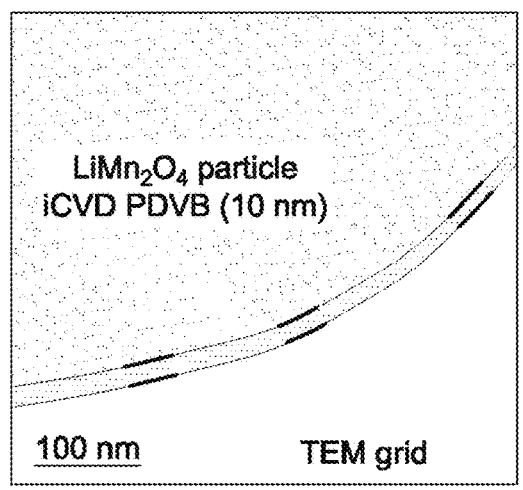
Figure 6E:
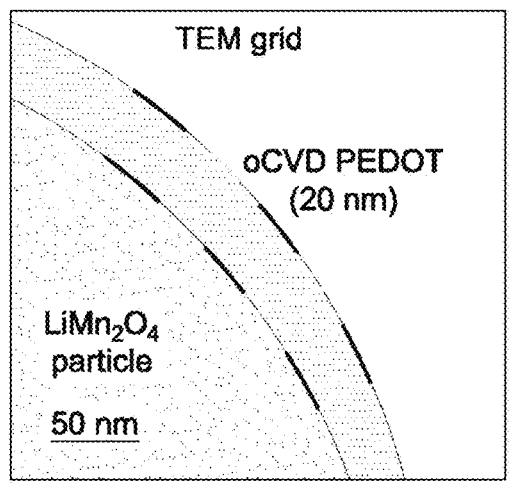
Figure 6F:
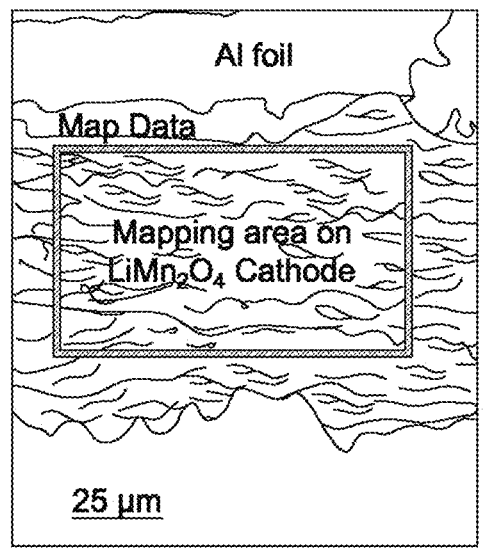
Figure 6G:
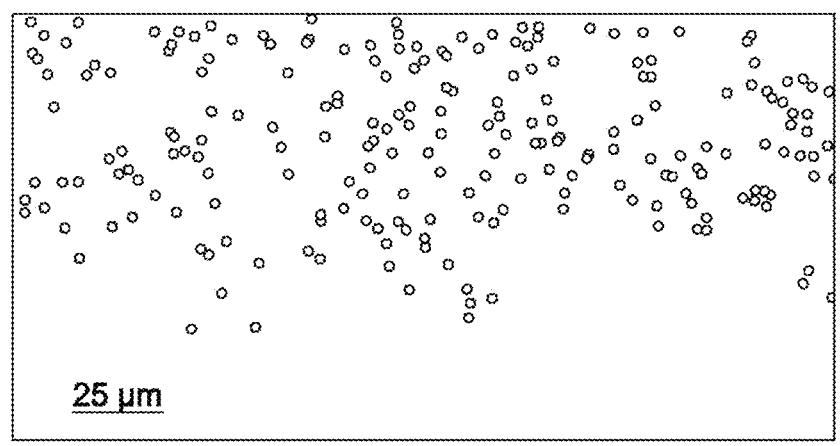

Material Characterizations. CVD polymerization may uniformly deposit polymer thin films onto complex structures ranging in thickness from a few nanometers to tens of micrometers. FIG. 6 shows the microscopic images of polymer thin films coated onto a silicon trench and a $LiMn_2O_4$ particle. FIGS. 6A and 6B compare the SEM images of a silicon trench before and after being coated with a 100 nm PDVB film. The film coating is uniform on the overall surface, including the curved parts, as shown in the enlarged figures of the top and bottom sections. FIGS. 6C-D show the TEM images of a $LiMn_2O_4$ particle before and after being coated with a 10 nm thick PDVB film and a 20 nm thick PEDOT film. Both PDVB and PEDOT films are conformally coated on the $LiMn_2O_4$ particles all over the electrode. FIGS. 6F and 6G shows the cross-sectional image of a $LiMn_2O_4$ electrode and the EDS mapping of the S element within the selected area. As S only exists in the PEDOT thin films, the uniform distribution of S indicates that PEDOT is uniformly coated on the $LiMn_2O_4$ particles all over the electrode. The CVD polymerization process according to the present invention may be used to engineer the surface of a cathode electrode with uniform polymer thin films. The thickness of the coating may be tuned by adjusting the deposition parameters, such as the chamber pressure and/or the coating time. Furthermore, the morphology of the cathode electrode may remain the same before and after the coating to provide enough surface area for the lithium-ion intersection during charging/discharging process. Each of these characteristics may indicate the improvement of the vapor-based deposition process compared with solution processing that lacks sufficient control over coating thickness and conformality.

Figure 7:
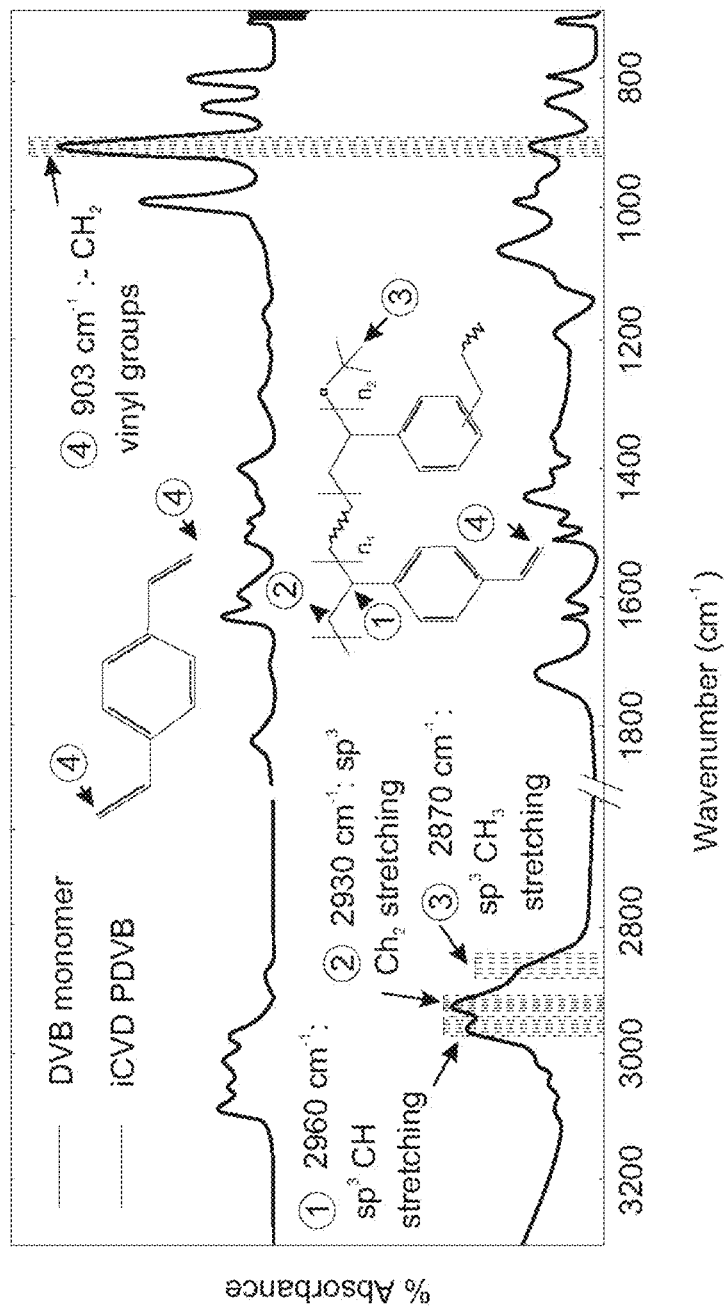
FIG. 7 shows FTIR spectra of the DVB monomer and iCVD PDVB. The characteristic peaks in both the spectra and the corresponding positions in their molecular structures are numbered.

FTIR and Raman spectroscopies and X-ray photoelectron spectroscopy (XPS) may be used to characterize polymerization of PDVB and PEDOT thin films. Successful polymerization of PDVB may be shown by comparing the FTIR spectra of the DVB monomer and the PDVB polymer, as shown in FIG. 7. The peak at 903 $cm^{-1}$ may be a $CH_2$ out-of-plan deformation in the unreacted vinyl groups. The reduction of this peak may indicate the loss of vinyl groups after polymerization. Additionally, strong peaks at 2870 cm$^{-1}$, 2930 cm$^{-1}$, and 2960 cm$^{-1}$ are observed in the PDVB spectrum, allocated to symmetric sp$^3$ CH$_3$, asymmetric sp$^3$ CH$_2$, and asymmetric sp$^3$ CH stretching in the backbone of the newly formed polymer chain. The relationship between each peak in the spectra and its corresponding functional group is shown in FIGS. 7 and 8. The spectra show that the PDVB polymer has been successfully synthesized via the iCVD process.

Figure 8A:
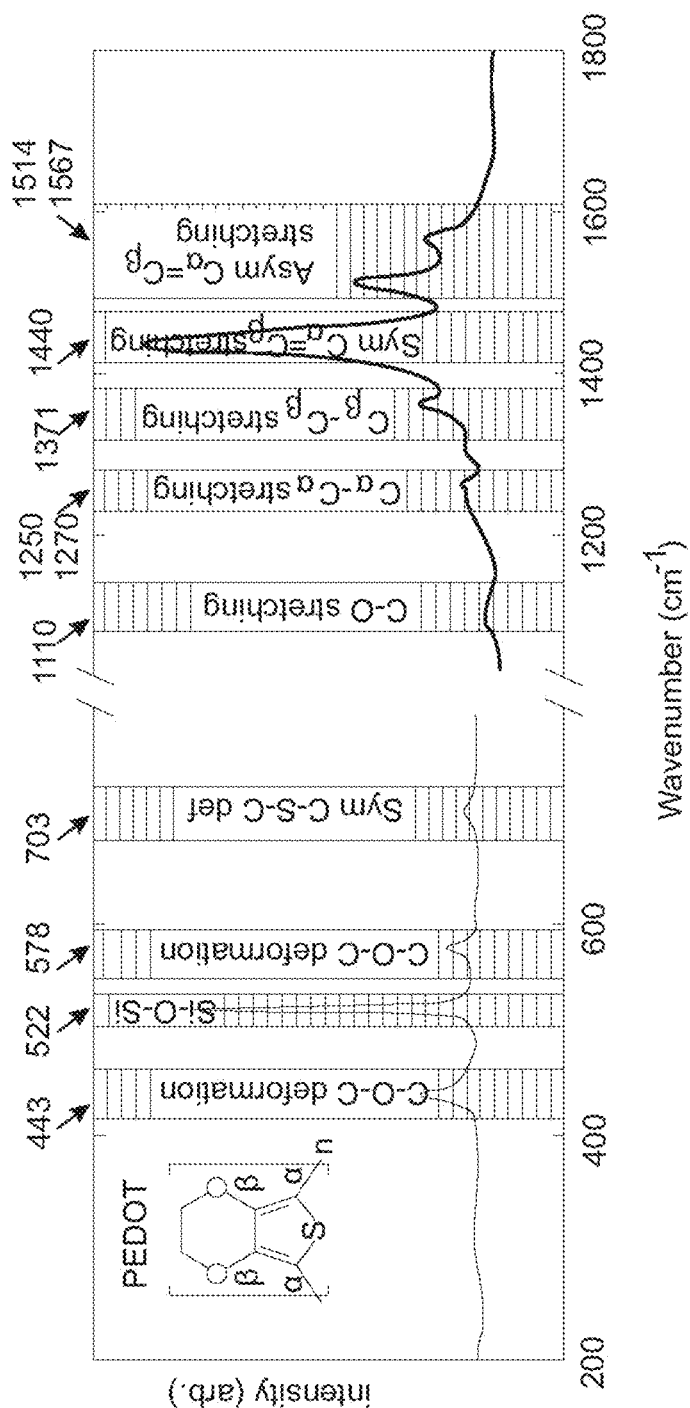
FIGS. 8A and 8B show (FIG. 8A) Raman spectra of a PEDOT thin film; the source of each peak is labeled for clarity, (FIG. 8B) comparison of Raman spectra of a $LiMn_2O_4$ electrode, a PEDOT thin film, and a PEDOT-coated $LiMn_2O_4$ electrode; an optical microscopy image is inserted to show the measurement position for a $LiMn_2O_4$ electrode. The sources of Raman peaks in the PEDOT-coated $LiMn_2O_4$ are indicated by dashed lines.
Figure 8B:
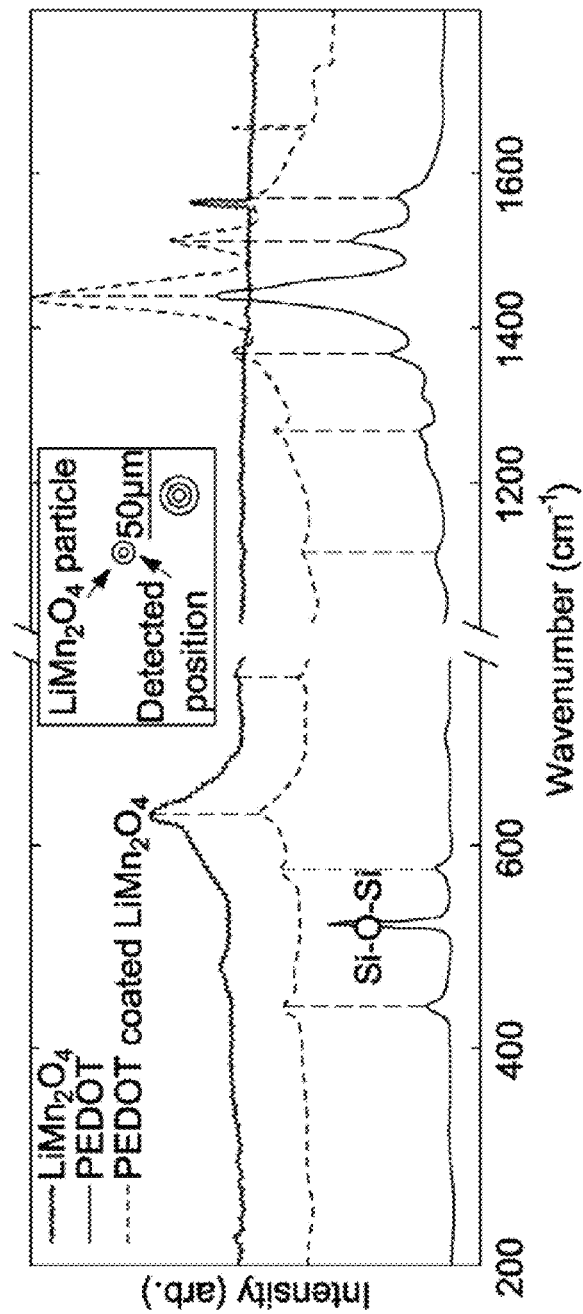

Raman spectroscopy indicates successful PEDOT thin film deposition on the LiMn$_2$O$_4$ electrode. FIG. 8A shows the FTIR spectra of a PEDOT film on a silicon wafer with a thermally grown oxide layer. The molecular structure of PEDOT is shown in the top-left section of the figure. The four main peaks having high wave-numbers may be from C$_\alpha$-C$_\alpha$ inter-ring stretching (1250 cm$^{-1}$ and 1270 cm$^{-1}$), C$_\beta$-C$_\beta$ stretching (1371 cm$^{-1}$), C$_\alpha$-C$_\beta$ symmetrical stretching (1440 cm$^{-1}$), and C$_\alpha$-C$_\beta$ asymmetrical stretching (1514 cm$^{-1}$ and 1567 cm$^{-1}$). FIG. 8B compares the Raman spectra of a PEDOT polymer film (on a Si/SiO$_2$ substrate), a LiMn$_2$O$_4$ electrode, and a PEDOT-coated LiMn$_2$O$_4$ electrode. The inserted figure shows the position of the Raman laser projected onto a LiMn$_2$O$_4$ particle. The result shows that the Raman spectra of a PEDOT-coated LiMn$_2$O$_4$ electrode include peaks from the spectra of both LiMn$_2$O$_4$ and PEDOT, indicating that the PEDOT film is coated on the LiMn$_2$O$_4$ electrode. The peak at 522 cm$^{-1}$ is from Si—O—Si of the SiO$_2$ substrate rather than the PEDOT polymer. The sharp peak at 1640 cm$^{-1}$ in the spectra of the PEDOT-coated LiMn$_2$O$_4$ sample may be from a cosmic ray, which appears randomly during the Raman spectroscopy measurement.

The thickness of the transparent PDVB polymer thin films may be measured by ellipsometry. Profilometry may be used to measure the thickness of the PEDOT thin films (which are not optically transparent). Details of the measurement are shown in FIG. 17 and Table 6. The process parameters that may be selected to achieve the desired polymer coating may include, but not be limited to, the substrate temperature during polymer growth, film thickness, having and lacking postdeposition annealing, and annealing temperature. One or more of these parameters may affect the polymer thin films and thereby affect the electrochemical performance of cathode electrodes.

The electrochemical stability of PDVB films may be studied using a cyclic voltammetry (CV) test. The CV test is conducted within a voltage range of 3.5-4.3 V with the scan rate of 1 mV/s. Compared to the cell using a pristine Al foil as the cathode, a cell with the PDVB-coated Al foil may not show new peaks during the scanning process, indicating that the PDVB film is electrochemically stable within the tested voltage range (3.5-4.3 V). The PEDOT film having a desired electrochemical stability may be applied as an effective coating material for LIB cathodes.

Figure 9A:
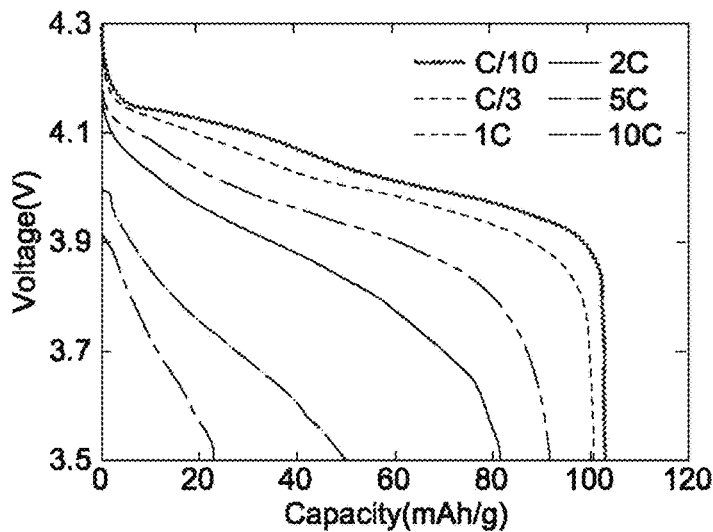
FIG. 9A-E show the effect of polymer coatings on the rate capability of the $LiMn_2O_4$ electrode.
Figure 9B:
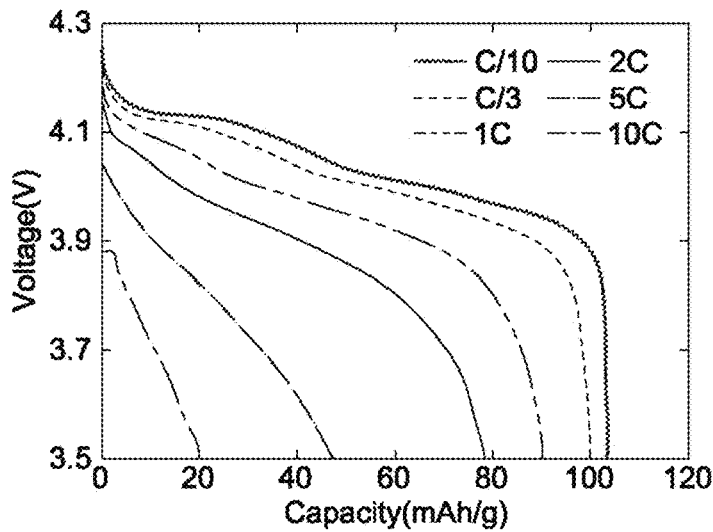
Figure 9C:
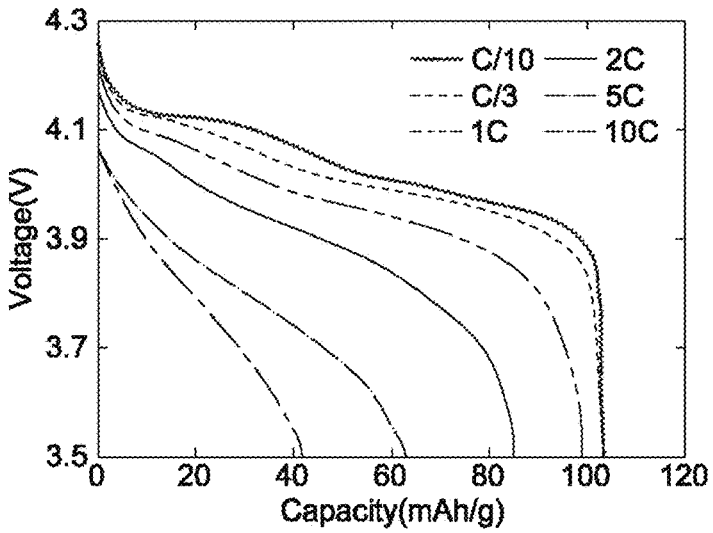

Rate Capability of the LiMn$_2$O$_4$ Electrode. The conducting PEDOT thin film may improve the kinetic performance of the LiMn$_2$O$_4$ electrode, whereas the insulating PDVB thin film may have little effect. FIGS. 9A-C show the discharge curves of the cells using a pristine LiMn$_2$O$_4$, PDVB-coated LiMn$_2$O$_4$, and PEDOT-coated LiMn$_2$O$_4$ electrode as the cathode electrode, respectively. The overall shape of the discharge curve remains similar for all the three types of cells, whereas the voltage drop may be affected by polymer coatings. Compared to the pristine cell, the conducting PEDOT thin film coating reduces the voltage drop, especially at high C-rates, whereas the insulating PDVB coating does not show a significant improvement in the voltage drops. Thus, the PEDOT thin film coating may decrease the overall resistance of the coin cells and thereby increase the discharge capacities at high rates such as 5 C and 10 C.

Figure 9D:
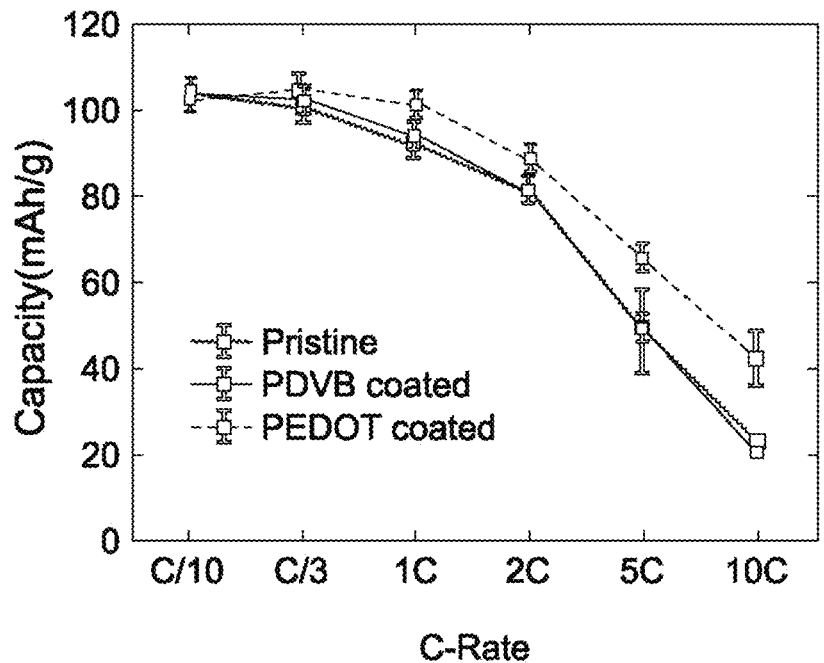
Figure 9E:
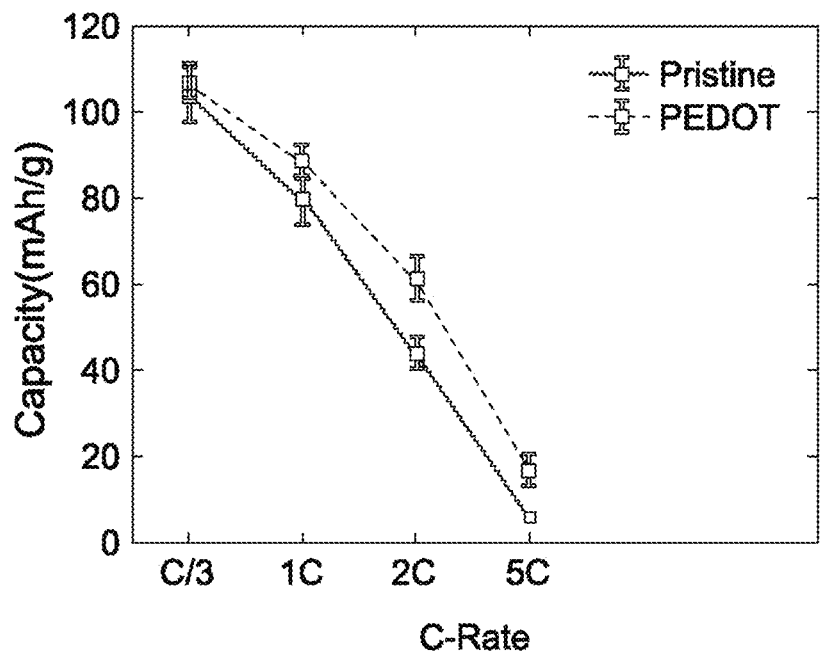
Figure 9F:
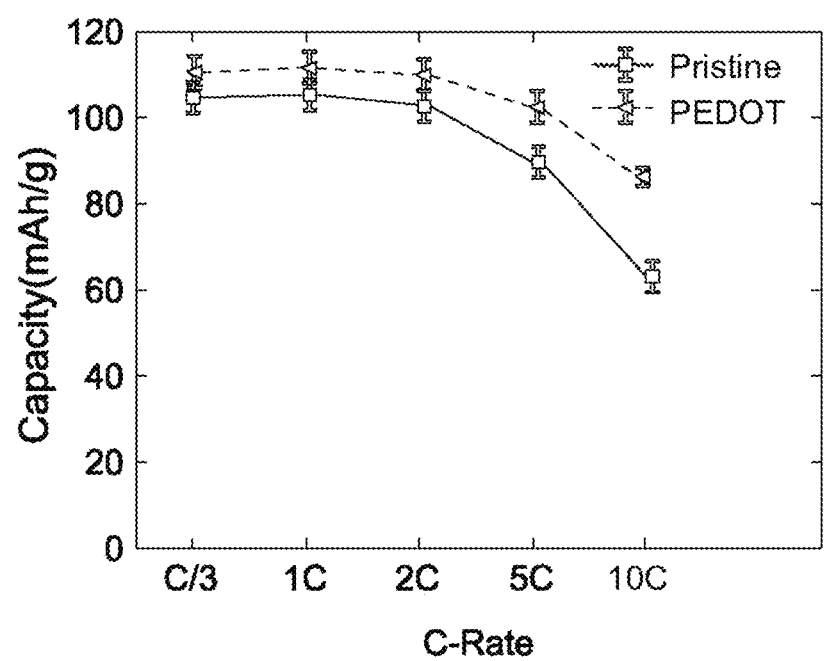

FIGS. 9D-F compare the cell capacities at different C-rates, and each data point is averaged over three samples. Each cell is charged at room temperature at C/3 to provide the same starting point for discharging. Hence, the different discharge capacities may be attributed to the polymer coatings only. At room temperature, the insulating PDVB coating does not improve the rate performance, whereas the conducting PEDOT thin film significantly increases the cell capacity, especially at high C-rates such as 10 C. The cell capacity increases by 35% at 5 C (from 49 mA h/g to 66 mA h/g) and by 83% at 10 C (from 23 mA h/g to 42 mA h/g) by coating the LiMn$_2$O$_4$ electrode with a PEDOT thin film. To consider the effect of temperature on the conductivity of PEDOT thin films, cells having LiMn$_2$O$_4$ electrodes having and lacking a PEDOT coating are tested at a low temperature (0° C.) and a high temperature (50° C.), and the results are shown in FIGS. 9E and 9F. The PEDOT coating improves the rate capability of the LiMn$_2$O$_4$ electrode independent from the testing temperature. The 10 C capacity at 50° C. reaches 83 mA h/g, which is about 80% of the maximum capacity (105 mA h/g) tested at a low C-rate (C/10) and 25° C. The 5 C capacity at 0° C. is about tripled (from 6 mA h/g to 17 mA h/g), although the value is still quite low for battery applications.

Figure 10A:
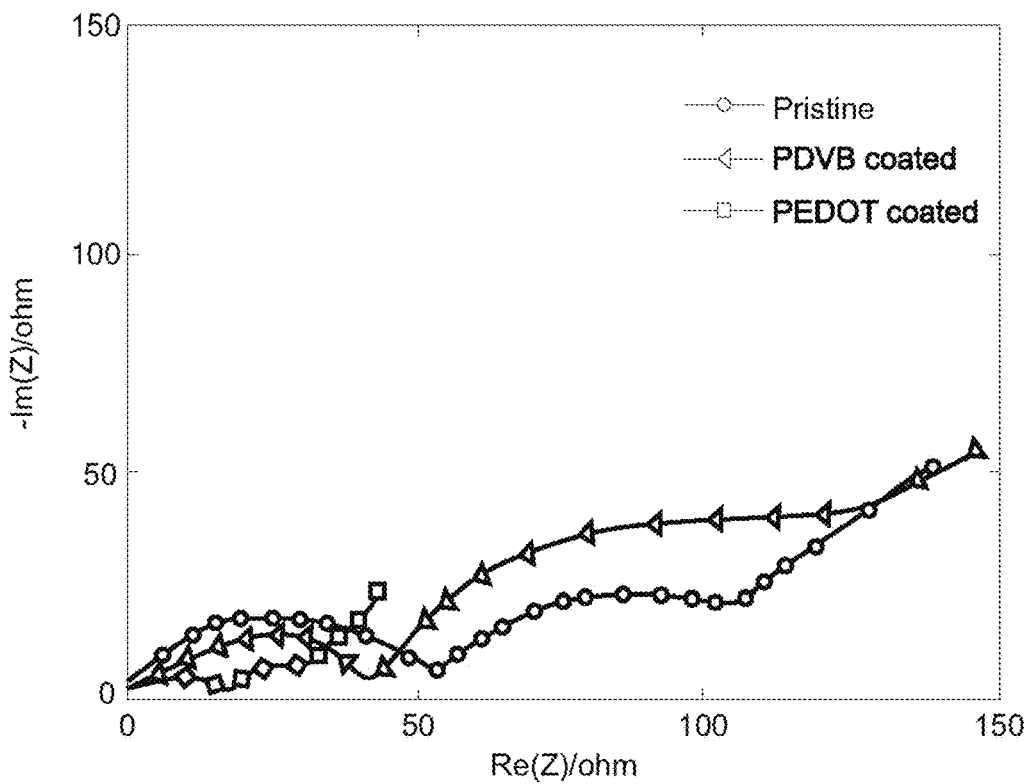
FIGS. 10A and 10B show (FIG. 10A) EIS of three types of cells tested at room temperature with a 4.1 V open-circuit voltage and (FIG. 10B) third-order equivalent circuit model to simulate the EIS data and a schematic that shows different circuit components derived from different partitions on the impedance data.
Figure 10B:
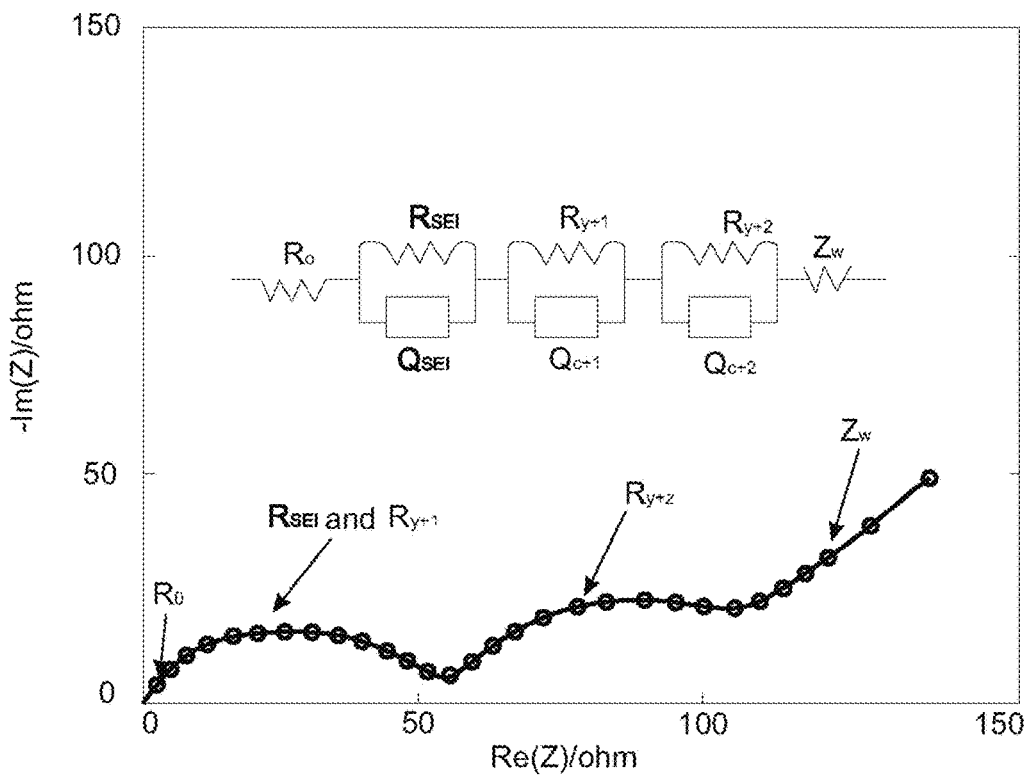

Electrochemical impedances of the three types of cells are measured to characterize the kinetic effects of polymer coatings. FIG. 10A compares the EIS of the three types of cells and shows that the conducting PEDOT polymer coating significantly reduces the overall impedance of the cell, whereas the insulating PDVB coating does not appear to have an effect on the overall impedance. FIG. 10B shows a third-order equivalent circuit model. The semicircle at a higher frequency may relate to the charge-transfer process on the Li anode ($R_{ct1}$), whereas the semicircle at a lower frequency may relate to the charge-transfer process on the LiMn$_2$O$_4$ cathode ($R_{ct2}$).

The charge-transfer resistances at the interfaces of the anode/electrolyte ($R_{ct1}$) and cathode/electrolyte ($R_{ct2}$) may be significantly reduced by the PEDOT coating. PEDOT may be highly conductive and facilitate electron transport from the current collector to the cathode particles, which may lead to the decrease of $R_{ct2}$. The reduction of the $R_{ct1}$ may relate to the cross-talk between the anode and the cathode. Such a cross-talk may change the compositions of SEI formed on the surface of both electrodes and thereby reduce the $R_{ct1}$. In comparison, the PDVB coating has little effect on the overall charge-transfer resistance. It slightly reduces the resistance on the anode ($R_{ct1}$), whereas it increases the resistance on the cathode ($R_{ct2}$). The two effects cancel off, and the overall impedance remains similar as the pristine cell. The increased $R_{ct2}$ may be from the insulating PDVB coating on the cathode that inhibits the charge-transfer process involving Li$^+$, whereas the reduced $R_{ct1}$ may related to the cross-talk behavior between the cathode and the anode.

Cycling Life Extension at a High Temperature. Cells are cycled at 50° C. to characterize the effect of polymer coatings on their cycling life. At such a high temperature, these cells may suffer from both calendar aging and cycling aging. For example, an index referred to as the equivalent cycle number ($N_{eq}$) may be applied to so that each cell experiences the same amount of storage time when it goes through the same number of cycles. The equivalent cycle number ($N_{eq}$) is defined in Equation 2. Applying $N_{eq}$ as the index ensures that the different aging performances among these cells are only from the cycling test.

Figure 11A:
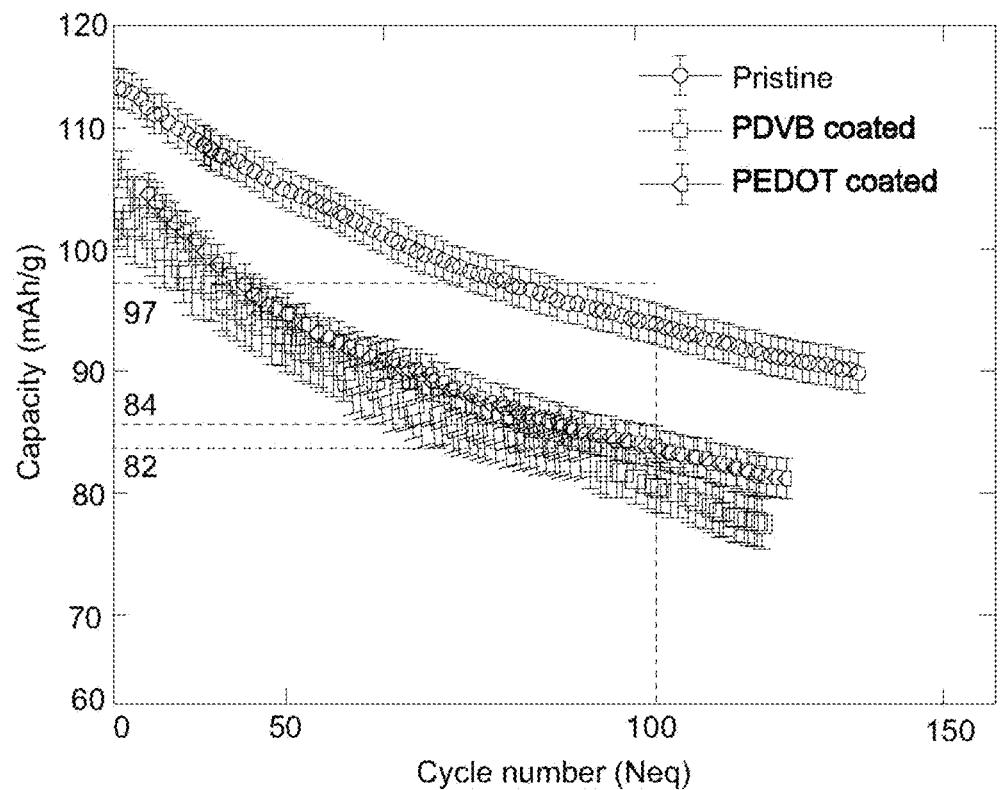
FIGS. 11A and 11B show cell cycling life is extended by the PEDOT coating, whereas it is reduced by the PDVB coating.
Figure 11B:
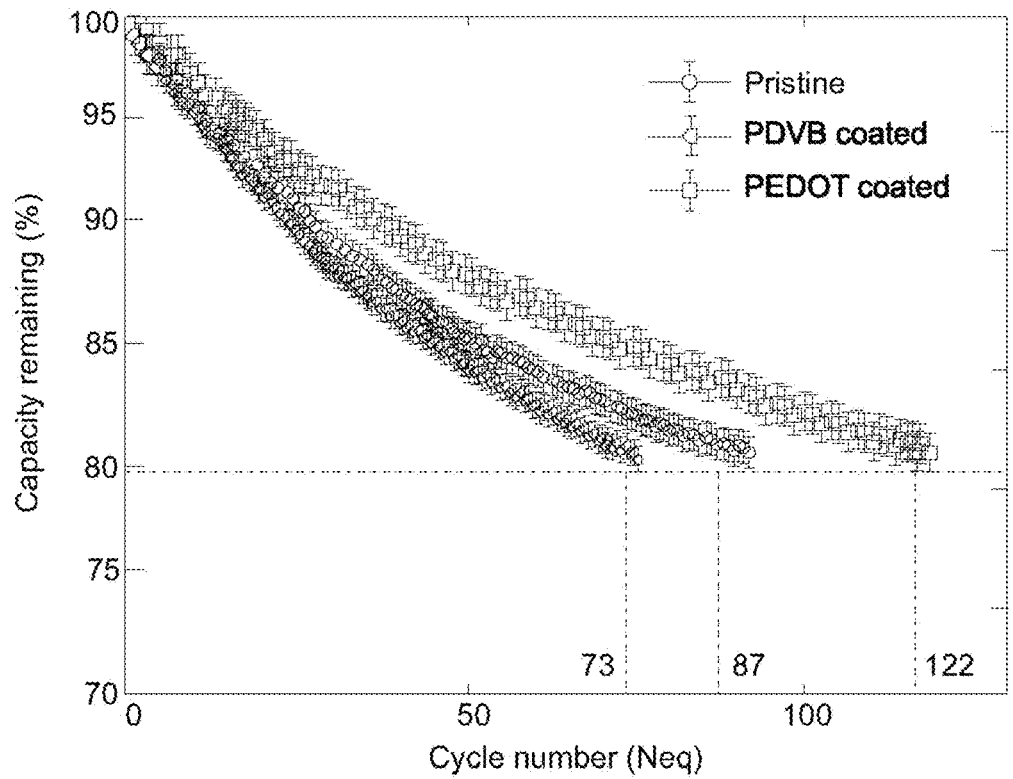

FIG. 11 indicates that the PEDOT coating extends the cells cycling life, whereas the PDVB coating does not show such an improvement. FIG. 11A compares the specific capacities of the three types of cells during the cycling test. The PEDOT coating not only increases the initial specific capacity from 105 mA h/g to 115 mA h/g, but it also slows down the capacity degradation from 0.21 mA h/g to 0.17 mA h/g per cycle on average. In contrast, the PDVB coating does not improve the cycling performance. The cycling life improvement from the PEDOT polymer coating is shown in FIG. 11B, where the capacity remaining is compared among the three types of cells. Generally, the cycling life of a cell may be defined as the number of cycles that it can undergo before its capacity degrades to 80% of its initial capacity. According to this definition, the cycling life of the $LiMn_2O_4$ cell may be extended from 87 cycles to 122 cycles by the PEDOT coating, which is an improvement of over 40%. However, the PDVB thin film coating does not extend the cycling life. In fact, it may reduce the number of cycles to some degree.

Figure 12A:
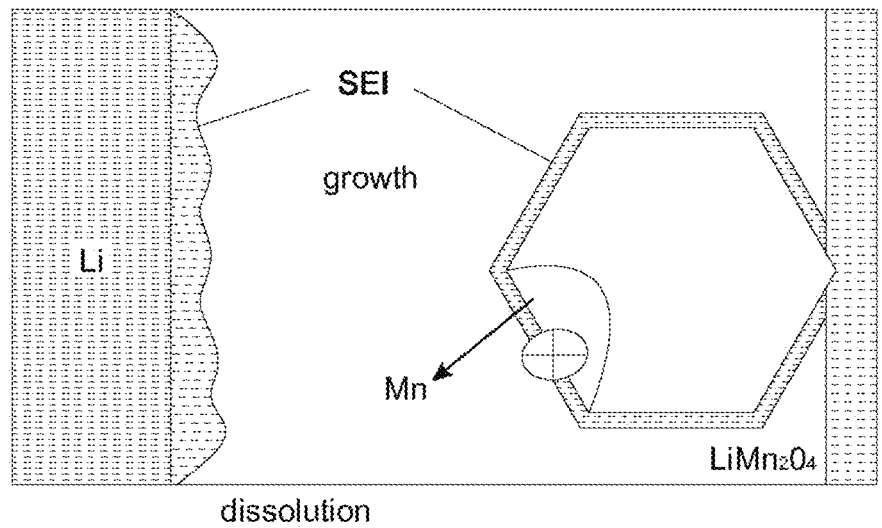
FIGS. 12A and 12B show (FIG. 12A) schematic of the main aging mechanisms in Li/$LiMn_2O_4$ coin cells, including the SEI growth and the Mn dissolution.

Manganese dissolution and SEI growth may be the main aging mechanisms in $Li/LiMn_2O_4$ cells during high-temperature cycling tests, as shown in FIG. 12A. Mn dissolution is caused by a disproportionation reaction with the help of acids (2 $LiMn_2O_4+4H+\rightarrow 2Li^++Mn^{2+}+2H_2O+3\lambda\text{-}MnO_2$). The amount of Mn dissolution may be proportional to the number of cycles during the cycling tests. Hence, the contribution of Mn dissolution to the overall capacity degradation may be described using a linear equation (Equation 3). SEI forms on the surfaces of both the electrodes and increases the cells resistance, which leads to a gradually increased overpotential and reduces the cells' capacity. The SEI growth follows the square root of the number of cycles or the storage time. Thus, the effect of SEI growth on the cell capacity may be described by Equation 4. Considering these two effects, the capacity remaining may be related to the number of cycles by Equation 5.

$$Cap_{loss,Mn}=k_1\times N \qquad \text{Equation 3}$$

$$Cap_{loss,SEI}=k_2\times \sqrt{N} \qquad \text{Equation 4}$$

$$Cap_{remaining}=1-k_1\times N-k_2\times \sqrt{N} \qquad \text{Equation 5}$$

Figure 12B:
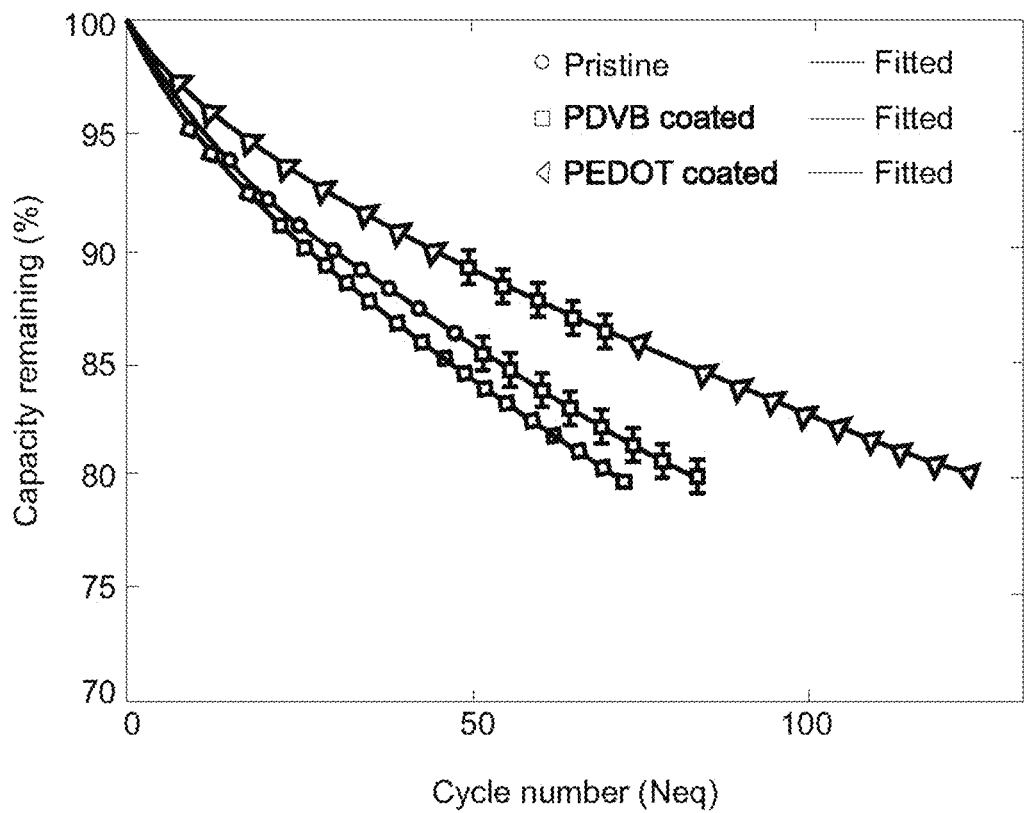

FIG. 12B shows that the fitted curves fit the experimental data for all the three types of cells, indicating that Eq. 4 may accurately describe the capacity remaining with respect to the number of cycles. Referring to FIG. 12A, the aging mechanisms may contribute to the capacity degradation during the cycling test in the $Li/LiMn_2O_4$ coin cells. Parameters $k_1$ and $k_2$ in Eq. 4 may be fitted based on the average capacity values of each type of cell using the least-squares method in MATLAB. The fitted values of $k_1$ and $k_2$ with a 95% confidence interval are listed in Table 2. As shown in Table 2, PEDOT-coated cells have significantly smaller $k_1$ and $k_2$ values compared to pristine cells, which indicates the PEDOT coating inhibits both the Mn dissolution and the SEI growth during the high-temperature cycling test. In contrast, the PDVB coating slightly promotes the Mn dissolution and the SEI growth during the cycling test. This conclusion may be further validated by comparing the cell performance after the cycling test. After the cycling test, the PEDOT-coated cell has a larger capacity and smaller overpotential during discharging compared to the pristine cell, indicating that more active material ($LiMn_2O_4$) remains and less SEI forms during the cycling test.

Effect of the Film Properties on the Cell Performance. Rinsing PEDOT films in an organic solvent, e.g., methanol, isopropyl alcohol, and acetone may improve the electrochemical performance of $LiMn_2O_4$. Organic solvents include aliphatic hydrocarbons, cyclic hydrocarbons, aromatic hydrocarbons, halogenated hydrocarbons, ketones, amines, esters, alcohols, aldehydes, and ethers. The effect of PEDOT coating on the performance of coin cells may be affected by having or lacking methanol rinsing for a PEDOT-coated $LiMn_2O_4$ electrode after the oCVD experiment. The rate performance of $LiMn_2O_4$ may be reduced without the rinsing step (perhaps because of the $FeCl_3$ impurity), compared with the samples with rinsing step. However, the rinsing step seems to have little effect on the cell cycling performance. Therefore, rinsing a PEDOT-coated electrode with methanol may provide improved performance of $LiMn_2O_4$ relative to the same PEDOT-coated electrode lacking the rinsing step.

Figure 13A:
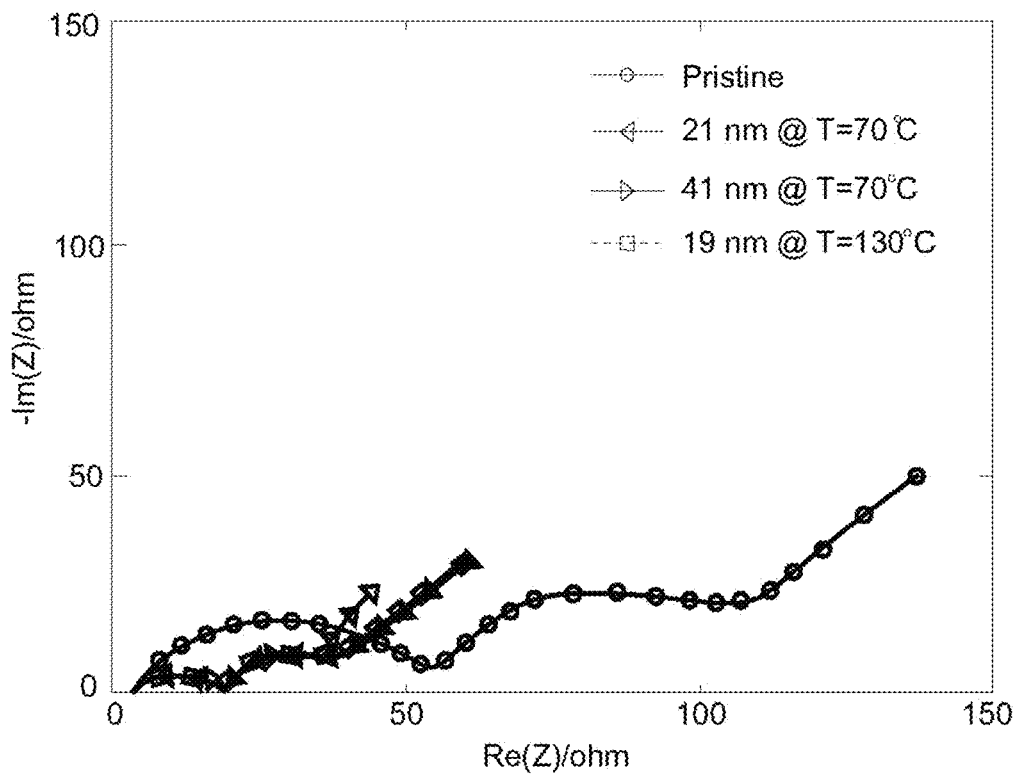
FIGS. 13A and 13B show PEDOT coatings decrease cell impedance and extend cell cycling life.

A higher stage temperature during oCVD deposition may improve the conductivity of the PEDOT films. During the oCVD process, the substrate contacting the stage may achieve a steady state. For example, the substrate may contact the stage for sufficient time, e.g., two hours, to achieve substantially the same temperature of the stage. FIG. 13A shows the comparison of two stage temperatures, 70° C. and 130° C., respectively. Additionally, two thicknesses of the PEDOT polymer coatings, 21 nm and 41 nm, at the same stage temperature (70° C.) are also shown. The electrochemical impedance of the $LiMn_2O_4$ electrode may be largely reduced by the PEDOT coatings under the examined conditions. However, increasing the conductivity of a PEDOT film by using 130° C. as the stage temperature does not further reduce the impedance. In addition, the impedance of the $LiMn_2O_4$ electrode does not significantly change when varying the film thickness. Without wishing to be bound to any particular theory, it is believed that the charge-transfer kinetics may be dominated by the desolvation process when the SEI is sufficiently conductive. The conducting PEDOT film on the cathode electrode largely increases the conductivity of the SEI. As a result, further increasing the conductivity of the PEDOT film may not continuously reduce the overall impedance of the $LiMn_2O_4$ electrode when electron transfer is not the limiting step.

Figure 13B:
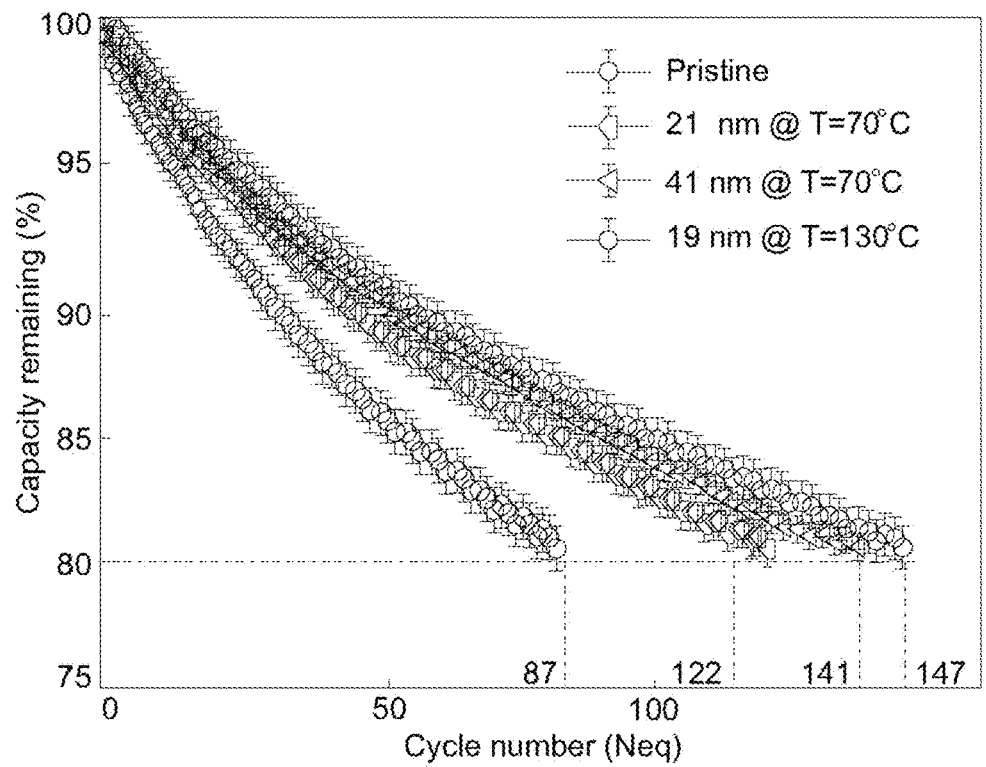

FIG. 13B compares the capacity degradation of different cells using different PEDOT polymer-coated $LiMn_2O_4$ electrodes. Each of the PEDOT coatings show a significant improvement in cell's capacity remaining during the cycling test at 50° C. compared to the pristine cells. For the PEDOT films synthesized at the stage temperature of 70° C., increasing the coating thickness from 21 nm to 41 nm improves the capacity remaining rate. The cycling life is also extended by around 15% (from 122 to 141). Without wishing to be bound to any particular theory, it is believed that the molecular weight, length of conjugation, and/or the degree of deprotonation of the PEDOT polymer chain may be affected by the stage temperature, and thereby the temperature of the substrate, during the oCVD experiment. For example, increasing the stage temperature and/or substrate temperature during oCVD polymerization from 70° C. to 130° C. improves the cycling performance and cycling life. The latter is extended by around 20% (from 122 to 147). Therefore, the PEDOT film from the stage/substrate temperature of 130° C. may have improved protection for the $LiMn_2O_4$ electrode compared to that from the stage/substrate temperature of 70° C.

The coating thickness of the PDVB film does not show a significant effect on the improvement of the $LiMn_2O_4$ electrode. The capacity degradation of pristine cells and cells having $LiMn_2O_4$ cathodes comprising different thicknesses of PDVB film coatings may be compared. Five thicknesses of coatings are shown, including 23 nm, 43 nm, 56 nm, 74 nm, and 100 nm. The improvement of cycling life is not obvious even when the coating reaches a thickness of 100 nm. To compare the remaining capacity of different cells, the remaining capacity of different cells when they go through 60 times of cycling at 50° C. may be determined to indicate that the PDVB coatings do not improve the life extension of the $LiMn_2O_4$ electrode regardless of the coating thickness.

Without wishing to be bound to any particular theory, it is believed that polymer coatings may reduce the electrolyte oxidization on the surface of cathode electrodes by introducing a physical barrier between the oxidizing spinel and the electrolyte. However, a physical barrier alone may not be sufficient to improve the electrochemical performance of the $LiMn_2O_4$ electrode. A physical barrier may be formed between the electrode and the electrolyte by coating an insulating PDVB thin film on the surface of $LiMn_2O_4$. However, the barrier seems to have little effect on the electrochemical performance. In addition to the barrier, chemical factors, such as the formation of chemical or coordinate bonds between the polymer thin film and the electrode, may provide the desired performance improvement. The chemical factors may stabilize the manganese element by increasing its chemical valence and thus inhibiting the disproportionation reaction of Mn' during the cycling process.

X-Ray Photoelectron Spectroscopy. The mechanism behind the performance improvement of cathode electrodes from different coatings is not fully understood. For inorganic coatings, without wishing to be bound to any particular theory, it is believed that metal oxide coatings scavenge trace hydrogen fluoride (HF) acids in the electrolyte and thus slow down the dissolution of the metal elements in the cathodes, resulting in a better performance. However, in certain circumstances, the coating of $YPO_4$ on $LiCoO_2$ may induce more acidity from the electrolyte. Further, the $LiNi_xMn_yCO_2O_2$ degradation mechanism may further disprove the proposed HF-based mechanisms. For organic coatings, elements having strong electronegativity, such as O and S, may form bonds with Mn on the spinel $LiMn_2O_4$ interface and therefore stabilize the electrode during its operation in LIBs.

XPS measurements are conducted on $LiMn_2O_4$ electrodes having and lacking the two types of polymer coatings to show the effect of polymer coating on the cycling performance of $LiMn_2O_4$. The effect of PEDOT coating on the S 2p, O 1s, and Mn 2p binding energies is compared in FIG. 14, and the binding energies are listed in Table 3.

Figure 14A:
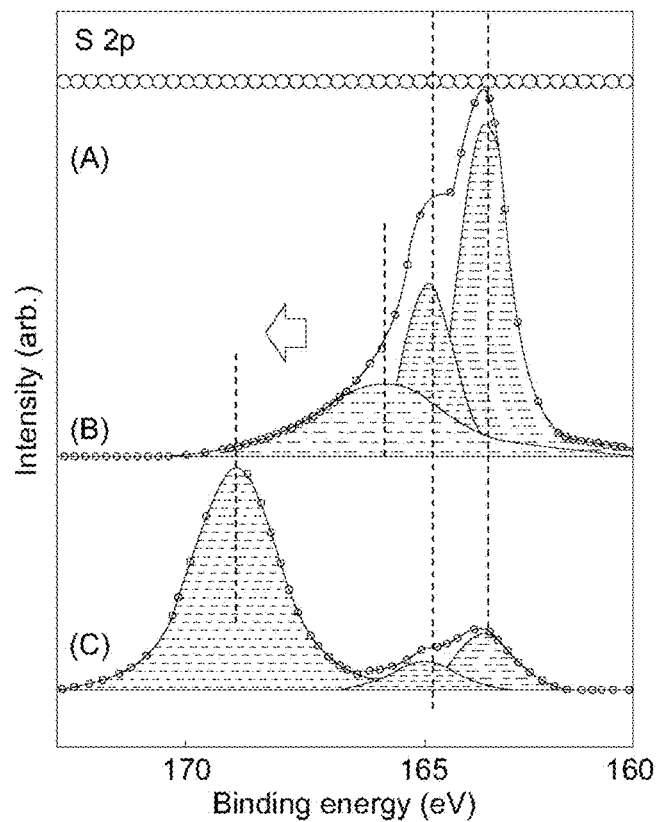
FIGS. 14A-D show XPS spectra of (a) S 2p, (b) O 1s, and (c) Mn 2p in (A) pristine $LiMn_2O_4$, (B) PEDOT thin film, and (C) PEDOT-coated $LiMn_2O_4$. Measurement data (dots) are fitted by several individual spectra (shaded regions). The combined spectra from these shaded regions are shown as an envelope that matches well with the experimental data (dots). The schematics of these materials are shown in (d).
Figure 14B:
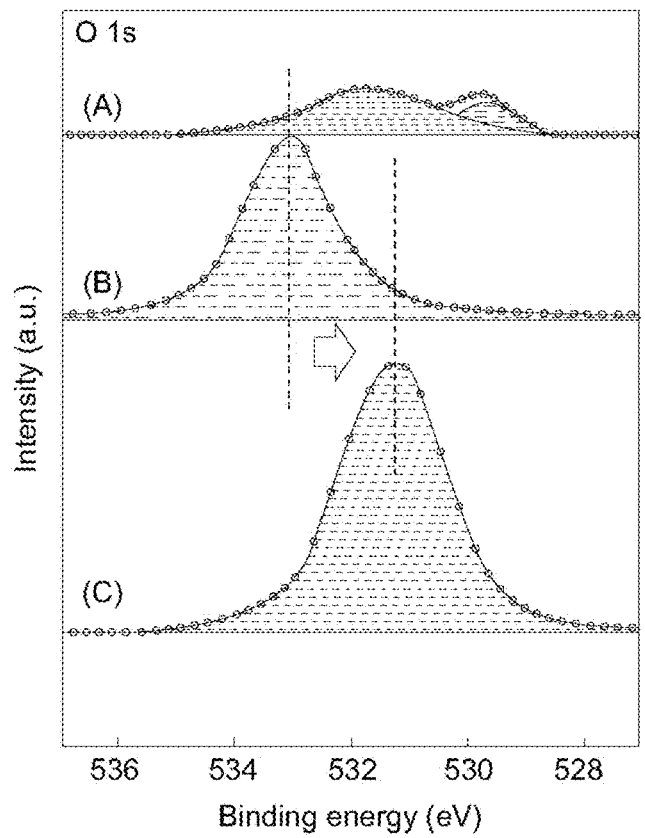
Figure 14C:
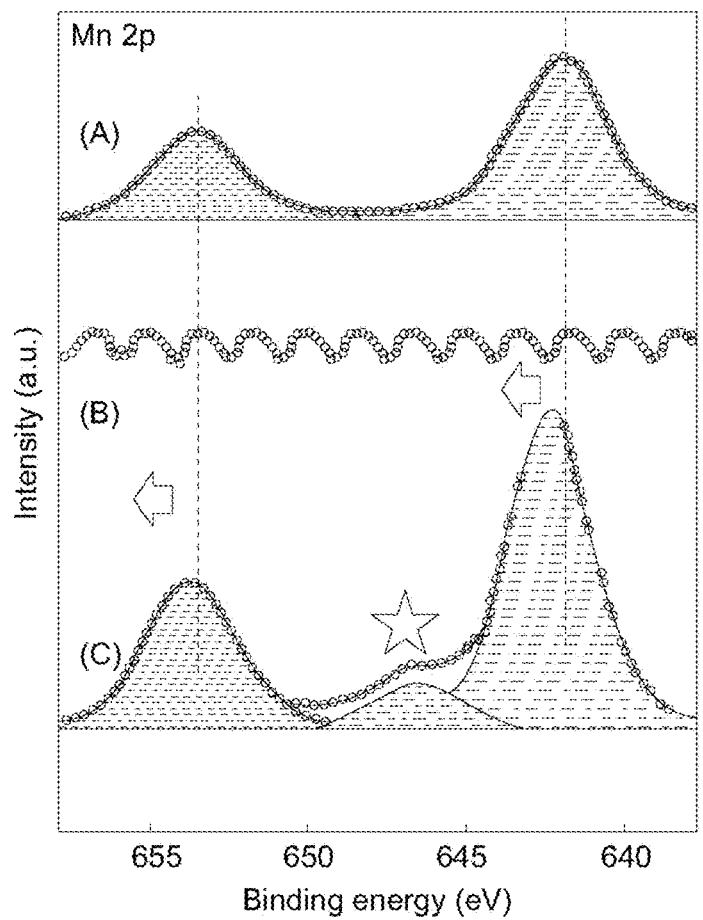
Figure 14D:
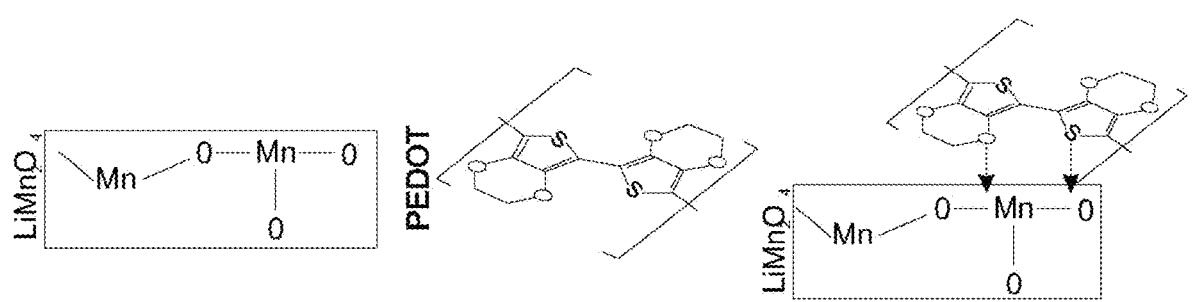

Coating PEDOT thin films on the surface of $LiMn_2O_4$ may change the binding energies of S 2p and O 1s in PEDOT and Mn 2p in $LiMn_2O_4$, respectively. This suggests the formation of new bonds. S 2p in PEDOT generally has doublet peaks at around 163 eV and 164.3 eV, as shown in FIG. 14A. Another peak shows up at about 165.2 eV, which may be attributed to the oxidization of S by Cl during the doping process in the CVD PEDOT synthesis. Coating a PEDOT film onto a $LiMn_2O_4$ surface shifts the S—Cl peak from 165.2 eV to 168.3 eV because of the oxidation of S by O present in $LiMn_2O_4$. The area ratio under the 168.3 eV peak significantly increases after the coating, indicating that some of the undoped S may also be oxidized by O present in $LiMn_2O_4$. FIG. 14B compares the O 1s peaks in the three studied materials, which binding energy is in the range of 528-535 eV. The peak at 529.7 eV is from O in $LiMn_2O_4$, whereas the peak at 531.6 eV is from O in $Li_2CO_3$, which is formed during $LiMn_2O_4$ exposure to air. The evidence of $Li_2CO_3$ formation may be shown in the C 1s spectra. In contrast, only one peak is shown in the PEDOT and the PEDOT-coated $LiMn_2O_4$ samples because XPS may only detect a composition near the surface (about 10 nm). The O 1s peak in PEDOT reduces from 533.1 to 531.3 eV after being coated onto $LiMn_2O_4$, indicating the reduction of the O element in the PEDOT film. FIG. 14C shows the evolution of the Mn 2p peaks after polymer coating. The Mn 2p doublet peaks shift from 641.9 eV to 642.2 eV and from 653.6 eV to 653.8 eV. This suggests that Mn in $LiMn_2O_4$ may be further oxidized by the PEDOT coating. Also, a MnO satellite feature is shown at 646.6 eV after the coating, indicating the surface reconstruction of the $LiMn_2O_4$ electrode after the coating. Integrating the above results, without wishing to be bound by any particular theory, it is believed that bonds form between Mn in $LiMn_2O_4$ and O and S in PEDOT at the interface of the coating. These bonds further oxidize Mn on the surface of $LiMn_2O_4$. Therefore, the stability of $LiMn_2O_4$ may be increased as the amount of energy needed to destroy the spinel structure is increased. In comparison, the PDVB coating does not have a significant effect on the binding energy of Mn 2p, indicating that no bonds are formed between Mn and the elements in the PDVB film after coating. Thus, the PDVB coating may not improve the high-temperature cycling performance of the $LiMn_2O_4$ electrode, as shown in FIG. 11.

The present invention is directed to the field of surface and interface engineering for battery materials. The CVD polymerization process described herein may be used to improve the performance of many other cathodes in the LIBs, including the high-rate cathode $LiCoO_2$, high-voltage cathode $Li—Ni_{0.5}Mn_{1.5}O_4$, and high-capacity Ni-rich cathode $Li—Ni_xCo_yMn_zO_2$ (x>0.8). For example, PEDOT coating significantly improves the high-voltage (3.0-4.5 V) cycling stability of $LiCoO_2$. The number of cycles is almost tripled by the PEDOT coating when pristine $LiCoO_2$ decreases to 50% of its initial capacity. In contrast, the PDVB coating has little effect on the cycling performance.

The present invention is directed to CVD polymerization processes to systematically modify the surface of a $LiMn_2O_4$ cathode electrode in LIBs using multifunctional polymer films. A comparison of the effect of PEDOT and PDVB polymers on the $LiMn_2O_4$ performance show that the conducting PEDOT coating significantly improves the kinetic performance of the $LiMn_2O_4$ electrode in the temperature range from 0-50° C. In contrast, the insulating PDVB coating does not show much effect on the cell rate performance. The EIS results further indicate that the PEDOT coating largely reduces the charge-transfer resistance of $Li^+$ at the interface of the electrolyte and both electrodes, whereas the PDVB coating has little effect. Furthermore, the high-temperature (50° C.) cycling life of a $LiMn_2O_4$/Li cell is extended by over 60% using the PEDOT thin film coating but declined with the PDVB coating. A cell capacity degradation module based on the main aging mechanisms in the Li/$LiMn_2O_4$ cells shows that PEDOT coating inhibits both Mn dissolution and SEI growth during the cycling test. The XPS analysis shows that there are bonds formed between Mn in $LiMn_2O_4$ and O/S in PEDOT, which stabilize the $LiMn_2O_4$ cathode material during the cycling test. In comparison, no bonds are formed between Mn and the elements in the PDVB film. The CVD polymerization process may be applied to other cathode materials and $LiCoO_2$ is chosen as an example to illustrate the potential of the process to enable advanced LIBs. The CVD polymerization process has the potential to improve the overall performance of many advanced cathode and anode materials by the systematic study of processing-structure-property relationships.

Example 3

Figure 20A:
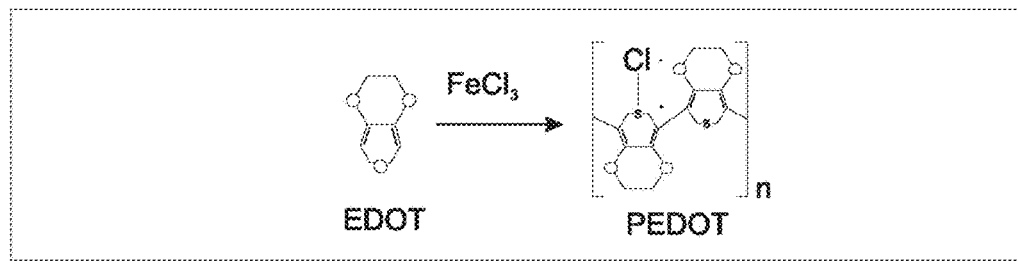
FIGS. 20A-C include schematics of synthesizing (FIG. 20A) poly(3, 4-ethylenedioxythiophene) (PEDOT), (FIG. 20B) poly(divinylbenzene) (PDVB), and (FIG. 20C) poly (1H,1H,2H,2H-perfluorodecyl acrylate-co-divinylbenzene) (P(PFDA-co-DVB)). The PDVB and P(PFDA-co-DVB) are synthesized by iCVD method, while the PEDOT is synthesized by oCVD method.
Figure 20B:
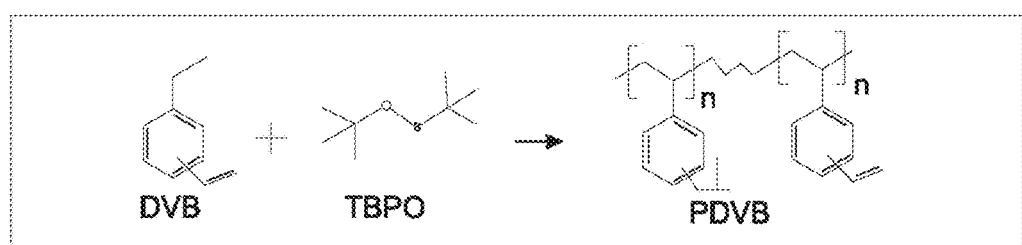
Figure 20C:
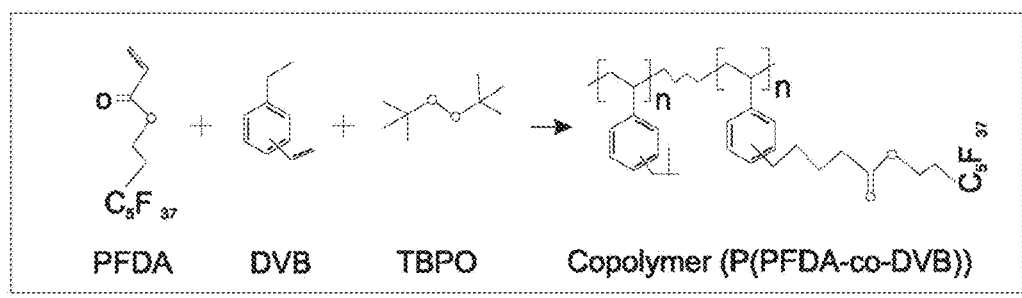
Figure 21B:
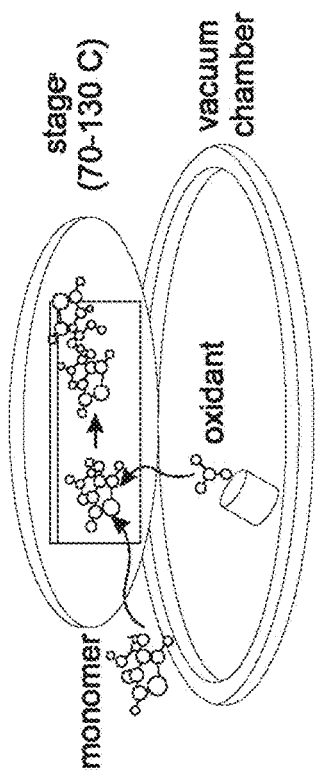
FIGS. 21A-H show material characterization of CVD polymer coatings and $LiCoO_2$ particles. Schematics of (FIG. 21A) initialed chemical vapor deposition polymerization and (FIG. 21B) oxidative chemical vapor deposition polymerization.
Figure 21A:
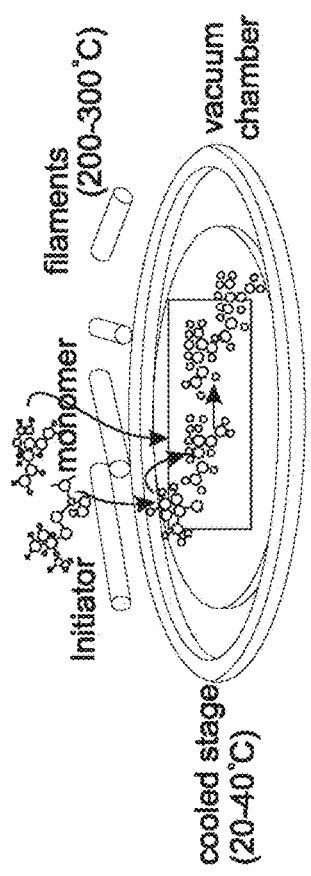
Figure 21C:
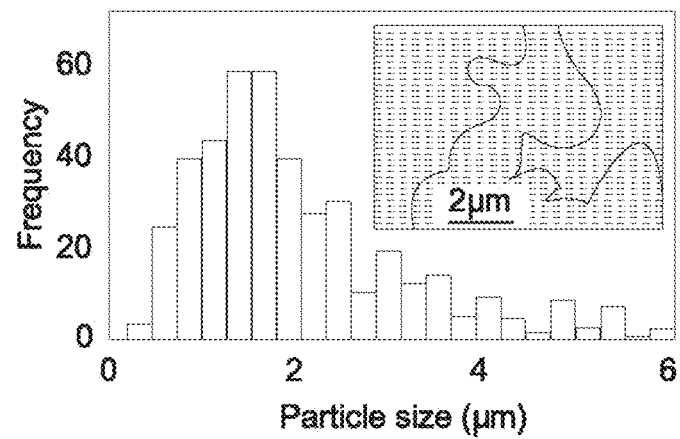
Figure 21D:
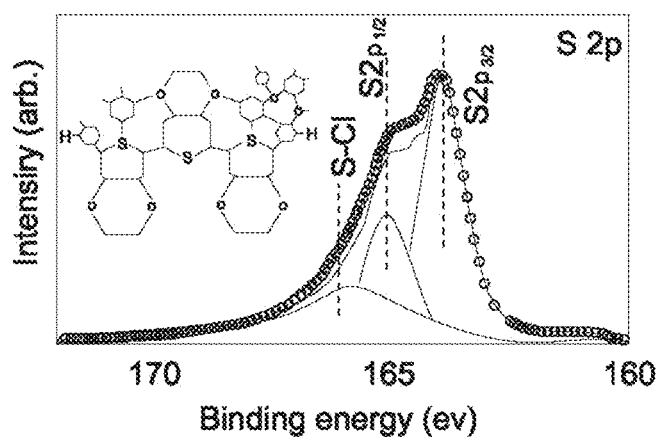
Figure 22A:
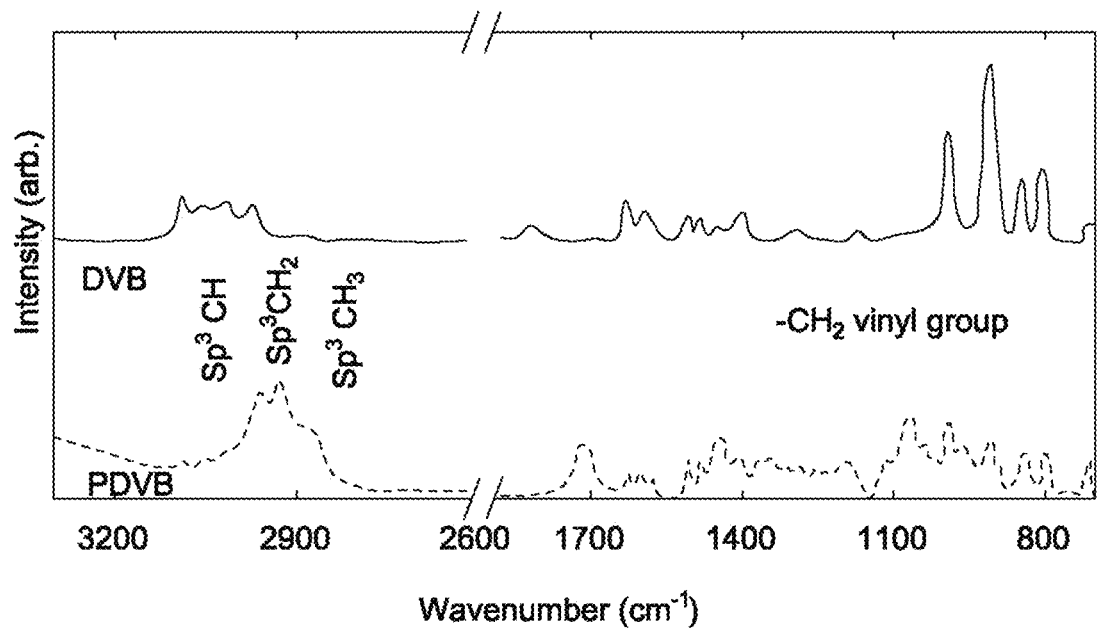
FIGS. 22A and 22B show material characterizations for polymers, including (FIG. 22A) Fourier transform infrared (FTIR) spectroscopy of DVB monomer and PDVB polymer, and (FIG. 22B) Raman spectroscopy of $LiCoO_2$ particle, PEDOT film, and PEDOT coated $LiCoO_2$. An optical microscopy image is inserted to show the measurement position for a $LiCoO_2$ electrode. The Raman spectra of the PEDOT-coated $LiCoO_2$ electrode include all peaks from the spectra of the $LiCoO_2$ electrode and the PEDOT film suggesting that the PEDOT polymer has been successfully coated onto the surface of the electrode. The peak at 510 $cm^{-1}$ in the PEDOT sample that does not appear in the PEDOT-coated $LiCoO_2$ sample may be from the Si substrate.

Chemical Vapor Deposition Polymerization Processes. The CVD polymerization processes according to the present invention may comprise initiated CVD (iCVD) and/or oxidative CVD (oCVD). The CVD polymerization processes may be used to synthesize dielectric polymers (PDVB, copolymer) and conducting polymers (PEDOT) respectively. FIGS. 5A and 5B each illustrate diagrams of these processes. The syntheses of these polymers are illustrated in FIG. 20. The size of LiCoO$_2$ powder is about 2 micrometers (see FIG. 21C). Fourier transform infrared (FTIR) spectroscopy, Raman spectroscopy, and X-ray photoelectron spectroscopy (XPS) may be applied to characterize synthesized polymers. FTIR spectra in FIG. 22A shows peak intensity reduction at 903 cm$^{-1}$ and new peaks appearance at 2870 cm$^{-1}$, 2930 cm$^{-1}$, and 2960 cm$^{-1}$ after polymerization of divinylbenzene (DVB), indicating the PDVB polymer is successfully synthesized because of the loss of vinyl groups and the formation of —CH, —CH$_2$, —CH$_3$ groups. The synthesis PEDOT may be shown by Raman spectra in FIG. 22B. Since FeCl$_3$ is utilized as an oxidant, a portion of S atoms in PEDOT are doped by Cl in the final polymer. By analyzing the XPS spectrum of S 2p, referring to FIG. 21D, about 25% of S is doped by Cl. The synthesis of P(PFDA-co-DVB) may be shown by C 1s spectrum, as shown in FIG. 23, which indicates the ratio of PFDA of about 56%. Additionally, the density of the three polymers are studied by X-ray reflectivity (XRR) and neutron reflectivity.

Figure 21E:
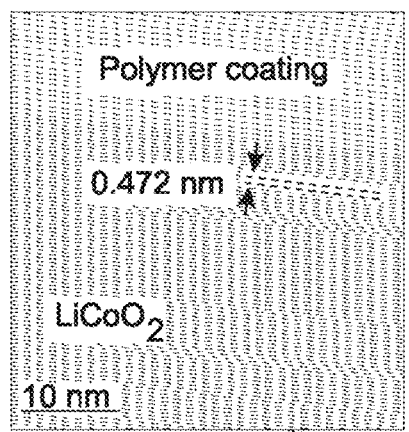
Figure 21F:
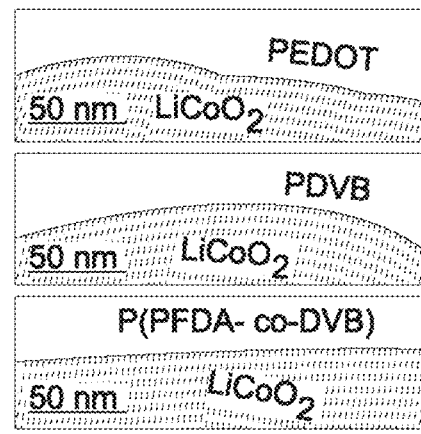
Figure 21G:
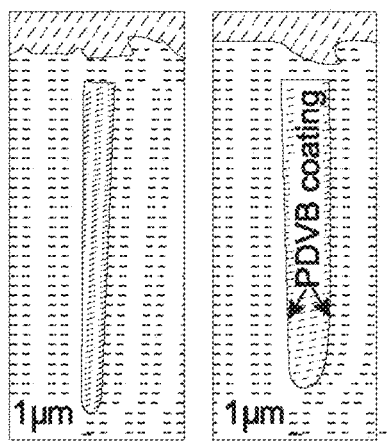
Figure 21H:
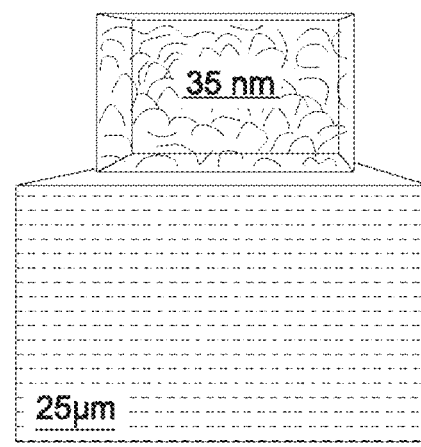

Transmission electron microscopy (TEM) and scanning electron microscopy (SEM) are applied to study the effectiveness of the CVD processes on engineering LiCoO$_2$ electrodes. FIG. 21E shows an amorphous nanolayer on the (003) plane of a LiCoO$_2$ particle. FIG. 21F shows a larger region that indicates LiCoO$_2$ particles are conformally covered by all the three types of polymers. The ability to engineer complex structure may be characterized by cross-section SEM. FIG. 21G shows about 100 nm thick PDVB uniformly coated on a silicon trench. The CVD processes according to the present invention may be used to engineer the entire battery electrodes that have porous structures. The engineering of the PEDOT through LiCoO$_2$ electrodes may be further characterized by energy-dispersive X-ray spectroscopy (EDS) mapping. Since S element presents in PEDOT, the uniformly distributed S element in FIG. 21H indicates that PEDOT was uniformly coated over the whole electrode.

Kinetics of Li$^+$ Movement Tuned by Polymers. Without wishing to be bound to any particular theory, it is believed that the kinetics of Li$^+$ movement in LIBs may relate to their rate capability and power density. By engineering the surface of LiCoO$_2$ electrodes, the cathode-electrode interphase (CEI) may affect the kinetics of Li$^+$ movement between the electrode and electrolyte. Generally, the movement of Li$^+$ in LIBs may be described by Nernst-Planck equation as shown in Equation 6. When a battery is charged/discharged at a certain C-rate, the J and the $\nabla c$ of Li$^+$ may be fixed. Thus, the potential gradient on the cathode side ($\nabla \phi+$) may relate to the diffusion coefficient of Li$^+$ (D), as shown in Equation 7:

$$J = -D\nabla c - D\frac{F_Z}{RT}c\nabla\phi_+ \quad \text{Equation 6}$$

$$\nabla\phi_+ = RT\left(\frac{\nabla_c}{F_Z} + \frac{1}{D} \times \frac{1}{F_Z}\right) \quad \text{Equation 7}$$

where J is the flux of Li$^+$, D is the diffusion coefficient of Li$^+$ in CEI, $\nabla_c$ is the concentration gradient of Li$^+$, F is the Faraday constant, z is the number of charge, R is the ideal gas constant, T is the temperature, and $\nabla\phi+$ the potential gradient on cathode side.

Neutron depth profiling (NDP) process may be applied to study the diffusion coefficient of Li$^+$ in different polymers, as represented by the following equations:

$$^6\text{Li}+n \rightarrow {}^4\text{He}(2055 \text{ keV})+{}^3\text{H}(2727 \text{ keV}) \quad \text{Equation 8}$$

$$J=D\nabla_c \quad \text{Equation 9}$$

where J is the flux of Li$^+$, D is the diffusion coefficient of Li$^+$ in polymers, $\nabla c$ is the concentration gradient of Li$^+$.

Density function theory (DFT) simulation may be applied to understand different Li$^+$ diffusion coefficients in the three polymers. Since the glass transition temperatures of these polymers may be much higher than room temperature, Li$^+$ transport in these polymers may be characterized by the rules of ionic transport in glassy materials. The transport starts with Li$^+$ at local sites being excited to neighboring sites by electrical field and/or concentration gradient, and then collectively diffusing on a macroscopic scale. The ability of Li$^+$ movement may relate to the activation energy of Li$^+$ hopping from one site to another and the concentration of Li$^+$. However, it may be appreciated by those skilled in the art that it may be difficult to calculate the hopping energy through DFT simulation when the polymers are amorphous, e.g., PDVB, and lack well defined crystal structure. When a polymer has a well-defined crystal structure, e.g., PEDOT, extended polymer matrices may be too large to be simulated with non-periodic DFT. Thus, the binding energy between Li$^+$ and small polymer clusters as well as the number of binding sites in polymers may be used as two descriptors to describe Li$^+$ mobility within a polymer matrix.

Figure 24A:
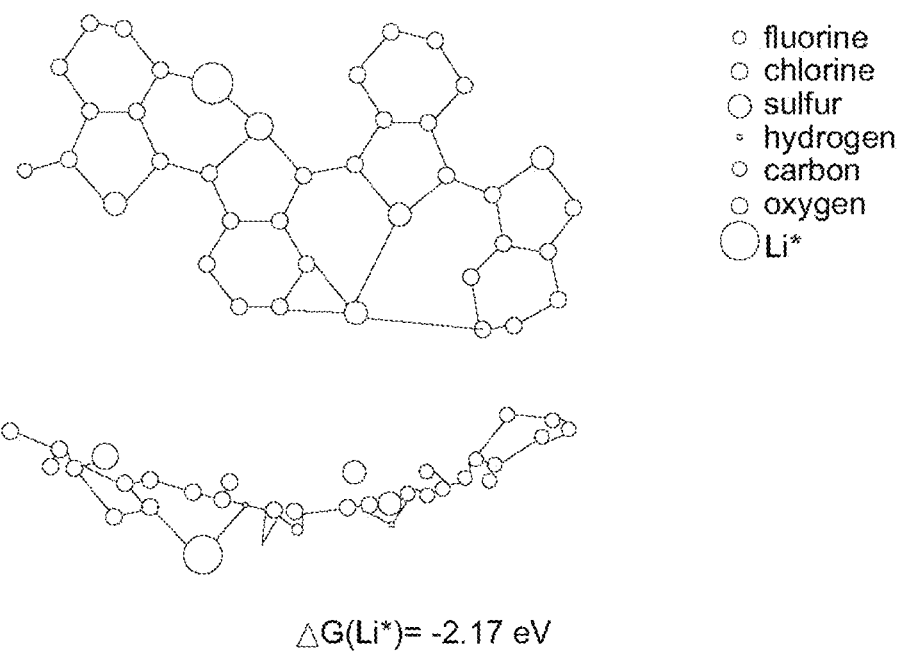
FIGS. 24A-D show density function theory simulations to calculate the interaction between $Li^+$ and polymers. The interaction between $Li^+$ and (FIG. 24A) PEDOT (Cl doped), (FIG. 24B) PDVB, (FIG. 24C) P(PFDA-co-DVB). Two views are shown for clarity, and the calculated binding energy is listed below each figure.
Figure 24B:
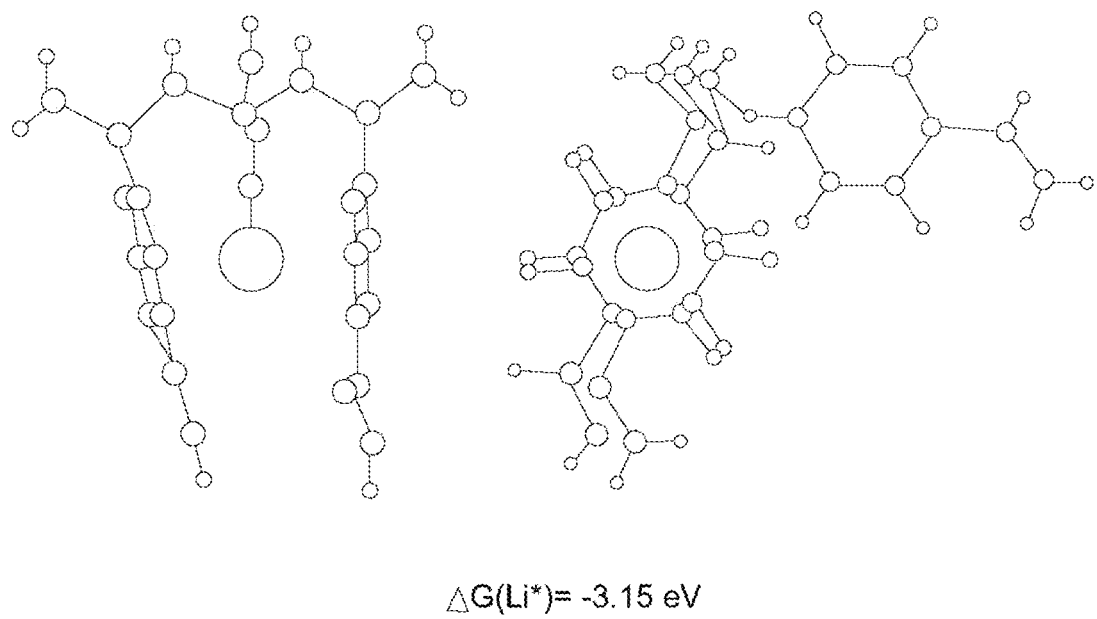
Figure 24C:
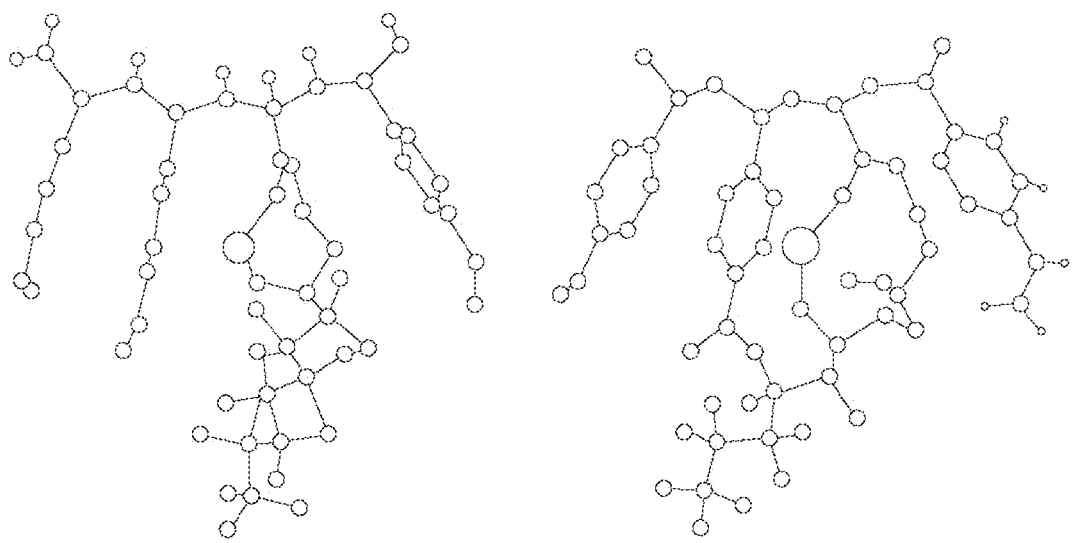
Figure 24D:
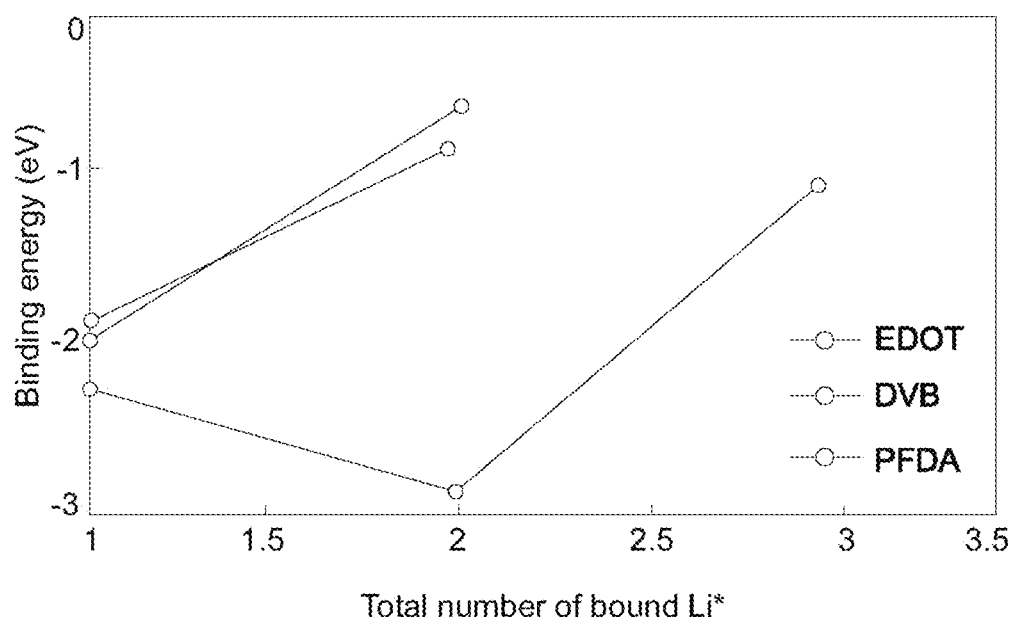
Figure 25A:
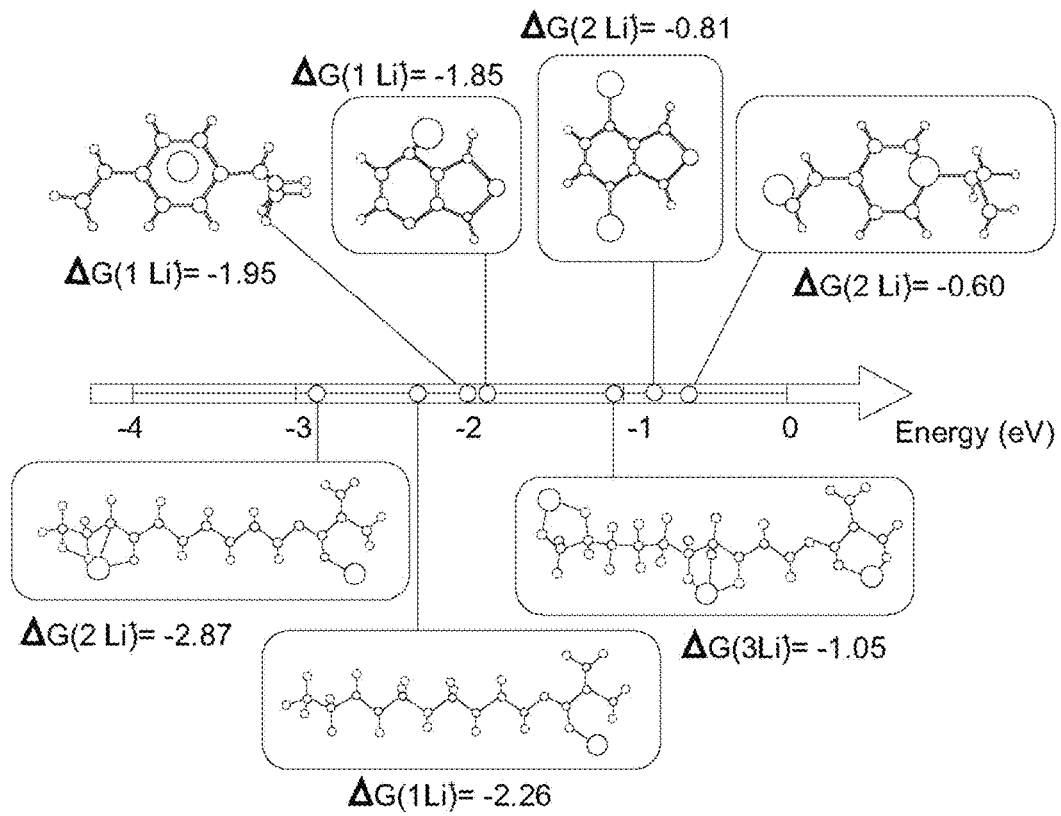
FIGS. 25A and 25B show density function theory simulations to calculate the interaction between $Li^+$ and polymers.
Figure 25B:
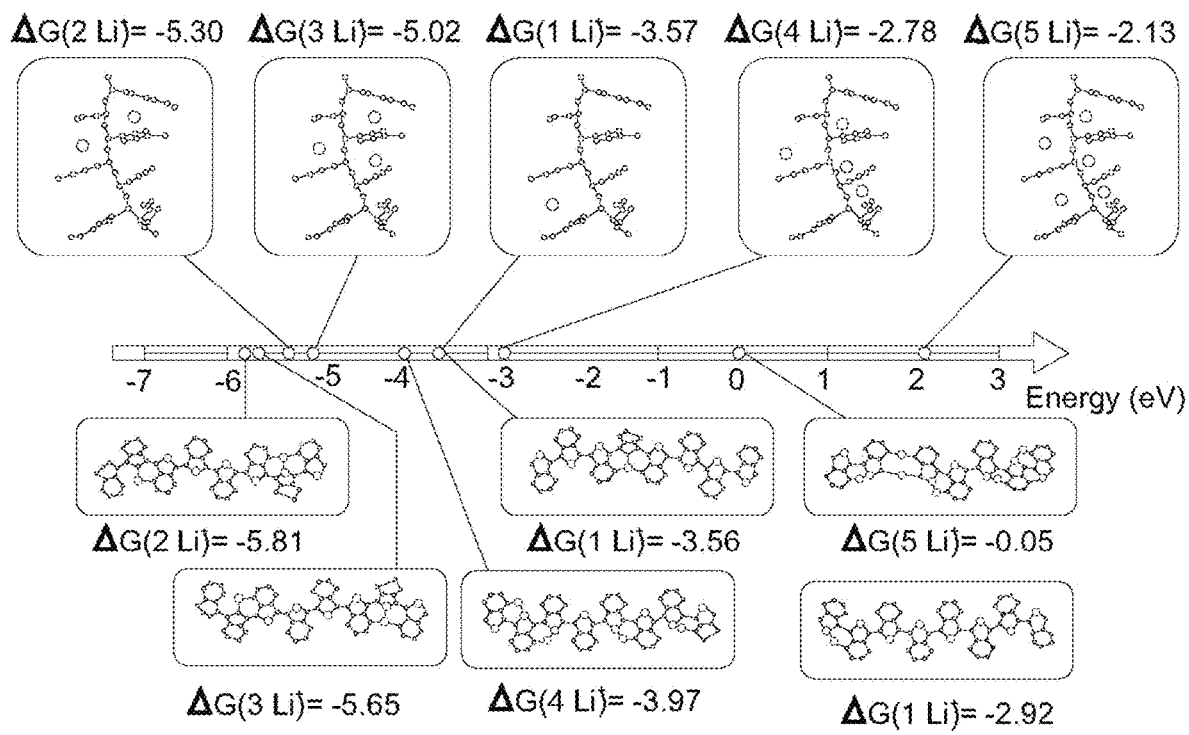

FIGS. 24A-D show the DFT simulation results of the interaction between Li$^+$ and polymers, which may suggest that the binding energy among Li$^+$ and polymers may be PEDOT (Cl doped)<PDVB<P(PFDA-co-DVB). The number of binding sites in the three polymers, referring to FIG. 24D and FIG. 25, compare the cumulative binding energy between Li$^+$ and different monomers. Considering that the molecular weight of PFDA (518 g/mol) is larger than the molecular weight of EDOT (142 g/mol) and the molecular weight of DVB (130 g/mol), the number of binding sites in a certain volume may be described as PEDOT≈PDVB>P (PFDA-co-DVB), when the densities of these polymers are assumed to be the same. Small binding energy and enough binding sites make PEDOT a good polymer for Li$^+$ movement and thus has high Li$^+$ diffusion coefficient.

Figure 26A:
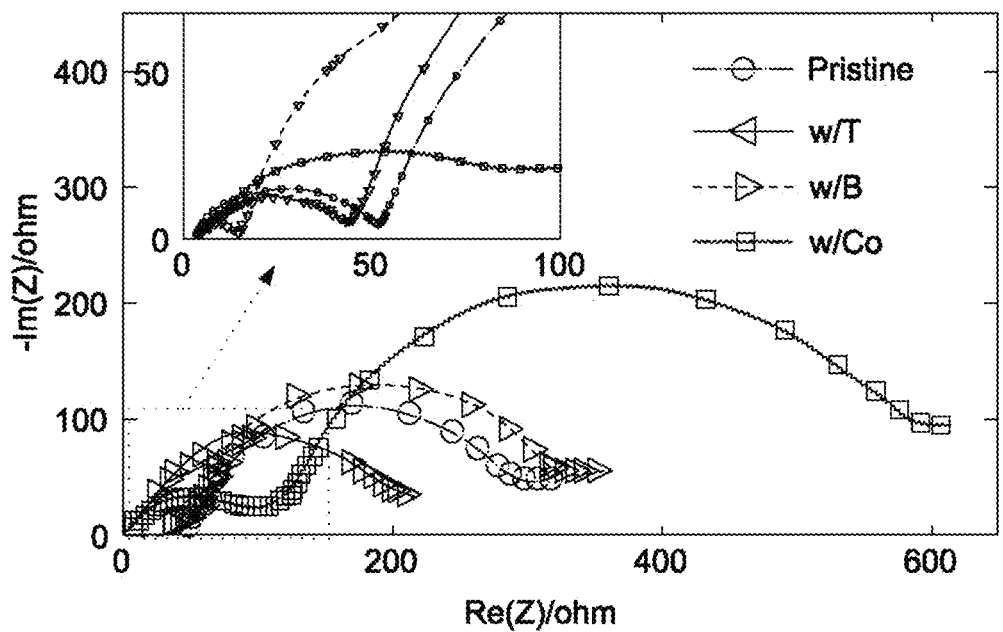
FIGS. 26A-D show electrochemical performance of $LiCoO_2$ electrodes with different polymer coatings.
Figure 26B:
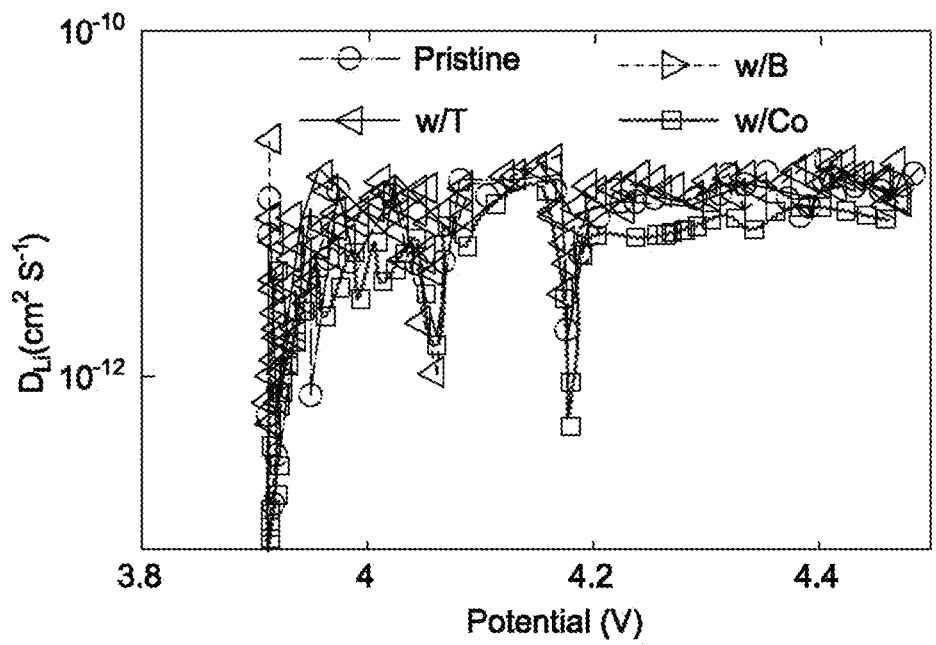
Figure 26C:
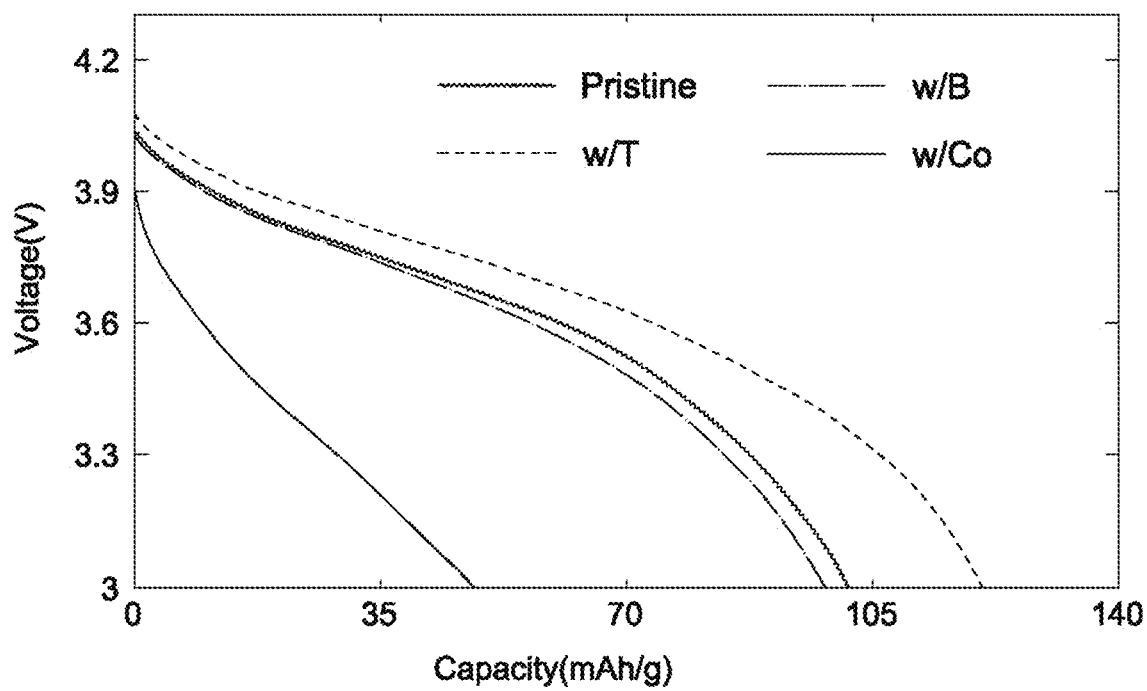
Figure 26D:
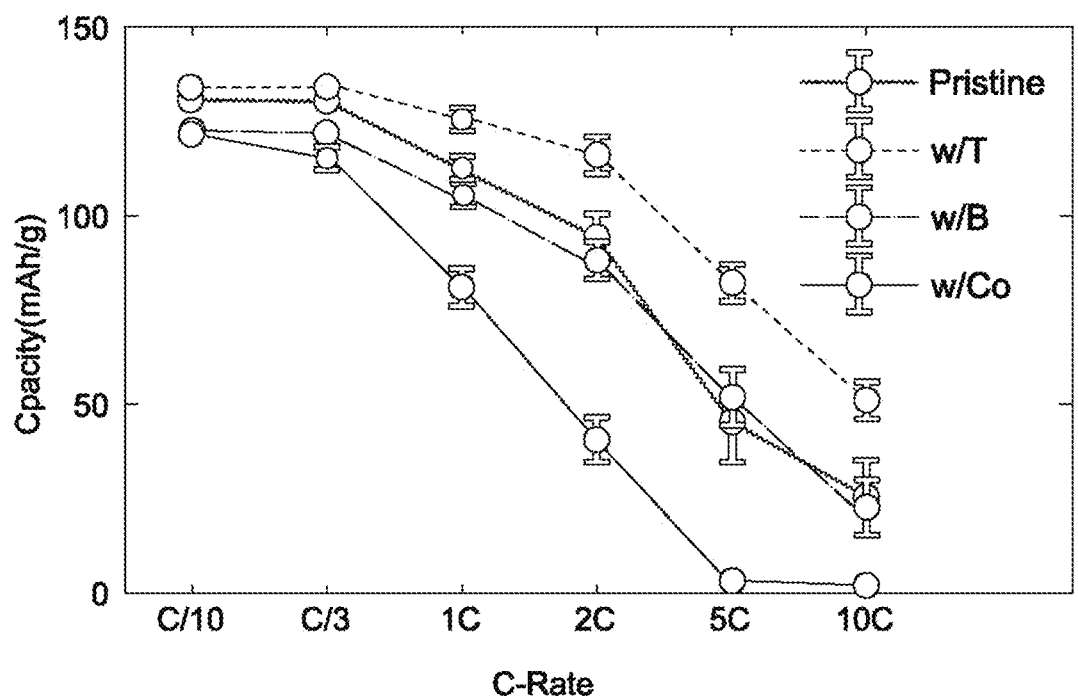
Figure 27A:
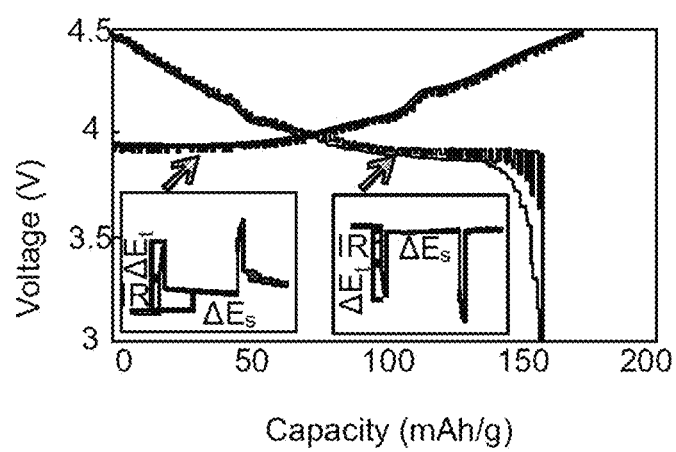
Figure 27B:
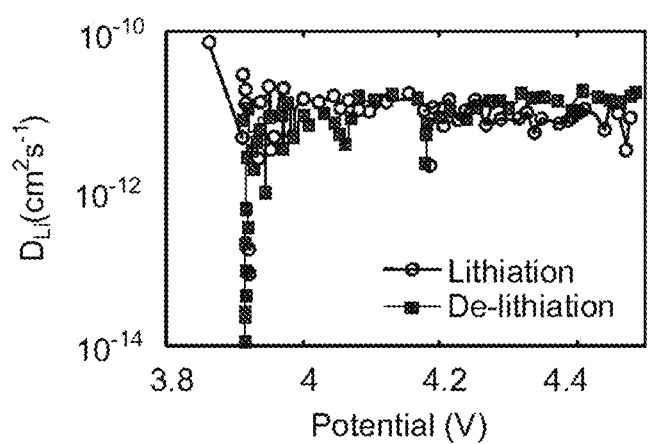
(FIG. 27B) Comparison of diffusion coefficient of Li during charging and discharging process in a pristine $LiCoO_2$ electrode.

The electrochemical performances of LiCoO$_2$ electrodes may be affected by polymer nanolayers. FIG. 26A compares the electrochemical impedance spectroscopy (EIS) of different LiCoO$_2$ electrodes. A second-order equivalent circuit model (ECM) is applied to fit the data and the results, as listed in Table 7, which suggest the polymer nanolayers may have little effect of ohmic resistance (R$_o$) varied while significantly changed the CEI resistance (R$_{CEI}$) and charge-transfer resistance (R$_{ei}$). The little effect on R$_o$ may relate to the coatings that do not segregate the connections among different particles since these polymers are applied to casted electrodes. In comparison, the large effect on $R_{CEI}$ and $R_{et}$ may relate to different $Li^{+0}$ transport properties in these polymers, as well as different binding energies between $Li^+$ and polymers that affect desolvation process and charge-transfer process of $Li^+$. Referring to FIG. 26B, the lithium diffusion coefficient ($D_{Li}$) in different $LiCoO_2$ electrodes measured from galvanostatic intermittent titration process (GITT) is shown. Each of the four types of $LiCoO_2$ electrodes have the $D_{Li}$ values in the order of $10^{-11}$ cm$^2$ s$^{-1}$. This indicates the coatings may not affect the bulk diffusion of Li in $LiCoO_2$. FIG. 26C shows the PEDOT nanolayer may reduce the overpotential and increase the specific capacity of $LiCoO_2$ electrodes, the PDVB nanolayer may have little effect, while the copolymer may increase the overpotential and decreased the specific capacity. FIG. 26D shows a comparison of the specific capacity of $LiCoO_2$ electrodes at various C-rates, which shows the PEDOT nanolayer about doubles the capacity at 5 C and 10 C, while having little capacities for the copolymer-coated $LiCoO_2$ electrode at these C-rates.

Figure 28A:
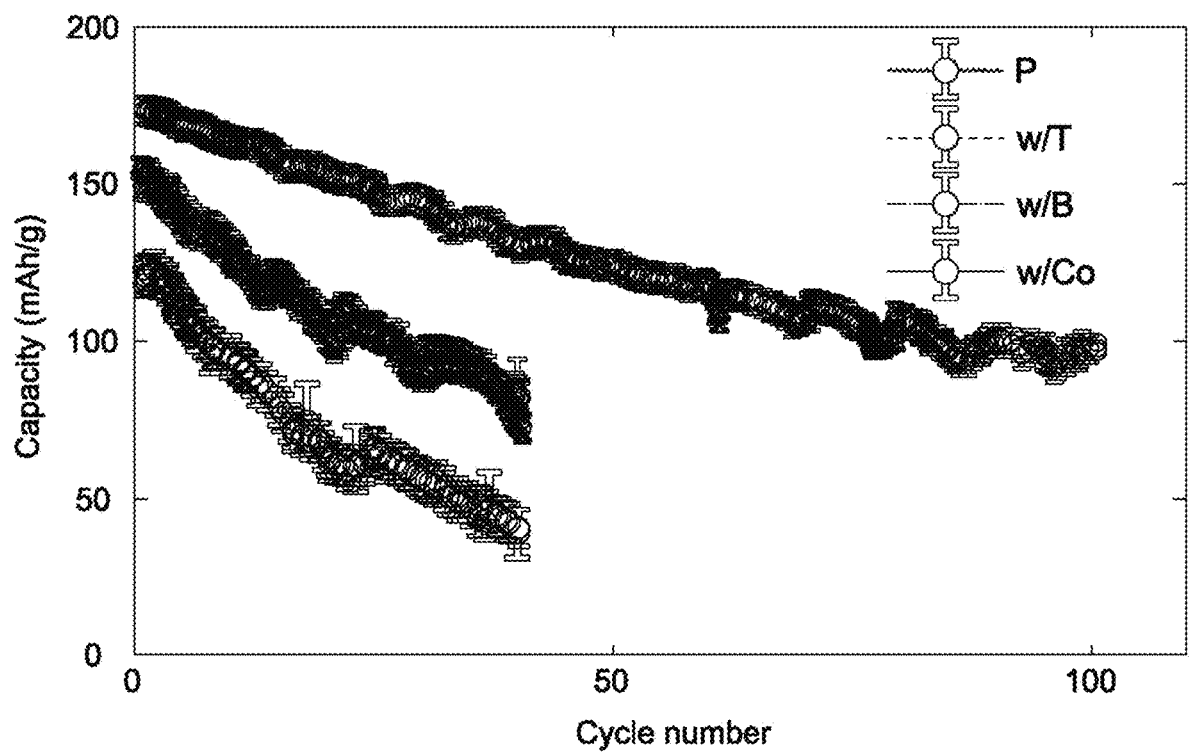
FIGS. 28A-D show electrochemical performance of $LiCoO_2$ electrodes comprising different polymer coatings during high voltage cycling tests within 3.0-4.5 V at C/2.
Figure 28B:
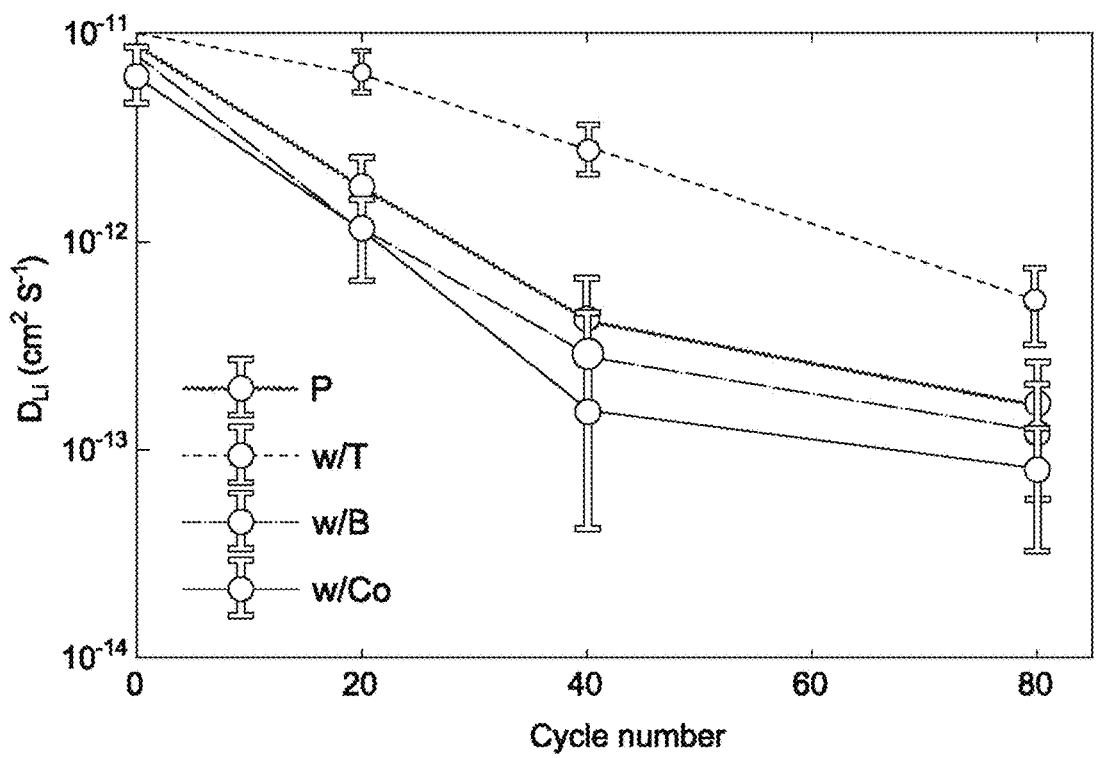
Figure 28C:
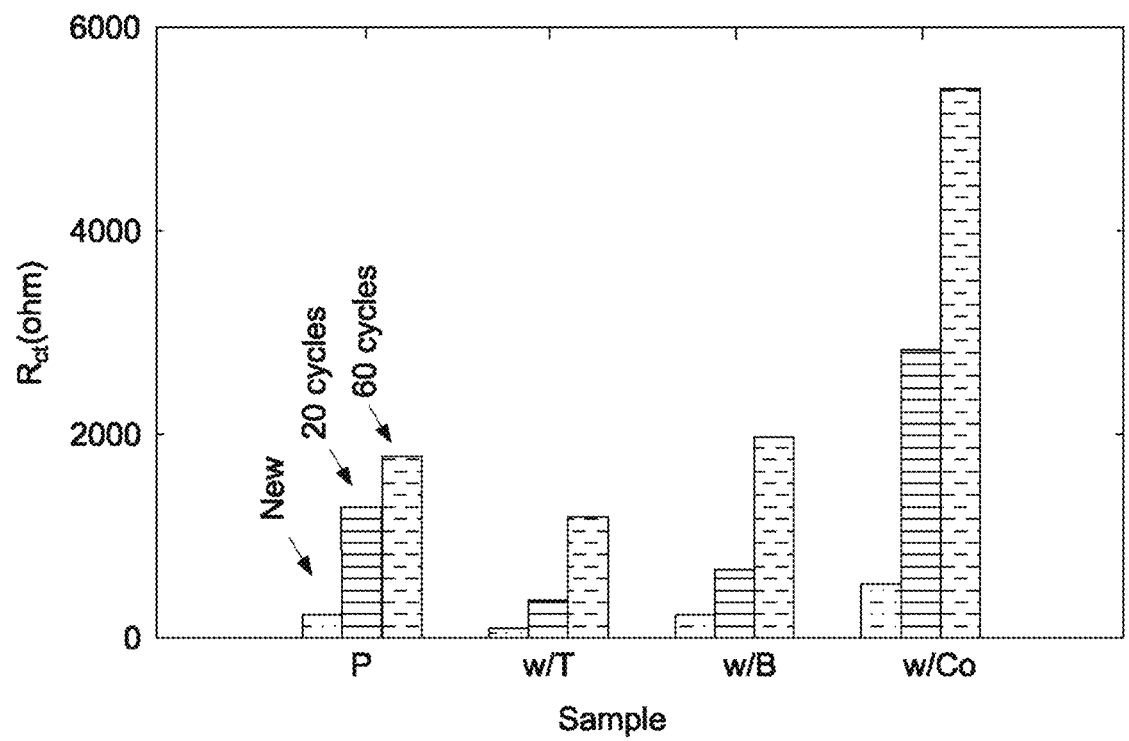
Figure 28D:
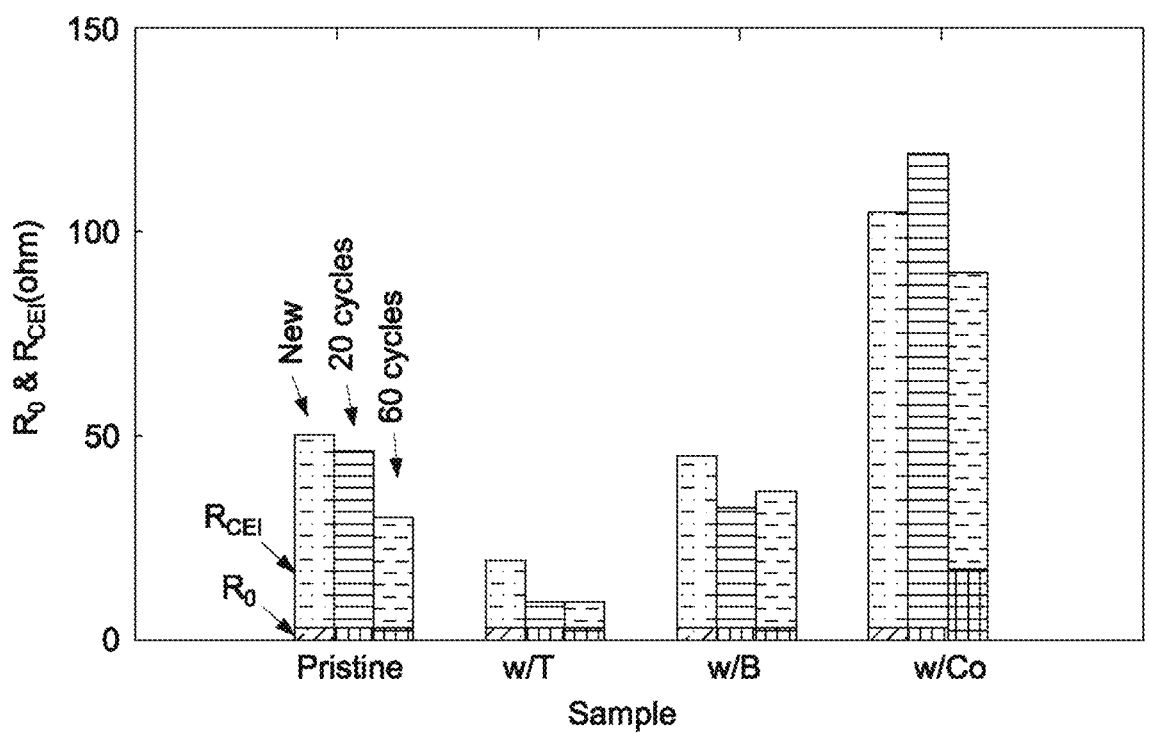
Figure 29A:
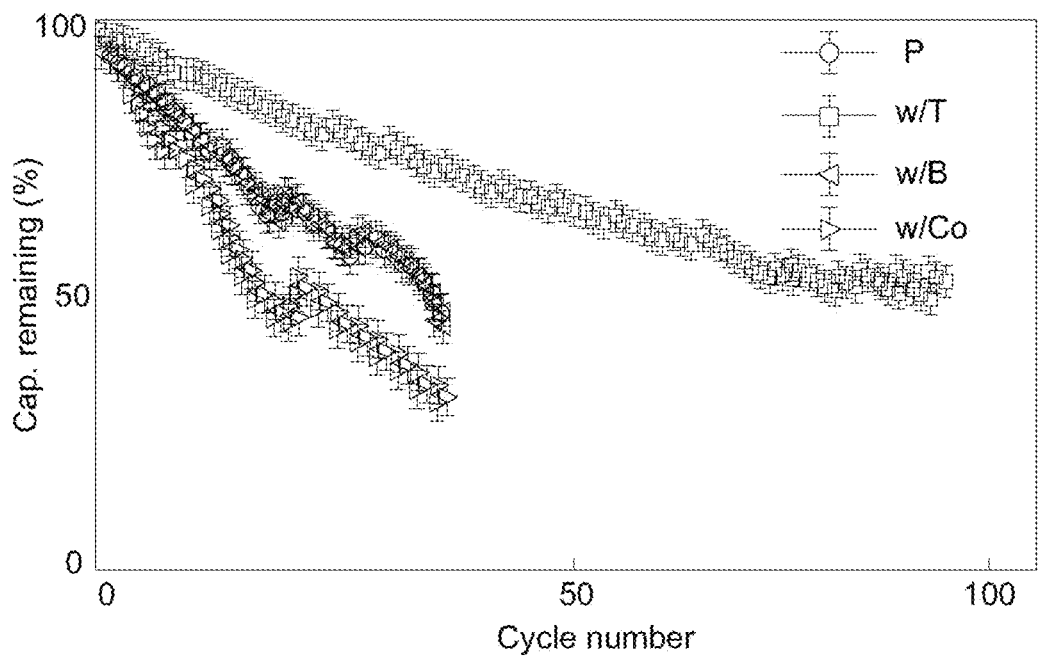
FIGS. 29A-D show normalized capacity fading of different $LiCoO_2$ electrodes during the high voltage (4.5 V) cycling test.
Figure 29B:
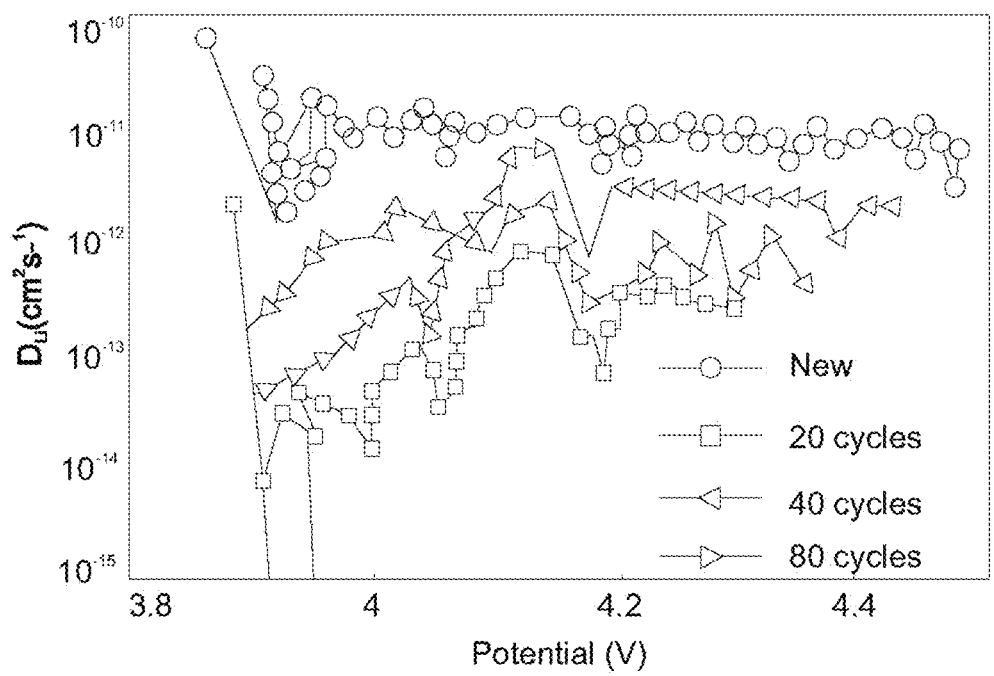
Figure 29C:
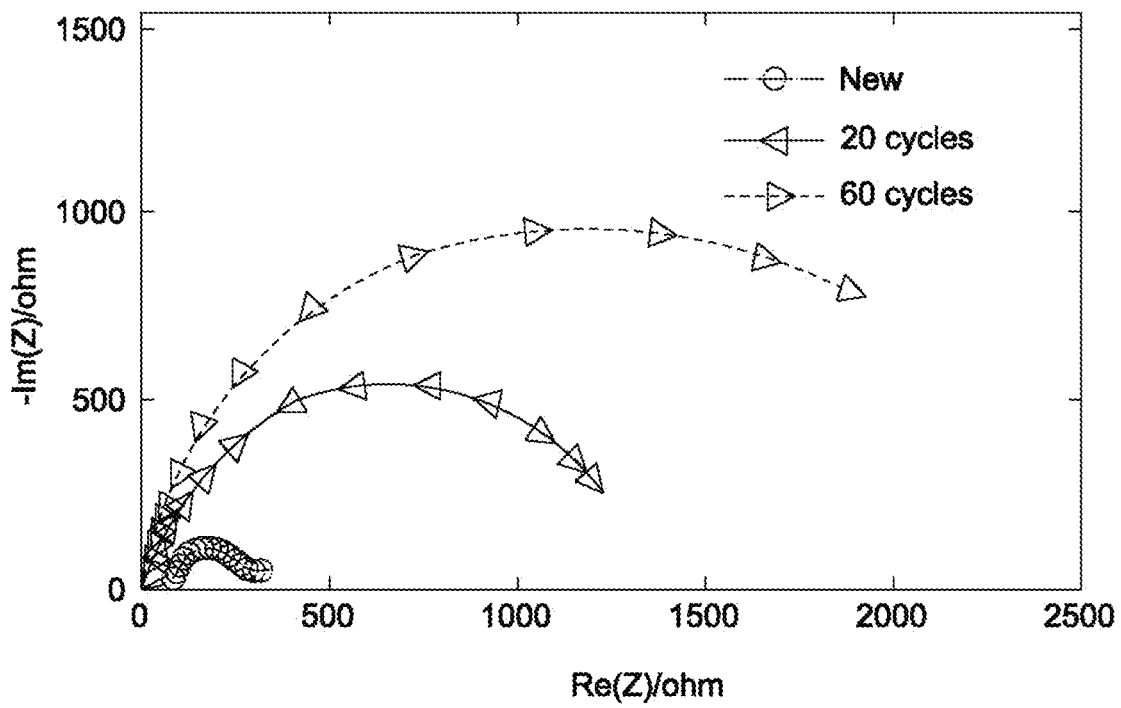
Figure 29D:
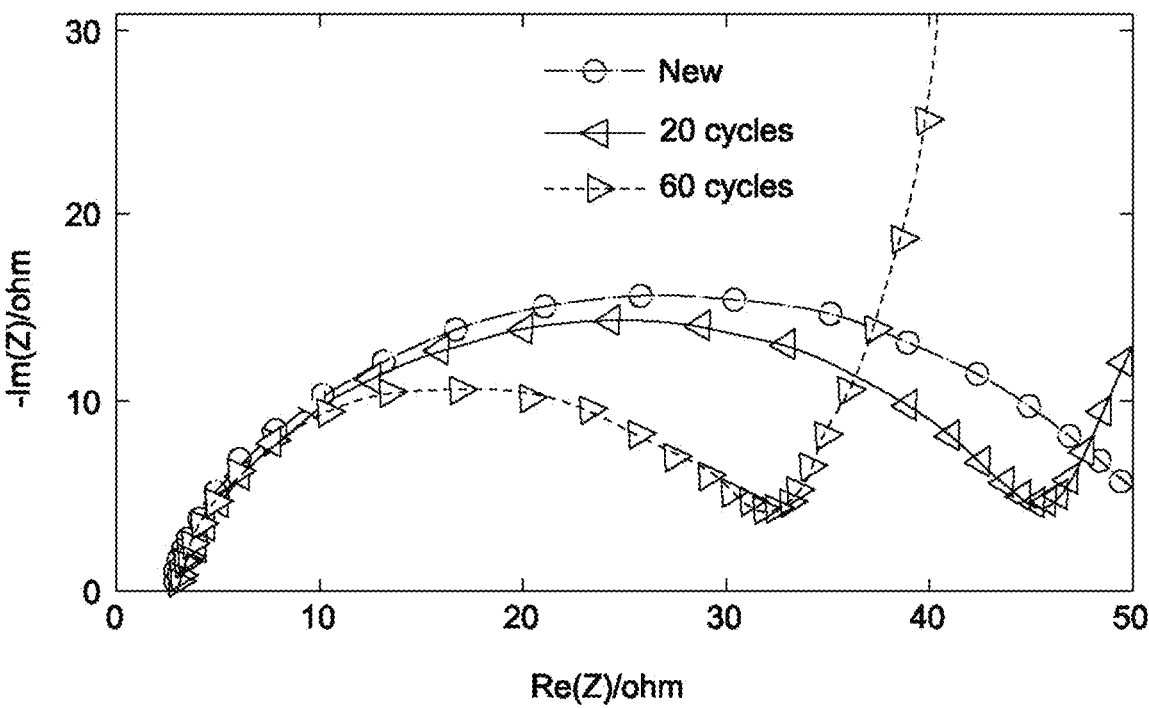
Figure 30A:
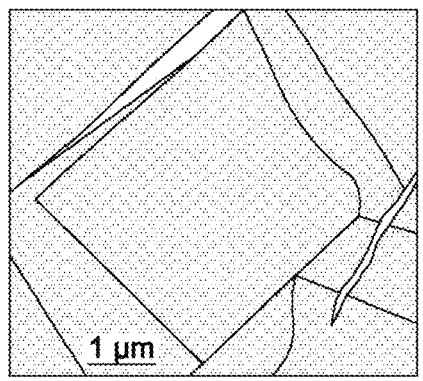
FIGS. 30A-D show SEM images for (FIG. 30A) $LiCoO_2$ electrodes at new status and (FIG. 30C), (FIG. 30D) $LiCoO_2$ electrodes after going through 40 cycles. Cracks are identified on the aged $LiCoO_2$ particles.
Figure 30B:
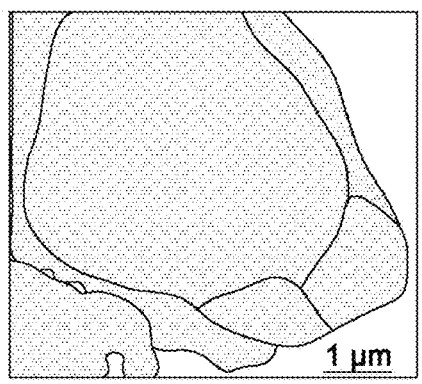
Figure 30C:
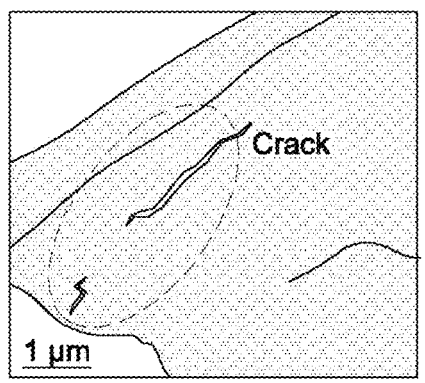
Figure 30D:
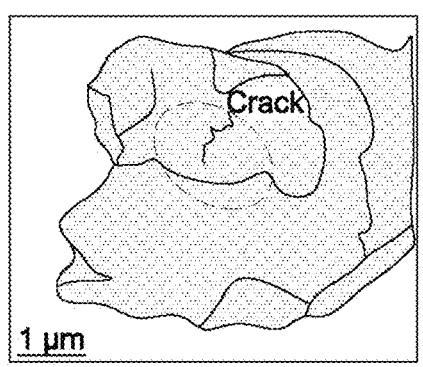

$LiCoO_2$ Cycling Stability Tuned by Polymer Nanolayers. The evolution of capacity and resistance represents the cycling stability of the $LiCoO_2$ electrodes. FIG. 28A and FIG. 29A each show that the PEDOT not only increases the $LiCoO_2$ initial capacity from 153.0 mA h/g to 172.7 mA h/g, but also extends its cycling number from 38 to 100 (50% capacity remaining) when cycled between 3.0-4.5 V at C/2. In comparison, the copolymer decreases both initial capacity and the cycling number, while the PDVB shows little effects. FIG. 29B shows the Li diffusion coefficient in a pristine $LiCoO_2$ electrode decreases two orders of magnitudes (from $10^{-11}$ cm$^2$ S$^{-1}$ to $10^{-13}$ cm$^2$ S$^{-1}$) after 80 cycles. This may be alleviated by the PEDOT nanolayer but may be accelerated by the copolymer, as shown in FIG. 28B. FIG. 29C indicates the overall impedance of cells using pristine $LiCoO_2$ electrodes may increase an order of magnitude (from 250Ω to 2500Ω) after 60 cycles. This increase may be alleviated by the PEDOT nanolayer, but may be accelerated by the copolymer coating (see FIG. 28C). The $R_{et}$ dominates the increase of the overall impedance, which may relate to the surface degradation of $LiCoO_2$ electrodes affecting the resistance increase. FIG. 28D shows the $R_o$ changes very little during the cycling test, which may indicate the electrolyte resistance and electron path in electrodes does not change. Additionally, the $R_{CEI}$ slightly decreases during the cycling test, which may relate to micro-cracking of $LiCoO_2$ electrodes during the cycling test that may cause increase electrodes surface area, as shown in FIG. 30.

Figure 31A:
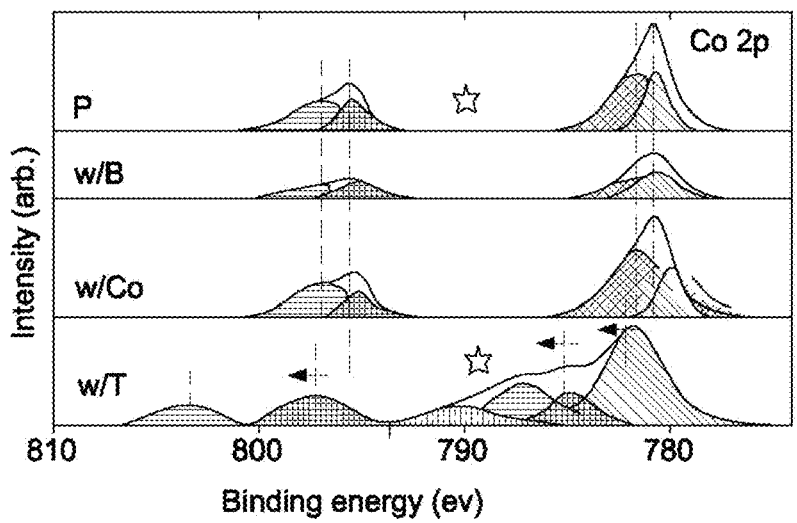
FIGS. 31A-E show the interaction between polymers and the surface of $LiCoO_2$, XPS spectra of (FIG. 31A) Co 2p, (FIG. 31B) S 2p, (FIG. 31C) O 1s in different samples. Where P is pristine $LiCoO_2$, w/B the PDVB-coated $LiCoO_2$, w/Co the copolymer-coated $LiCoO_2$, w/T the PEDOT coated $LiCoO_2$, T the PEDOT film. Measurement data (dots) are fitted by several individual spectra (shaded regions). The combined spectra from these shaded regions is shown as an envelope that matches well with experimental data (dots). Electron density difference plots for (FIG. 31D) EDOT and (FIG. 31E) DVB binding to the $LiCoO_2$ surface using an isovalue of 0.01. Light regions correspond to an electron density gain, and dark regions corresponds to an electron density loss.
Figure 31B:
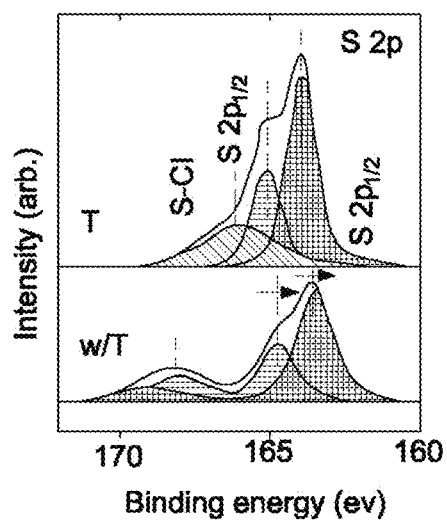
Figure 31C:
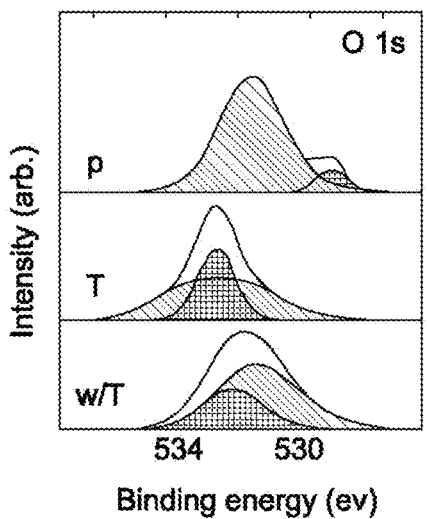
Figure 31D:
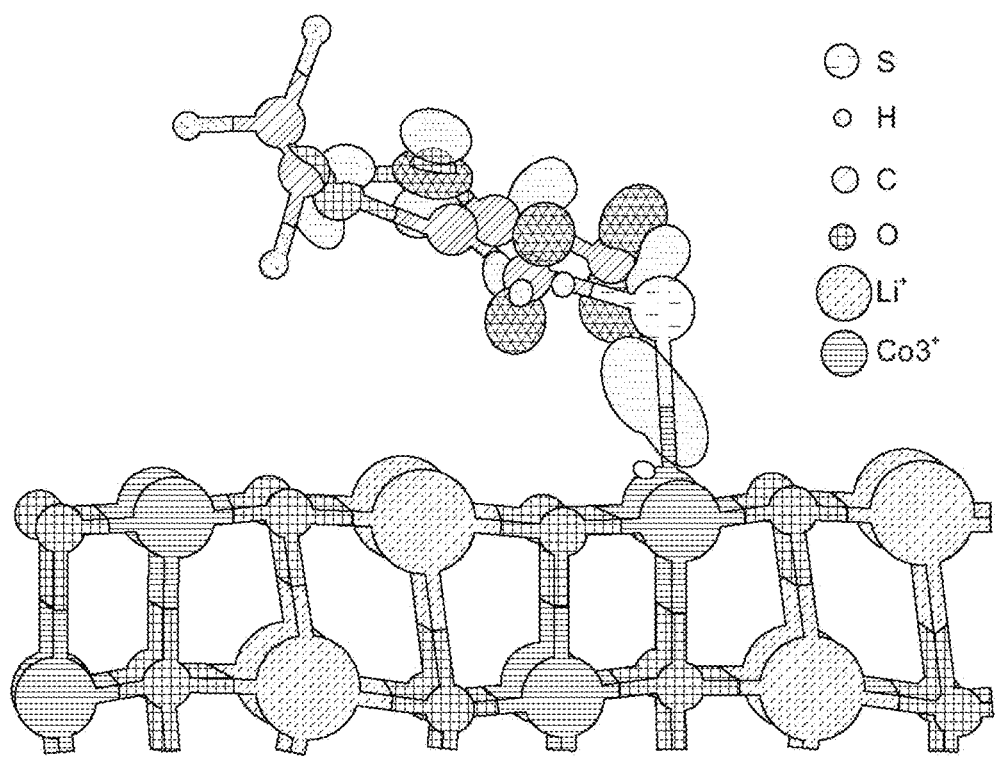
Figure 31E:
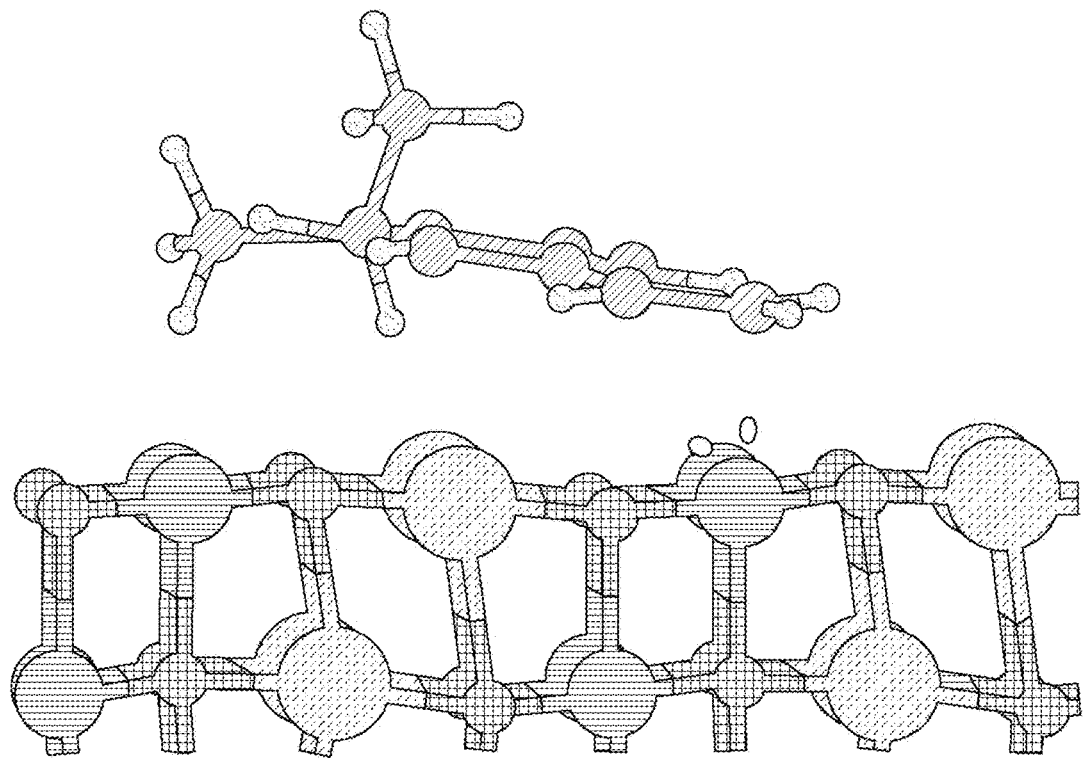

To understand different cycling stabilities of $LiCoO_2$ electrodes, the interaction between polymers and the electrodes may be characterized through XPS and DFT simulation. FIG. 31A shows that the binding energy of Co' 2p 3/2 peak in a $LiCoO_2$ electrode may not be affected by the PDVB and the copolymer, while it may be increased from 780.61 eV to 781.72 eV after the PEDOT coating. Similar trends may be found for other Co 2p peaks. FIGS. 31B and 31C each show that the binding energies of S 2p and O 1s in PEDOT may decrease after being engineered on a $LiCoO_2$ electrode. The fitted values for all peaks are listed in Table 8 and Table 9. These results indicate that the Co at the surface of $LiCoO_2$ may form chemical/covalent bonds with the S and O in the PEDOT. These bonds may stabilize Co element in $LiCoO_2$ during the cycling test and therefore improve the cycling stability of $LiCoO_2$ electrodes.

DFT calculations may characterize the interaction between $LiCoO_2$ and the EDOT/DVB monomer units, as shown in FIG. 31. The EDOT and DVB molecules may bind to the $LiCoO_2$ surface in orientations that increase/maximize their contact to the surface. EDOT may bind slightly more favorably than DVB ($\Delta E_{bind}$, EDOT=−1.36 eV, $\Delta E_{bind}$, DVB=−1.29 eV). Tables 8 and 9 decompose the binding energies of both molecules into their electronic and dispersion components. Ninety-six percent of the DVB-$LiCoO_2$ binding energy may relate to dispersion interactions (−1.24 eV of −1.29 eV), while only 68% of the EDOT-$LiCoO_2$ binding energy may relate to dispersion interactions (−0.92 eV of −1.36 eV). FIG. 31D shows that interactions between EDOT and the surface impact the electronic state of the EDOT molecule and the closest Co atom in the surface. Referring to FIG. 31E, small changes of electronic structure are shown for DVB. Without wishing to be bound to any particular theory, it is believed that EDOT is chemically adsorbed to the surface, while DVB is physically adsorbed to the surface.

The dispersion contribution to the DVB binding energy (−1.24 eV) is greater than that of EDOT (−0.92 eV). When the dispersion contributions are scaled by the cross-sectional area of each molecule that interacts with the surface, the dispersion interactions have a similar magnitude (see Table 19). Therefore, when PEDOT and PDVB occupy a similar amount of surface area at the $LiCoO_2$-polymer interface, the total magnitude of the attractive dispersion interactions may be similar. The presence of the additional chemisorption interactions that may occur between PEDOT and Co atoms on the surface may cause PEDOT to form a stronger overall interaction to the surface than PDVB.

Figure 33A:
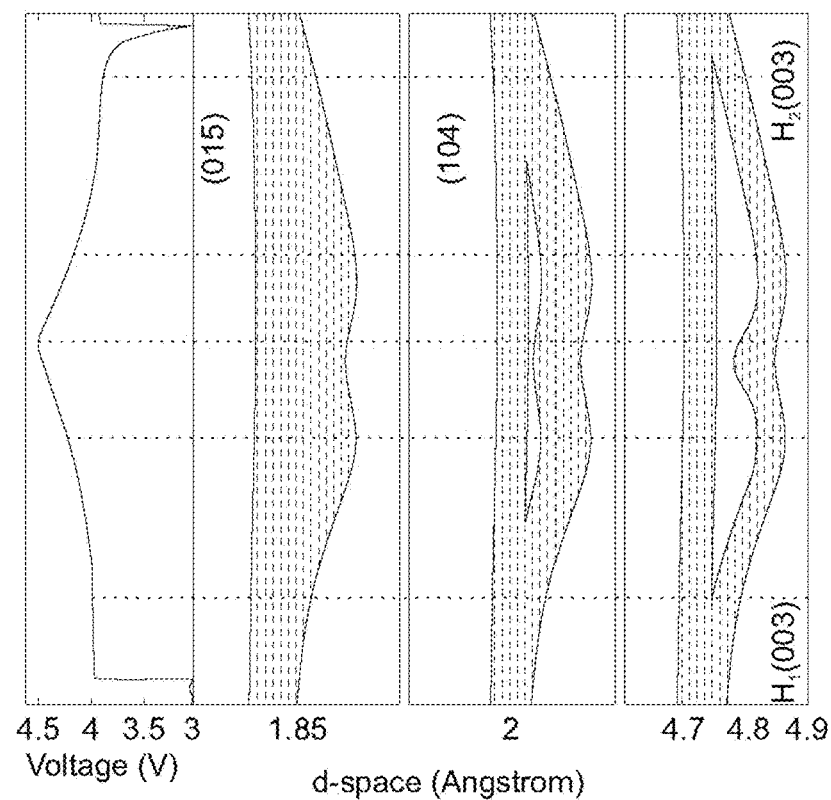
FIGS. 33A-D show in-situ operando synchrotron ED-XRD characterization for $LiCoO_2$ electrodes during a high voltage cycling test.
Figure 33B:
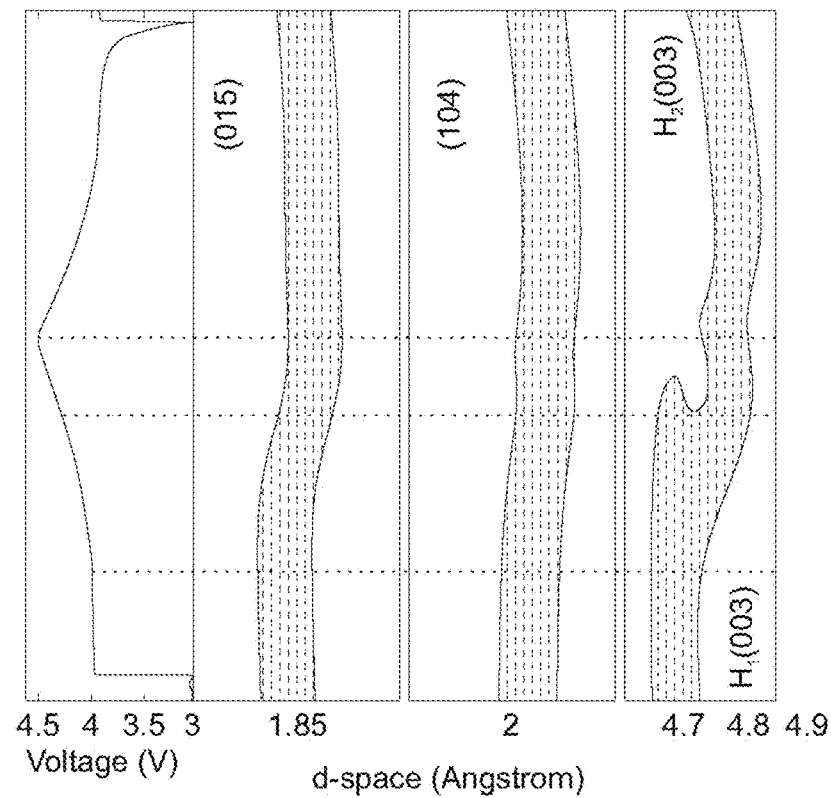

In-situ operando synchrotron energy dispersive X-ray diffraction (ED-XRD) may be used to characterize the effect of PEDOT coating on the structure evolution of $LiCoO_2$ during the cycling test. FIGS. 33A and 33B show the evolution of the ED-XRD patterns correlates well with the electrochemical process. Generally, $Li_xCoO_2$ may undergo metal-insulator transition between two hexagonal phases ($H_1$ to $H_2$) when x decreases from 0.95 to 0.75, and $H_2$ phase has a larger c parameter than $H_1$ phase. When x<0.75, the $H_1$ phase may disappear resulting in a single-phase region with only $H_2$ phase and c lattice parameter almost increases linearly. When x=0.5, the $Li_xCoO_2$ may undergo an order/disorder transition where the phase transfer from hexagonal to monoclinic and then transfer back to hexagonal and the c parameter of $H_2$ phase reaches its maximum. Maintaining de-lithiation when x<0.5 may induce a dramatic decrease of the c parameter of the hexagonal phase.

Figure 33C:
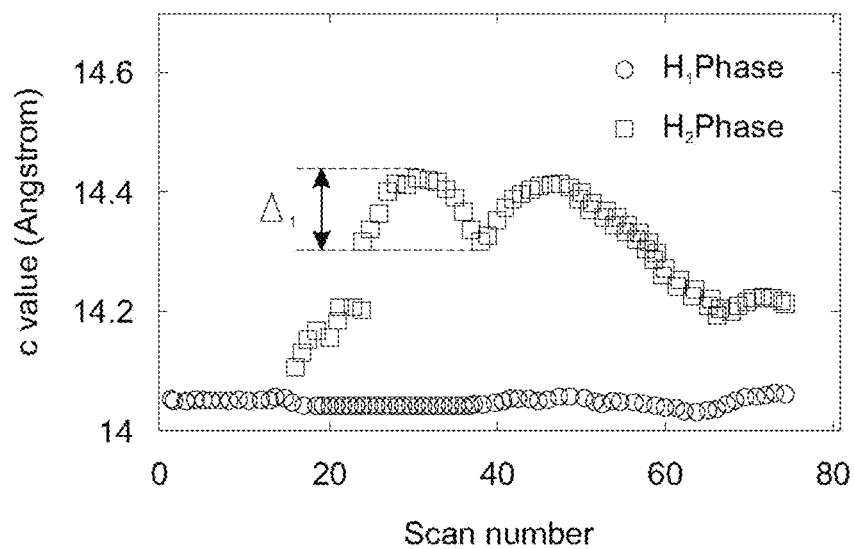
Figure 33D:
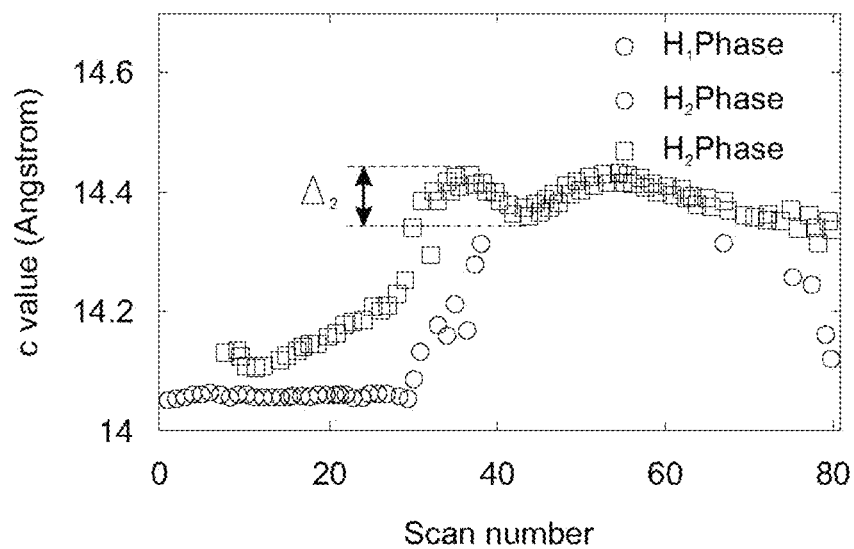

FIG. 33C shows the evolution of c parameter during cycling of a pristine $LiCoO_2$ electrode follows well with the above trend. However, the $H_1$ phase may not disappear during the cycling process because some $LiCoO_2$ particles may not be active in the electrode. Such inhomogeneous current distribution may be alleviated by the PEDOT nanolayer, as shown in FIG. 33D, that the $H_1$ phase disappears in the PEDOT-coated $LiCoO_2$ electrode after 30 scans. By improving the homogeneous current distribution, PEDOT may alleviate the degree of overcharging for active $LiCoO_2$ particles, as indicated from the variation of c lattice parameter ($\Delta_2<\Delta_1$). This may relate to the improved capacity retention from PEDOT-coated $LiCoO_2$ electrodes.

Non-uniform physical structures and processes coupled with heterogeneous chemical activities at surfaces and in the bulk of battery materials may result in the heterogeneity in electrochemical processes at both the electrode and individual grain levels.

Figure 32A:
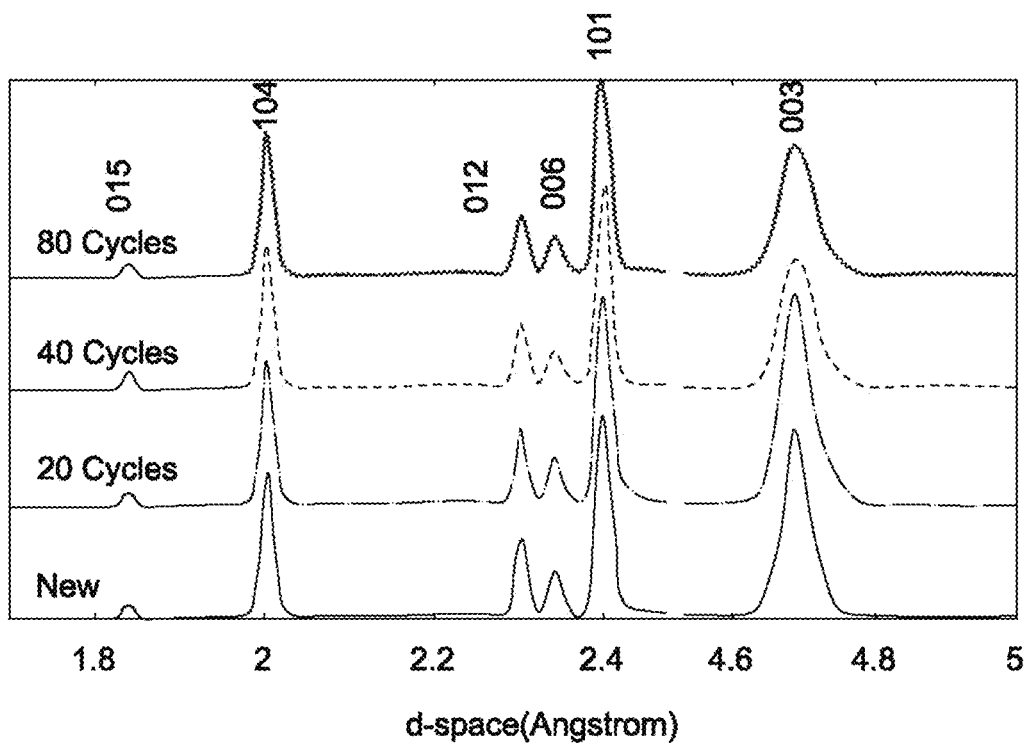
FIGS. 32A and 32B show comparison of ED-XRD data of (FIG. 32A) a pristine $LiCoO_2$ electrode and (FIG. 32B) a PEDOT-coated $LiCoO_2$ electrode after they go through different cycles.
Figure 32B:
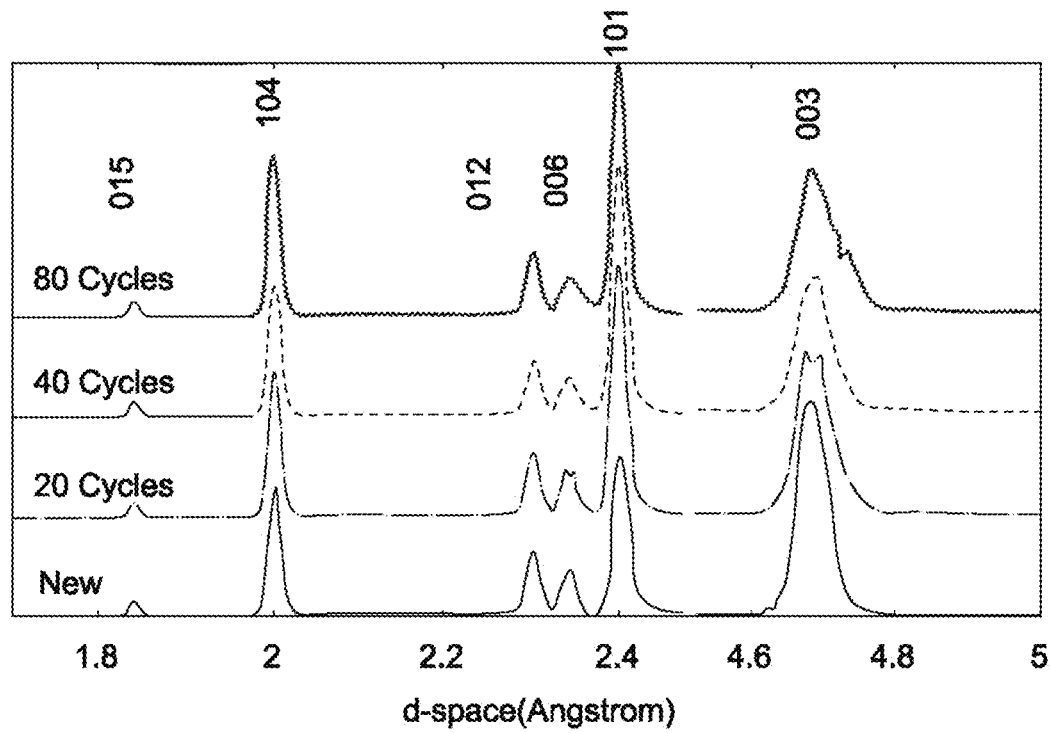
Figure 34:
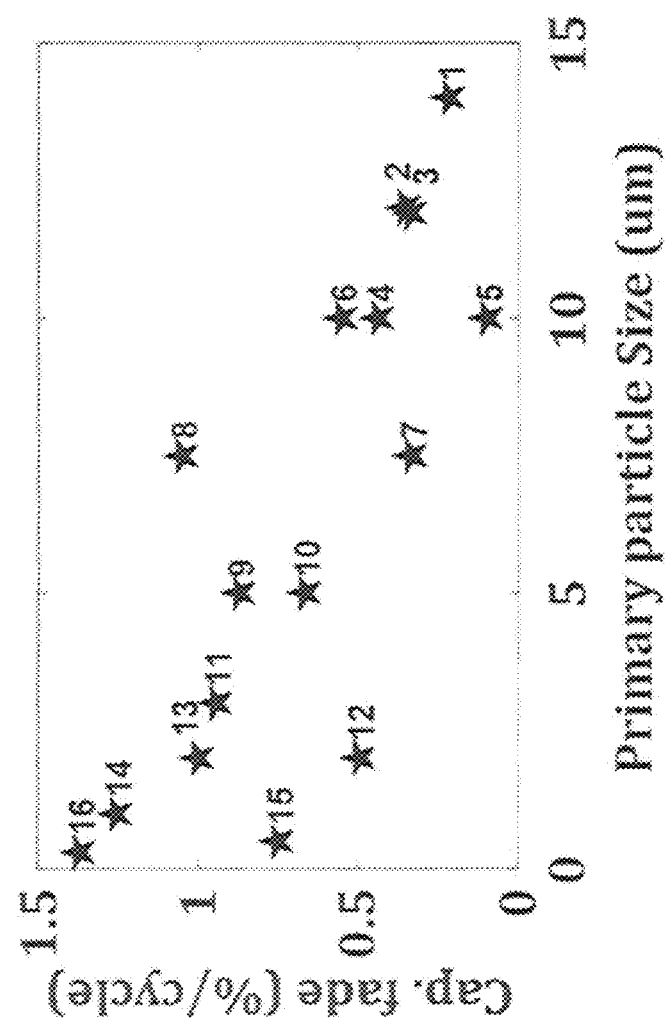
FIG. 34 shows comparison high voltage (4.5V) cycling performance of pristine $LiCoO_2$ comprising different particle sizes.

The structural instability of $LiCoO_2$ has been widely blamed for fast capacity fading at high voltages, even though full extraction of lithium (x=0) does not destroy its structure. However, the surface instability may facilitate fast capacity degradation during high voltage applications in $LiCoO_2$. Indeed, the capacity fading rate of $LiCoO_2$ may be directly proportional to the total surface area of the $LiCoO_2$ particles (see FIG. 34). Moreover, referring to FIG. 32, XRD patterns of $LiCoO_2$ electrodes at different aging statues shows that the crystal structure of the electrodes may not change. Thus, the performance may be improved when the surface of the $LiCoO_2$ electrodes is protected.

Figure 35A:
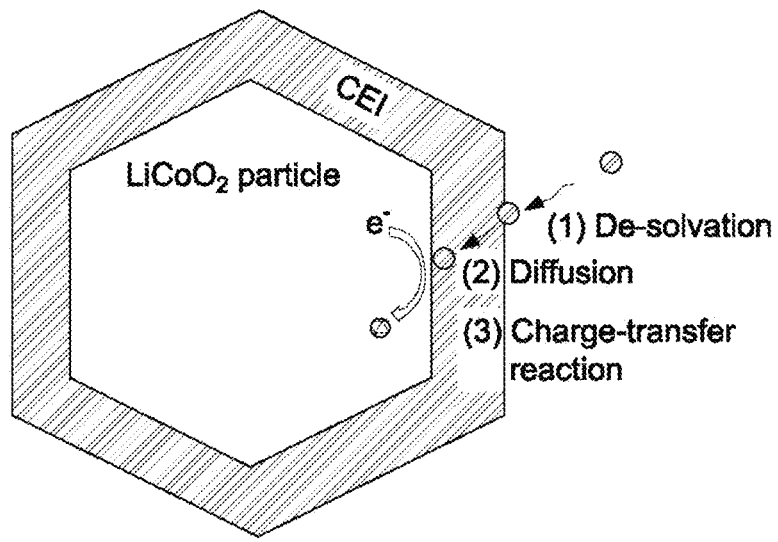
FIGS. 35A and 35B show schematics to illustrate the kinetics and cycling stability of $LiCoO_2$ electrodes.
Figure 35B:
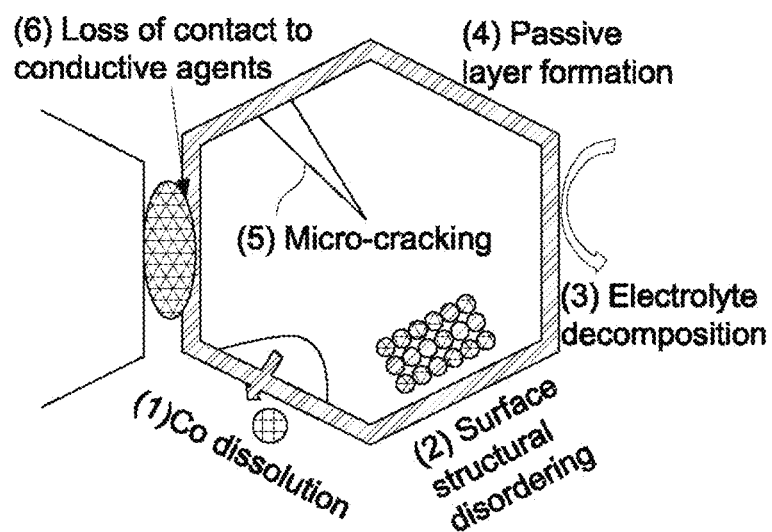

FIGS. 35A and 35B include schematics to show how polymers affect the performance of $LiCoO_2$ electrodes. FIG. 35A illustrates the steps of $Li^+$ transport from electrolyte to a $LiCoO_2$ particle. PEDOT shows small binding energy with and enough binding sites for $Li^+$, making the diffusion process favorable. Additionally, the binding energy between $Li^+$ and PEDOT may balance the de-solvation process and the charge-transfer process, resulting in small $R_{ct}$ for the PEDOT-coated $LiCoO_2$ electrode. FIG. 35B shows the aging mechanisms of $LiCoO_2$ electrodes. The effect of PEDOT nanolayers on improving the cycling stability of $LiCoO_2$ electrodes may be related to at least one of the following aspects. First, PEDOT may form chemical/covalent bonds with Co atoms in $LiCoO_2$ (see FIG. 31), which inhibit Co dissolution and alleviate lattice O releasing and surface structural disordering. Second, these bonds may alleviate parasitic reactions because Co atoms have been shown to be the active sites for electrolyte decomposition. Secondly, the PEDOT nanolayer may uniformize current distribution over the entire electrode (see FIG. 33), which may reduce local current density and relieve over-charging of $LiCoO_2$ particles. Third, the PEDOT nanolayer may decrease the variance of c parameter during the cycling test (see FIG. 33). This may alleviate the mechanical fatigue of $LiCoO_2$ particles. Fourth, PEDOT may be a good conductor for both electron and $Li^+$, and thus the loss of contact to conductive agents for $LiCoO_2$ particles may be mitigated with the PEDOT nanolayer.

In summary, a polymer useful for artificial CEIs for $LiCoO_2$ electrodes may be characterized by a reasonable binding energy with and enough binding sites for $Li^+$ may improve the kinetics of $Li^+$ transport between electrolyte and electrodes, and/or functional groups with strong electronegativity that interact with transition metals on the surface of electrodes to improve the cycling stability. See Laisuo, Su et al., *Surface Engineering of a $LiMn_2O_4$ Electrode Using Nanoscale Polymer Thin Films via Chemical Vapor Deposition Polymerization, ACS Appl. Mater. Interfaces* 2018, 10, 27063-27073.

CVD polymerization. iCVD system may be used to synthesize PDVB and P(PFDA-co-DVB), while oCVD system may be used to synthesize PEDOT. The schematics of the two systems are shown in FIG. 21A, 21B. All chemicals are purchased from Sigma-Aldrich without further purification, including DVB, EDOT, PFDA, t-butylperoxide (TBPO) and $FeCl_3$. To synthesize PEDOT, the flow rate of EDOT monomer and Ar carrier gas is 1 sccm and 2 sccm, respectively. The chamber pressure is held constant at 50 mTorr, the stage temperature is controlled to 130° C., and the temperature of crucible is 200° C. that contains $FeCl_3$ oxidant. The thickness of the film may be controlled by varying deposition time. To grow PDVB, the flow rate of DVB monomer, TBPO initiator, and Ar carrier gas are 1.3 sccm, 2.0 sccm, and 8.5 sccm, respectively. The chamber pressure is held constant at 500 mTorr, the stage temperature is controlled to 25° C., and the filament temperature is 230° C. to cleave TBPO initiator. Such condition gives $P_m/P_{sat}$=0.14 that is low enough to provide conformal coating for complex structure. As for P(PFDA-co-DVB) synthesis, the flow rate of PFDA monomer, DVB monomer, TBPO initiator, and Ar carrier gas are 0.16 sccm, 0.6 sccm, 1.0 sccm, and 0.4 sccm, respectively. The chamber pressure is held constant at 100 mTorr, the stage temperature is controlled to 30° C., and the filament temperature is 230° C. to cleave TBPO initiator. The $P_m/P_{sat}$=0.10 for PFDA monomer that provides conformal coating for $LiCoO_2$ electrodes. The thicknesses of iCVD films are monitored by an interferometry and thus the desired thickness may be achieved.

Material characterization. SEM and EDS are conducted on Quantum 600 using a 5.0 kV accelerating voltage, and the spot size is 5.0 nm (diameter). The trench is 6 μm deep and 1 μm wide with an 8 μm spacing between the trenches. A 2 nm thick platinum is coated on the surface of the samples to reduce the surface charging during SEM imaging. TEM is carried out on a JEOL 2000EX electron microscope operating at 200 kV in a bright field. Copper grids (300 mesh) coated with about 50 Å thick amorphous carbon film are utilized to hold $LiCoO_2$ particles. The whole grids are placed in CVD chambers to be coated with polymers. Then, TEM images are taken on these samples. Raman spectroscopies are measured using the NT-MDT Spectra AFM/Raman system equipped with a visible Raman microscope and a CCD detector. The excitation wavelength is 532 nm, and the spectra are obtained over 10 s at a 1.0 $cm^{-1}$ resolution. XPS measurements are tested using monochromatized Al K a radiation (1486.7 eV) as the X-ray source. The base pressure is $10^{-8}$ Pa and the spot diameter is 600 μm during the test. Three survey scans with a step size of 1.0 eV are collected, followed by ten high-resolution scans with a step size of 0.1 eV for target elements. The binding energies are calibrated by the C 1s hydrocarbon peak (284.8 eV). The XPS spectra are analyzed by AVENTAGE software with the following parameters: full width at half-maximum (eV)=0.5:3.5 and Lorentzian/Gaussian=30%.

Electrochemical Characterization. Electrochemical performance was measured in CR2016 coin cells. The $LiCoO_2$ electrodes are made by casting a slurry that contained 80% $LiCoO_2$, 10% polyvinylidene fluoride binder, and 10% super-P conductive agent onto Al current collectors. The typical load is 3-4 mg cm'. After drying, disks having a diameter of 14 mm are punched and used as cathodes. Coin cells are assembled in glove box having $H_2O$ and $O_2$ levels less than 0.5 ppm using lithium chip as anode, Cellgard separator, and IM $LiFP_6$ dissolved in ethylene carbonate/diethyl carbonate (1:1 in volume) as electrolyte. The PDVB-coated and copolymer-coated $LiCoO^2$ electrodes are utilized directly, while the PEDOT-coated $LiCoO_2$ is rinsed in methanol for 5 minutes to remove residual monomer and oxidant. The electrochemical performances of coin cells are tested using a Biologic VMP3 and a LAND battery cycler. All cells are cycled using C/10 rate within voltage range of 3.0-4.2 V before conducting other tests. All tests are conducted at room temperature unless otherwise stated. The rate capability is measured using constant-current (CC) constant-voltage (CV) charging protocol followed by CC protocol at different C-rates within 3.0-4.2 V. The current during CC charging is C/3 and the cut-off current during CV charging is C/100. EIS measurement is conducted at 4.0 V for all cells by applying an AC voltage of 10 mV amplitude over the frequency range of 100 kHz to 10 mHz. High voltage cycling test is carried out within voltage range of 3.0-4.5 V at C/2 using CC protocol for both charging and discharging. The GITT measurement is conducted by applying a 10 min galvanostatic charge/discharge pulse (C/10) followed by a 2 h relaxation within voltage range of 3.0-4.5 V.

Neutron Depth Profiling. NDP data may be acquired at Neutron Guide 5 (NG5), Cold Neutron Depth Profiling station at the NIST Center for Neutron Research (NCNR) at the National Institute of Standards and Technology (NIST). Samples may be mounted behind a 6.0 mm circular, Teflon® aperture. Each sample may be irradiated at a near constant fluence rate of cold neutrons (about $10^9$ cm$^{-2}$ s$^{-1}$), and all experiments may be conducted under vacuum and near room temperature. NDP spectra may be collected for about 4 hours per spot. $^6$Li nuclear reaction triton (t) and alpha (a) particles may be detected using a circular transmission-type silicon surface-barrier detector that is positioned about 120 mm from the sample surface. Each spectrum is corrected for dead time (about 0.01%) and background signals.

Interactions of the triton ($^3$H) particles with the polymers may be modeled in SRIM utilizing the densities obtained by neutron reflectometry. Processed profiles may be used to estimate the relative penetration of Li into the polymers. Li concentrations may be calculated in reference to the known concentration of $^{10}$B in a B-implanted concentration standard. Final reported uncertainties may be reported to 26 and may be calculated from experimental counting statistics.

DFT Simulation. DFT calculations on polymer cluster models are performed using Gaussian 16. Structures are optimized at the B3LYP/6-31G* level with D3 dispersion and Becke-Johnson damping (D3BJ). The energy of each fully optimized structure is recalculated at the B3LYP/cc-pVDZ level with D3BJ dispersion. The vibrational frequencies of optimized molecular structures are calculated at the B3LYP/6-31+G* level with D3BJ dispersion and are used to confirm that all molecular structures are fully optimized. The frequencies are then used within the ideal gas, rigid rotor, and harmonic oscillator approximations to calculate free energy contributions for each structure. The binding sites are identified by systematically placing Li$^+$ atoms at different binding sites and fully optimizing each structure to identify the most favorable binding site and orientation.

Each periodic DFT calculation that contained LiCoO$_2$ surfaces are performed using the Vienna ab intio simulation package (VASP). These calculations utilize the Perdew-Burke-Ernzerhof (PBE), GGA exchange correlation functional and the projector augmented wave (PAW) method. D2 dispersion is utilized to account for Vander Waals interactions. The on-site Hubbard U model (U-J=3.3 eV) to account for the over-delocalization of electron density present in DFT may be used.

The adsorption of EDOT and DVB to a 4-layer thick LiCoO$_2$ surface comprising 48 LiCoO$_2$ formula units in unit cell with a=18.0 Å, b=11.26 Å, gamma=108.22°, and 20 Å of vacuum space are modeled. The LiCoO$_2$ surface is selected because it is stable at a variety of experimental conditions and allows for Li' to be transported away from the surface. Using a gamma-point and an energy cutoff of 800 eV produced converged energies for the LiCoO$_2$ surface with and without adsorbates present. All structures are fully optimized using the default VASP convergence criteria. The bottom 2 layers of the LiCoO$_2$ slab are fixed to bulk LiCoO$_2$ coordinates. The energies for a variety of different EDOT and DVB orientations at different adsorption sites in the surface may be compared to locate low energy adsorbate structures. Electron density difference plots are calculated by subtracting the electron density of the surface and EDOT or DVB from the electron density of the full system. The surface area of the EDOT and DVB molecules that interacted with the LiCoO$_2$ surface are estimated by placing spheres (R=Vander Waals radii, $R_H$=1.20 Å, $R_o$=1.52 Å, $R_c$=1.70 Å, $R_s$=1.80 Å) on each atom of the fully optimized EDOT/DVB molecule adsorbed to the LiCoO$_2$ surface. These spheres are projected onto the XY plane (the plane that is parallel to the surface) to obtain the approximate surface area of each molecule interacting with the surface.

In-Situ ED-X RD Measurement. In-situ operando ED-XRD measurement is conducted using beamline 6-ID-B at the Advanced Photon Sources in Argonne National Laboratory. The white x-ray radiations are generated by bending magnets with spectral flux up to 250 keV, and the detection angles are 2.99 and 6.70 for two Canberra germanium detectors to collect the diffraction spectrum. The in-situ operando experiment is conducted by cycling coin cells at C/2 within 3.0-4.5 V, during which ED-XRD spectrum is collected for 60 s at one point. Three points at different amplitudes, corresponding to different locations to separator, are measured continuously followed by a 60 s rest. The XRD data is collected until the cells went through one full cycle.

Figure 23A:
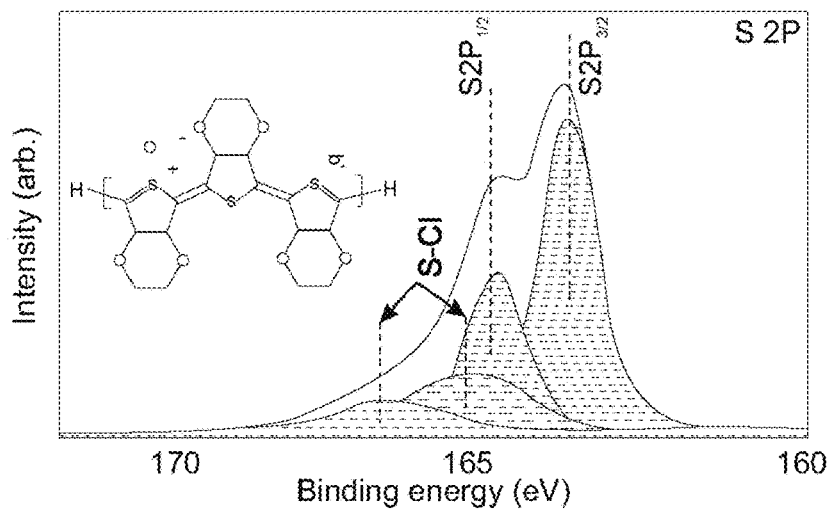
FIGS. 23A-C show X-ray photoelectron spectroscopy spectra for three polymers.

Calculation the Composition of Sulfur Doped PEDOT. When FeCl$_3$ is utilized as the oxidant agent, part of Sulfur may be doped by Cl. XPS may be conducted to study the percentage of S that is doped by Cl, as shown in FIG. 23A. S 2p in PEDOT may have doublet peaks at around 163 eV and 164.3 eV. The other peak at about 165.2 eV may be attributed to the oxidization of S by Cl. The area under the three peaks are 1:0.51:0.55. Therefore, the ratio of Cl doped S is 1/3, which may mean the percentage of S that is doped by Cl is 25%.

$$\frac{S}{S-Cl} = \frac{1+0.51}{0.55} \approx \frac{3}{1} \quad \text{Equation 10}$$

Figure 23B:
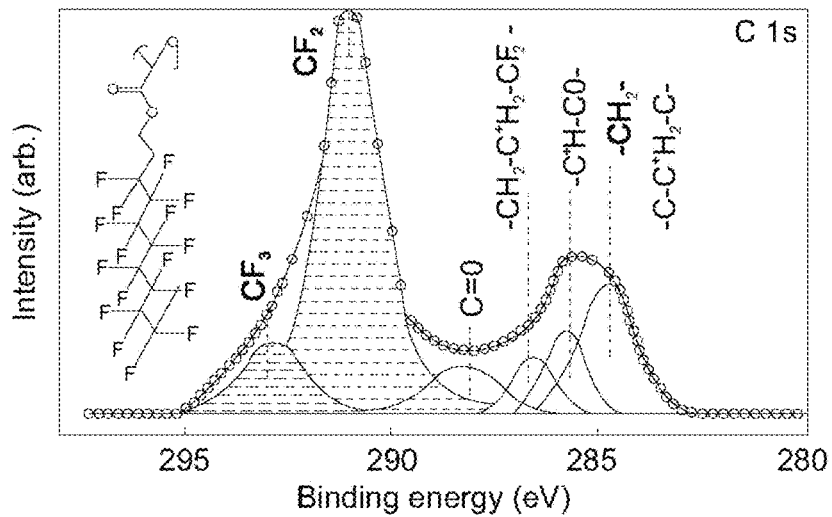
Figure 23C:
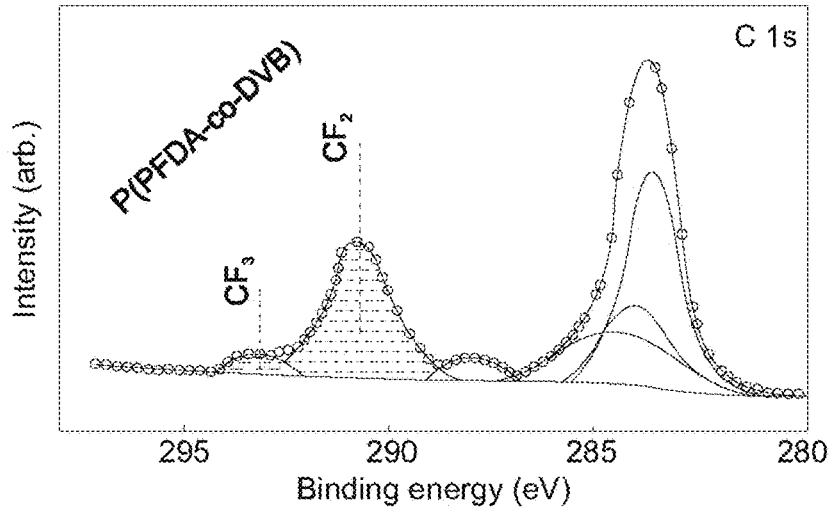

Calculation the Composition of P(PFDA-Co-DVB). XPS may be conducted for both PFDA and P(PFDA-co-DVB) to characterize the composition of the copolymer, as shown in FIGS. 23B and 23C. FIG. 23B shows the C 1s spectrum of PFDA. Each peak may be assigned to different functional groups. The C 1s in —CF$_3$ and —CF$_2$ has the highest binding energy due to the strong electronegativity of fluorine. The area under these two peaks is 64% of the total area, which is close to the theoretical value (62%). Similarly, FIG. 23C shows the C 1s spectrum of P(PFDA-co-DVB). The area ratio under —CF$_3$ and —CF$_2$ may be decreased to 38% due to the existing of DVB. If there are x PFDA copolymerized with y DVB, then x/y is about 5/4 based on the following equation. Thus, the P(PFDA-co-DVB) may comprise 39% PFDA and 61% DVB.

$$\frac{8x}{13x+10y} = 0.28 \quad \text{Equation 11}$$

Calculation the diffusion coefficient of Li$^+$ in LiCoO$_2$. When the pulse time, t, is short and the pulse current is small, the diffusion coefficient of lithium, D, may be calculated by the following equation.

$$D = \frac{4r^2}{\pi\tau}\left(\frac{\Delta E_s}{\Delta E_t}\right)^2 \quad \text{Equation 12}$$

where r is the particle size, $\Delta E_t$ is the total transient voltage change of the galvanic cell for an applied galvanostatic current for the time t, $\Delta E_s$ is the change of the steady-state voltage of the cell for the corresponding step.

Example 4

The electrode-electrolyte interface (EEI) may be useful as a component in lithium-ion batteries (LIBs) due to reactions that occur in this region, including $Li^+$ transfer process and electron combination, electrolyte decomposition, and electrode degradation. Engineering the EEI to comprise desired properties may enable advanced LIBs having higher power densities, higher degree of thermal safety, and/or longer lifespans. For example, $Li^+$ migration at the EEI may mediate the $LiFePO_4$ phase separation. Engineering the EEI with desirable coatings may change in-plane $Li^+$ migration, and, therefore, the electrochemical performance of $LiFePO_4$. Inorganic materials used to modify EEIs, such as metal oxides and metal phosphates, generally have poor $Li^+$ conductivity, leading to poor rate capability of LIBs. Additionally, inorganic compounds may react with HF present in $LiPF_6$-based electrolytes, limiting their protection abilities. In contrast, organic polymers may comprise alternative EEI-modifying materials based on their improved Li+ transport properties and resistance to HF, and therefore, improved rate capability and cycle life simultaneously for LIBs.

Interface engineering may use processes to produce uniform and conformal nanolayers having controllable thickness. Coating methods based on wet chemical processes, such as sol-gel synthesis, hydro/solvothermal synthesis, and chemical polymerization, may incorporate both organic and inorganic materials, but suffer from surface tension and de-wetting effects that lead to non-uniform film thickness and non-conformal surface coverage. Deposition processes, including chemical vapor deposition (CVD) and atomic layer deposition, may alleviate some of the limitations of wet coating methods. However, conventional CVD deposition processes may be limited to inorganic materials and/or use high operation temperatures, e.g., greater than 200° C., which may limit the application of components having low melting points, such as polyvinylidene difluoride binder, for example.

The present invention is directed to low-temperature CVD polymerization processes useful to engineer battery electrodes with uniform and conformal organic polymer coatings. The low-temperature CVD polymerization process may be used to synthesize a wide range of polymer films having uniform thickness and conformal surface coverage at low temperatures. This process may be used to coat PEDOT on both secondary and primary particles of $LiNi_xCo_yMn_{1-x-y}O_2$, for example, to improve electrochemical performance and thermal stability. Without wishing to be bound to any particular theory, it is believed that the improved performance may relate to the ability of PEDOT to trap $Li^+$ under an electric field.

Poly(3,4-ethylenedioxythiophene) (PEDOT) may be compared t, poly(divinylbenzene) (PDVB) and poly(1H,1H,2H,2H-perfluorodecyl acrylate-co-divinylbenzene) (P(PFDA-co-DVB) or copolymer), which are also CVD synthesized polymers. These polymers show good mechanical stability and high melting points. The rate capability and 4.5 V high voltage cycling stability of $LiCoO_2$ may be improved when applying the PEDOT, or significantly degraded when using the P(PFDA-co-DVB). The PDVB may not significantly affect either of rate capability and cycling stability of $LiCoO_2$ electrodes. Multiple characterization methods, including neutron processes (reflectometry, depth profiling) and operando synchrotron energy-dispersive X-ray diffraction, may be applied to characterize the composition of CVD polymers, measure the polymer thin film densities, study $Li^+$ transport between electrolyte and polymer-engineered $LiCoO_2$ electrodes, and the interaction between polymers and $LiCoO_2$ electrodes.

Figure 36A:
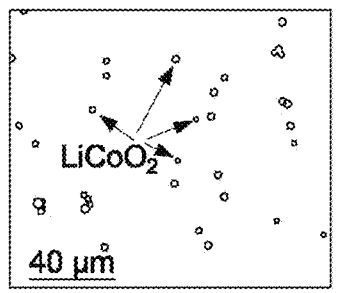
FIGS. 36A-D show a SEM image of $LiCoO_2$ primary particles disperse on (FIG. 36A) carbon tape.
Figure 36B:
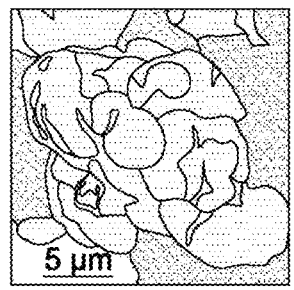
Figure 36C:
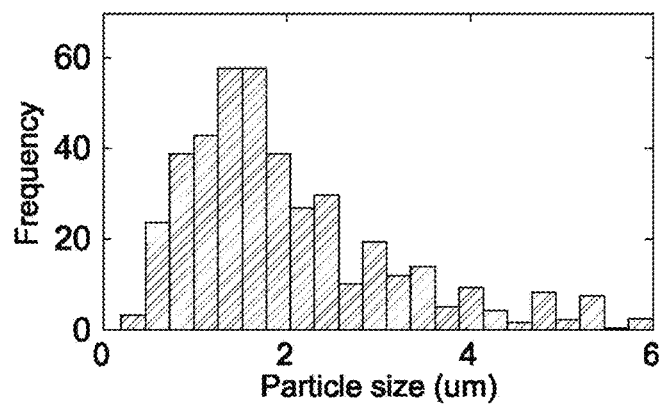
Figure 36D:
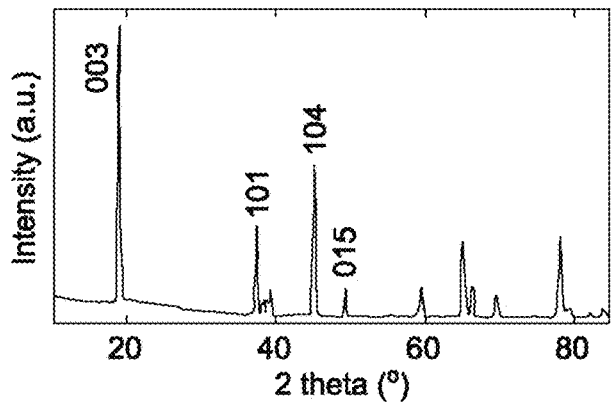

Engineering the Surface of $LiCoO_2$ Electrodes Using CVD Polymerization Processes. The CVD polymerization processes according to the present invention may comprise initiated CVD (iCVD) and/or oxidative CVD (oCVD). The CVD polymerization processes may be used to synthesize dielectric polymers (e.g., PDVB, copolymer) and conducting polymers (e.g., PEDOT), respectively. The $LiCoO_2$ powder may comprise micron-sized secondary particles including primary particles having 2.1 micrometer (mean) diameter, as determined by SEM (FIGS. 36A and 36C). The powder shows the expected hexagonal unit cell with space group of R3m (FIG. 36D). Cast $LiCoO_2$ electrodes, rather than the active material powder, are utilized for the surface engineering during initiated CVD (iCVD) and oxidative CVD (oCVD) polymer deposition processes.

Figure 37A:
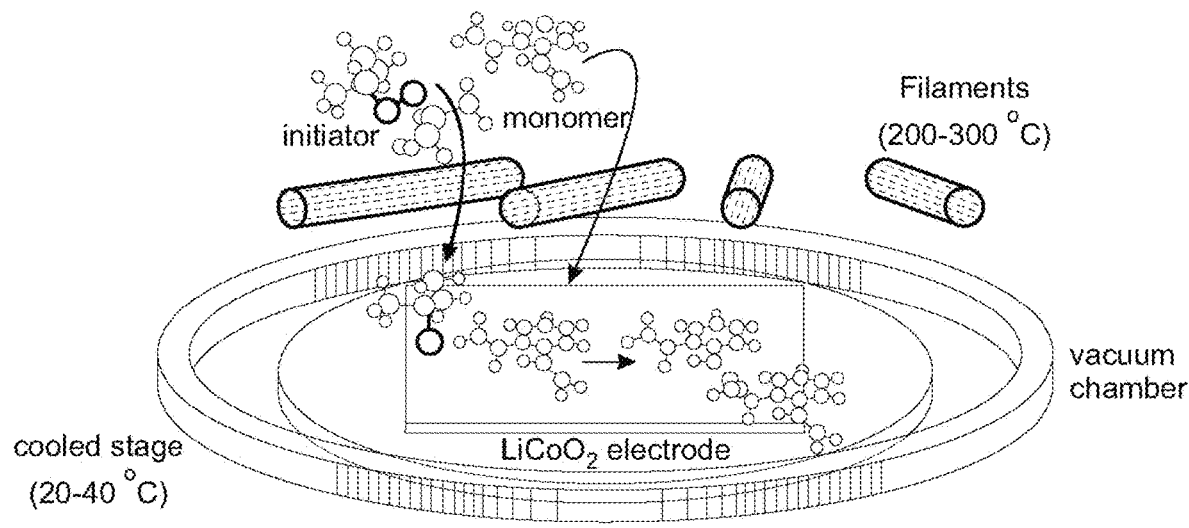
FIGS. 37A-F show a schematic of chemical vapor deposition polymerization processes, and material characterization of polymer coatings on different substrates.
Figure 37B:
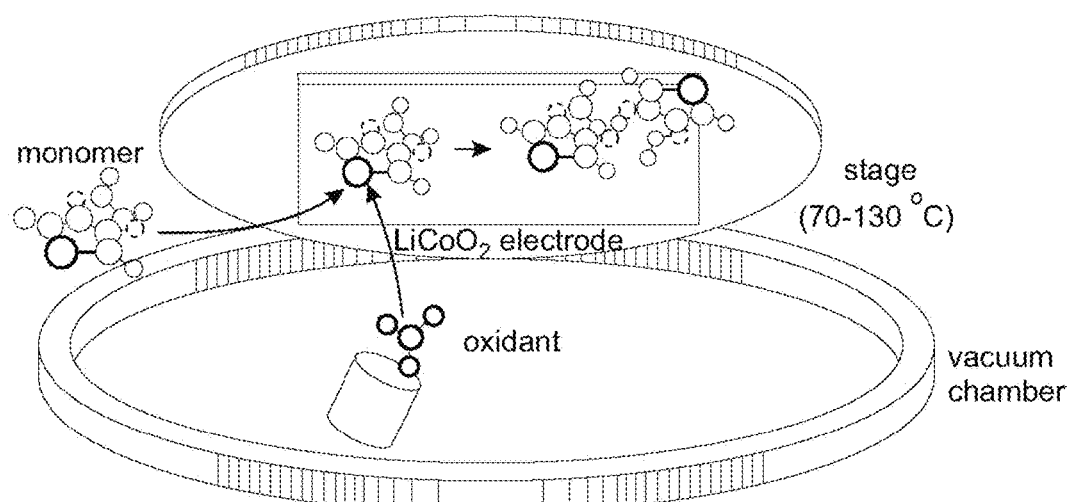

FIGS. 37A and 37B show the schematics of the two CVD polymerization experiment setups. During the iCVD synthesis, the monomer and initiator are vaporized and introduced into a vacuum reactor with controllable flow rates. The labile initiator is thermally cleaved using resistively heated nichrome filaments, generating radicals that attack monomer molecules absorbed on $LiCoO_2$ electrodes and triggers free-radical polymerization. During the oCVD synthesis, the monomer is introduced into a vacuum reactor and absorbed on the surface of $LiCoO_2$ electrodes. $FeCl_3$ oxidant is then sublimed and spontaneously reacted with the monomer vapors, resulting in thin-film growth on $LiCoO_2$ electrodes. The schematics of synthesizing PEDOT, PDVB, and P(PFDA-co-DVB) are illustrated in FIG. 20.

Figure 22B:
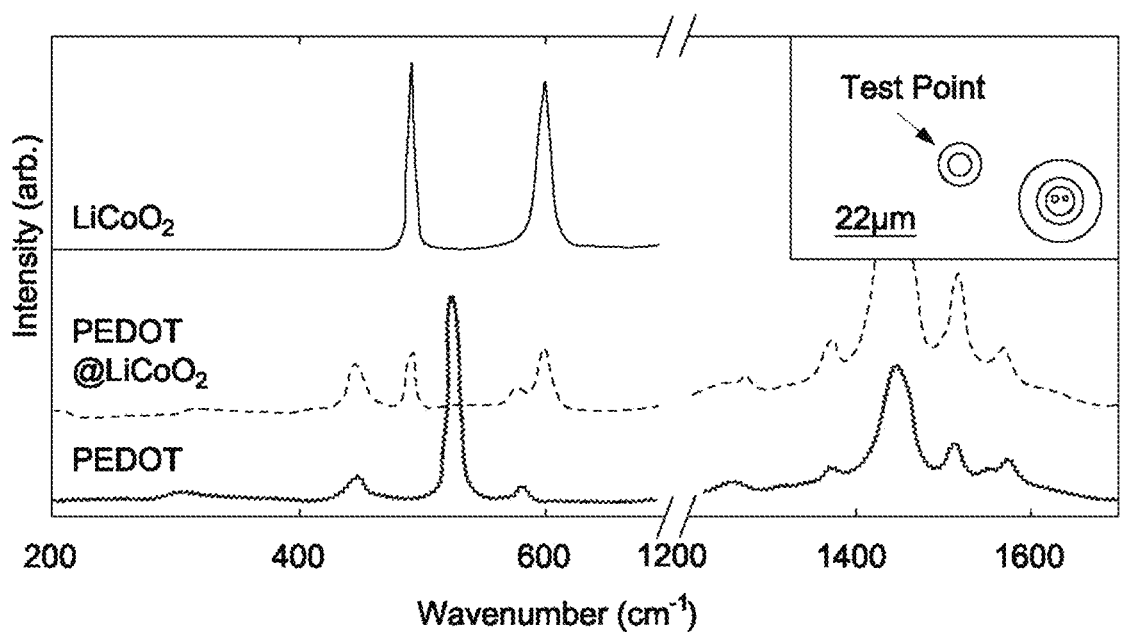

PEDOT and PDVB polymers may be synthesized via CVD polymerization processes. Raman spectra may confirm successful coating of the $LiCoO_2$ electrode with PEDOT (FIG. 22B). X-ray photoelectron spectroscopy (XPS) may be used to characterize the composition of PEDOT and P(PFDA-co-DVB). About 25% of the PEDOT film is doped with Cl from the $FeCl_3$ oxidant, which balances the positive charge in the PEDOT chain (FIG. 23A). In addition, the copolymer sample is comprised of about 39% PFDA and about 61% DVB (FIGS. 23B,C).

Figure 38A:
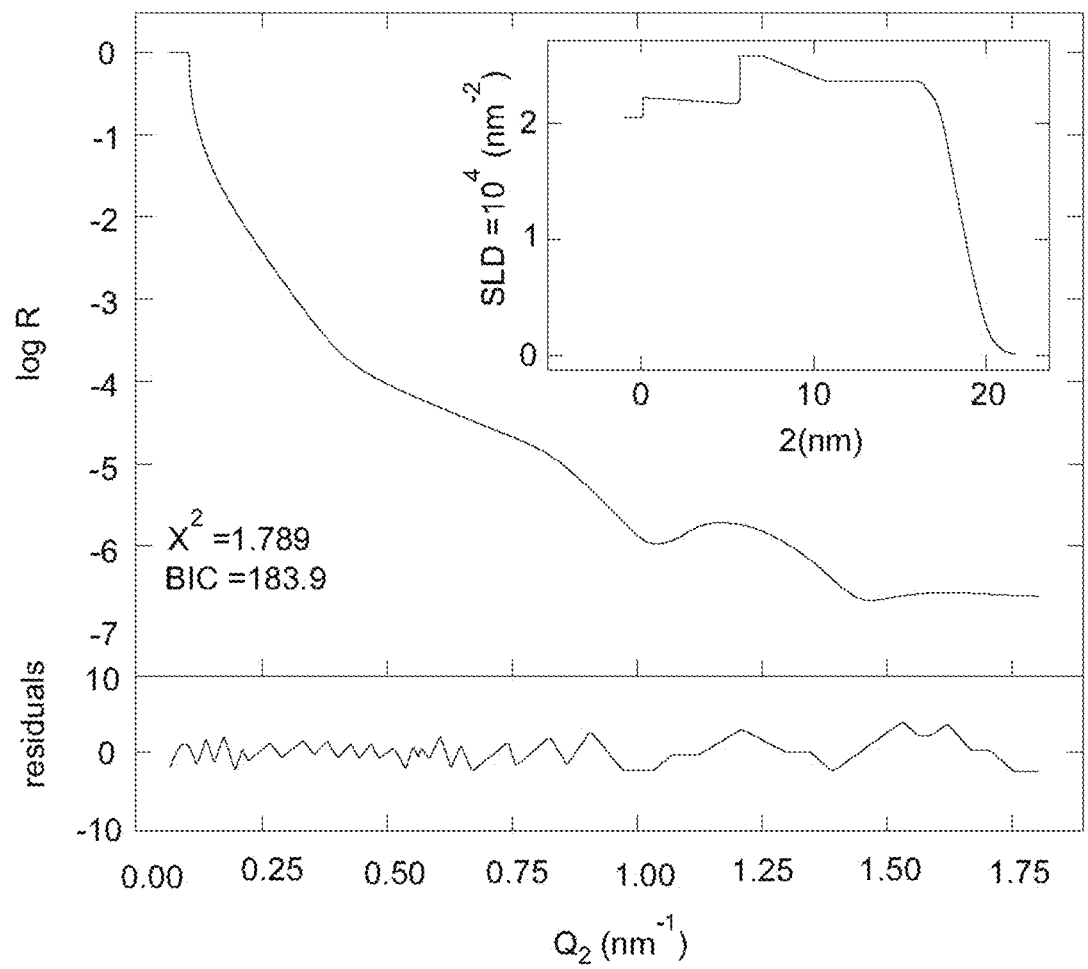
FIGS. 38A and 38B show summary of best-fit-model (Si, SiOx, Poly 1, Poly 2, Air) to NR data collected on the Copolymer sample.
Figure 38B:
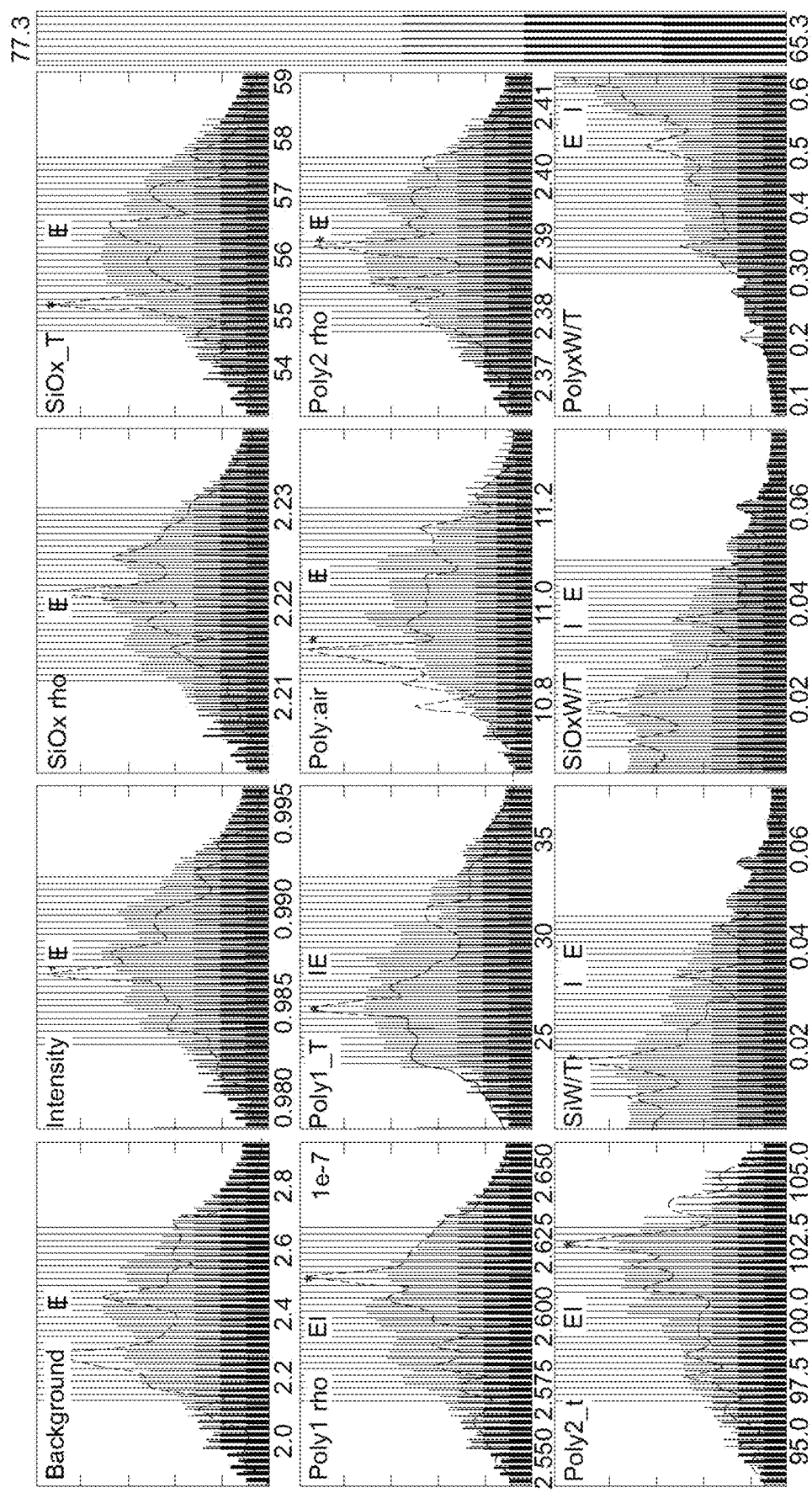
Figure 39A:
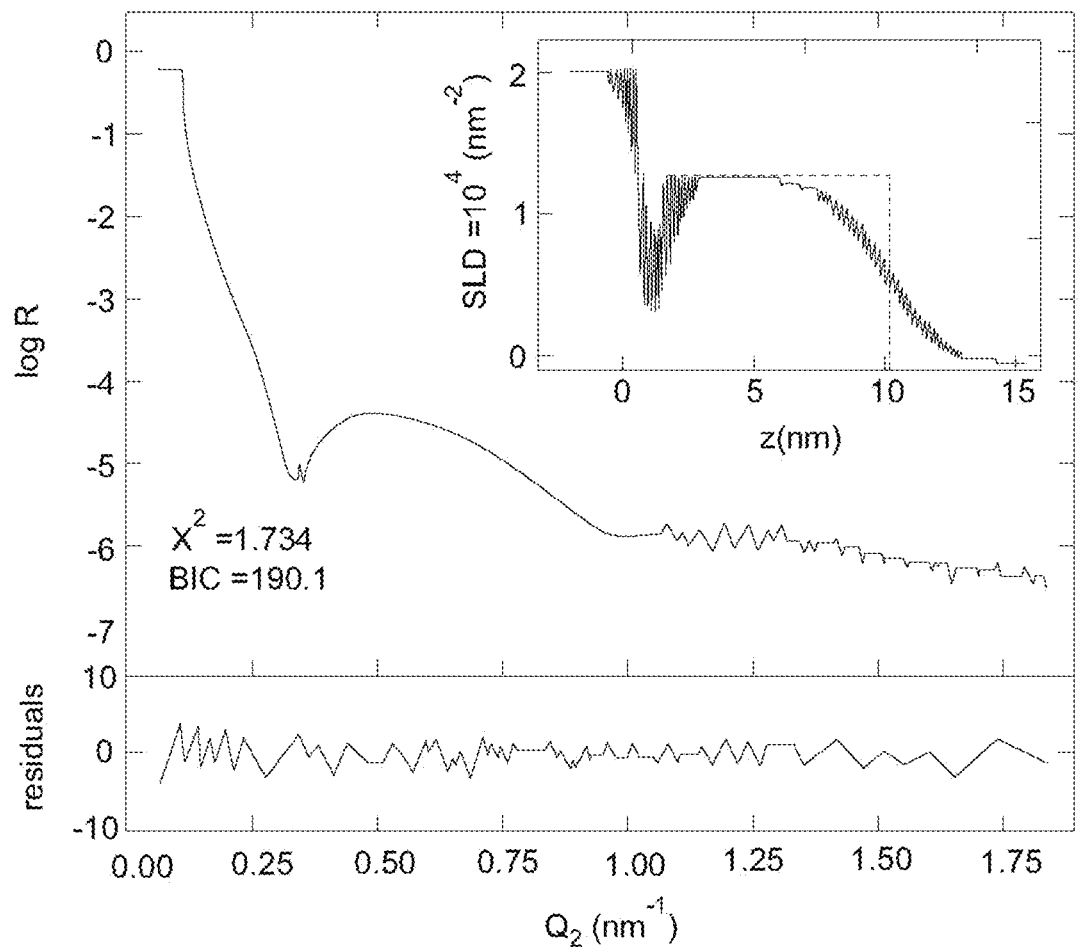
FIGS. 39A and 39B show summary of best-fit-model (Si, Poly 1, Poly 2, Air) to NR data collected on the PDVB sample.
Figure 39B:
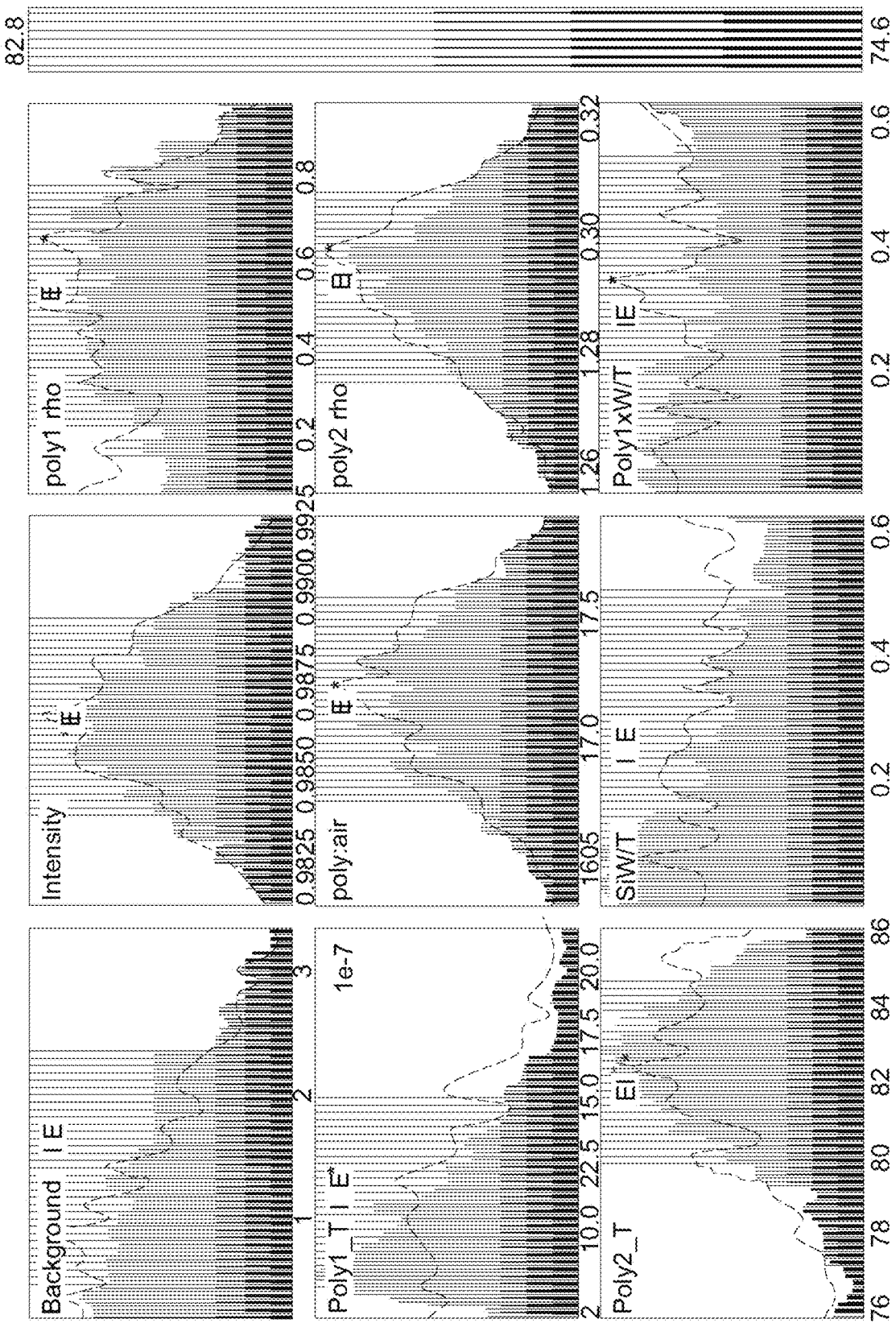
Figure 55A:
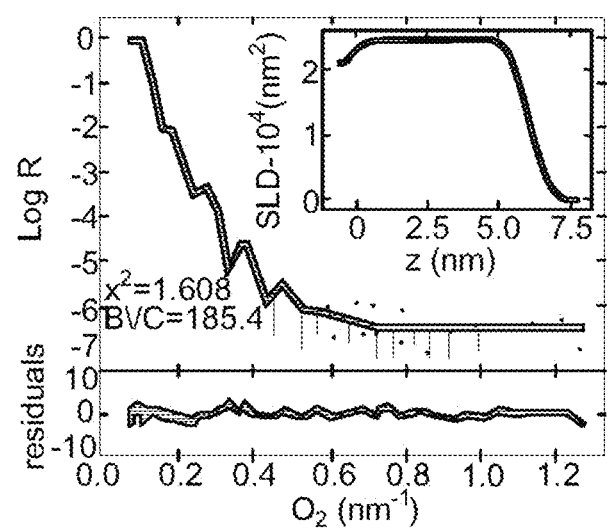
FIGS. 55A and 55B show a summary of best-fit-model (Si, Poly 1, Air) to NR data collected on the PEDOT sample.
Figure 55B:
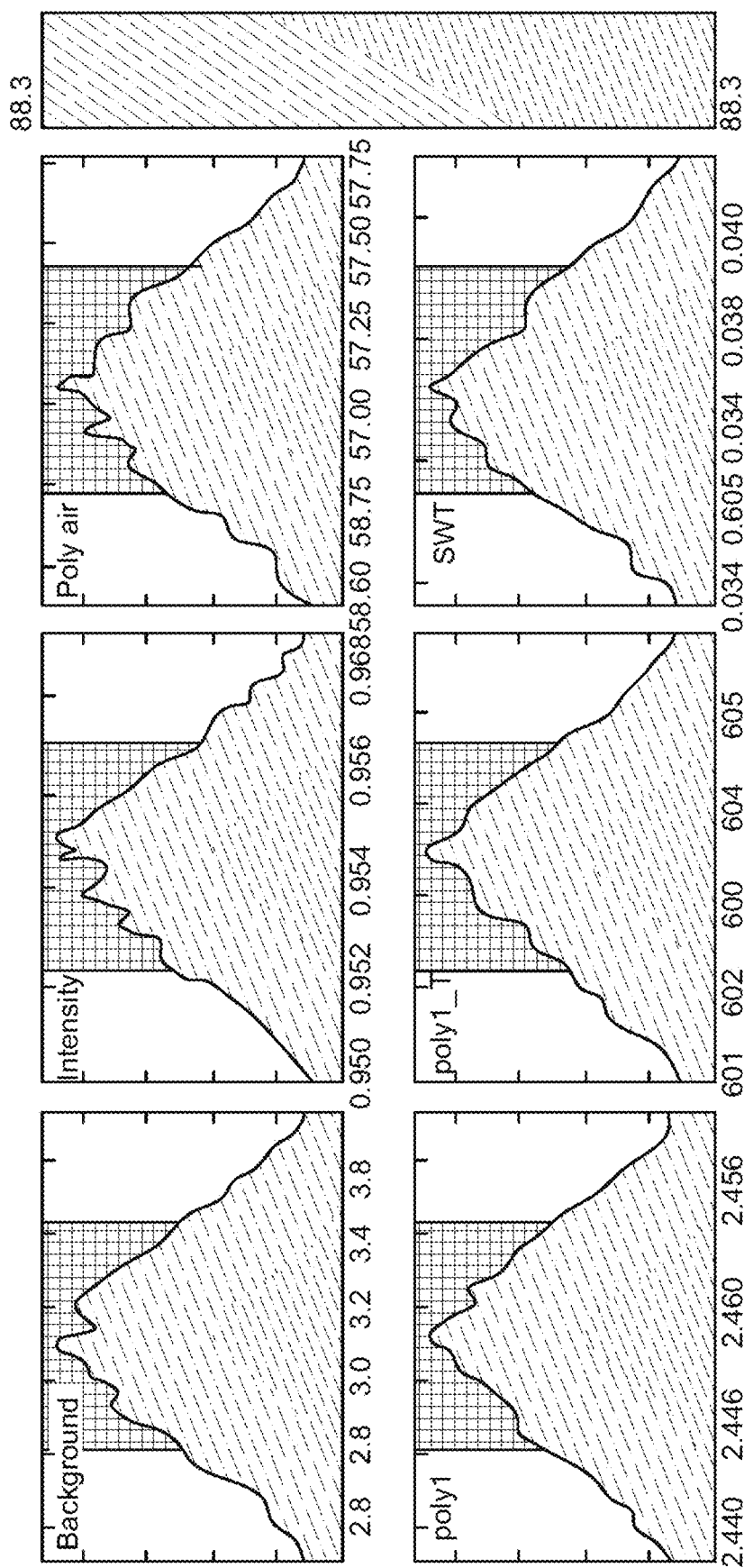

The initiator to monomer ratio used in CVD polymerization is generally much higher than that used in traditional solution-based polymerization processes, leading to different polymer properties like molecular weight and polymer density. Neutron reflectometry (NR) may be applied to measure the densities of CVD synthesized nanoscale polymer thin films. The results are listed in Table 11 (see FIGS. 38-39, FIG. 55 and Table 14-17). The densities the CVD synthesized PEDOT and PDVB are close to the values reported in literature. Small discrepancies may be from different synthesis methods and conditions. There are no literature reports the density of P(PFDA-co-DVB). But the NR measured density (1.279 g/cm³) is close to its theoretical density (1.39 g/cm³) calculated from its composition.

Figure 37C:
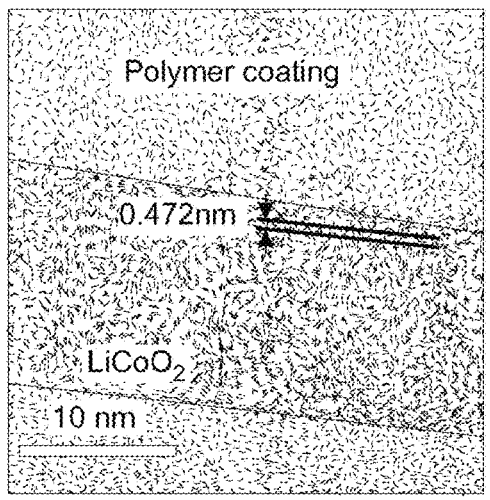
Figure 37D:
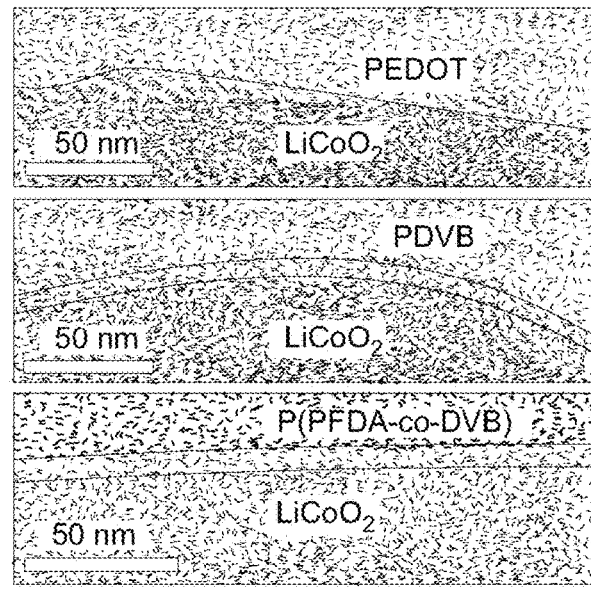
Figure 37E:
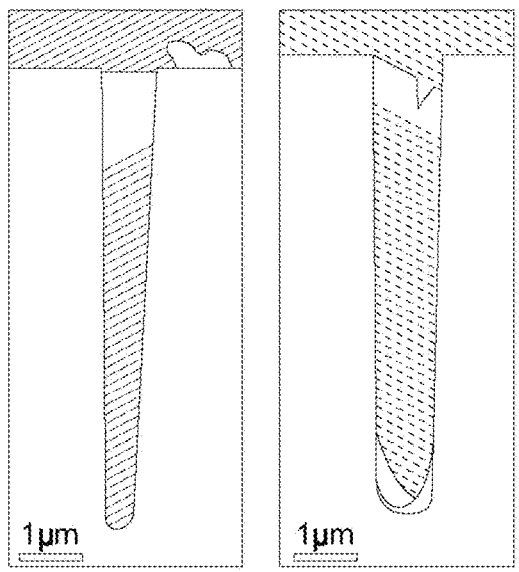
Figure 37F:
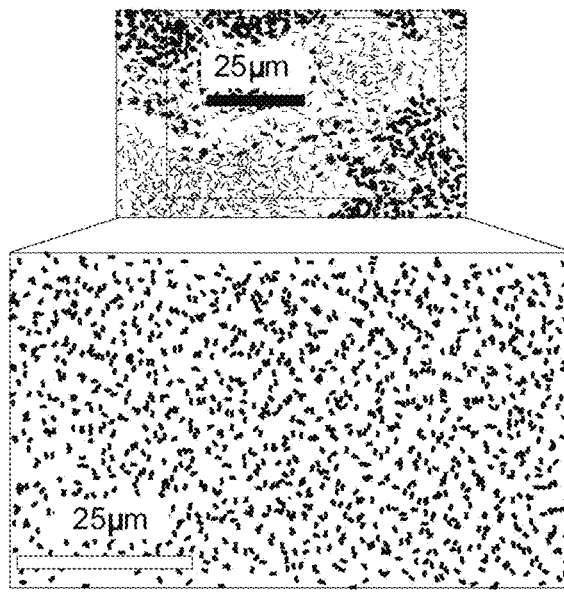
Figure 40A:
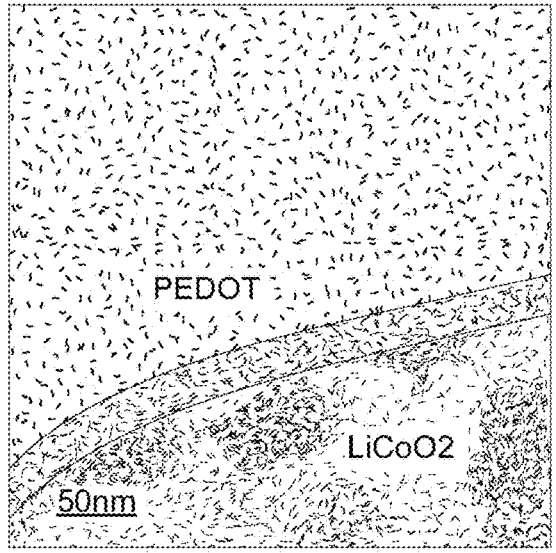
FIGS. 40A-C show TEM images of different CVD synthesized polymers on the surface of $LiCoO_2$, including PEDOT (FIG. 40A), PDVB (FIG. 40B), and P(PFDA-co-DVB) (FIG. 40C).
Figure 40B:
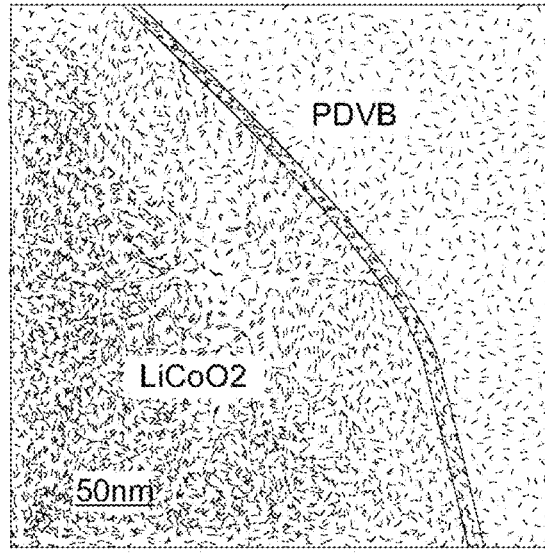
Figure 40C:
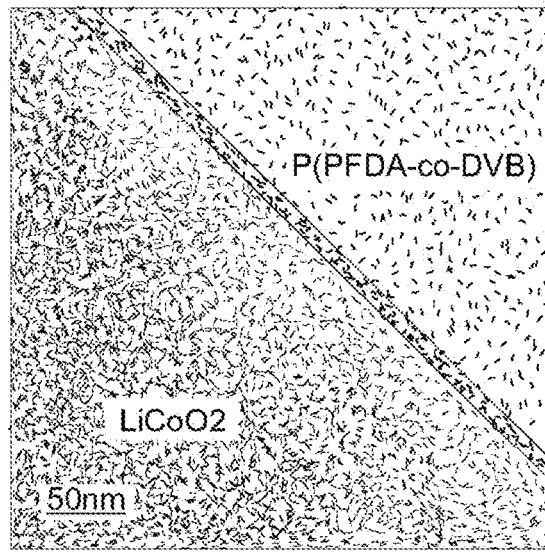

The polymer coated $LiCoO_2$ electrodes are characterized by transmission electron microscopy (TEM) and scanning electron microscopy (SEM). FIG. 37C shows a polymer layer on the (003) plane of a $LiCoO_2$ particle, suggesting the polymer is successfully coated on the particle by CVD polymerization. Larger regions of $LiCoO_2$ particles shown in FIG. 37D and FIG. 40 show that all three polymers conformally cover the surface of the particles. Cross-section SEM and energy-dispersive X-ray spectroscopy (EDS)

elemental mapping may be used to show the effectiveness of the CVD polymerization process to engineer complex structures. FIG. 37E shows about 100 nm thick PDVB is uniformly coated on the surface of a silicon trench. The coating is conformal with constant thickness along the edge. The CVD polymerization according to the present invention may allow the monomer and initiator molecular to penetrate in porous electrode layers and effectively shrink-wrap electrode particles. Precisely engineering such a conformal coating by solution-based methods may be difficult due to surface tension and dewetting effects. FIG. 37F shows the distribution of sulfur element along the cross-section of a PEDOT-coated $LiCoO_2$ electrode prepared by using doctor blade. As sulfur is only expected to be present in PEDOT, the continuous distribution of sulfur along the cross-section may indicate that the PEDOT polymer uniformly covers the whole electrode, rather than only the exterior face of the electrode. A person having ordinary skill in the art may appreciate that obtaining a conformal polymer coating on $LiCoO_2$ electrodes is not trivial. Various experiment parameters, such as temperature, chamber pressure, and precursors flow rate, need to be controlled.

Figure 41A:
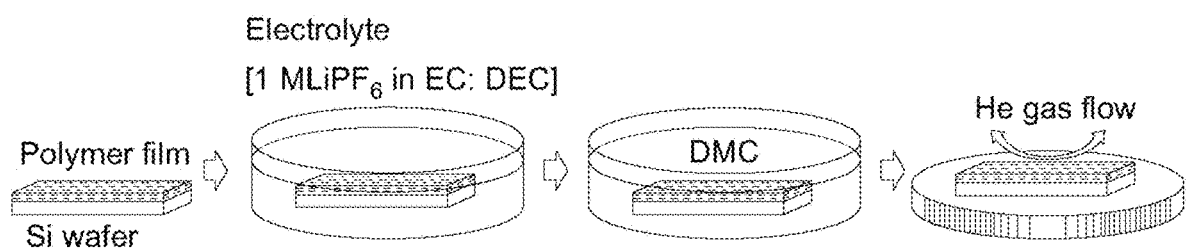
FIGS. 41A-E show neutron depth profiling (NDP) studies the transport of $Li^+$ polymer thin films on silicon wafer.

By engineering CVD polymers on a $LiCoO_2$ electrode, a physical barrier may be formed between the electrode and electrolytes. This may prevent unwanted side reactions that consume finite lithium source in batteries and lead to capacity fading. However, some CVD synthesized polymer thin films may take $Li^+$ into their bulk structure under static conditions, limiting their ability to protect the underlying battery electrodes. Neutron depth profiling (NDP) may be used to describe the possible uptake of $Li^+$ in the three CVD grown polymers under static conditions. FIG. 41A shows the lithiation steps, which includes soaking the sample in electrolyte for three days and rinsing them to remove electrolyte residuals. Each of the lithiation steps are conducted in an Ar-filled glovebox. Exposing the samples to an environment containing water vapor as $H_2O$ may react with $LiPF_6$ and form lithium salts on the surface of polymer films that may be to rinse away.

Figure 41B:
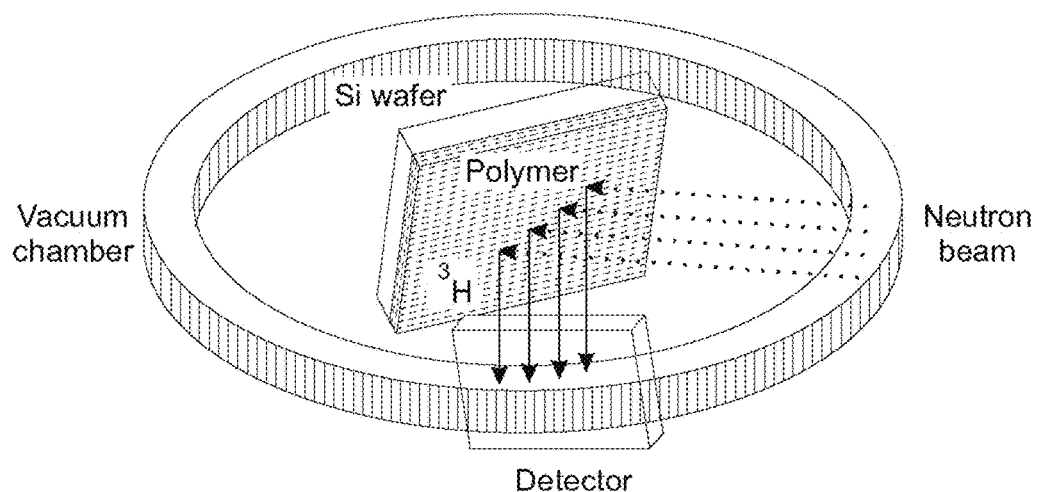
Figure 41C:
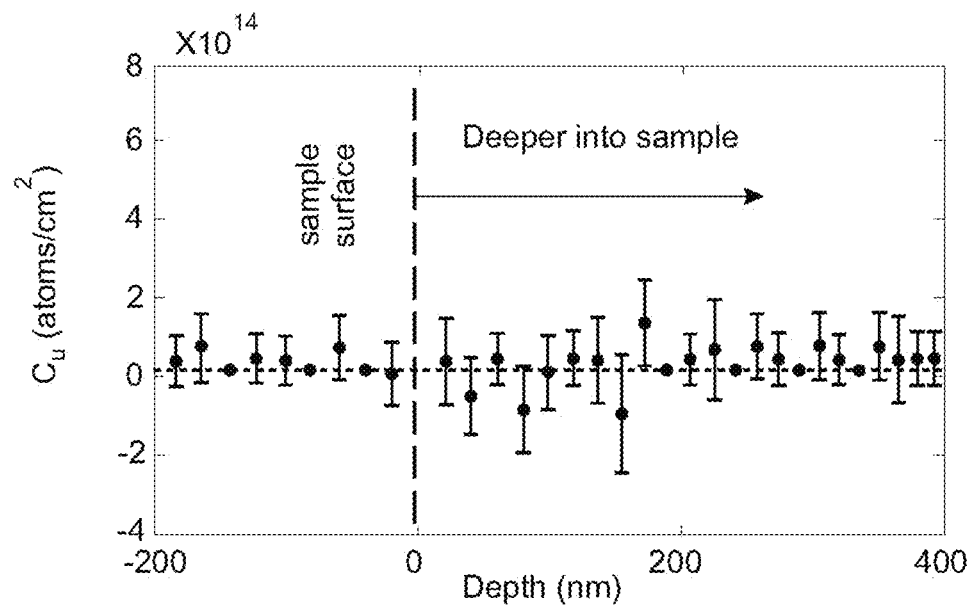
Figure 41D:
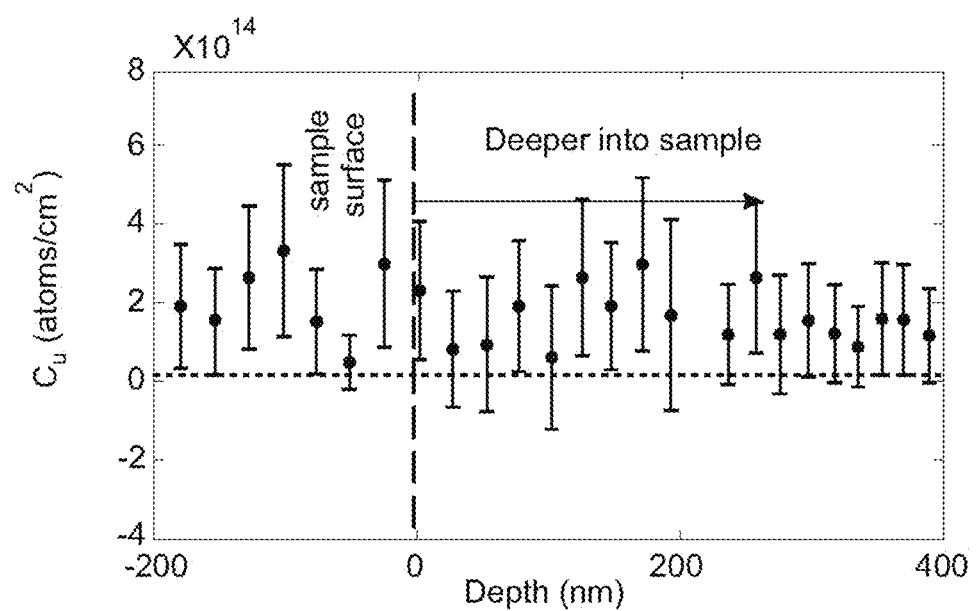
Figure 41E:
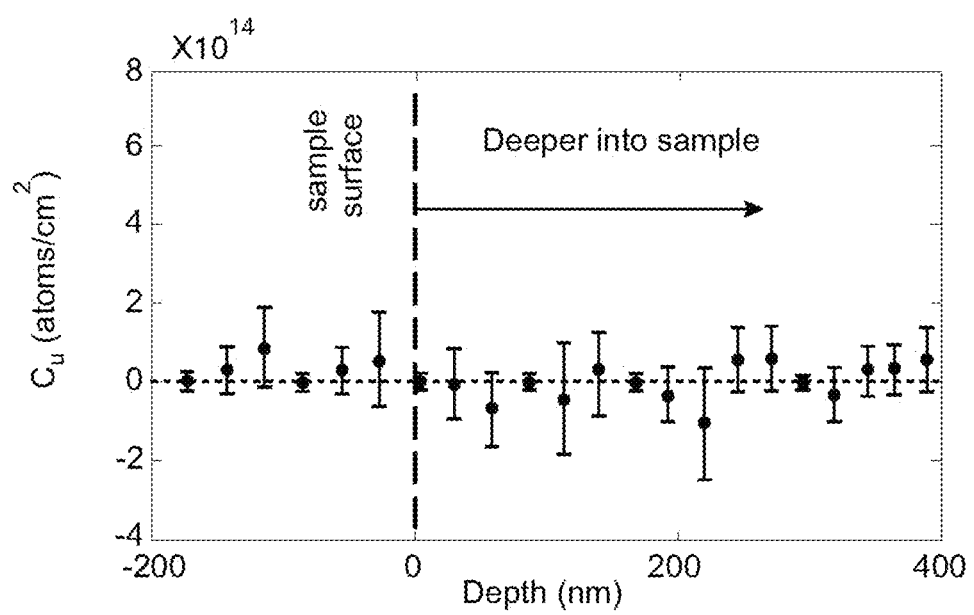

FIG. 41B shows a schematic of the NDP process: a neutron beam is directed onto the sample and captured by $^6Li$ isotopes through the nuclear reaction in (1). When the generated α-particle ($He^{2+}$) and triton particle ($^3H$) travel through the surrounding material, they interact with the material and gradually lose energy. By measuring the energy loss, the depth of $^6Li$ atom may be determined and the Li-atom concentration profile as a function of depth may be constructed. See Equation 8. FIGS. 41C-E show the lithium distribution in the three different polymer thin films derived from the a depth profiles. The NDP profiles for the three polymers indicate no statistically significant uptake of Li into the thin films during the soaking process. A slight increase in Li concentration for PDVB (FIG. 41D) is observed, but it is not statistically resolved enough from the experimental background. These results suggest that the polymers, in addition to being uniformly deposited (see FIG. 37D), also do not allow for contact between $Li^+$ in the electrolyte and the underlying surface under static conditions. Thus, the CVD polymer artificial coatings may extend the calendar life of battery electrodes.

Figure 42A:
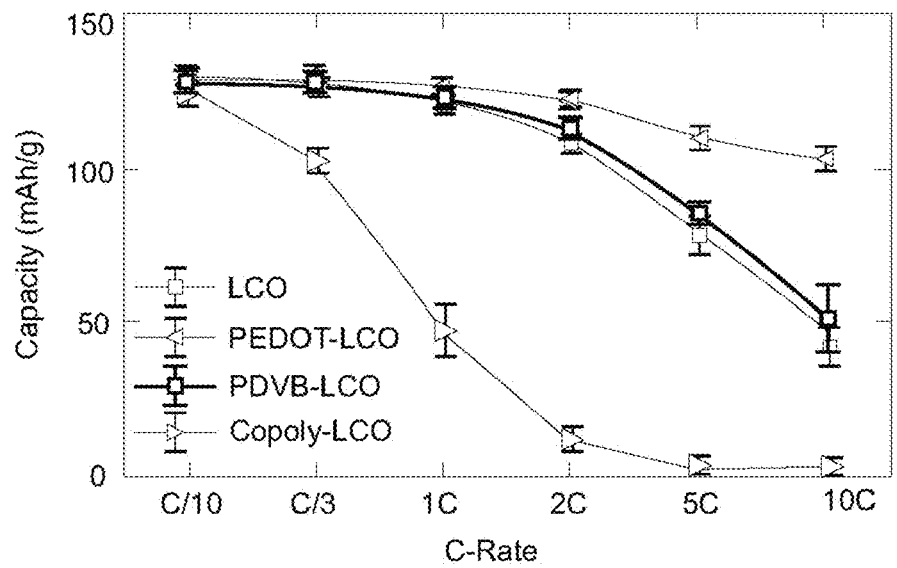
FIGS. 42A-C show kinetics of $LiCoO_2$ electrodes affected by 10 nm thick polymer coatings.

Kinetics of $LiCoO_2$ Electrodes Comprising Polymer Coatings. By building a polymer nanolayer on a $LiCoO_2$ electrode, the contact between electrode and electrolyte may be separated and the composition of the cathode-electrolyte-interphase (CEI) may be changed. This may alter the transport of electrons between the current collector and the $LiCoO_2$ particles as well as the transport of $Li^+$ between the electrolyte and the electrode, thereby affecting the kinetics of the $LiCoO_2$ electrode. Thus, the rate capability of the $LiCoO_2$ electrode may be affected by these polymer coatings (FIG. 42A). Compared to the pristine $LiCoO_2$, the PEDOT-coated $LiCoO_2$ shows much higher specific capacities at high rates (>5 C) (1 C=145 mA/g). For example, the 10 C capacity increases from 48 mA h/g to 102 mA h/g after introducing a 10 nm thick PEDOT coating. In comparison, the P(PFDA-co-DVB) coating largely decreases the rate capability, and the PDVB coating has no significant effect.

Figure 42B:
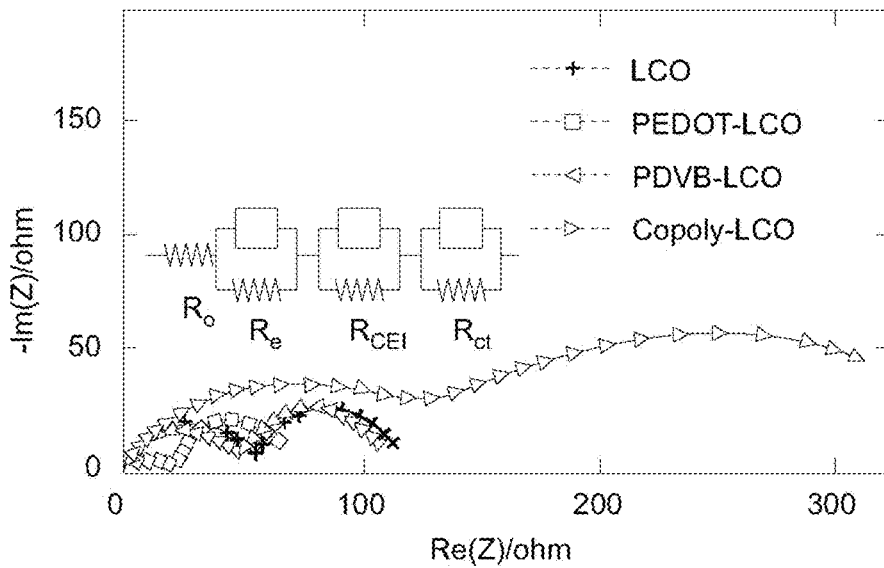
Figure 42C:
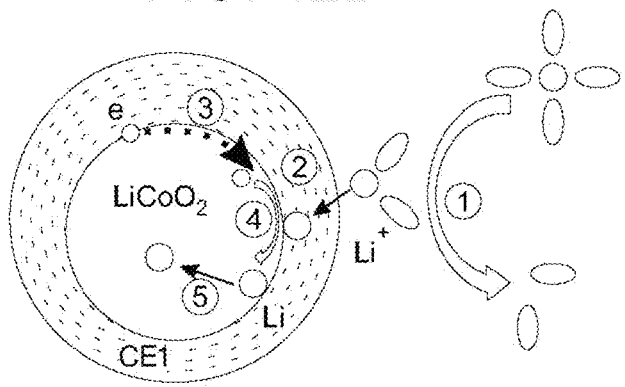
Figure 43:
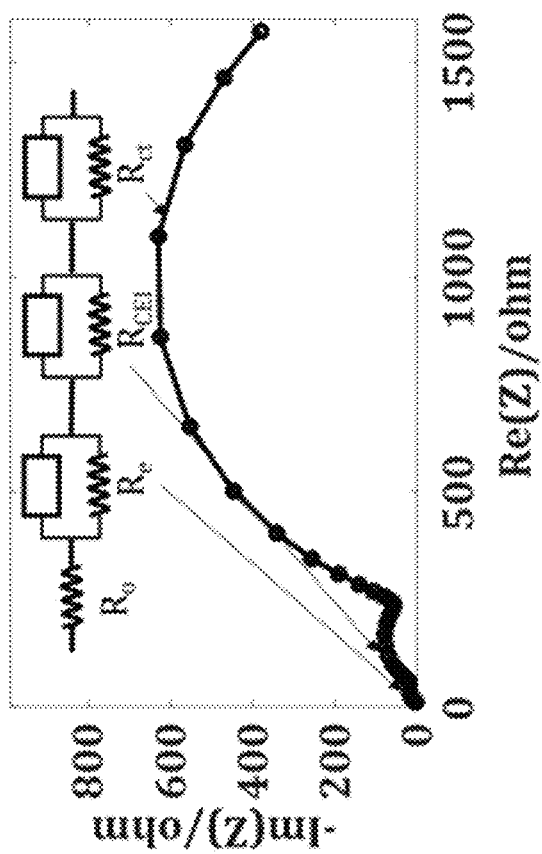
FIG. 43 shows electrochemical impedance spectroscopy of a pristine $LiCoO_2$ electrode measured at 0° C. A third-order equivalent circuit model is inserted to fit the impedance because three semi-circles may be identified from the impedance data.

Electrochemical impedance spectroscopy (EIS) may be conducted to characterize the effect of different polymer coatings on the kinetics of $LiCoO_2$ electrodes. FIG. 42B shows that the PEDOT coating reduces the overall impedance of the electrode, while the P(PFDA-co-DVB) coating increases the impedance and the PDVB coating has no significant effect. This result matches well with the rate capability shown in FIG. 42A. A third-order equivalent circuit model (ECM) is applied to fit the measurement results because three semi-circles may be identified from EIS data at low temperatures, as shown in FIG. 43. The $R_o$ corresponds to the ohmic resistance in a cell; the $R_e$ corresponds to the kinetics of electron transport in/on $LiCoO_2$ particles (step ③ in FIG. 42C); the $R_{CEI}$ corresponds to the kinetics of $Li^+$ transport in CEI (step ②); and the $R_{ct}$ corresponds to the kinetics of the de-solvation process (step ①) and the charge-transfer process (step ④). Since polymer coatings possess different properties compared to the naturally formed CEI, the electrochemical steps ①-④ may be affected and thus result in different impedances of the $LiCoO_2$ electrode. The polymer-influenced impedance changes the overpotential of the electrode during cycling, leading to different $LiCoO_2$ specific capacities (FIG. 42A).

Figure 42D:
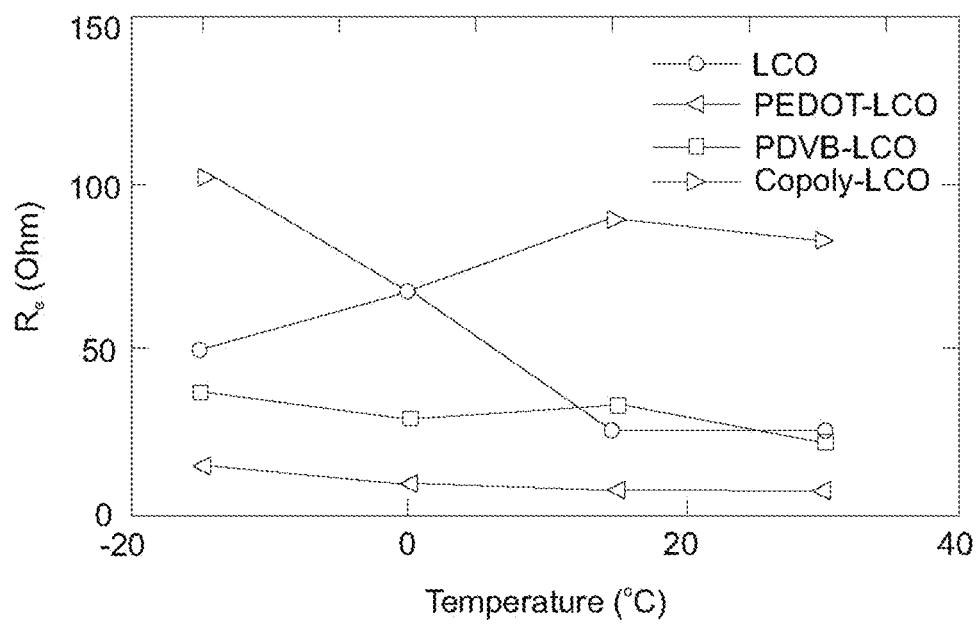
FIGS. 42D-F show the evolution of fitted $R_e$ (FIG. 42D), $R_{CEI}$ (FIG. 42E), $R_{ct}$ (FIG. 42F) with respect to ambient temperature for different $LiCoO_2$ electrodes. The $R_e$ is plotted in linear scale, while the $R_{CEI}$ and $R_{ct}$ are plotted in log scale.
Figure 42E:
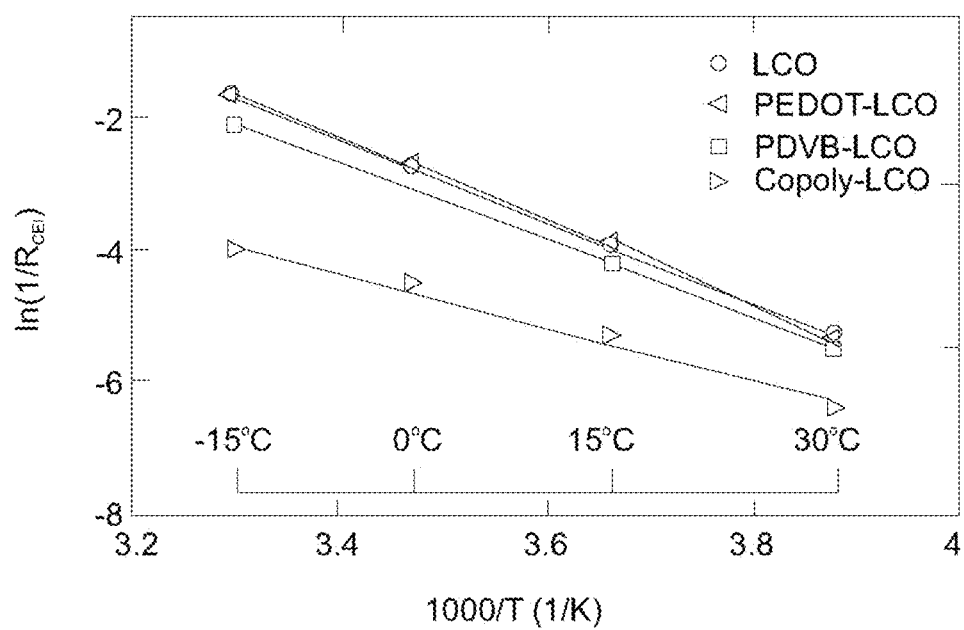
Figure 42F:
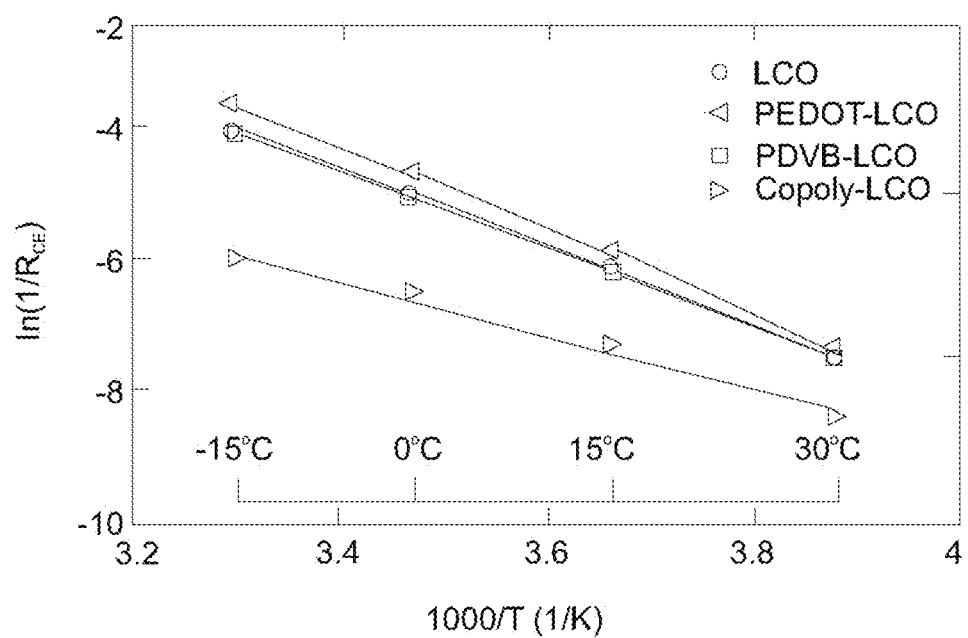

To better understand the effect of polymer coatings on the kinetics of the $LiCoO_2$ electrode, its impedance may be measured at different temperatures, including −15° C., 0° C., 15° C., and 30° C. A third-order ECM may be applied to fit the measured data, and the results are shown in FIGS. 42C-E. The PEDOT-coated electrode shows the smallest $R_e$, $R_{CEI}$, and $R_{ct}$ at all the measured temperatures among the three polymer-coated $LiCoO_2$ electrodes. The small $R_e$ of the PEDOT-coated $LiCoO_2$ may be attributed to the good electron conductivity of the CVD PEDOT film (22 S/cm). The reduced $R_{CEI}$ and $R_{ct}$ from the PEDOT coating are related to the interaction between $Li^+$ and the polymer. Additionally, the change in $R_{CEI}$ and $R_{ct}$ with respect to temperature follows the Arrhenius Equation 2. This agrees with the fact that they are attributed to electrochemical processes. Table 12 lists the calculated activation energy ($E_a$) and the pre-exponential factor (A) for $R_{CEI}$ and $R_{ct}$ based on Equation 2. The activation energy is in the range of 0.35 eV to 0.56 eV for the $R_{CEI}$ and is in the range of 0.46 eV to 0.56 eV for the $R_{ct}$. Interestingly, the A value of the PEDOT-coated electrode is two to three orders of magnitude higher than the other two polymer-coated $LiCoO_2$ electrodes. As the pre-exponential factor is proportional to the attempt frequency, a high A value in the PEDOT-coated electrode suggests that the PEDOT polymer thin film could take much more $Li^+$ from electrolyte under the electric field than the other two polymers.

$$\frac{1}{R_\Omega} = A \times \exp\left(-\frac{E_a}{RT}\right) \qquad \text{Equation 13}$$

where $R_Ω$ is the resistance, A is the pre-exponential factor, which is a constant, $E_a$ the activation energy, R the universal gas constant, and T is the temperature.

Li$^+$ transport in the three polymers follows rules of ionic transport in glassy materials because of their relatively high melting points. Li$^+$ movement depends on the activation energy of Li$^+$ hopping from one site to another, with the concentration gradient of Li$^+$ and applied electric field giving collective movement on a macroscopic scale. However, a person having ordinary skill in the art may appreciate that it is difficult to calculate the hopping activation energy through DFT simulation because most of the polymers, like PDVB, are amorphous. Even if a polymer has a crystal structure, like PEDOT, extended polymer matrices are too large to be simulated with non-periodic DFT. Alternatively, two other descriptors that relate to the hopping activation energy, which are the binding energy between Li$^+$ and a small polymer cluster and the number of Li$^+$ binding sites in a polymer.

FIG. 44 shows DFT calculation results of the interactions between Li$^+$ and different polymers using Equation 14. FIG. 44A-C shows the lowest energy configurations when one Li$^+$ is added to the polymer matrix. The binding energy between Li$^+$ and PEDOT, PDVB, and copolymer is −2.17 eV, −3.15 eV, and −3.92 eV, respectively. The relatively weak binding energy between Li+ and PEDOT may be one of the reasons for good Li$^+$ transport kinetics in the PEDOT-coated LiCoO$_2$.

$$ΔG_{bind}=G(\text{polymer}+\text{Li}^+)-G(\text{polymer})-G(\text{Li}^+) \quad \text{Equation 14}$$

where ΔGbind is the binding energy between a polymer and Li$^+$; G(x) the Gibbs free energy of the x system in vacuum, where x stands for a structure, including polymer, Li$^+$, or polymer+Li$^+$.

Figure 44A:
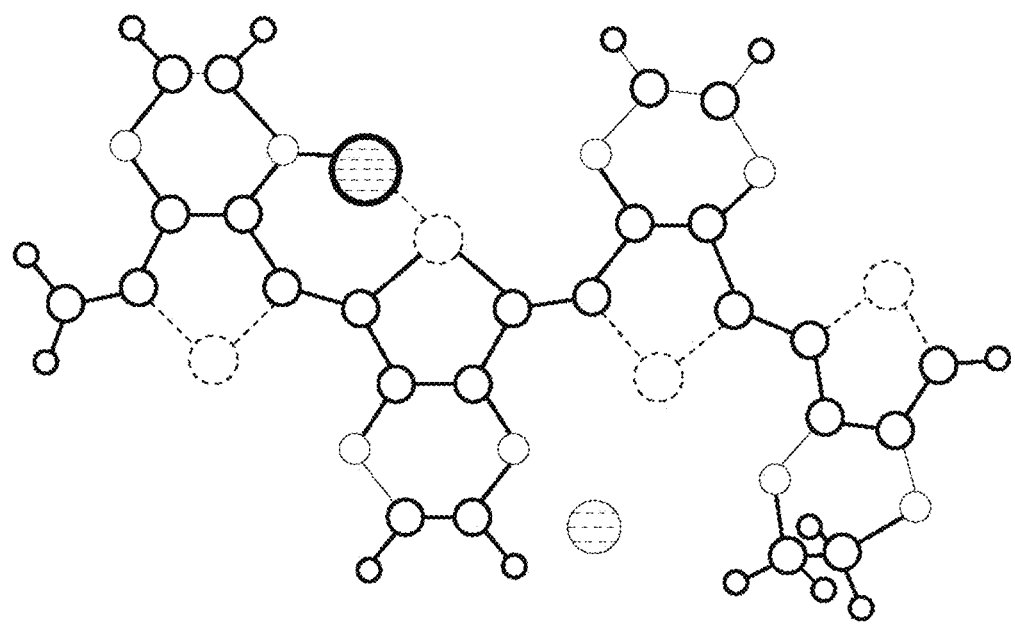
FIGS. 44A-E show the density function theory calculation compares the interactions between $Li^+$ and different polymers.
Figure 44B:
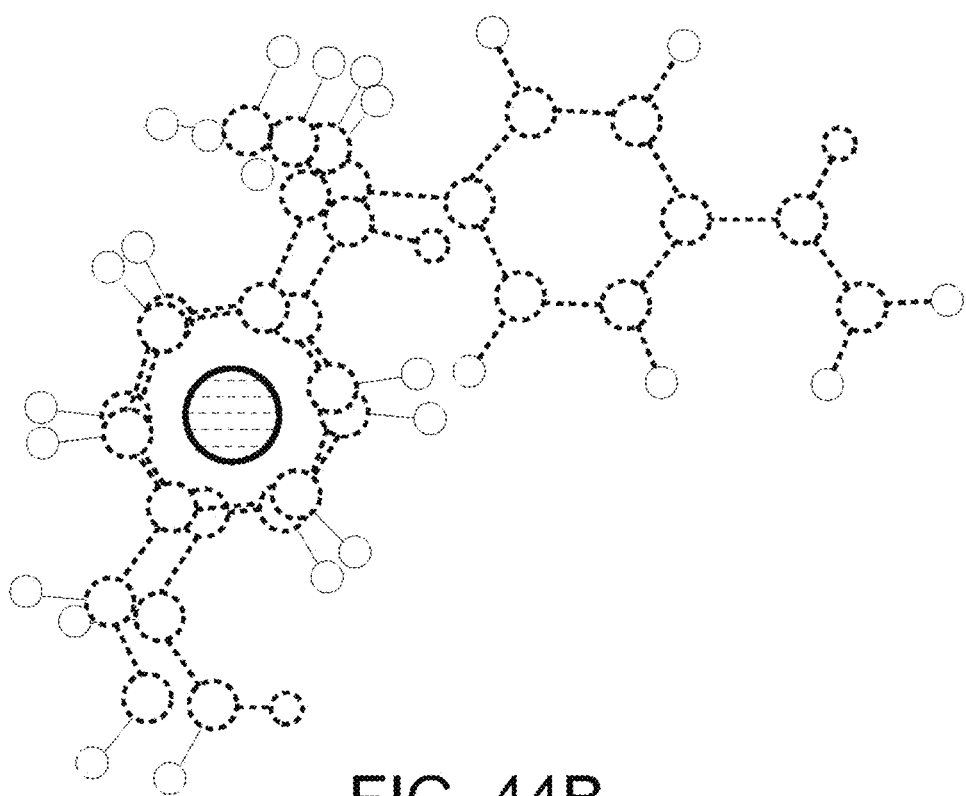
Figure 44C:
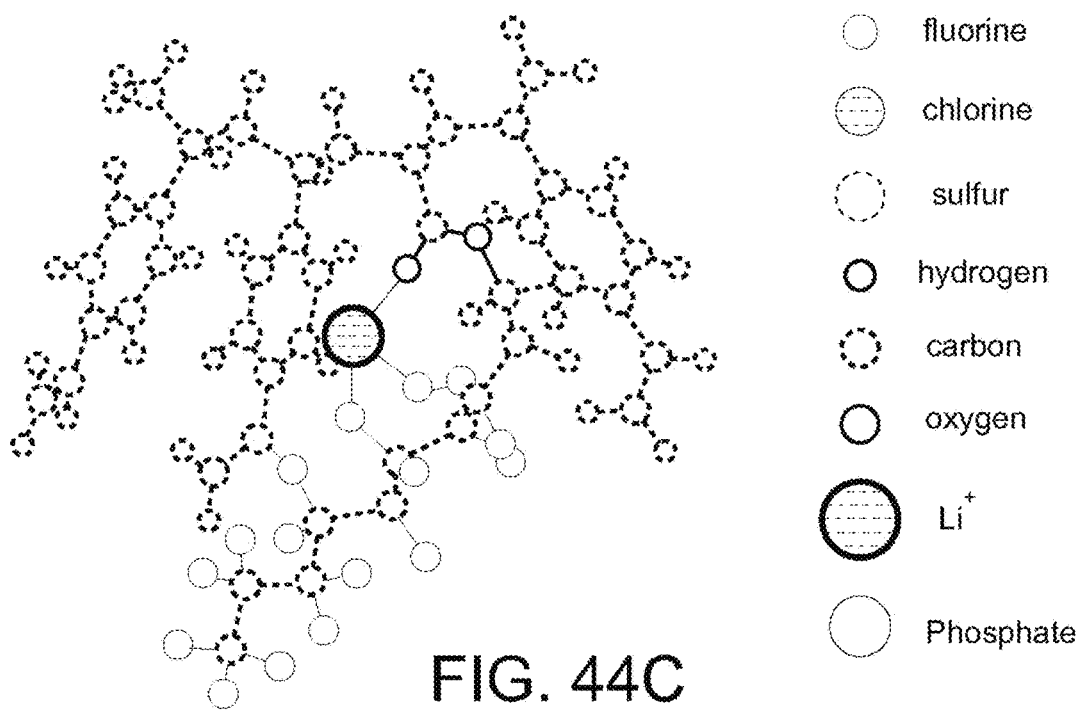
Figure 44D:
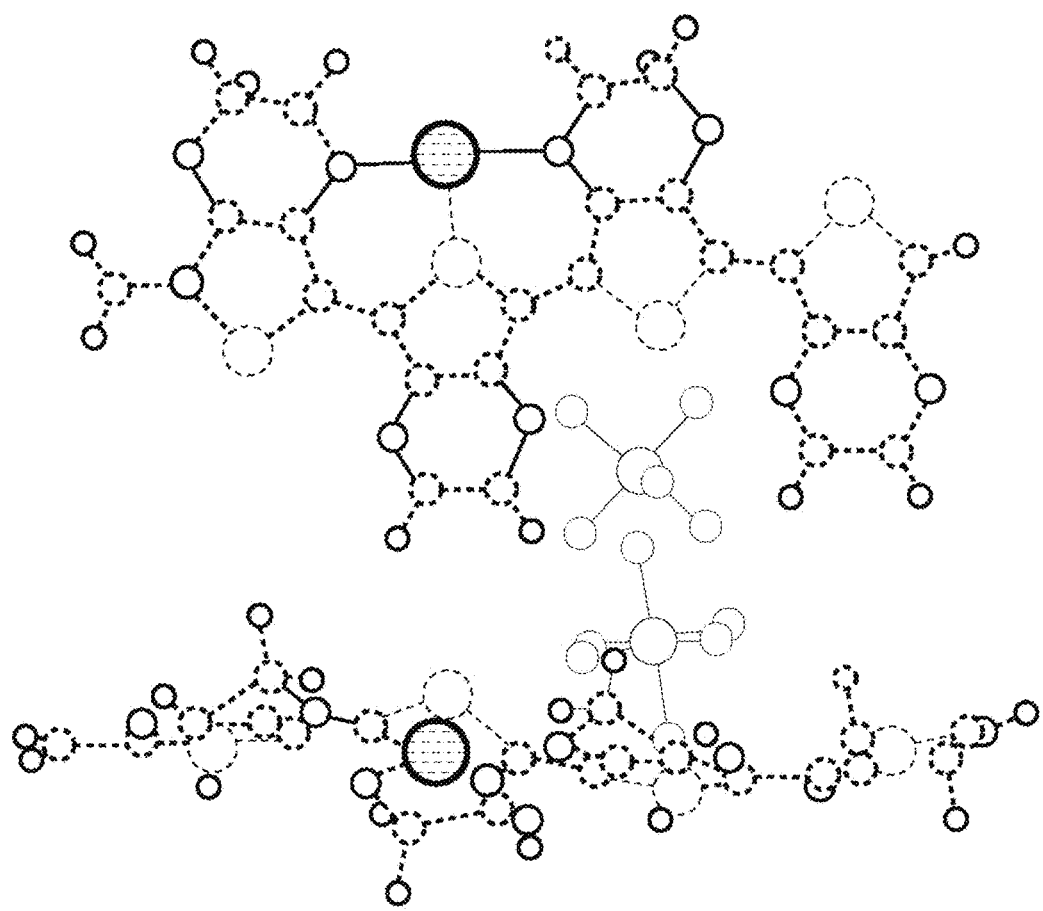

Since LiPF$_6$-based electrolytes are utilized in LIBs, PF$_6^-$ may replace Cl$^-$ in oCVD PEDOT. FIG. 44D shows that the dopant exchange from Cl$^-$ to PF$_6^-$ has little effect on the binding energy between PEDOT and Li$^+$ (from −2.17 eV to −2.21 eV). The effect of PF$_6^-$ on Li$^+$ transport in PDVB and P(PFDA-co-DVB) may be described by calculating the binding energy between PF$_6^-$ and these polymers. The calculated results in FIG. 45 show that the binding energy between PF$_6^-$ and PDVB/P(PFDA-co-DVB) is relatively small, which may indicate the interaction between them may not be significant when characterizing the interaction between Li$^+$ and these polymers. Additionally, when both Li$^+$ and PF$_6^-$ are considered in PDVB and P(PFDA-co-DVB) systems, no minimum energy stationary points may be found that do not result in a Li—PF$_6^-$ ion pair, which further limits the transport of Li$^+$ in the two polymers.

Figure 44E:
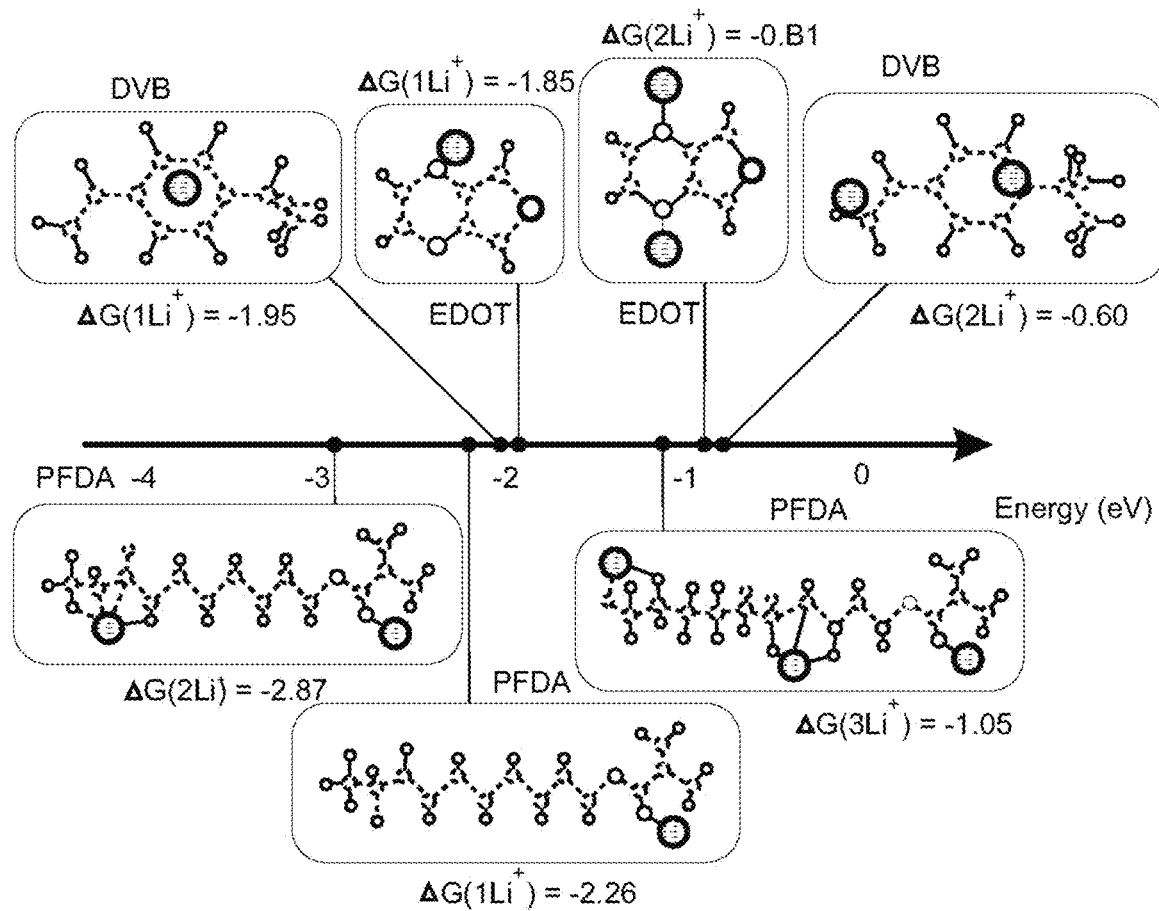
Figure 45A:
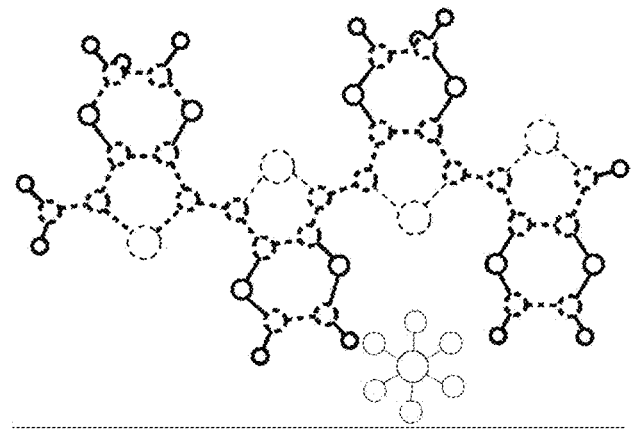
FIGS. 45A-C show density function theory calculation for the interaction between $PF_6^-$ and polymers. The interaction between $PF_6^-$ and PEDOT (FIG. 45A), PDVB (FIG. 45B), as well as P(PFDA-co-DVB) (FIG. 45C). Two views are shown for clarity, and the calculated binding energy is listed below each figure.
Figure 45A:
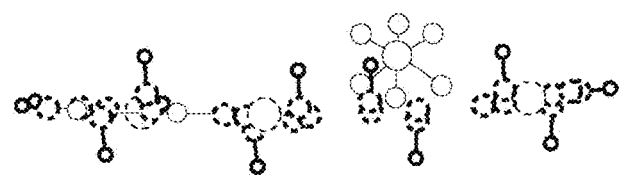
Figure 45B:
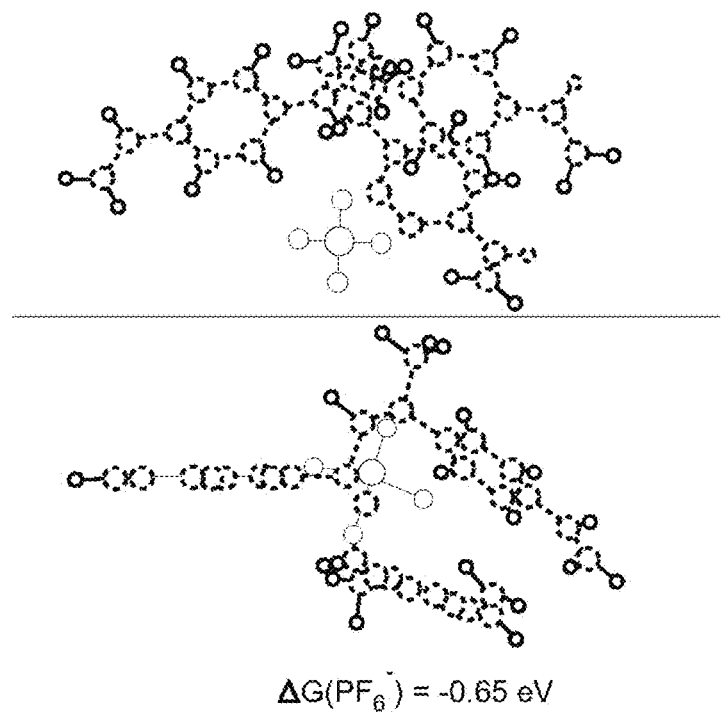
Figure 45C:
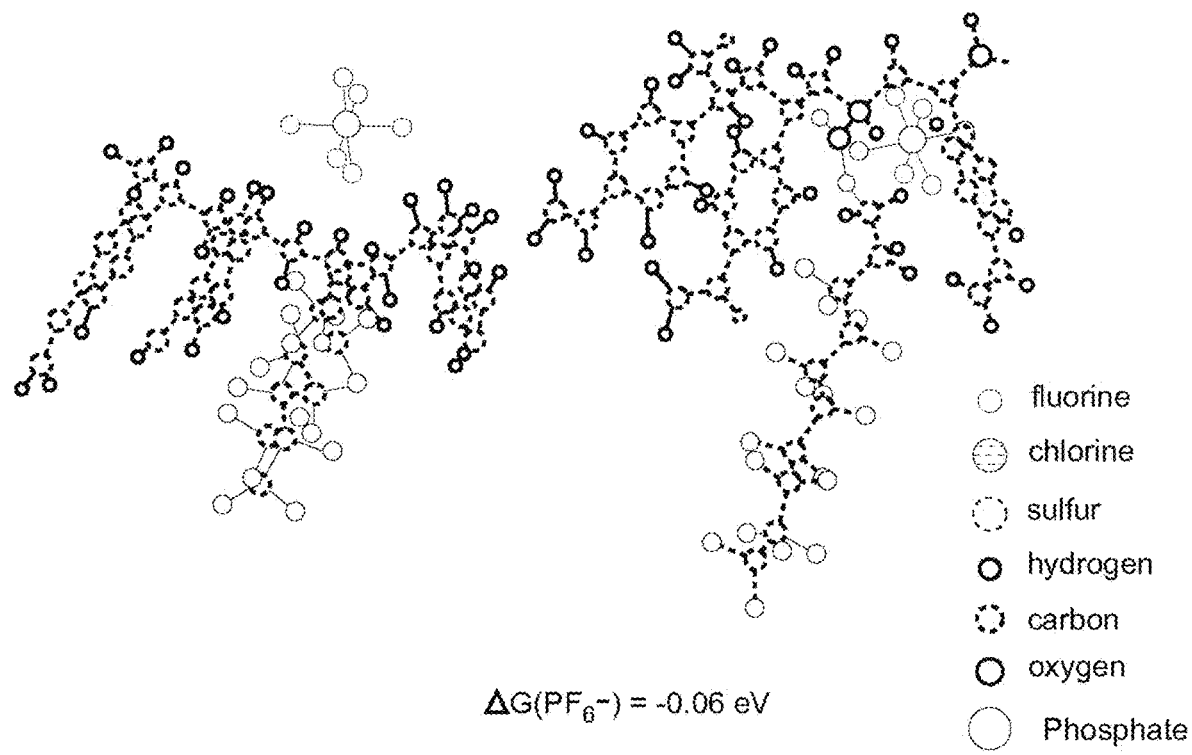
Figure 56:
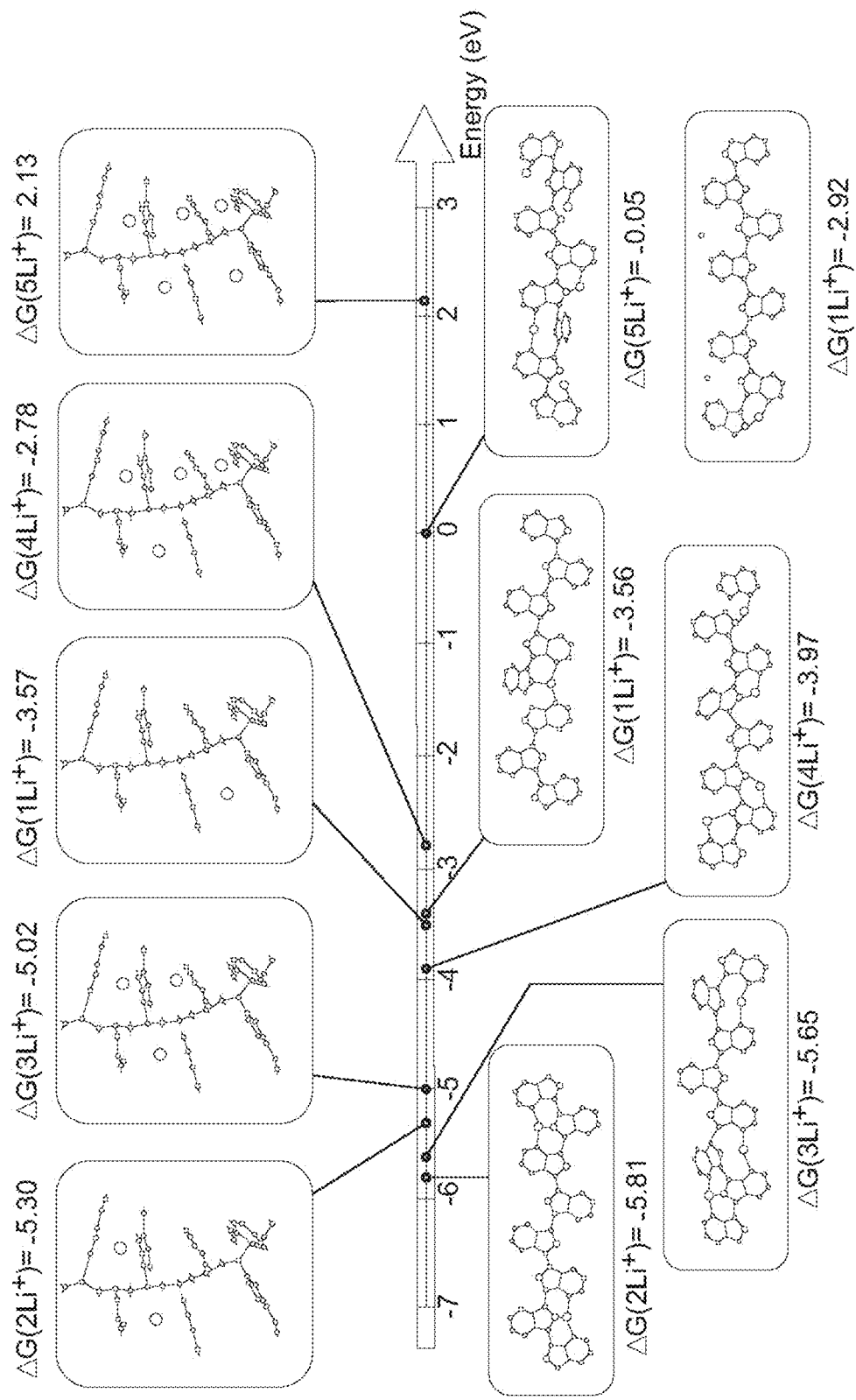
FIG. 56 shows density function theory calculation for the cumulative binding energy between $Li^+$ and PDVB and PEDOT oligomers. Each oligomer has eight monomer units.

The number of Li$^+$ binding sites in polymers may be characterized by calculating the cumulative binding energy between Li+ and monomers as well as small polymer clusters. FIG. 44E shows each EDOT and DVB monomer may provide two binding sites for Li$^+$, while each PFDA monomer may provide three sites. By considering the molecular weight of the monomer and the density of the polymer thin film (see Table 11), the concentration of Li$^+$ binding sites in different polymers (see Table 13 and FIG. 56). The result suggests that the PEDOT may provide almost twice as many Li$^+$ binding sites than the PDVB and the copolymer. These results agree well with the much larger pre-exponential factor value of the PEDOT-coated electrode (see Table 12). Small binding energy with Li$^+$ and enough binding sites for Li$^+$ make PEDOT a much better Li$^+$ conductor compared to PDVB and P(PFDA-co-DVB). Without wishing to be bound to any particular theory, it is believed that the smaller $R_{CEI}$ and $R_{ct}$ in the PEDOT-coated LiCoO$_2$ compared to the other two polymer-coated LiCoO$_2$ electrodes (see FIG. 42B).

By providing channels for the transport of both electrons and Li$^+$, the PEDOT coating may improve the current homogeneity in LIBs and therefore may have the potential to reduce their spatially heterogeneous deterioration. Operando synchrotron energy-dispersive X-ray diffraction (ED-XRD) may be used to characterize the effect of the PEDOT coating on the current homogeneity by monitoring the evolution of LiCoO$_2$ crystal structure during cycling. Generally, Li$_x$CoO$_2$ goes through metal-insulator transition between two hexagonal phases (H1 to H2) when x decreases from 0.95 to 0.75, and H2 phase has a larger c parameter than H1 phase. Beyond x<0.75, the H1 phase disappears, resulting in a single-phase region with only the H2 phase and an increasing c lattice parameter. At around x=0.5, the LixCoO$_2$ goes through an order-disorder transition, where there is a phase transformation from hexagonal to monoclinic and then back to hexagonal and the c parameter of H2 phase reaches its maximum. Keeping de-lithiation when x<0.5 may induce a dramatic decrease of the c parameter of the H2 phase.

Figure 46A:
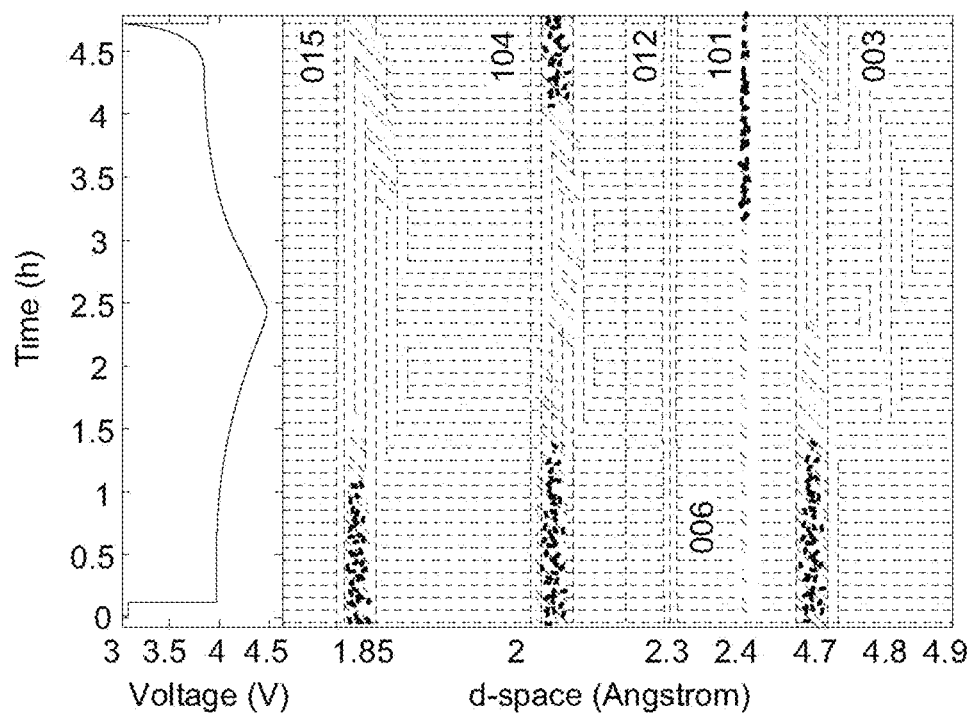
FIGS. 46A-F show synchrotron operando ED-XRD characterization for $LiCoO_2$ electrodes during a high voltage cycling test.

FIG. 46 compares the operando synchrotron ED-XRD results for pristine LiCoO$_2$ and PEDOT-coated LiCoO$_2$. The electrochemical cycling curves in FIG. 46A, B show the first charge-discharge cycle of the two electrodes tested at C/2 within voltage range of 3.0-4.5 V. The specific discharge capacity of the PEDOT-coated LiCoO$_2$ (177 mA h/g) may be higher than that of the pristine LiCoO$_2$ (153 mA h/g). In addition, FIG. 47 indicates that the PEDOT coating may reduce the cell overpotential during the charge and discharge process. The two-dimensional contour plots in FIG. 46A, B show the structural evolution of the two LiCoO$_2$ electrodes during cycling, which are quite different.

Figure 46B:
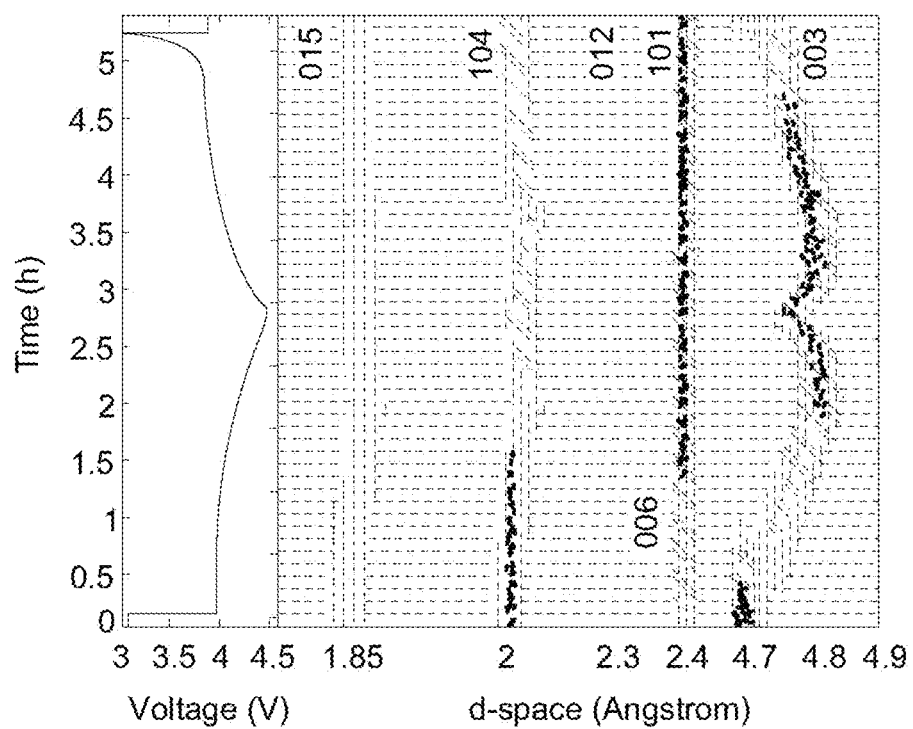
Figure 46C:
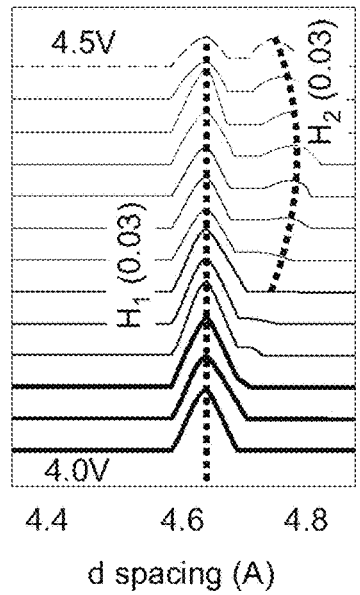
Figure 46D:
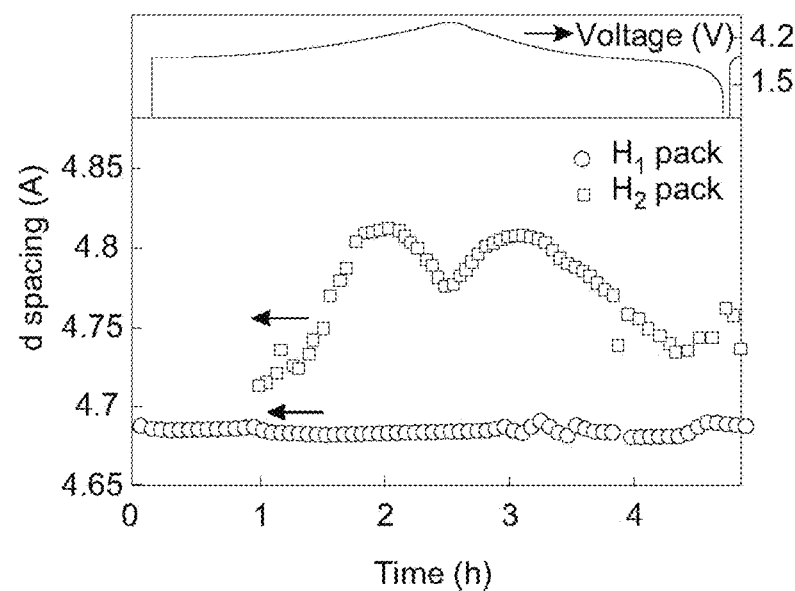
Figure 46E:
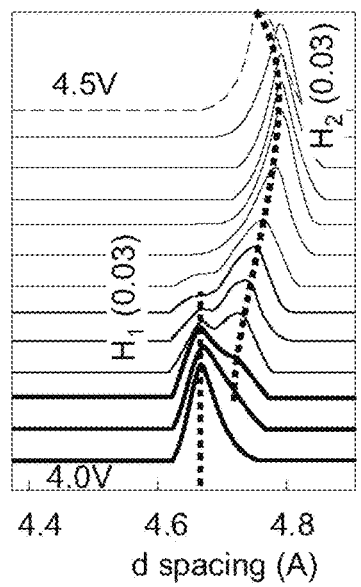
Figure 46F:
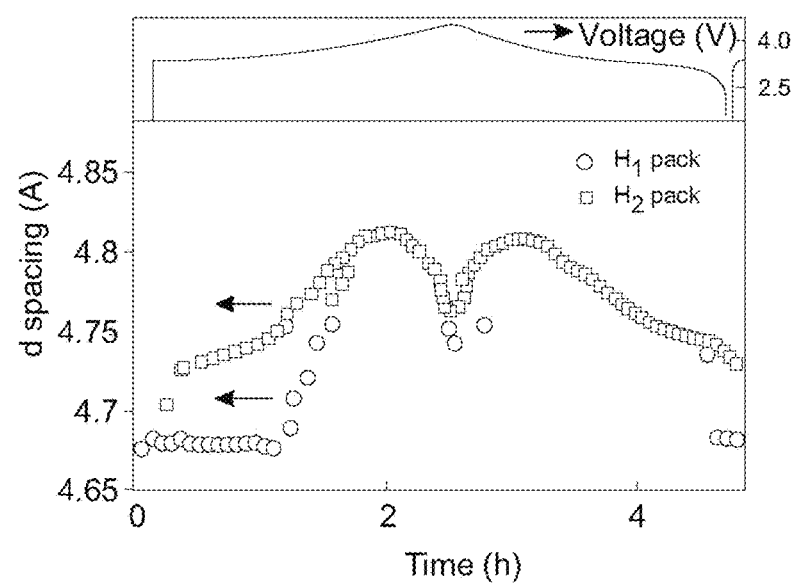
Figure 47:
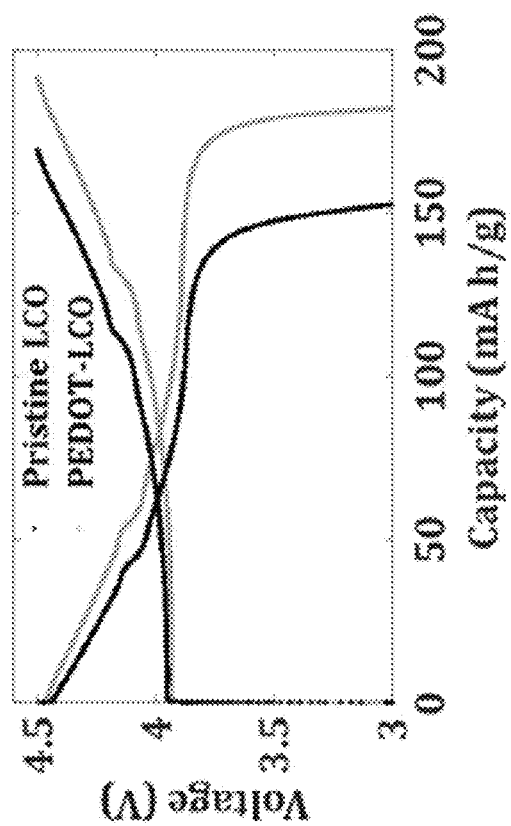
FIG. 47 shows electrochemical performance of pristine $LiCoO_2$ and PEDOT-coated $LiCoO_2$ from the operando ED-XRD.
Figure 48A:
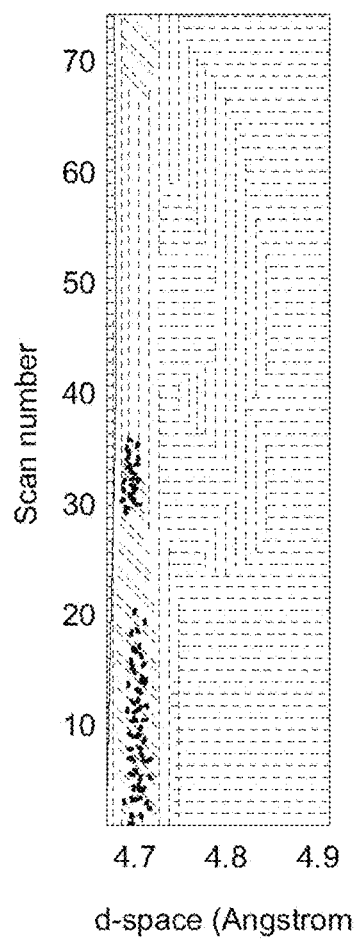
FIGS. 48A-F show in-situ ED-XRD characterization of a pristine $LiCoO_2$ electrode (FIGS. 48A-C) and a PEDOT-coated $LiCoO_2$ electrode (FIGS. 48D-F). Three different locations are measured for each electrode, including near to Al current collector (FIGS. 48A, D), in the middle of $LiCoO_2$ electrodes (FIGS. 48B, E), and near to the separator (FIGS. 48C, F).
Figure 48B:
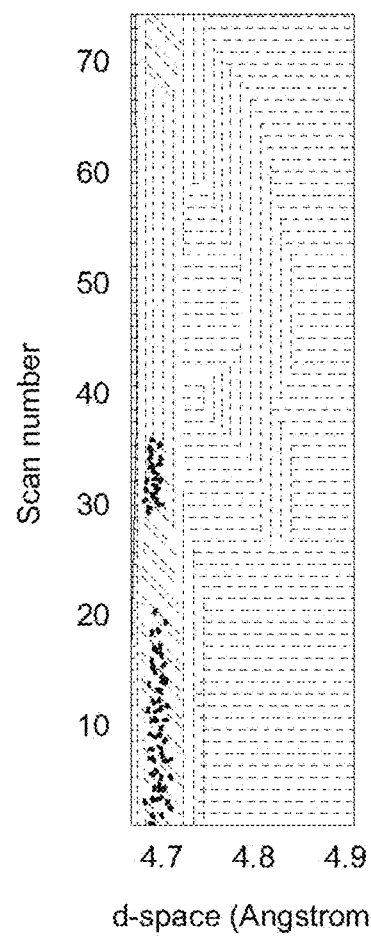
Figure 48C:
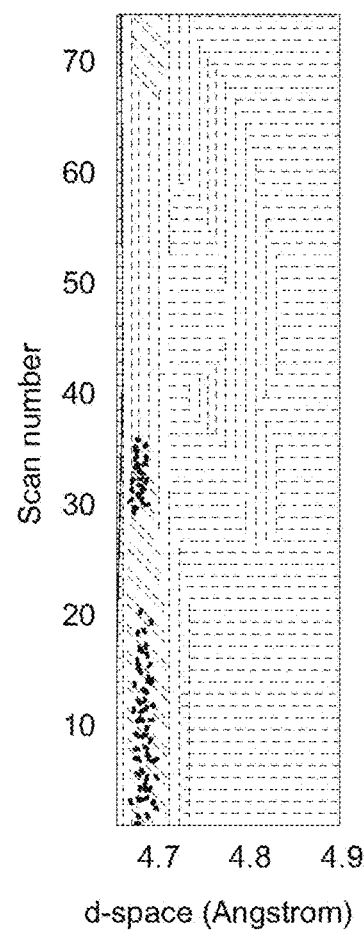
Figure 48D:
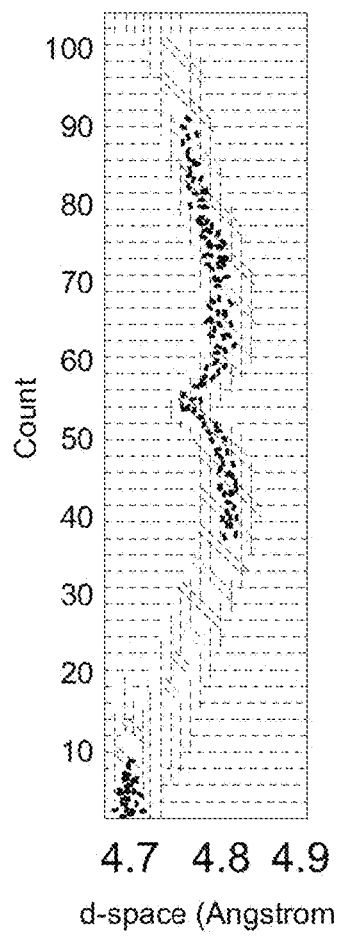
Figure 48E:
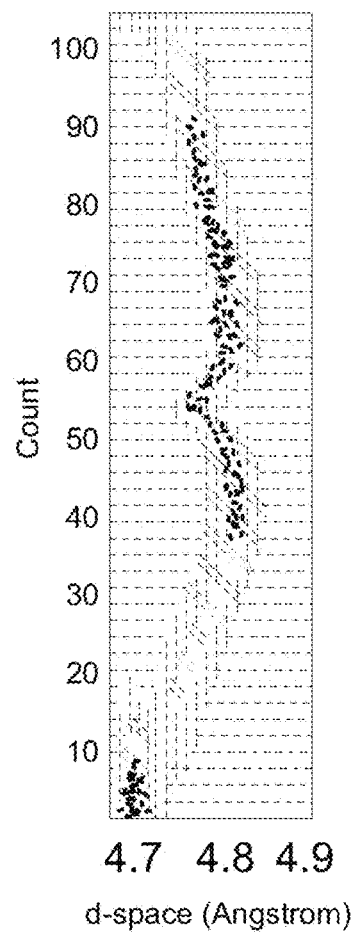
Figure 48F:
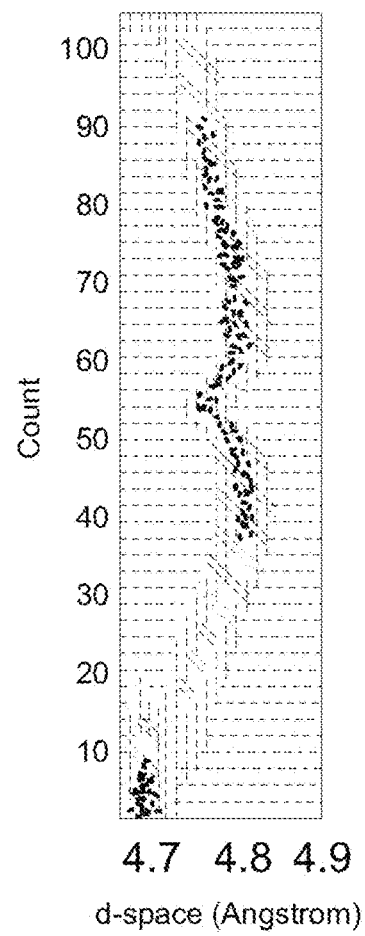

The structural evolution of the PEDOT-coated LiCoO$_2$ matches well with existing studies on LiCoO$_2$ (FIG. 46B). FIGS. 46E and 46F highlights the evolution of the (003) peak in FIG. 46B. The result shows that a second (003) peak appears after around 17.3 mA h/g of charging, indicating the start of the phase transition from the H1 phase to the H2 phase. The average composition of the electrode is Li$_{0.937}$CoO$_2$ at this point. When the charge capacity reaches 82.4 mA h/g, the H1 peak disappears, indicating all the H1 phase has transferred to H2 phase in the electrode. The average composition of the electrode at this point is Li$_{0.7}$CoO$_2$. The PEDOT-coated LiCoO$_2$ electrode compositions at the two critical points, where the H2 phase appears and the H1 phase disappears, are close to Li$_{0.95}$CoO$_2$ and Li$_{0.75}$CoO$_2$, respectively.

Conventional studies generally apply a very small C-rate, such as C/50, during the operando experiment. The small C-rate allows the XRD information to be collected at quasi steady-state of the LiCoO$_2$ electrode. Here, cells are cycled at a relatively large C-rate (C/2) during the operando experiment, which may cause non-steady steady of the LiCoO$_2$ electrode and inhomogeneous Li distribution in the electrode. For example, a pronounced non-steady state and inhomogeneous Li distribution occurs in the pristine LiCoO$_2$ electrode. FIG. 46A indicates the structural evolution of the pristine LiCoO$_2$ significantly deviates from existing studies because of the relatively large C-rate (C/2). The evolution of the (003) peak is highlighted in FIG. 46C, D. The second (003) peak appears after around 53.6 mA h/g of charging, corresponding to an average composition of Li$_{0.80}$CoO$_2$. In addition, the H1 phase does not disappear during the whole cycling process, indicating that the x value in some LixCoO$_2$ particles does not go below 0.75 during cycling. Thus, an abnormally large fraction of LixCoO$_2$ particles is relatively nonactive during the cycling test. Three different locations on both samples show similar results (see FIG. 48). Therefore, the PEDOT coating may improve the current homogeneity among the LiCoO$_2$ electrode by providing transport channels for electrons and Li+. This may alleviate spatially heterogeneous deterioration of LiCoO$_2$ electrodes, and, thus, improve their cycling stability.

Figure 49A:
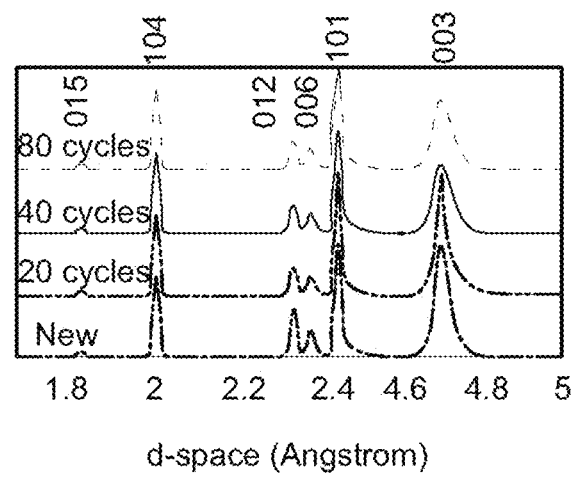
FIGS. 49A and 49B show comparison of ED-XRD data of a pristine $LiCoO_2$ electrode (FIG. 49A) and a PEDOT-coated $LiCoO_2$ electrode (FIG. 49B) at different aging statuses cycled between 3.0 V to 4.5 V at C/2.
Figure 49B:
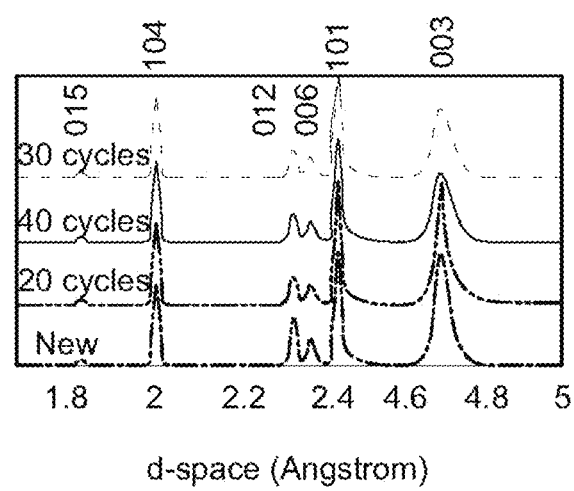

Cycling Stability of LiCoO$_2$ Electrodes Comprising Polymer Coatings. Without wishing to be bound to any particular theory, it is believed that the capacity loss of LiCoO$_2$ with an upper cutoff potential of 4.5 V may related to the interfacial impedance growth between the LiCoO$_2$ and electrolyte that results from side reactions between LiPF$_6$-based electrolyte and LiCoO$_2$ surface impurities. The full extraction of lithium (x=0) from LixCoO$_2$ may not compromise its structure. However, the structure instability of LiCoO$_2$ may cause its fast capacity fading at high voltage. Pristine LiCoO$_2$ and PEDOT-coated LiCoO$_2$ crystal structures may be compared at different aging states under high voltage (4.5 V) cycling via synchrotron ED-XRD (see FIG. 49). The results indicate that the 4.5 V cycling test may not significantly change the crystal structure for both LiCoO$_2$ electrodes.

Figure 50A:
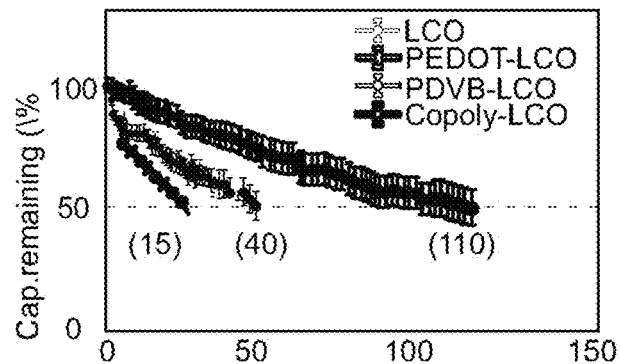
FIGS. 50A-E show the effect of polymer coatings on high voltage cycling stability of $LiCoO_2$ electrodes.
Figure 50B:
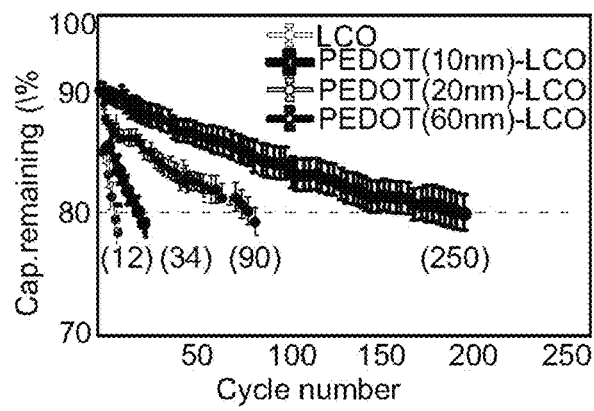
Figure 50C:
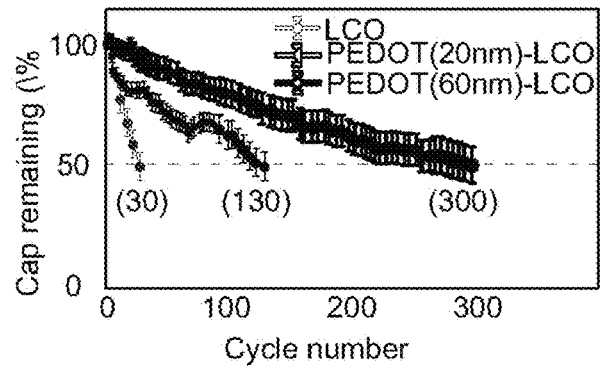
Figure 51A:
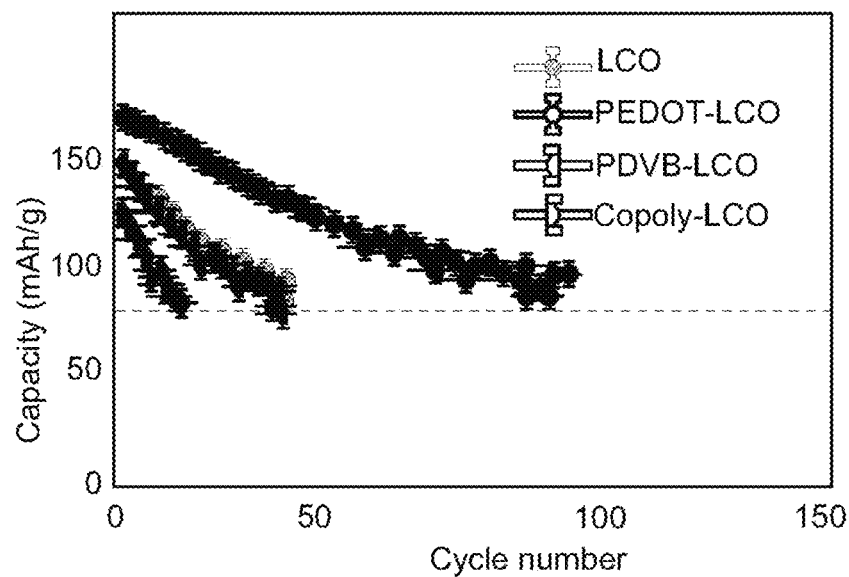
FIGS. 51A and 51B show 4.5 V High voltage cycling stability of $LiCoO_2$ electrodes.
Figure 51B:
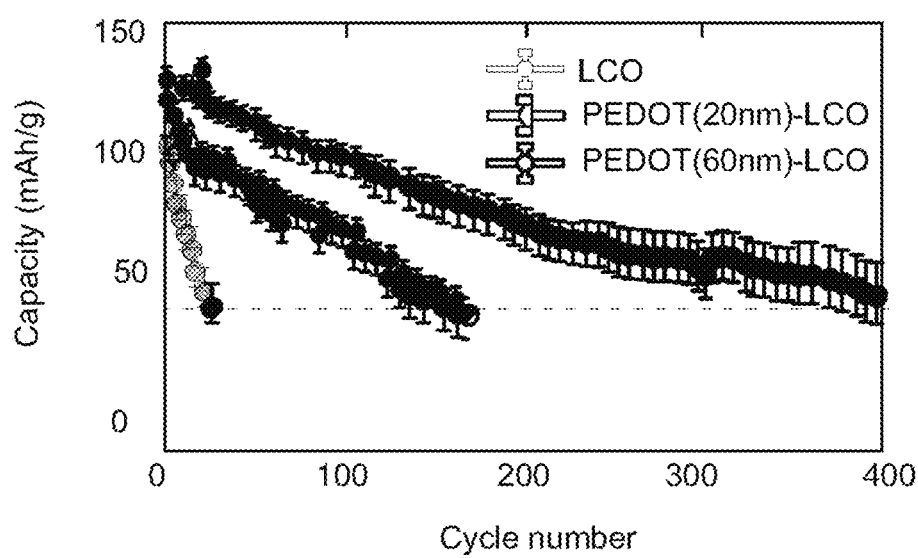

FIGS. 50A and 50B show the discharge capacity degradation of different LiCoO$_2$ electrodes cycled from 3.0 V to 4.5 V at C/2. The discharge capacity degradation shows that selecting a polymer artificial coating may improve the cycling stability of LiCoO$_2$. With the same 10 nm thick polymer coating, PEDOT decreases the capacity fading rate from 1.33% per cycle to 0.57% per cycle, while the copolymer P(PFDA-co-DVB) increases the value to 2.22% per cycle and PDVB shows no significant effect (FIG. 50A). The influence of the PEDOT coating on LiCoO$_2$ cycling stability may be improved by increasing the coating thickness (FIG. 50B). For example, the capacity fading rate may be reduced from 1.33% per cycle to 0.073% per cycle when a 60 nm thick PEDOT coating is applied, which provides a more than 1700% of cycle life improvement. Additionally, the PEDOT coating increases LiCoO$_2$ initial discharge capacity from 153 mA h/g to 173 mA h/g (see FIG. 51A). The increased initial capacity may be attributed to the improved electron and Li$^+$ transport in the PEDOT-coated LiCoO$_2$ that reduces the overpotential during the cycling. Improved rate capability and improved cycling stability indicates that the PEDOT artificial coating may fast charge of LiCoO$_2$ electrodes at high voltage. FIG. 50C shows a comparison of the 5 C cycling stability of LiCoO$_2$ electrodes having and lacking PEDOT coatings. The 5 C cycling stability of LiCoO$_2$ electrode degrades to 50% after only 30 cycles. In comparison, the cycle number is extended to 300 cycles when a 60 nm thick PEDOT coating is applied. Additionally, the initial discharge capacity at 5 C is increased from 104.8 mA h/g to 132.3 mA h/g when a 60 nm thick PEDOT coating is applied (see FIG. 51B).

Figure 50D:
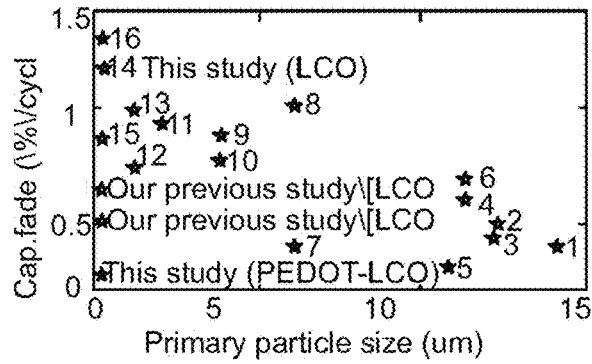

FIG. 50D summarizes the 4.5 V capacity fade rate of LiCoO$_2$ to compare the cycling stability of LiCoO$_2$. The capacity fading rate decreases with the increase of LiCoO$_2$ primary particle size. This indicates that surface degradation may contribute to capacity degradation with an upper cutoff voltage of 4.5 V. The capacity fade rate of the pristine LiCoO$_2$ follows the trend in shown in FIG. 50D. When a 60 nm thick PEDOT coating is applied, the capacity fade rate is reduced from 1.25% per cycle to 0.080% per cycle, or in other words, more than 15 times of cycle life improvement. Moreover, the effect of the PEDOT artificial coating on LiCoO$_2$ cycling stability is better than inorganic coatings, such as TiO$_2$ and ZrO$_2$. Without wishing to be bound to any particular theory, it is believed that the dioxane ring in the PEDOT molecular structure provides a coordination site for HF, a common side product in commercial LiPF$_6$-based electrolyte. In comparison, HF attacks metal oxides (TiO$_2$ and ZrO$_2$) and triggers an HF generation-corrosion loop, which reduces their protection for LiCoO$_2$ electrodes. This result demonstrates the advantages of applying polymer artificial coatings compared to inorganic coatings for battery electrodes.

Figure 50E:
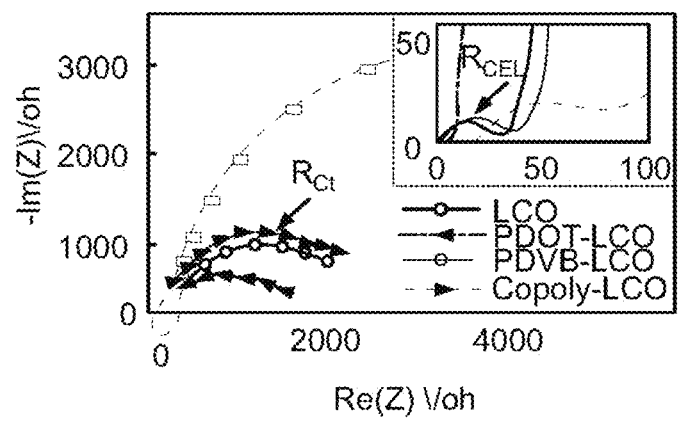
Figure 52A:
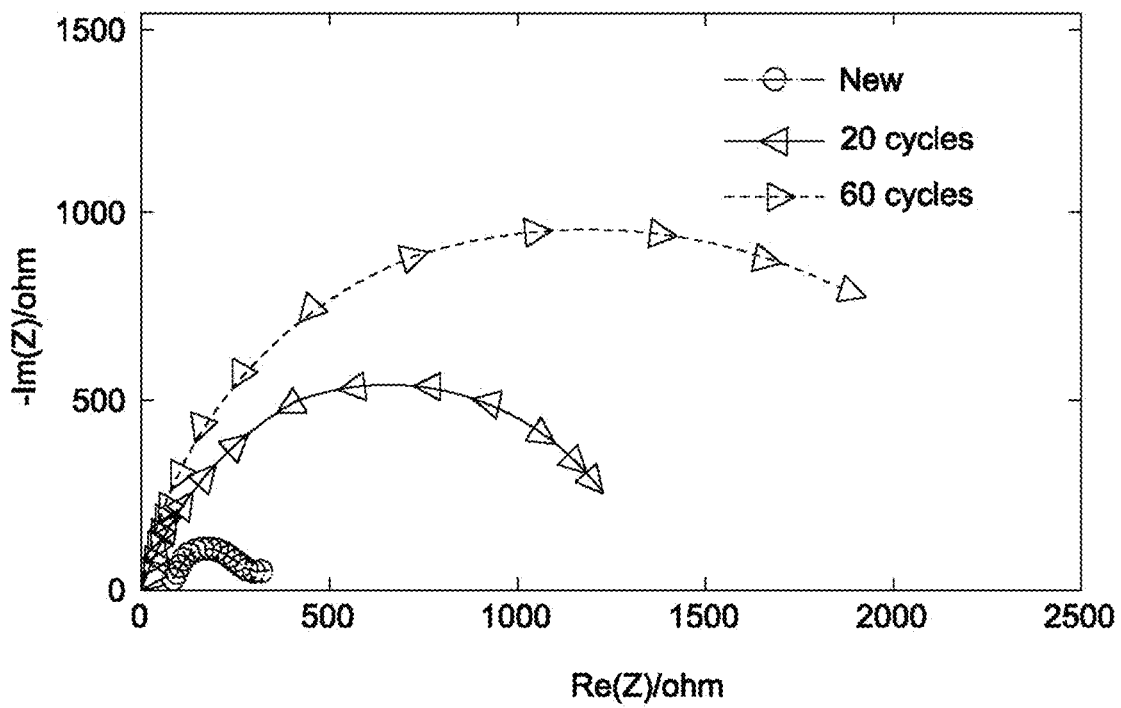
FIGS. 52A-D show the evolution of impedance for $LiCoO_2$ electrodes during 4.5 V high voltage cycling test.
Figure 52B:
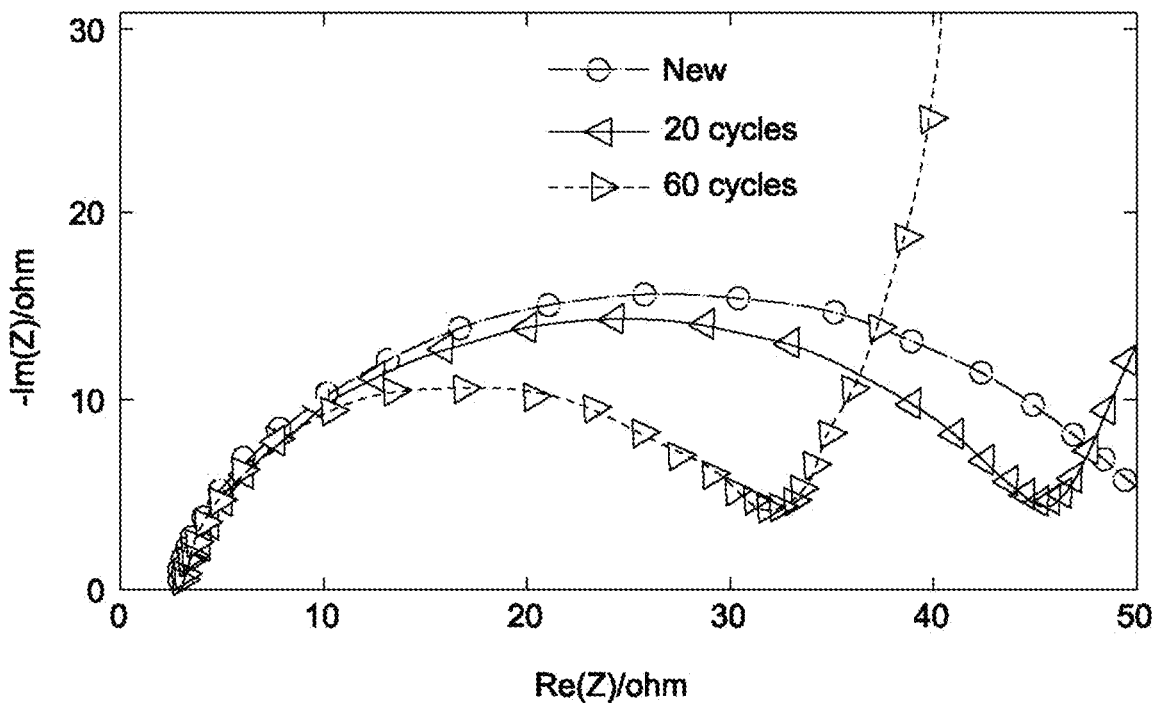
Figure 52C:
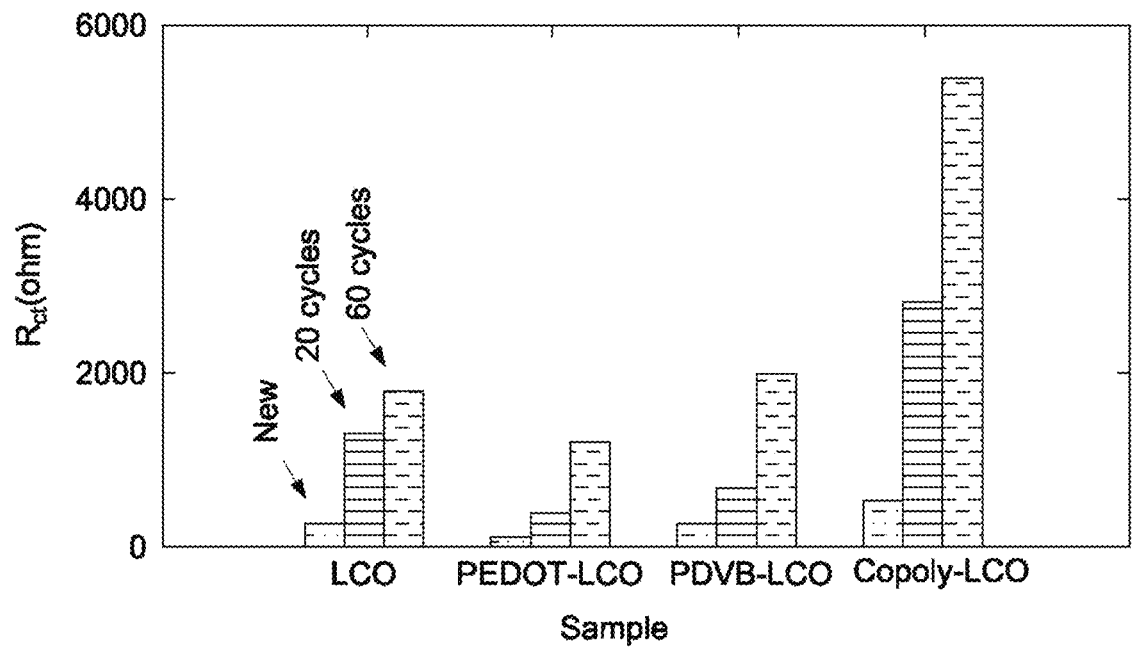
Figure 52D:
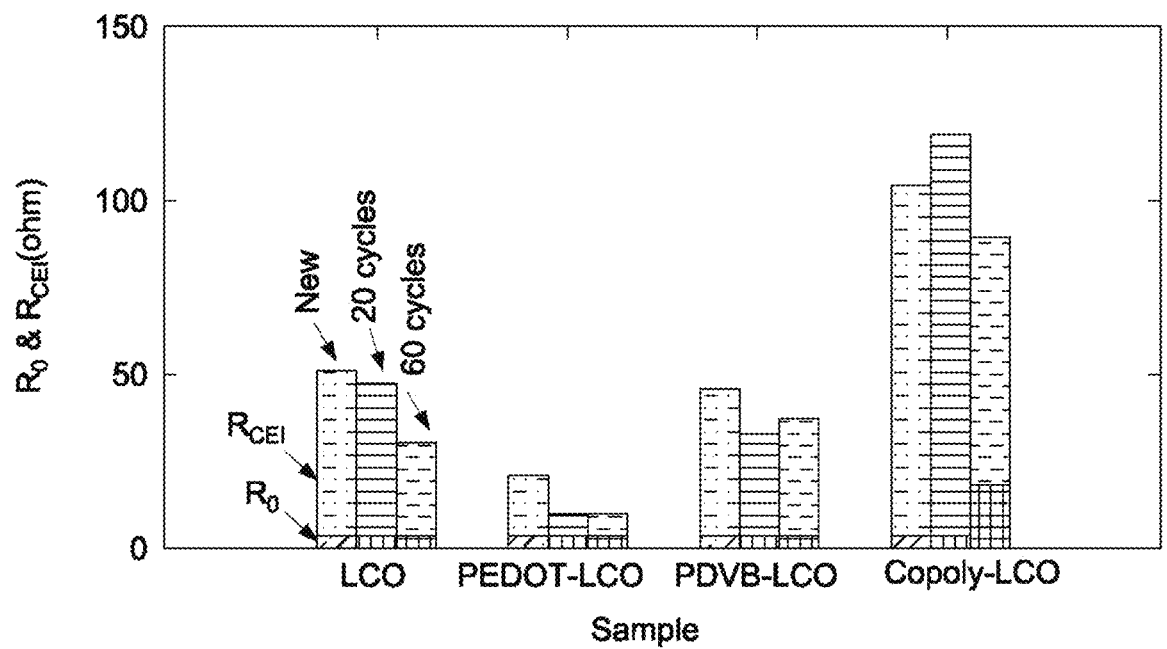

The effect of polymer coatings on the kinetics of the LiCoO$_2$ electrode during cycling may be characterized by the impedance and Li diffusion coefficient of the electrode at different aging states. FIG. 50E compares the EIS of different LiCoO$_2$ electrodes after 60 cycles. Compared to the cells before cycling (see FIG. 42B), the overall impedance for the LiCoO$_2$ electrodes increases by more than two orders of magnitude. The PEDOT coating may inhibit the growth of the impedance, while the copolymer P(PFDA-co-DVB) accelerates the growth and the PDVB has little effect. FIG. 52 compares the impedance of a pristine, non-coated LiCoO$_2$ electrode at new state, after 20 cycles, and after 60 cycles. The result shows that the increase in the charge-transfer resistance (R$_{ct}$) may be the main contribution to the overall impedance. A second-order ECM may be applied to fit the impedance as only two semi-circles are identified from the EIS (see FIGS. 52A and 52B). The fitted results are shown in FIGS. 52C and 52D. The R$_{ct}$ dominates among all the resistances during the cycling test. Without wishing to be bound to any particular theory, it is believed that the large increase of R$_{ct}$ may be from the formation of resistive side products on the surface of LiCoO$_2$, such as LiF and Li$_x$PF$_y$, and surface structure destruction caused by Co dissolution and O$_2$ release. The R$_{CEI}$ decreases for all the LiCoO$_2$ electrodes during cycling (FIG. 52D). This result may contradict the general belief that the thickness of the passive CEI layer on LiCoO$_2$ gradually increases during cycling. Without wishing to be bound to any particular theory, it is believed that the reduced R$_{CEI}$ may relate the formation of micro cracks in LiCoO$_2$ particles during cycling. This may increase the total surface area and, thus, reduce the R$_{CEI}$ of the electrode.

Figure 50F:
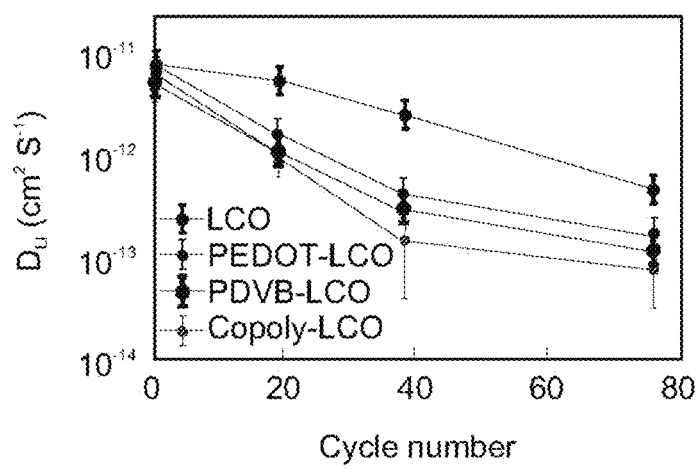
FIG. 50F shows the evolution of Li diffusion coefficient in different $LiCoO_2$ electrodes measured using GITT. The values are averaged for all measured $D_{Li}$ values between 4.0 V to 4.5 V.
Figure 53A:
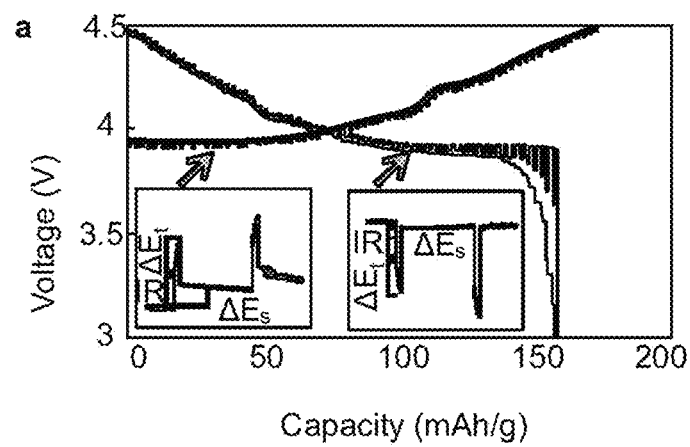
FIGS. 53A and 53B show diffusion coefficient of Li in $LiCoO_2$ electrodes calculated from GITT technique.
Figure 53B:
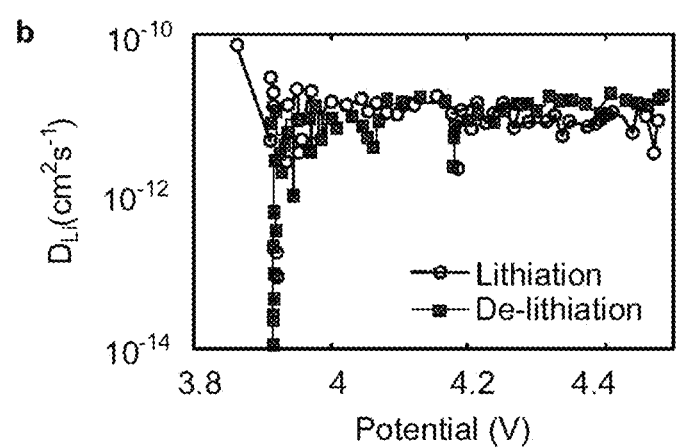

The Li diffusion coefficient in LiCoO$_2$ is a bulk property that may not be affected by polymer coatings. However, an artificial polymer coating may change the LiCoO$_2$ surface stability during cycling, which may cause a different apparent diffusion coefficient of Li (D$_{Li}$) in aged LiCoO$_2$. For example, LiCoO$_2$ surface may lose soluble cobalt species and O$_2$ when it is cycled above 4.2 V may lead to surface destruction and structural instability, which may affect the D$_{Li}$ during cycling. Galvanostatic intermittent titration process (GITT) may be used to characterize the D$_{Li}$ in LiCoO$_2$ (see FIG. 53). FIG. 50F shows that the D$_{Li}$ in pristine LiCoO$_2$ decreases by two orders of magnitude (from $10^{11}$ cm$^2$ S$^{-1}$ to $10^{-13}$ cm$^2$S$^{-1}$) after 80 cycles. The PEDOT coating may decelerate the decrease of D$_{Li}$, while the PDVB coating may have no significant effect, and the copolymer may accelerate the degradation rate of D$_{Li}$. The improved D$_{Li}$ retention by the PEDOT coating matches well with the amount of Co element dissolution measured through inductively coupled plasma mass spectrometry measurement (ICP-MS), which shows that the PEDOT coating reduces the Co dissolution from 0.27% to 0.08% in LiCoO$_2$ after 40 cycles.

The improved cycling stability from the PEDOT coating may relate to the interaction between polymer coatings and LiCoO$_2$. FIG. 54A-C compares XPS patterns of Co, S, and O in different samples. The binding energies of these XPS peaks are fitted via Lorentzian/Gaussian functions and the fitted values are listed in Table 8 and Table 9. Pristine $LiCoO_2$ has $Co^{3+}$ 2p peaks at 780.61 eV and 795.45 eV. These peaks are not affected by the PDVB and the copolymer coating, but the PEDOT coating increases the binding energies to 781.72 eV and 797.31 eV. FIGS. 54B and 54C shows that the S 2p and O is binding energies for PEDOT on $LiCoO_2$ are smaller than those for a PEDOT film deposited on a silicon wafer, which interacts weakly with the polymer. The Co at the surface of $LiCoO_2$ may form chemical/covalent bonds with S and O present in PEDOT. These bonds may inhibit the dissolution of cobalt species from $LiCoO_2$ during its cycling and prevent electrolyte decomposition.

DFT calculations may be used to characterize the electrode-polymer interactions in the system of $LiCoO_2$-PEDOT and $LiCoO_2$-PDVB. The repeating unit of PEDOT/PDVB (monomer) is utilized to reduce the computational cost. FIGS. 54D and 54E show the structure constructions that have the minimum global Gibbs free energies for the two systems. Interactions between EDOT and the $LiCoO_2$ surface impact the electronic state of the EDOT molecule and the closest Co atom on the $LiCoO_2$ surface, while only small changes in electronic structure are observed for DVB. The binding energy of the system may be obtained from Equation 15. Table 19 decomposes the binding energies of both molecules into their electronic and dispersion components. Only 4% of the DVB-$LiCoO_2$ binding energy may relate to the electronic interactions (−0.05 eV out of −1.29 eV), while 32% of the EDOT-$LiCoO_2$ binding energy may relate to the electronic interactions (−0.44 eV out of −1.36 eV). The results indicate that the sulfur in EDOT forms chemical bonds with Co on the surface of $LiCoO_2$, while DVB interacts with $LiCoO_2$ almost completely through van der Waals interactions.

$$\Delta E_{bind} = E_{total}(\text{surface+molecule}) - E_{total}(\text{surface}) - E_{total}(\text{molecule}) \quad \text{Equation 15}$$

where $\Delta E_{bind}$ is the binding energy between $LiCoO_2$ and a monomer; $E_{total(surface+molecule)}$ is the total electronic energy of the optimized surface and adsorbate, $E_{total(surface)}$ and $E_{total(molecule)}$ are the total energy of the optimized surface and molecule when separated.

FIGS. 54F and 54G show the mechanisms of the improved $LiCoO_2$ cycling stability by the PEDOT artificial coating. Firstly, the dioxane ring the PEDOT may chemically coordinate HF in electrolyte, which may significantly decrease the concentration of HF and reduce the dissolution of Co element from $LiCoO_2$. In comparison, the pristine $LiCoO_2$ goes through an HF generation-corrosion loop, resulting in continuous transition metal dissolution during cycling tests. The percentage of Co dissolution from $LiCoO_2$ may be characterized using ICP-MS measurement. The result shows that the 10 nm thick PEDOT coating reduces the Co dissolution from 0.27% to 0.08% after 40 cycles. Secondly, the PEDOT forms chemical bonds with Co present in $LiCoO_2$. The transition metals in battery cathodes may be the active sites for electrolyte decomposition. Hence, these chemical bonds may alleviate parasitic reactions between electrolyte and $LiCoO_2$. Thirdly, as PEDOT may be a good conductor for electrons and $Li^+$, provide channels for the transport of electrons and $Li^+$ in LIBs. These channels may reduce the kinetics degradation of the $LiCoO_2$ during cycling. Lastly, the PEDOT coating may improve the homogeneity of current distribution over the $LiCoO_2$ electrode, and, therefore, reduced local current density for active regions in $LiCoO_2$. In comparison, high flux of lithium insertion/extraction from pristine $LiCoO_2$ may generate fast mechanical stress/strain oscillation during cycling, leading to micro-cracks in $LiCoO_2$ particles and eventually mechanical fatigue of the $LiCoO_2$ electrode.

Considerations for Selecting and Designing Polymer Coatings for Battery Electrodes. The polymer coating may have very different effects on the electrochemical performance of the $LiCoO_2$ electrode. The PEDOT artificial coating may improve rate capability and cycling stability, the PDVB coating may have no significant effect, and the P(PFDA-co-DVB) coating may worsen both performance metrics. The compositions and properties of the CVD polymer thin films, the interactions between the polymer coating and $Li^+$, and the interactions between the polymer coatings and $LiCoO_2$ may be considered to select polymers as artificial coatings for battery cathodes:

The polymer coating may provide fast transport channels for $Li^+$ and electrons to promote kinetics of battery cathodes. The functional groups in a polymer may have reasonable binding energy with $Li^+$ and sufficient binding sites for $Li^+$. For example, the binding energy of $Li^+$ in PEDOT (−2.17 eV) may be lower than that in PDVB and P(PFDA-co-DVB), which may cause the transport of $Li^+$ in the PEDOT polymer matrix. Additionally, PEDOT has almost twice the binding sites for $Li^+$ compared to P(PFDA-co-DVB). This may reduce the hopping distance of $Li^+$ from one site to its neighbors, and, thus, improve the transport of $Li^+$ in the polymer matrix. To promote the transport of electrons in cathodes, the polymer may have conducting conjugated bonds or at least semi-conducting conjugated bonds.

The polymer may form chemical bonds with the transition metals on the surface of the cathodes. Transition metals may comprise active sites for electrolyte decomposition. The chemical bonds between transition metals and polymers may alleviate parasitic reactions between electrolyte and cathodes. The polymer may comprise functional groups having sigma donors or both σ and π donors. For example, PEDOT comprises dioxane and thioether functional groups that may chemically bond with Co on the surface of $LiCoO_2$. In comparison, PDVB may interact with $LiCoO_2$ through only Van der Waals force.

The polymer may comprise functional groups that sequester HF. HF is a common side product in $LiPF_6$-based electrolyte that reacts with battery cathodes. The reaction leads to transition metals dissolution and generates side products, such as LiF, that block $Li^+$ transport and increase the impedance. The dioxane ring in PEDOT may comprise at least one HF coordination site by forming O—H—F covalent bonds. This may reduce the Co dissolution from 0.27% to 0.08% after 40 cycles when a 10 nm thick PEDOT artificial coating is applied.

The polymer may be electrochemically stable at high voltage (>4.5 V) to be compatible with the cathode materials. PEDOT is stable with 4.6 V high voltage cathodes. In comparison, the poor cycling stability of the P(PFDA-co-DVB)-coated $LiCoO_2$ may relate to the poor electrochemical stability of the copolymer at high voltage.

The chemical vapor deposition (CVD) polymerization process may be characterized as a chemically versatile, non-line-of-sight process for creating uniform and/or conformal polymer thin films with improved compositional control. A comparison of three different polymers, including PEDOT, PDVB and P(PFDA-co-DVB), for engineering the surface of battery cathodes shows the importance of selecting polymers having desirable properties for engineering battery electrodes. For example, the 4.5 V cycle life of the LiCoO$_2$ is increased by over 1500% using the CVD PEDOT polymer coating, while it is largely reduced by the CVD P(PFDA-co-DVB) polymer coating. In addition, the CVD PEDOT coating improves the cycle life of LiCoO$_2$ better than inorganic coatings, such as TiO$_2$ and ZrO$_2$, indicating the superiority of organic polymer coatings. The present invention may be characterized by at least one of mild synthesis conditions, conformal coatings, and controllable thickness and functionalities. The CVD polymer coating according to the present invention may improve the performance of battery cathodes, battery anodes, solid electrolytes, and other renewable energy systems, such as solar cells and fuel cells.

CVD Polymerization. iCVD system (GVD Corp.) may be used to synthesize PDVB and P(PFDA-co-DVB), while oCVD system (GVD Corp.) may be used to synthesize PEDOT. The schematics of the two systems are shown in FIG. 37. All chemicals may be purchased from Sigma-Aldrich without further purification, including DVB, EDOT, PFDA, t-butylperoxide (TBPO) and FeCl$_3$. To synthesize PEDOT, the flow rate of EDOT monomer and argon carrier gas may be 1 sccm and 2 sccm, respectively. The chamber pressure may be held constant at 50 mTorr, the stage temperature may be controlled to 130° C., and the temperature of crucible comprising the FeCl$_3$ oxidant may be 200° C. The thickness of the film may be controlled by varying deposition time. To grow PDVB, the flow rate of DVB monomer, TBPO initiator, and argon carrier gas may be 1.3 sccm, 2.0 sccm, and 8.5 sccm, respectively. The chamber pressure may be held constant at 500 mTorr, the stage temperature may be controlled to 25° C., and the filament temperature may be 230° C. to cleave TBPO initiator. Such conditions provide a ratio of 0.14 between monomer partial pressure ($P_m$) to saturation pressure ($P_{sat}$) that is low enough to provide conformal coating for complex structures. As for P(PFDA-co-DVB) synthesis, the flow rate of PFDA monomer, DVB monomer, TBPO initiator, and Ar carrier gas may be 0.16 sccm, 0.6 sccm, 1.0 sccm, and 0.4 sccm, respectively. The chamber pressure may be held constant at 100 mTorr, the stage temperature may be 30° C., and the filament temperature may be 230° C. to cleave TBPO initiator. The $P_m/P_{sat}=0.10$ for PFDA monomer may provide a conformal coating for LiCoO$_2$ electrodes. The thicknesses of iCVD films may be characterized by an interferometer built in the iCVD system, and, thus, the desired thickness may be achieved.

Material Characterization. SEM and EDS may be conducted on Quanta 600 (Thermo Fisher Scientific) using 5.0-10.0 kV accelerating voltages, depending on the conductivity of the materials. The spot size may be around 10 nm. The trench to study the conformal coating may be 6 μm deep and 1 μm wide and an 8 μm spacing between the trenches. A 2 nm thick platinum may be coated on the surface of the samples to reduce the surface charging during SEM imaging. TEM may be carried out on a JEOL 2000EX electron microscope operating at 200 kV in a bright field. Copper grids (300 mesh, TED PELLA, INC.) may be coated with about 50 Å thick amorphous carbon film may be utilized to hold LiCoO$_2$ particles. The whole grids may be placed in CVD chambers to be coated with polymers. Then, TEM images may be take on these samples. The thicknesses of transparent PDVB and P(PFDA-co-DVB) on silicon wafer may be measured by ellipsometry, while the thickness of optical nontransparent PEDOT on silicon wafer may be measured by profilometry. In addition, the polymer coating thickness on LiCoO$_2$ particles may be measured by TEM because of their rough surface. As the different substrates, the polymer film may be about two times thicker on silicon wafer than that on LiCoO$_2$ particles under the same conditions. Raman spectroscopies may be measured using the NT-MDT Spectra AFM/Raman system equipped with a visible Raman microscope and a CCD detector. The excitation wavelength may be 532 nm, and the spectra may be obtained over 10 s at a 1.0 cm$^{-1}$ resolution. XPS measurements may be characterized using monochromatized Al K a radiation (1486.7 eV) as the X-ray source. The base pressure may be 10$^{-8}$ Pa and the spot diameter may be 600 μm during the test. Three survey scans with a step size of 1.0 eV may be collected, followed by ten high-resolution scans with a step size of 0.1 eV for target elements. All the binding energies may be calibrated by the C 1s hydrocarbon peak (284.8 eV). The obtain XPS data may be analyzed by Avantage software with the following parameters: full width at half-maximum (eV)=0.5:3.5 and Lorentzian/Gaussian=30%.

Electrochemical Characterization. Electrochemical performance may be measured in CR2016 coin cells. All the raw materials may be purchased from MTI Corporation, unless specified. The LiCoO$_2$ electrodes may be made by casting a slurry contained 80% LiCoO$_2$, 10% polyvinylidene fluoride binder, and 10% super-P conductive agent onto Al current collectors. The typical load may be 3-4 mg cm$^{-2}$. After drying, disks having a diameter of 14 mm may be punched and used as cathodes. Coin cells may be assembled in glove box (Thermo Fisher Scientific) with H$_2$O and O$_2$ level less than 0.5 ppm using lithium chip as anode, Cellgard separator, and 1M LiFP$_6$ dissolved in ethylene carbonate/diethyl carbonate (1:1 in volume) as electrolyte. The PDVB-coated and copolymer-coated LiCoO$_2$ electrodes may be utilized directly, while the PEDOT-coated LiCoO$_2$ may be rinsed in methanol for 5 min to remove residual monomer and oxidant. The electrochemical performances of coin cells may be tested using a VMP3 (Biologic Company) and LAND battery cyclers (LAND Electronics Co., Ltd.). All cells may be cycled using C/10 rate within voltage range of 3.0-4.2 V before conducting other tests. All tests may be conducted at room temperature unless otherwise stated. The rate capability may be measured using constant-current (CC) constant-voltage (CV) charging protocol followed by CC protocol at different C-rates within 3.0-4.2 V. The current during CC charging may be C/3 and the cut-off current during CV charging may be C/100. EIS measurement may be conducted at 4.0 V for all cells by applying an AC voltage of 10 mV amplitude over the frequency range of 100 kHz to 10 mHz. High voltage cycling test may be carried out within voltage range of 3.0-4.5 V at C/2 using CC protocol for both charging and discharging. The GITT measurement may be conducted by applying a 10 min galvanostatic charge/discharge pulse (C/10) followed by a 2 h relaxation within voltage range of 3.0-4.5 V.

Coin cells may be disassembled in an argon-filled glove box with O$_2$ and H$_2$O level below 0.5 ppm to study the Co dissolution from LiCoO$_2$ electrodes after cycling. All components may be immersed in 10 mL dimethyl carbonate (DMC) for three days. Two mL of the solution may be then diluted in 6 mL HNO3 (65%). The mixed solution may be heated to 120° C. in a vacuum chamber until all liquid disappeared. The remaining white/yellow powder may be collected and dissolved in 10 mL deionized water, followed by 30 min of ultrasonic treatment. Finally, 6 mL solution may be filtered through a 0.45 μm filter and 0.2 mL HNO$_3$ (70%) may be added to the solution before conducting the inductively coupled plasma mass spectrometry (ICP-MS, Agilent Technologies 7700 Series).

Neutron Reflectometry. Neutron Reflectometry (NR) experiments may be performed on the MAGIK reflectometer at the NIST Center for Neutron Research NCNR. Specular NR measures the reflected intensity of a collimated, monochromatic neutron beam scattered from the sample surface. Fitting the variations in reflected intensity as a function of scattering vector yields a one-dimensional depth profile of the sample SLD, which is a function of the sample composition. Samples may be analyzed in a helium-filled aluminum chamber, and NR data may be collected on the unlithiated polymer thin films.

NR data may be fit using Refl1d. In this program a model SLD profile may be used as a layered structure of material "slabs". Each slab may be described by: (i) real and imaginary SLD (which may be related by composition), (ii) thickness (in Å), and/or (iii) width of the interface with the next layer (i.e., the interfacial roughness and interdiffusion, in Å). The interface width may fit as a fraction of the thinnest layer to which it is in contact. Fitting of the models may be completed using DREAM, a differential evolution algorithm. DREAM randomly generates many models within a given parameter space and allows this population to "evolve" over a user-defined number of generations. The calculated resultant population density represents the probability density because the probability of retaining a given parameter set may be proportional to its likelihood. This method serves as an approach to sample multi-dimensional parameter spaces without selecting only a nearby local minima (as may occur in gradient descent approaches), may be able to identify multiple best fits when more than one solution is statistically feasible, and provides accurate uncertainty estimates for fitted parameters, as it may preserve inter-parameter correlations. Samples may be fit independently of one another, with zero, one (1), two (2), three (3) and, in certain cases, four-slab models. In certain cases, the parameters of these slabs may be allowed to vary over a wide range to account for possible compositional variations and thicknesses of the polymer films. Models having and lacking the native oxide, SiOx, are tested. In the case of the SiOx models, the SLD parameter for this layer are limited to a range of 2.0 to 3.0. The quality of a model's fit may be determined by comparing it to the measured profile and calculating the $\chi 2$, and the difference between fits may be evaluated using Bayesian Information Criteria (BIC).

Neutron Depth Profiling. NDP data may be acquired at Neutron Guide 5 (NG5), Cold Neutron Depth Profiling station at the NIST Center for Neutron Research (NCNR) at the National Institute of Standards and Technology (NIST). Samples may be mounted behind a 6.0 mm circular, Teflon® aperture. Each sample may be irradiated at a near constant fluence rate of cold neutrons (about 109 cm.$^{-2}$ s$^{-1}$), and the tests may be conducted under vacuum and near room temperature. NDP spectra are collected for about 4 hrs per spot. $^6$Li nuclear reaction triton (t) and alpha (a) particles are detected using a circular transmission-type silicon surface-barrier detector that are positioned about 120 mm from the sample surface. Each spectrum may be corrected for dead time (about 0.01%) and background signals.

Interactions of the triton (3H) particles with the polymers may be modeled in SRIM utilizing the densities obtained by NR (see Table 11). Processed profiles are used to estimate the relative penetration of Li into the polymers. Li concentrations are calculated in reference to the known concentration of $^{10}$B in a B-implanted concentration standard. Final reported uncertainties may be reported to $2\sigma$ and may be calculated from experimental counting statistics.

DFT Calculation. DFT calculations on polymer cluster models may be performed using Gaussian 16. Structures may be optimized at the B3LYP/6-31G* level with D3 dispersion and Becke-Johnson damping (D3BJ). The energy of each fully optimized structure may be recalculated at the B3LYP/cc-pVDZ level with D3BJ dispersion. The vibrational frequencies of optimized molecular structures may be calculated at the B3LYP/6-31+G* level with D3BJ dispersion and may be used to confirm that all molecular structures are fully optimized. The frequencies may be then used within the ideal gas, rigid rotor, and harmonic oscillator approximations to calculate free energy contributions for each structure. The binding sites may be identified by systematically placing Li$^+$ atoms at different binding sites and fully optimizing each structure to identify the most favorable binding site and orientation.

Each periodic DFT calculation that includes $LiCoO_2$ surfaces may be performed using the Vienna ab initio simulation package (VASP). These calculations may use the Perdew-Burke-Ernzerhof (PBE), GGA exchange correlation functional and the projector augmented wave (PAW) method. D2 dispersion may be utilized to account for Vander Waals interactions. On-site Hubbard U model (U-J=3.3 eV) may be used to account for the over-delocalization of electron density present in DFT.

The adsorption of EDOT and DVB may be modeled to a 4-layer thick (1014) $LiCoO_2$ surface comprising 48 $LiCoO_2$ formula units in unit cell with a=18.0 Å, b=11.26 Å, gamma=108.22°, and 20 Å of vacuum space. The (1014) $LiCoO_2$ surface may be desirable for its stability at a variety of experimental conditions and facilitating Li$^+$ to be transported away from the surface. Using a gamma-point and an energy cutoff of 800 eV may provide converged energies for the $LiCoO_2$ surface having and lacking the adsorbates present. All structures may be optimized using the default VASP convergence criteria. The bottom 2 layers of the $LiCoO_2$ slab are fixed to bulk $LiCoO_2$ coordinates. The energies for a variety of different EDOT and DVB orientations may be compared at different adsorption sites in the surface to locate low energy adsorbate structures. Electron density difference plots may be calculated by subtracting the electron density of the surface and EDOT or DVB from the electron density of the full system. The surface area of the EDOT and DVB molecules that interacted with the $LiCoO_2$ surface may be estimated by placing spheres (R=Vander Waals radii, RH=1.20 Å, RO=1.52 Å, RC=1.70 Å, Rs=1.80 Å) on each atom of the fully optimized EDOT/DVB molecule adsorbed to the $LiCoO_2$ surface. These spheres may be projected onto the XY plane (the plane that is parallel to the surface) to obtain the approximate surface area of each molecule interacting with the surface.

In-Operando ED-XRD Measurement. In-operando energy dispersive X-ray diffraction (ED-XRD) measurements we may be re conducted using beamline 6-BM-A at the Advanced Photon Sources in Argonne National Laboratory. The white x-ray radiation may be generated by bending magnets with energy range of 20-200 keV, and the detection angles may be 2.99° and 6.70° for two Canberra germanium detectors to collect the diffraction spectrum. The in-operando testing may be conducted using a transmission geometry to provide spatial and temporal mapping capabilities. Coin cells are cycled at C/2 within 3.0 V to 4.5 V, during which ED-XRD spectrum may be collected for 60 s at one point. The height (10 μm) and width (2 mm) of the incident X-ray beam may be kept constant during the measurement. Three points at different amplitudes, corresponding to different locations to separator, may be measured continuously followed by a 60 s rest. The XRD data may be collected until the cells went through one full cycle.

Neutron Reflectometry Results of Polymer Thin Films on Si Wafers. PEDOT: Four independent models are tested for PEDOT, two comprising an $SiO_x$ layer and two lacking an $SiO_x$ layer. The results are shown in Table 14. According to the Bayesian Information Criteria (BICs), the best fit model may be for a sample lacking the $SiO_x$ layer and one polymer slab (Si, Poly1, Air). This fit is shown in Table 14 and FIG. 55. The no $SiO_x$ model having two layers of polymer produce essentially the same fit profile (with the additional layer approximately matching the scattering length density (SLD) of the Si substrate), however, the BIC is higher than that for the first model due to the inclusion of more fitting parameters. Modeling with an $SiO_x$ layer that is allowed to vary widely and one polymer slab or two polymer slabs also reproduced the SLD profile of the Si, Poly1, Air model, by fitting the $SiO_x$ SLD to the same value as Si. Interestingly, the best fit model may not include the presence of a native $SiO_x$ layer. This may be common to all measured samples. This indicates that the deposition process removes this layer. The polymer air interface width is 5.7 nm, RMS, indicating the surface of the sample may be relatively rough.

P(PFDA-co-DVB): Six independent models may be tested for the Co-Poly sample, three lacking $SiO_x$ and three comprising $SiO_x$. The calculated parameters for each model are summarized in Table 15. The best fit is found for the Si, Poly 1, Poly 2, Poly 3, air and the Si, $SiO_x$, Poly1, Poly 2, air models. Statistically, these models represent the data equally as well and result in the same $x^2$ and BIC values. The chemistry of the layer between z=0 Å and 50 Å (FIG. 38) is not known. The layer's calculated SLD ($2.2191(95) \times 10^{-4}$ $nm^{-2}$) is above the SLD expected for PDVB (1.291), but below the SLD for PFDA ($3.729 \times 10^{-4}$ $nm^{-2}$), which are the two constituents of the co-polymer. The calculated SLD is close to the Si SLD and may be a remnant of the native Sift layer. For this test the "bulk" co-poly layer may be assigned to the average SLD of the 50 Å to 200 Å region, which has an SLD of 2.438(18). All other models listed in Table 15 have higher BICs and $\chi^2$s. The calculated surface roughness for the Co-Poly may be less and close to 1 nm.

PDVB: Five independent models may be tested for the PDVB sample, three lacking SiOx and two comprising SiOx. The best fit model may be the Si, Poly 1, Poly 2, Air, and is summarized in Table 16 and FIG. 39. A one polymer slab lacking SiOx model has the highest χ2 value and third highest BIC. The two highest BIC values may be calculated for the models comprising SiOx. The no SiOx model with three layers has the overall best BIC and χ2, however it has very large uncertainties associated with both the SLDs and thickness parameters, and the SLD of the layer closes to Si support (Poly 1 in the 3-layer model) has a calculated value statistically close to that of Si. The SLD of the "bulk" polymer layer in the 3-layer (Poly 3) is statistically the same that of the bulk polymer in the 2-layer model (Poly 2). The low SLD layers in both models are not statistically different. Therefore, it may be determined that no SiOx, 2-layer model is the best model for this profile despite having a slightly higher BIC by about 4. The surface roughness of the best-fit-model may be calculated to be about 1.7 nm.

Discussion of the Neutron Reflectometry Measurements. A summary of calculated SLDs for the "bulk" polymer slabs and calculated density for each sample is shown in Table 17. The underlying native Sift layer appears to have been either removed (as is the case with PEDOT and possibly PDVB) or modified (as is the case with Co-Poly). The NR-determined densities for all polymers are less than those reported in the literature, which may be from different synthesis methods and conditions.

Neutron Depth Profiling to Measure Li Distribution in Polymer Films. The Li distribution in the polymer film may be characterized using neutron depth profiling. The sample may be prepare as follows: About 7.0 mL of electrolyte (1 M $LiFP_6$ in EC+DEC (50:50 wt %) ay be added to a 25.0 mL Nalgene® bottle. Using clean, stainless steel tweezers, immerse sample, polymer face side up, into electrolyte solution to completely immerse the wafer in the electrolyte. Cap the bottle to prevent evaporation of the electrolyte. Leave sample in electrolyte for three days. Remove wafer from electrolyte solution with clean tweezers and place in a clean plastic petri dish, polymer side up. Add 4.0 mL of DMC to the petri dish and lightly swirl the dish to move the solution over around the sample for 5.0 min. Remove wafer from the petri dish and place onto a clean towel (polymer side up) to wick away excess DMC. Place the wafer into clean petri dish and allow to sit under lightly flowing He gas for at least 3 hrs. Load the sample into a clean Kapton sleeve and seal the sleeve shut. Remove the sample from the glovebox and immediately load the sample into NDP chamber under flowing argon gas. Run NDP experiment for 4 hours under standard NDP operating conditions (i.e., under vacuum). Steps 1 to 8 may be completed in a low moisture (0.0 ppm) and low 02 (0.1 ppm) He filled glovebox.

EDOT/DVB Binding Energy Calculations. The binding energies between EDOT/DVB and the $LiCoO_2$ surface may calculated from Equation 15 where $E_{total}$(surface+molecule) is the total electronic energy of the optimized surface and adsorbate, $E_{total}$(surface) and $E_{total}$(molecule) correspond to the total energy of the optimized surface and molecule when separated.

The contribution of the dispersion to the binding energies between EDOT/DVB and the $LiCoO_2$ surface may calculated using Equation 16:

$$\Delta E_{disp} = E_{disp}(\text{surface+molecule}) - E_{disp}(\text{surface}) - E_{disp}(\text{molecule}) \quad \text{Equation 16}$$

where the energy terms are the same to those in equation 2, but only include the energy contributions from dispersion.

Finally, the difference between the total binding energy ($\Delta E_{total}$) and the dispersion contributions ($\Delta E_{disp}$) corresponds to the remaining electronic contributions ($\Delta E_{elec}$), as shown in Equation 17:

$$\Delta E_{elec} = \Delta E_{total} - \Delta E_{disp} \quad \text{Equation 17}$$

19 decomposes the binding energies between EDOT/DVB and the $LiCoO_2$ surface. As shown in Table 19, EDOT has a more favorable interaction with the surface than DVB. Most of the interaction between DVB and the $LiCoO_2$ surface may be attributed to dispersion interactions, while EDOT has an additional electronic component that may be attributed to chemisorption interactions between the EDOT and the surface.

The dispersion contribution to the DVB binding energy (−1.24 eV) may be larger than that of EDOT (−0.92 eV). When the dispersion contributions are scaled by the cross-sectional area of each molecule that interacts with the surface, the dispersion interactions may have a similar magnitude (see Table 19). Therefore, when PEDOT and PDVB occupy a similar amount of surface area at the $LiCoO_2$-polymer interface, the total magnitude of the attractive dispersion interactions may be similar. The presence of the additional chemisorption interactions that may occur between PEDOT and Co atoms in the surface may result in PEDOT forming a stronger overall interaction to the surface than PDVB.

The present invention is directed to the following aspects:

Aspect 1. A method to form a coated cathode material, comprising: forming, via chemical vapor deposition, an interfacial layer coating on an exterior surface of a cathode active material, wherein the interfacial layer comprises an organic polymer; wherein the interfacial layer is substantially uniform on and conformal to the exterior surface of the cathode active material; and wherein the chemical vapor deposition comprises one of oxidative chemical vapor deposition and initiated chemical vapor deposition.

Aspect 2. The method of any of the foregoing aspects comprising, after forming the interfacial layer coating, contacting the coated cathode material and an organic solvent to remove impurities from the interfacial layer coating, wherein the organic solvent comprises methanol, isopropyl alcohol, acetone, and combinations thereof.

Aspect 3. The method of any of the foregoing aspects, wherein the cathode active material comprises a temperature from 50-130° C. when forming the interfacial layer coating.

Aspect 4. The method of any of the foregoing aspects, wherein the substantially uniform interfacial layer coating comprises a thickness variation less than 5%.

Aspect 5. The method of any of the foregoing aspects, wherein the substantially uniform interfacial layer coating comprises a thickness from 10-100 nanometers.

Aspect 6. The method of any of the foregoing aspects, wherein the substantially uniform interfacial layer coating comprises at least 95% of the exterior surface of the coated cathode material.

Aspect 7. The method of any of the foregoing aspects, wherein less than 5% of the exterior surface of the coated cathode material lacks the substantially uniform interfacial layer coating.

Aspect 8. The method of any of the foregoing aspects wherein the organic polymer comprises a conductive polymer including poly(3,4-ethylenedioxythiophene), polythiophene, polythiophene derivatives, polypyrrole, polyselenophenes, polyaniline, poly(1,3-dihydroisothianapthene), poly (2-thiophene acetic acid), poly(3-thiopheneethanol), and combinations thereof.

Aspect 9. The method of any of the foregoing aspects, wherein the organic polymer comprises an insulating polymer including polydimethylsiloxane, poly(siloxanes), polyhexavinyldisiloxane, poly(ethylene oxide), poly(isobenzofuran), polyoxymethylene, poly(1,3,5-trimethyl-1,3,5-trivinyl cyclotrisiloxane), poly(1,3,5,7-tetravinyl-1,3,5,7-tetramethylcyclotetrasiloxane), poly(1,3,5-trivinyl-1,3,5-trimethyl-cyclotrisilazane), poly(1,3,5,7-tetravinyl-1,3,5,7-tetramethylcyclotetrasilazane), and combinations thereof.

Aspect 10. The method of any of the foregoing aspects, wherein forming the interfacial layer coating comprises forming at least one of oxide bonds and sulfide bonds between the conductive polymer and cathode active material; and wherein the conducting polymer comprises as least one coordination site for a free acid formed by one of hydrolysis and decomposition of an electrolyte for a lithium ion battery.

Aspect 11. The method of any of the foregoing aspects, wherein forming the interfacial layer coating is solvent-free.

Aspect 12. A coated cathode material comprising: a cathode active material; and an interfacial layer coating the cathode active material, wherein the interfacial layer includes an organic conductive polymer.

Aspect 13. The coated cathode material of any of the foregoing aspects, wherein the interfacial layer comprises a thickness from 10-100 nanometers.

Aspect 14. The coated cathode material of any of the foregoing aspects, wherein the organic conductive polymer comprises poly(3,4-ethylenedioxythiophene), polythiophene, polypyrrole, polyselenophenes, polyaniline, poly(1,3-dihydroisothianapthene), poly (2-thiophene acetic acid), poly(3-thiopheneethanol) formed on an exterior surface of a cathode active material via oxidative chemical vapor deposition.

Aspect 15. The coated cathode material of any of the foregoing aspects, wherein the cathode active material comprises a layered lithium transition metal oxide selected from lithium nickel manganese cobalt oxide, lithium cobalt oxide, lithium iron phosphate, and lithium manganese oxide.

Aspect 16. The coated cathode material of any of the foregoing aspects, wherein the cathode active material is in the form of a particle, and the interfacial layer covers the particle.

Aspect 17. The coated cathode material of any of the foregoing aspects, wherein the particle has a dimension in a range of 10 nm to 100 micrometers.

Aspect 18. The coated cathode material of any of the foregoing aspects comprising: a cycling life of at least 40% greater than a cycling life of a cathode material lacking the interfacial layer coating; and a specific capacity tested at 5 C at least 50% greater than a specific capacity of a cathode material lacking the interfacial layer coating.

Aspect 19. The coated cathode material of any of the foregoing aspects comprising: a low temperature (0° C.) capacity greater than 10 mAh/g at 5 C; a room temperature (25° C.) capacity greater than 40 mAh/g at 10 C; and/or a high temperature (50° C.) capacity greater than 80 mAh/g at 10 C.

Aspect 20. A lithium ion battery, comprising: an anode having a layer of the anode active material selected from carbon, graphite, and/or silicon; a cathode having a layer of the coated cathode material as described in any of the foregoing aspects; and an electrolyte.

All documents cited herein are incorporated herein by reference, but only to the extent that the incorporated material does not conflict with existing definitions, statements, or other documents set forth herein. To the extent that any meaning or definition of a term in this document conflicts with any meaning or definition of the same term in a document incorporated by reference, the meaning or definition assigned to that term in this document shall govern. The citation of any document is not to be construed as an admission that it is prior art with respect to this application.

While particular embodiments have been illustrated and described, it would be obvious to those skilled in the art that various other changes and modifications may be made without departing from the spirit and scope of the invention. Those skilled in the art will recognize or be able to ascertain using no more than routine experimentation, numerous equivalents to the specific apparatuses and methods described herein, including alternatives, variants, additions, deletions, modifications and substitutions. This application including the appended claims is therefore intended to cover all such changes and modifications that are within the scope of this application.

Trade names and commercial products are identified in this paper to specify the experimental procedures in adequate detail. This identification does not imply recommendation or endorsement by the authors or by the National Institute of Standards and Technology, nor does it imply that the products identified are necessarily the best available for the purpose. Contributions of the National Institute of Standards and Technology are not subject to copyright.

REFERENCES

1. K. K. S. Lau ad K. K. Gleason, Initiated Chemical Vapor Deposition (iCVD) of Poly(alkyl acrylates): An Experimental Study, *MACROMOLECULES*, 39(2006), 3688.
(1) Manthiram, A.; Song, B.; Li, W. A perspective on nickel-rich layered oxide cathodes for lithium-ion batteries. *Energy Storage Materials* 2017, 6, 125-139.
(2) Manthiram, A. Materials Challenges and Opportunities of Lithium on Batteries. *The Journal of Physical Chemistry Letters* 2011, 2, 176-184.
(3) Manthiram, A. An Outlook on Lithium Ion Battery Technology. *ACS central science* 2017, 3, 1063-1069,
(4) Zhang, J.; Su, L.; Li, Z.; Su Y.; Wu, N. The Evolution of Lithium-Ion Cell Thermal Safety with Aging Examined in a Battery Testing Calorimeter. *Batteries* 2016, 2, 12.
1. A. Manthiram, Materials Challenges and Opportunities of Lithium Ion Batteries, *The Journal of Physical Chemistry Letters*, 2 (2011), 176.
2. P. Verma, P. Maire and P. Novák, A review of the features and analyses of the solid electrolyte Interphase in L-ion batteries, *ELECTROCMIM ACTA*. 55(2010), 6332.
3. A. Mauger and C. Julien, Surface modifications of electrode materials for lithium-ion batteries: status and trends, *IONICS*, 20 (2014), 751.
4. H. Ha, K. H. Jeong, N. J, Yun, M. Z. Hong and K. Kim, Effects of surface modification on the cycling stability of LiNi0.8Co0.2O2 electrodes by $CeO_2$ coating, *ELECTROCHIM ACTA*, 50 (2005), 3764.
5. L. Liu, L. Chen, X. Huang, X Yang, W. Yoon, H. S. Lee and J. McBreen, Electrochemical and In Situ Syncluotron XRD Studies on Al2O3-Coated $LiCoO_2$ Cathode Material, *ELECTROCHEM SOC*, 151 (2004), A1344
6. R. I. Patel, S. A. Palaparty and X. Liang, Ultrathin Conductive CeO2 Coating for Significant Improvement in Electrochemical Performance of LiMn1.5Ni0.5O4 Cathode Materials, *J ELECTROCHEM SOC*, 164 (2017), A6236.
7. M. C. Kim, S. H. Kim, V. Aravindan, W. S. Kim, S. Lee and Y. S. Lee, Ultrathin Polyimide Coating for a Spiral LiNi0.5Mn1.5O4 Cathode and Its Superior Lithium Storage Properties under Elevated Temperature Conditions, *J ELECTROCHEM SOC*, 160 (2013), A1003.
8. Y. Kim, N. J. Dudney, M. Chi, S. K. Martha, J. Nanda, G. M. Veith and C. Liang, A perspective on coatings to stabilize high-voltage cathodes: LiMn1.5Ni0.5O4 with sub-nanometer lipon cycled with LiPF6 electrolyte, *J ELECTROCHEM SOC*, 160 (2013), A3113.
9. A. Yano, M. Shikano, A. Ueda, H. Sakaebe and Z. Ogumi, LiCoO2 Degradation Behavior in the High-Voltage Phase Transition Region and Improved Reversibility with Surface Coating, *J ELECTROCHEM SOC*, 164 (2017), A6116.
10. Y. Sun, C. S. Yoon, S. Myung, I. Belharouak and K. Amine, Role of AlF3 Coating on LiCoO2 Particles during Cycling to Cutoff Voltage above 4.5 V, *J ELECTROCHEM SOC*, 156 (2009), A1005.
11. J. Liu, B. Reeja-Jayan and A. Manthirani, Conductive Surface Modification with Aluminum of High Capacity Layered Li[Li0.2Mn0.54Ni0.13Co0.13]O2 Cathodes, *The Journal of Physical Chemistry*, 114 (2010), 9528.
12. H. Cheng, F. Wang, J. P. Chu, R. Santhanam, J. Rick and S. Lo, Enhanced Cycleability in Lithium Ion Batteries: Resulting from Atomic Layer Deposition of Al2O3 or TiO2 on LiCoO2 Electrodes, *The Journal of Physical Chemistry C*, 116 (2012), 7629.
13. J. H. Woo, J. E. Trevey, A. S. Cavanagh, Y. S, Choi, S. C. Kim, S. M. George, K. H. Oh and S. Lee, Nanoscale interface modification of LiCoO2 by Al2O3 atomic layer deposition for solid-state Li batteries, *J ELECTROCHEM SOC*, 159 (2012), A1120.
14. Y. S. Jung, A. S. Cavanagh, A. C. Dillon, M. D. Groner, S. M. George and S. Lee, Enhanced stability of LiCoO2 cathodes in lithium-ion batteries using surface modification by atomic layer deposition, *J ELECTROCHEM SOC*, 157 (2010), A75.
15. Y. S. Jung, A. S. Cavanagh, L. A. Riley, S. Kang. A. C. Dillon, M. D. Groner, S. M. George and S. Lee, Ultrathin Direct Atomic Layer Deposition Composite Electrodes for Highly Durable and Safe Li-Ion Batteries. *ADV MATER*, 22 (2010), 2172.
16. N. Chen, B. Recja-Jayan, J. Lau, P. Moni, A. Liu, B. Dunn and K. K. Gleason, Nanoscale, conformal polysiloxane thin film electrolytes for three-dimensional battery architectures, *Materials Horizons*, 2 (2015), 309.
17, B. Reeja-Jayan, P. Kovacik, R. Yang, H. Sojoudi, A. Ugur, D. H. Kim, C. D. Petruczok, X. Wang, A. Liu and K. K. Gleason, A Route Towards Sustainability Through Engineered Polymeric Interfaces, *Advanced Materials Interface*, 1 (2014), 1400117.
18. B. Reeja-Jayan, N. Chen, J. Lau, J. A. Kattirzi, P. Moni, A. Liu, I. G. Miller, R. Kayser. A. P. Willard, B. Dunn and K. K. Gleason, A Group of Cyclic Siloxane and Silazane Polymer Films as Nanoscale Electrolytes for Microbattery Architectures, *MACROMOLECULES*, 48 (2015), 5222.
19. C. D. Petruczok, R. Yang and K. K. Gleason, Controllable cross-linking of vapor-deposited polymer thin films and impact on material properties, *MACROMOLECULES*, 46 (2013), 1832.
20. A. Manthiram, H. Song and W. Li, A perspective on nickel-rich layered oxide cathodes for lithium-ion batteries, *Energy Storage Materials*, 6 (2017), 125.
21. C. Zhan, J. Lu, A. Jeremy Kropf, T. Wu, A. N. Jansen, Y. Sun, X. Qiu and K. Amine, Mn(II) deposition on anodes and its effects on capacity fade in spinel lithium manganate-carbon systems, *NAT COMMUN*, 4 (2013)
22. V. Raghunathan, J. L. Yague, J. Xu, J. Michel, K. K. Gleason and I. C. Kimerling, Co-polymer clad design for high performance athermal photonic circuits, *OPT EXPRESS*, 20 (2012), 20808.
23. N, Chen, B. Reeja-Jayan, J. Lau, P. Moni, A. Liu, B. Dunn and K. K. Gleason, Nanoscale, conformal polysiloxane thin film electrolytes for three-dimensional battery architectures, *Materials Horizons*, 2 (2015), 309.
24. A. M. Coclite, R. M. Howden, D. C. Borrelli, C. D. Petruczok, R. Yang, J. L. Yagüe, A. Ugur, N. Chen, S. Lee, W. J. Jo, A. Liu, X. Wang and K. K. Gleason, 25th Anniversary Article: CVD Polymers: A New Paradigm for Surface Modification and Device Fabrication, *ADV MATER*, 25 (2013), 5392.
25. K. Xu, Electrolytes and Interphases in Li-Ion Batteries and Beyond, *CHEM REV*, 114 (2014), 11503.
26. J. Lei, L. Li, R. Kostecki, R. Muller and F. McLarnon, Characterization of SEI Layers on LiMn2O4 Cathodes with In Situ Spectroscopic Ellipsometry, *J ELECTROCHEM SOC.* 152 (2005), A774.

27. Q. Pan, K. Guo, L. Wang and S. Pang, Ionic conductive copolymer encapsulated graphite as an anode material for lithium ion batteries, *SOLID STATE IONICS*, 149 (2002), 193.
28. G. Hu, X. Wang, F. Chen, J. Zhou, R. Li and Z. Deng, Study of the electrochemical performance of spinel LiMn2O4 at high temperature based on the polymer modified electrode, *ELECTROCHEM COMMUN,* 7 (2005), 383.
29. G. G. Amatucci, A. Blyr, C. Sigala, P. Alfonse and J. M. Tarascon, Surface treatments of Li1+x Mn2-xO4 spinels for improved elevated temperature performance, *SOLD STATE IONICS,* 104 (1997) 13.
30. A. Blyr, C. Sigala, G. Amatucci, D. Guyomard, Y. Chabre and J. M. Tarascon, Self-Discharge of LiMn2O4/C Li-Ion Cells in Their Discharged State Understanding by Means of Three-Electrode Measurements. *J ELECTROCHEM SOC,* 145(1998), 194.
31. Y. Zhang, X. Li, L. Su, Z. Li, B. Y. Liaw and J. Zhang, Lithium Plating Detection and Quantification in Li-Ion Cells from Degradation Behaviors, ECS Transactions, 75(2017), 37.
32. J. Huang. Z. Li, H. Ge and J. Zhang, Analytical Solution to the Impedance of Electrode/Electrolyte Interface in Lithium-Ion Batteries, *J ELECTROCHEM SOC,* 162 (2015), A7037.
33. P. Albetus, J. Christensen and J. Newman, Experiments on and modeling of positive electrodes with multiple active materials for lithium-ion batteries, *J ELECTROCHEM SOC,* 156 (2009), A606.
34. T. Ohzuku, M. Kitagawa and T. Hirai, Electrochemistry of Manganese Dioxide in Lithium Nonaqueous Cell III. X-Ray Diffractional Study on the Reduction of Spinel-Related Manganese Dioxide, *J ELECTROCHEM SOC,* 137 (1990), 769.
35. M. Dubarry and B. Y. Liaw, identify capacity fading mechanism in a commercial LiFePO4 call, *J POWER SOURCES,* 194 (200)), 541.
(5) Mao, F.; Guo, W.; Ma, J. Research progress on design strategies, synthesis and performance of LiMn2O4-based cathodes. *RSC Advance* 2015, 5, 105248-105258.
(6) Hirayama, M.; Ido, H.; Kim, K.; Cho, W.; Tamura, K.; Mizuki, J. I.; Kamo R. Dynamic Structural Changes at LiMn2O4/Electrolyte Interface during Lithium Battery Reaction. *Journal of the American Chemical Society* 2010, 132, 15268-15276.
(7) Ha, H.; Jeong, K. H.; Yun, N. J.; Hong, M. Z.; Kim, K. Effects of surface modification on the cycling stability of LiNi0.8Co0.2O2 electrodes by CeO2 coating, *Electrochimica Acta* 2005, 50, 3764-3769.
(8) Liu. L; Chen, L.; Huang, X.; Yang, X.; Yoon, W.; Lee, H. S.; McBreen, J Electrochemical and In Situ Synchrotron XRD Studies on Al2O3-Coated LiCoO2 Cathode Material. *Journal of The Electrochemical Society* 2004, 151, A1344-A1351.
(9) Yano, A.; Shikano, M., Ueda, A.; Sakaebe, H.; Ogumi, Z. LiCoO2 Degradation Behavior in the High-Voltage Phase Transition Region and Improved Reversibility with Surface Coating, *Journal of The Electrochemical Society* 2017, 164, A6116-A6122.
(10) Sun, Y.; Yoon, C. S.; Myung, S.; Belharouak, I.; Amine, K. Role of AlF3 Coating on LiCoO2 Particles during Cycling to Cutoff Voltage above 4.5 V. *Journal of* The Electrochemical Society 2009, 156, A1005-A1010.
(11) Liu, J.; Reeja-Jayan, B.; Manthiram, A. Conductive Surface Modification with Aluminum of High Capacity Layered Li[Li0.2Mn0.54Ni0.13Co0.13]O2 Cathodes. *The Journal of Physical Chemistry C* 2010, 114, 9528-9533.
(12) Liu, J.; Manthiram, A. Improved electrochemical performance of the 5 V spinel cathode LiMn1.5Ni0.42Zn0.08O4 by surface modification. *Journal of The electrochemical Society* 2009, 156, A66-A72.
(13) Liu, J., Manthiram, A. Understanding the Improvement in the Electrochemical Properties of Surface Modified 5 V LiMn1.42Ni0.42Co0.16O4 Spinel Cathodes in Lithium-ion Cells. *Chemistry of Materials* 2009, 21, 1695-1707.
(14) Hu, G., Wang, X. Chen, F.; Zhou, J.; Li, R.; Deng, Z. Study of the electrochemical performance of spinel LiMn2O4 at high temperature based on the polymer modified electrode. *Electrochemistry Communications* 2005, 7, 383-388.
(15) Xu, K. Electrolytes and Interphase in Li-on Batteries and Beyond. *Chemical Reviews* 2014, 114, 11503-11618.
(16) Arbizzani, C.; Balducci, A.; Mastragostino, M.; Rossi, M.; Soavi, F. Characterization and electrochemical performance of Li-rich manganese oxide spinel/poly(3,4-ethylenedioxythiophene) as the positive electrode for lithium-ion batteries. *Journal of Electroanalytical Chemistry* 2003, 553, 125-133.
(17) Vidu, R.; Stroeve, P. Improvement of the Thermal Stability of Li-Ion Batteries by Polymer Coting of LiMn2O4, *Industrial & Engineering Chemistry Research* 2004, 43, 3314-3324.
(18) Guan, D; Wang, Y. Ultrathin surface costings to enhance cycling stability of LiMn2O4 cathode in lithium-ion batteries. *Ionics* 2013, 19, 1-8.
(19) Reeja-Jayan, H.; Chen, N.; Lau, J.; Kattirzi, J. A.; Muni, P.; Liu, A.; Miller, I. G.; Kayser, R.; Willard, A. P.; Dunn, R.; Gleason, K. K. A Group of Cyclic Siloxane and Silazane Polymer Filuts as Nanoscale electrolytes for Microbattery Architectures. *Macromolecules* 2015, 48, 5222-5229.
(20) Chen, N.: Reeja-Jayan, B.; Liu, J., Moni, P.; Liu, A.; Dunn, B.; Gleason, K. K. Nanoscale, conformal polysiloxans thin film electrolytes for three-dimensional battery architectures. *Material Horizons* 2015, 2, 309-314.
(21) Reeja-Jayan, B.; Kovacik, P.; Yang, R.; Sojoudi, H.; Ugur, A.; Kim, D. H.; Petruczok, C. D.; Wang, X; Liu, A.; Gleason, K. K. A Route Towards Sustainability Through Engineered Polymeric Interfaces. *Advanced Materials Interfaces* 2014, 1, 140017.
(22) Tarascon, J. M.; Guyomard, D. The Li1+xMn2O4/C rocking-chair system: a review. *Electrochimica Acta* 1993, 38, 1221-123.
(23) Im, S. G.; Gleason, K. K. Systematic Control of the Electrical Conductivity of Poly(3,4-ethylenedioxythiophene) via Oxidative Chemical Vapor Deposition. *Macromolecules* 2007, 40, 6552-6556.
(24) Petruczok, C. D.; Yang, R.; Gleason, K. K. Controllable cross-linking of vapor-deposited polymer thin films and impact on material properties. *Macromolecules* 2013, 46, 1832-1840.
(25) Infrared Tables (short summary of common absorption frequencies). http://www.cpp.edu/~psbeaucharp/pdf/spec_ir_nmr_spectra_tables.pdf (accessed January 2018).
(26) Aldalbahi, A.; Rahaman, M.; Almoiqli, M. A Strategy to Enhance the Electrode Performance of Novel Three-Dimensional PEDOT/RVC Composites by Electrochemical Deposition Method. *Polymers* 2017, 9, 157.
(27) Feng, Z.; Wu, J.; Cho, W.; Leach, M. K.; Franz, E. W.; Naim, Y. I.; Gu, Z.; Corey, J. M.; Martin, D. C. Highly

(28) aligned poly(3,4-ethylene dioxythiophen) (PEDOT) nano- and microscale fibers and tubes. *Polymer* 2013, 54, 702-708.

(28) Raman Band Correlation Table (http://www.utse.utoronto.ca/~traceslab/raman%20correlation%20table.pdf) (accessed January 2018).

(29) Huang, J.; Li, Z.; Liaw, B. Y.; Zhang, J. Graphical analysis of electrochemical impedance spectroscopy data in Bode and Nyquist representations, *Journal of Power Sources* 2016, 309, 82-98.

(30) Albertus, P.; Christensen, I.; Newman, J, Experiments on and modeling of positive electrodes with multiple active materials for lithium-ion batteries. *Journal of the Electrochemical Society* 2009, 156, A606-A618.

(31) Fang, S.; Jackson, D.; Dreibelbis, M. L.; Kuech, T. F.; Hamers, R. J. Anode-originated SE1 migration contributes to formation of cathode-electrolyte interphase layer, *Journal of Power Sources* 2018, 373, 184-192.

(32) Su, L.; Zhang, J.; Huang, I.; Ge, H.; Li, Z.; Xie, F.; Liaw, B. Y. Path dependence of lithium ion cells aging under storage conditions. *Journal of Power Sources* 2016, 315, 35-46,

(33) Thackeray, M. M.; Johnson, P. I.; De Picciotto, L. A.; Bruce, P. G.; Goodenough, J. B. Electrochemical extraction of lithium from LiMn2O4. *Materials Research Bulletin* 1984, 19, 179-187.

(34) Jang, D. H.; Shin, Y. J.; Oh S. M. Dissolution of Spinel Oxides and Capacity Losses in 4 V Li/LixMn2O4 Cells. *Journal of The Electrochemical Society* 1996, 143, 2204-2211.

(35) Wang, L.; Ou, C.; Striebel, K. A.; Chen, J. Study of Mn Dissolution from LiMn2O4 Spinel Electrodes Using Rotating Ring-Disk Collection Experiments. *Journal of The Electrochemical Society* 2003, 150, A905-A911.

(36) Pinson, M. B.; Bazant, M. Z. Theory of SEI formation in rechargeable batteries: capacity fade, accelerated aging and lifetime prediction. *Journal of the Electrochemical Society* 2013, 160, A243-A250.

(37) Jow, T. R.; Delp, S. A.; Allen, J. L.; Jones, J.; Smart, M. C.; The Electrochemical Society: 2017, p 215-215.

(38) Amatucci, G. G.; Blyr, A.; Sigala, C.; Alfonse, P.; Tarascon, J. M. Surface treatments of Li+xMn2-xO4 spinels for improved elevated temperature performance. *Solid State Ionics* 1997, 104, 13-25.

(39) Blyr, A.; Sigala, C.; Amatucci, G.; Guyomard, D.; Chabre, Y.; Tarascon, J. M. Self-Discharge of LiMn2O4/C Li-ion Cells in Their Discharged State Understanding by Means of Three-Electrode Measurements. *Journal of The Electrochemical Society* 1998, 145, 194-209.

(40) Bai, Y.; Liu, N.; Liu, J.; Wang, Z.; Chen, L, Coating Material-Induced Acidic Electrolyte Improves LiCoO [sub 2] Performances. *Electrochemical and Solid-State Letters* 2006, 9, A552.

(41) Nowak, S.; Winter, M. The Role of Cations on the Performance of Lithium Ion Batteries: A Quantitative Analytical Approach. *Accounts of Chemical Research* 2018.

(42) Chastain, J.; King, R. C.; Moulder, J. *Handbook of X-ray photoelectron spectroscopy: a reference book of standard spectra for identification and interpretation of XPS data*; Physical Electronics Division, Perkin-Elmer Corporation Eden Prairie, Minn., 1992.

(43) JIN, Y.; CHEN, Q.; LESSNER, P. Thermal Stability Investigation of PEDOT Films from Chemical Oxidation and Prepolymerized Dispersion. *Electrochemistry* 2013, 81, 801-803.

(44) Samba, R. Is the Enhanced Adhesion of PEDOT Thin Films on Electrodes Due to Sulfur-Gold Interaction?—An XPS Study. *The Open Surface Science Journal* 2013, 5, 17-20.

(45) Di Castro, V.; Polzouctti, G. XPS study of MnO oxidation. *Journal of Electron Spectroscopy and Related Phenomena* 1989, 48, 117-123.

(1) Gauthier, M.; Carney. T. J.; Grimaud, A.; Giordano, L.; Pour, N.; Chang, H.; Fenning, D. P.; Lux, S. F.; Paschos, O.; Bauer, C.; Maglia, F.; Lupart, S.; Lamp, P.; Shao-Horn, Y. Electrode-electrolyte interface in Li-ion batteries: current understanding and new insights. *The Journal of Physical Chemistry Letters* 2015, 6, 4653-4672.

(2) Li. Y; Chen, H.; Lim, K.; Deng, H. D.; Lim, J.; Fraggedakis, D.; Attia, P. M.; Lee. S. C.; Jin. N.; Moškon, J.; Guan, Z.; Gent, W. E.; Hong, J.; Yu, Y.; Gaberšček, M.; Islam, M. S.; Bazant, M. Z.; Chuch, W. C. Fluid-enhanced surface diffusion controls intraparticle phase transformations *Nature Materials* 2018, 17, 915-922.

(3) Xie, Y.; Gao, H.; Gim, J.; Ngo, A, T.; Ma, Z.; Chen, Z. Identifying active sites for parasitic reactions at the cathode-electrolyte interface. *The Journal of Physical Chemistry Letters* 2019, 10, 589-594.

(4) Wang, K.; Li. X.; Chen J. Surface and interface engineering of electrode materials for lithium-ion batteries. *Advanced Materials* 2015, 27, 527-545.

(5) Wang, X., Yushin, G. Chemical vapor deposition and atomic layer deposition for advanced lithium ion batteries and supercapacitors *ENERGY & ENVIRONMENTAL SCIENCE* 2015, 8, 1889-1904.

(6) Kalluri, S.; Yoon, M.; Jo, M.; Park, S.; Myeong, S.; Kim, J.; Dou. S. X.; Guo. Z.; Cho, J. Surface engineering strategies of layered LiCoO2 cathode material to realize high-energy and high-voltage Li-ion cells. *Advanced Energy Materials* 2017, 7, 1601507.

(7) Xie, J.; Zhao, J.; Liu. Y.; Wang, H.; Liu, C.; Wu, T.; Hsu, P.; Lin, D.; Jin, Y.; Cui, Y. Engineering the surface of LiCoO2 electrodes using atomic layer deposition for stable high-voltage lithium ion batteries. *Nano Research* 2017, 10, 3754-3764.

(8) Reeja-Jayan, B.; Chen, N.; Lau, J.; Kattirzi, J. A.; Moni, P.; Liu, A.; Miller, I. G.; Kayser. R.; Willard, A. P.; Dunn, B. Gleason, K. K. A group of cyclic siloxane and silazane polymer films as nanoscale electrolytes for microbattery architectures. *Macromolecules* 2015, 48, 5222-5229.

(9) Chen, N.; Reeja-Jayan, B.; Lau, J.; Moni, P.; Liu, A.; Dunn, B.; Gleason, K. K. Nanoscale, conformal polysiloxane thin film electrolytes for three-dimensional battery architectures. *Materials Horizons* 2015, 2, 309-314.

(10) Gleason, K. K. *CVD polymers: fabrication of organic surfaces and devices*; John Wiley & Sons, 2015

(11) Su, L.; Smith. P. M.; Anand, P.; Reeja-Jayan, B. Surface Engineering of a LiMn2O4 Electrode Using Nanoscale Polymer Thin Films via Chemical Vapor Deposition Polymerization, *ACS Applied Materials & Interfaces* 2018, 10, 27063-27073.

(12) Seong, W. M.; Yoon, K.; Lee, M. H.; Jung. S.; Kang, K. Unveiling the intrinsic cycle reversibility of a LiCoO2 electrode at 4.8-V cutoff voltage through subtractive surface modification for lithium-ion batteries. *Nano Letters* 2018.

(13) Yang, Z.; Li, R.; Deng, Z. A deep study of the protection of lithium cobalt oxide with polymer surface modification at 4.5 V high voltage. *Scientific Report* 2018, 8.

(14) Petruczok, C. D.; Yang, R.; Gleason, K. K. Controllable cross-linking of vapor-deposited polymer thin films and impact on material properties. *Macromolecules* 2013, 46, 1832-1840.

(15) Im, S. G.; Gleason, K. K. Systematic control of the electrical conductivity of Poly(3,4-ethylenedioxythiophene) via oxidative chemical vapor deposition. *Macromolecules* 2007, 40, 6552-6556.

(16) Paxson, A. T.; Yagüe, J. L; Gleason, K. K.; Varanasi. K. K. Stable Dropwise Condensation for Enhancing Heat Transfer via the Initiated Chemical Vapor Deposition (iCVD) of Grafted Polymer Films. *Advanced Materials* 2014, 26, 418-423.

(17) Smith, P. M.; Su, L.; Gong, W.; Nakamura, N.; Reejayan, B.; Shen, S. Thermal Conductivity of Poly(3,4-ethylenedioxythiophene) Films Engineered by Oxidative Chemical Vapor Deposition (oCVD). *RSC Advances* 2018, 8, 19348-19352.

(18) Weaver, J. L.; Turkoglu, D. Natural alteration of 6Li alumino-silicate glass. *Journal of Nuclear Materials* 2018, 512, 56-64.

(19) Zhang, X.; Verhallen, T. W.; Labohm, F.; Wagemaker, M. Direct Observation of Li-Ion Transport in Electrodes under Nonequilibrium Conditions Using Neutron Depth Profiling. *Advanced Energy Materials* 2015, 5, 1500498.

(20) Angell, C. A. Mobile ions in amorphous solids. *Annual Review of Physical Chemistry* 1992, 43, 693-717.

(21) Xu, K. Electrolytes and interphases in Li-ion batteries and beyond. *Chemical Reviews* 2014, 114, 11503-11618.

(22) Xia, H.; Lu, L.; Meng, Y. S., Ceder. G, Phase transitions and high-voltage electrochemical behavior of $LiCoO_2$ thin films grown by pulsed laser deposition. *Journal of The Electrochemical Society* 2007, 154, A337-A342.

(23) Amatucci, G. G.; Tarascon, J. M.; Klein, L. C. $CoO_2$, the end member of the $Li_xCoO_2$ solid solution. *Journal of The Electrochemical Society* 1996, 143, 1114-1123

(24) Liu, L.; Chen. L.; Huang, X.; Yang, X.; Yoon, W.; Lee, H. S.; McBreen, J. Electrochemical and in situ synchrotron XRD studies on $Al_2O_3$-coated $LiCoO_2$ cathode material. *Journal of The Electrochemical Society* 2004, 151, A 1344-A1351.

(25) Su, L.; Zhang, J.; Wang, C.; Zhang, Y.; Li, Z.; Song, Y.; Jin, T.; Ma, Z. Identifying main factors of capacity fading in lithium ion cells using orthogonal design of experiments. *Applied Energy* 2016, 163, 201-210.

(26) Liu, Q.; Su, X.; Lei, D.; Qi, Y.; Wen, J.; Go, F.; Wu, Y. A.; Rong, Y.; Kou, R.; Xiao, X.; Aguesse, F.; Bareño, J.; Ren, Y.; Lu, W.; Li, Y. Approaching the capacity limit of lithium cobalt oxide in lithium ion batteries via lanthanum and aluminium doping. *Nature Energy* 2018.

(27) Qian, J.; Liu, L.; Yang, J.; Li, S.; Wang, X.; Zhuang, H. L.; Lu, Y. Electrochemical surface passivation of $LiCoO_2$ particles at ultrahigh voltage and its applications in lithium-based batteries. *Nature Communications* 2018, 9.

(28) Becke, A. D. Density-functional thermochemistry. III. The role of exact exchange. *The Journal of Chemical Physics* 1993, 98, 5648-5652.

(29) Peterson, G. A.; Al Laham, M. A. A complete basis set model chemistry. II. Open-shell systems and the total energies of the first-row atoms. *The Journal of Chemical Physic* 1991, 94, 6081-6090.

(30) Petersson, G. A. Bennett, A., Tensfeldt, T. G.; Al Laham, M. A.; Shirley, W. A.; Mantzaris, J. A complete basis set model chemistry. I. The total energies of closed-shell atoms and hydrides of the first-row elements. *The Journal of Chemical Physics* 1988, 89, 2193-2218.

(31) Grimme, S.; Antony, J.; Ehrlich, S.; Krieg, H. A consistent and accurateab initio parametrization of density functional dispersion correction (DFT-D) for the 94 elements H-Pu. *The Journal of Chemical Physics* 2010, 132, 154104.

(32) Grimme, S.; Ehrlich, S.; Goerigk, L. Effect of the damping function in dispersion corrected density functional theory. *Journal of Computational Chemistry* 2011, 32, 1456-1465.

(33) Dunning, T. H. Gaussian basis sets for use in correlated molecular calculations. I. The atoms boron through neon and hydrogen. *The Journal of Chemical Physics* 1989, 90, 1007-1023.

(34) Cramer, C. J. *Essentials of computational chemistry, theories and models*; Wiley: Chichester, England, 2002; Vol. 43.

(35) Kresse, G.; Hafner, J. Ab initio molecular-dynamics simulation of the liquid-metal-amorphous-semiconductor transition in germanium. *Physical Review B* 1994, 49, 14251.

(36) Kresse, G.; Furthmüller, J. Efficient iterative schemes for ab initio total-energy calculations using a plane-wave basis set. *Physical review B. Condensed matter* 1996, 54, 11169

(37) Perdew, J. P.; Burke, K.; Ernzerhof, M. Generalized gradient approximation made simple. *Phys Rev Lett* 1996, 77, 3865-3868.

(38) Kresse, G.; Joubert, D. From ultrasoft pseudopotentials to the projector augmented-wave method. *Physical Review B* 1999, 59, 1758.

(39) Kramer, D.; Ceder, G. Tailoring the morphology of $LiCoO_2$: a first principles study. *Chemistry of Materials* 2009, 2, 3799-3809.

Yang, X., et al., Improvement of the cycling performance of $LiCoO_2$ with assistance of cross-linked PAN for lithium ion batteries. Journal of Alloys and Compounds, 2015. 639: p. 458-464, Wang, Z., et al., improving the cycling stability of $LiCoO_2$ at 4.5V through co-modification by Mg doping and zirconium oxyfluoride coating Ceramics International, 2015. 41(1): p. 469-474.

Shen, B., et al., Lithium cobalt oxides functionalized by conductive Al-doped ZnO coating as cathode for high-performance lithium ion batteries. Electrochimica Acta, 2017, 224: p 96-104.

Choi, K., et al., Electrochemical performance and thermal stability of $LiCoO_2$ cathodes surface-modified with a sputtered thin film of lithium phosphorus oxynitride. Journal or Power Sources, 2010. 195(24): p. 8317-8321.

Cao, J., et al., Polypyrrole-coated $LiCoO_2$ nanocomposite with enhanced electrochemical properties at high voltage for lithium-ion batteries. Journal of Power Sources, 2015. 281: p. 49-55.

Chen, G., et al., On electrochemistry of $Al_2O_3$-coated $LiCoO_2$ composite cathode with improved cycle stability. Ionics, 2016, 22(5): p. 629-636.

Zhao, F., et al, Vapor-assisted synthesis of $Al_2O_3$-coated $LiCoO_2$ for high-voltage lithium ion batteries, Electrochimica Acta, 2015. 174: p. 384-390.

Zuo, D., Comparative Study of the Electrochemical Behaviors for $LiCoO_2$ Electrode Coated with Two Different $Al_2O_3$ Coating Layer, International Journal of Electrochemical Science, 2017: p. 5044-5057.

Liang D. D., et al., Spine $MgAl_2O_4$ modification on $LiCoO_2$ cathode materials with the combined advantages of MgO and $Al_2O_3$ modifications for high-voltage lithium-ion batteries. RSC Advances, 2017, 7(12): p. 6809-6817.

Yabuuchi, N., et al., Electrochemical properties of LiCoO2 electrodes with latex binders on high-voltage exposure. Journal of the electrochemical society, 2015. 162(4): p. A538-A544.

Yang, Z., R. Li and Z. Deng. A deep study of the protection of Lithium Cobalt Oxide with polymer surface modification at 4.5 V high voltage, Scientific Reports, 2018. 8(1).

Wang. Z., et. al., Synthesis of Li2MnO3-stabilized LiCoO2 cathode material by spray-drying method and its high-voltage performance. Journal of Alloys and Compounds, 2015. 626: p. 228-233.

Han, B., et al., Understanding the Role of Temperature and Cathode Composition on Interface and Bulk: Optimizing Aluminum Oxide Coatings for Li-Ion Cathodes. ACS Applied Materials & Interfaces, 2017, 9(17): p. 14769-14778.

Bai, Y., et al., New concept of surface modification to LiCoO2. Journal of Power Sources, 2007. 174(1): p. 328-334.

Zhang, J., et al., Unraveling the multiple effects of Li2ZrO3 coating on the structural and electrochemical performances of LiCoO2 as high-voltage cathode materials. Electrochimica Acta, 2016. 209: p. 102-110.

Bai, V., et al., Performance improvement of LiCoO2 by MgF2 surface modification and mechanism exploration. Electrochimica Acta, 2014, 134: p. 347-354.

Weppner, W. and R. A. Huggins, Determination of the kinetic parameters of mixed-conducting electrodes and application to the system Li3Sb. Journal of The Electrochemical Society, 1977, 124(10): p. 1569-1578.

Im, S. G. and K. K. Gleason, Systematic Control of the Electrical Conductivity of Poly(3,4-ethylenedioxythiophene) via Oxidative Chemical Vapor Deposition. Macromolecules, 2007. 40(18): p, 6552-6556.

Paxson, A. T., et al., Stable Dropwise Condensation for Enhancing Heat Transfer via the Initiated Chemical Vapor Deposition (iCVD) of Grafted Polymer Films, Advanced Materials, 2014. 26(3): p. 418-423.

Gauthier, M.; Carney, T. J.; Grimaud, A.; Giordano, L.; Pour, N.; Chang, H.; Fenning, D. P.; Lux, S. F.; Paschos, O.; Bauer, C.; Maglia, F.; Lupart, S.; Lamp, P.; Shao-Horn, Y. Electrode electrolyte interface in Li-ion batteries: current understanding and new insights. *The Journal of Physical Chemistry Letters* 2015, 6, 4653-4672.

Su, L.; Smith, P. M.; Anand, P.; Reeja-Jayan, B. Surface engineering of a LiMn2O4 electrode using nanoscale polymer thin films via chemical vapor deposition polymerization. *ACS Applied Materials & Interfaces* 2018, 10, 27063-27073.

Li, Y.; Chen, H.; Lim, K.; Deng, H. D.; Lim, J.; Fraggedakis, D.; Attia, P. M.; Lee, S. C.; Jin, N.; Moškon, J.; Guan, Z.; Gent, W. E.; Hong, J.; Yu, Y.; Gaberšček, M.; Islam, M. S.; Bazant, M. Z.; Chueh, W. C. Fluid-enhanced surface diffusion controls intraparticle phase transformations. *Nature Materials* 2018, 17, 915-922.

Wang, L.; Chen, B.; Ma, J.; Cui, G.; Chen, L. Reviving lithium cobalt oxide-based lithium secondary batteries-toward a higher energy density. *Chemical Society Reviews* 2018, 47, 6505-6602.

Kalluri, S.; Yoon, M.; Jo, M.; Park, S.; Myeong, S.; Kim, J.; Dou, S. X.; Guo, Z.; Cho, J. Surface engineering strategies of layered LiCoO2 cathode material to realize high-energy and high-voltage Li-ion cells. *Advanced Energy Materials* 2017, 7, 1601507.

Xu, G.; Liu, Q.; Lau, K. K. S.; Liu, Y.; Liu, X.; Gao, H.; Zhou, X.; Zhuang, M.; Ren, Y.; Li, J.; Shao, M.; Ouyang, M.; Pan, F.; Chen, Z.; Amine, K.; Chen, G. Building ultraconformal protective layers on both secondary and primary particles of layered lithium transition metal oxide cathodes. *Nature Energy* 2019.

Wang, X.; Yushin, G. Chemical vapor deposition and atomic layer deposition for advanced lithium ion batteries and supercapacitors. *ENERGY & ENVIRONMENTAL SCIENCE* 2015, 8, 1889-1904.

Reeja-Jayan, B.; Chen, N.; Lau, J.; Kattirtzi, J. A.; Moni, P.; Liu, A.; Miller, I. G.; Kayser, R.; Willard, A. P.; Dunn, B.; Gleason, K. K. A group of cyclic siloxane and silazane polymer films as nanoscale electrolytes for microbattery architectures. *Macromolecules* 2015, 48, 5222-5229.

Gleason, K. K. *CVD polymers: fabrication of organic surfaces and devices*; John Wiley & Sons, 2015.

Im, S. G.; Gleason, K. K. Systematic control of the electrical conductivity of Poly(3,4-ethylenedioxythiophene) via oxidative chemical vapor deposition. Macromolecules 2007, 40, 6552-6556.

Im, S. G.; Olivetti, E. A.; Gleason, K. K. Systematic control of the electrical conductivity of poly (3,4-ethylenedioxythiophene) via oxidative chemical vapor deposition (oCVD). *Surface and Coatings Technology* 2007, 201, 9406-9412.

Paxson, A. T.; Yagüe, J. L.; Gleason, K. K.; Varanasi, K. K. Stable Dropwise Condensation for Enhancing Heat Transfer via the Initiated Chemical Vapor Deposition (iCVD) of Grafted Polymer Films. *Advanced Materials* 2014, 26, 418-423.

Lepró, X.; Ehrmann, P.; Menapace, J.; Lotscher, J.; Shin, S.; Meissner, R.; Baxamusa, S. Ultralow Stress, Thermally Stable Cross-Linked Polymer Films of Polydivinylbenzene (PDVB). *Langmuir* 2017, 33, 5204-5212.

Raghunathan, V.; Yague, J. L.; Xu, J.; Michel, J.; Gleason, K. K.; Kimerling, L. C. Co-polymer clad design for high performance athermal photonic circuits. *Optics express* 2012, 20, 20808.

Lenz, A.; Kariis, H.; Pohl, A.; Persson, P.; Ojamde, L. The electronic structure and reflectivity of PEDOT:PSS from density functional theory. *Chemical Physics* 2011, 384, 44-51.

Zhang, X.; Verhallen, T. W.; Labohm, F.; Wagemaker, M. Direct Observation of Li-Ion Transport in Electrodes under Nonequilibrium Conditions Using Neutron Depth Profiling. *Advanced Energy Materials* 2015, 5, 1500498.

Zhuang, Q.; Xu, J.; Fan, X.; Dong, Q.; Jiang, Y.; Huang, L.; Sun, S. An electrochemical impedance spectroscopic study of the electronic and ionic transport properties of LiCoO$_2$ cathode. *Chinese Science Bulletin* 2007, 52, 1187-1195.

Nobili, F.; Dsoke, S.; Croce, F.; Marassi, R. An ac impedance spectroscopic study of Mg-doped LiCoO$_2$ at different temperatures: electronic and ionic transport properties. *Electrochimica Acta* 2005, 50, 2307-2313.

Smith, P. M.; Su, L.; Gong, W.; Nakamura, N.; Reeja-Jayan, B.; Shen, S. Thermal conductivity of poly(3,4-ethylenedioxythiophene) films engineered by oxidative chemical vapor deposition (oCVD). *RSC Advances* 2018, 8, 19348-19352.

Suresh, P.; Shukla, A. K.; Munichandraiah, N. Temperature dependence studies of ac impedance of lithium-ion cells. *Journal of applied electrochemistry* 2002, 32, 267-273.

Angell, C. A. Mobile ions in amorphous solids. *Annual Review of Physical Chemistry* 1992, 43, 693-717.

Moni, P.; Lau, J.; Mohr, A. C.; Lin, T. C.; Tolbert, S. H.; Dunn, B.; Gleason, K. K. Growth Temperature and Electrochemical Performance in Vapor-Deposited Poly (3, 4-ethylenedioxythiophene) Thin Films for High-Rate Electrochemical Energy Storage. ACS *Applied Energy Materials* 2018, 1, 7093-7105.

Cai, L.; An, K.; Feng, Z.; Liang, C.; Harris, S. J. In-situ observation of inhomogeneous degradation in large format Li-ion cells by neutron diffraction. *Journal of Power Sources* 2013, 236, 163-168.

Amatucci, G. G.; Tarascon, J. M.; Klein, L. C. CoO2, the end member of the LixCoO2 solid solution. *Journal of The Electrochemical Society* 1996, 143, 1114-1123.

Liu, L.; Chen, L.; Huang, X.; Yang, X.; Yoon, W.; Lee, H. S.; McBreen, J. Electrochemical and in situ synchrotron XRD studies on Al2O3-coated $LiCoO_2$ cathode material. *Journal of The Electrochemical Society* 2004, 151, A1344-A1351.

Xu, Y.; Hu, E.; Zhang, K.; Wang, X.; Borzenets, V.; Sun, Z.; Pianetta, P.; Yu, X.; Liu, Y.; Yang, X.; Li, H. In situ Visualization of State-of-Charge Heterogeneity within a $LiCoO_2$ Particle that Evolves upon Cycling at Different Rates. *ACS Energy Letters* 2017, 2, 1240-1245.

Chen, Z.; Dahn, J. R. Improving the Capacity Retention of LiCoO[sub 2] Cycled to 4.5 V by Heat-Treatment. *Electrochemical and Solid-State Letters* 2004, 7, A11.

Liu, Q.; Su, X.; Lei, D.; Qin, Y.; Wen, J.; Guo, F.; Wu, Y. A.; Rong, Y.; Kou, R.; Xiao, X.; Aguesse, F.; Bareño, J.; Ren, Y.; Lu, W.; Li, Y. Approaching the capacity limit of lithium cobalt oxide in lithium ion batteries via lanthanum and aluminium doping. *Nature Energy* 2018.

Su, L.; Jha, S. K.; Phuah, X. L.; Xu, J.; Nakamura, N.; Wang, H.; Okasinski, J. S.; Reejan-Jayan, B. Engineering Lithium Ion Battery Cathodes for High Voltage Applications Using Electromagnetic Excitation. *Journal of Materials Science (under review)* 2020.

Schulz, N.; Hausbrand, R.; Wittich, C.; Dimesso, L.; Jaegermann, W. XPS-Surface Analysis of SEI Layers on Li-Ion Cathodes: Part II. SEI-Composition and Formation inside Composite Electrodes. *Journal of The Electrochemical Society* 2018, 165, A833-A846.

Schulz, N.; Hausbrand, R.; Dimesso, L.; Jaegermann, W. XPS-Surface Analysis of SEI Layers on Li-Ion Cathodes: Part I. Investigation of Initial Surface Chemistry. *Journal of The Electrochemical Society* 2018, 165, A819-A832.

Amatucci, G. G.; Tarascon, J. M.; Klein, L. C. Cobalt dissolution in LiCoO 2-based non-aqueous rechargeable batteries. *Solid State Ionics* 1996, 83, 167-173.

Chebiam, R. V.; Kalman, A. M.; Prado, F.; Manthiram, A. Comparison of the chemical stability of the high energy density cathodes of lithium-ion batteries. *Electrochemistry Communications* 2001, 3, 624-627.

Xie, Y.; Gao, H.; Gim, J.; Ngo, A. T.; Ma, Z.; Chen, Z. Identifying active sites for parasitic reactions at the cathodeelectrolyte interface. *The Journal of Physical Chemistry Letters* 2019, 10, 589-594.

Li, Y.; Cheng, X.; Zhang, Y.; Zhao, K. Recent advance in understanding the electro-chemo-mechanical behavior of lithium-ion batteries by electron microscopy. *Materials Today Nano* 2019, 7, 100040.

Chen, L.; Venkatram, S.; Kim, C.; Batra, R.; Chandrasekaran, A.; Ramprasad, R.

Electrochemical Stability Window of Polymeric Electrolytes. *Chemistry of Materials* 2019, 31, 4598-4604.

Dura, J. A.; Pierce, D. J.; Majkrzak, C. F.; Maliszewskyj, N. C.; McGillivray, D. J.; Lösche, M.; O Donovan, K. V.; Mihailescu, M.; Perez-Salas, U.; Worcester, D. L.; White, S. H. AND/R: Advanced neutron diffractometer/reflectometer for investigation of thin films and multilayers for the life sciences. *Review of Scientific Instruments* 2006, 77, 074301.

Kienzle, P. A.; Maranville, B. B.; O'Donovan, K. V.; Ankner, J. F.; N. F. Berk, C. F. M. Reflectometry Software. https://www.nist.gov/ncnr/reflectometry-software 2017.

DeCaluwe, S. C.; Kienzle, P. A.; Bhargava, P.; Baker, A. M.; Dura, J. A. Phase segregation of sulfonate groups in Nafion interface lamellae, quantified via neutron reflectometry fitting techniques for multi-layered structures. *Soft Matter* 2014, 10, 5763-5776.

Bogdan, M.; Ghosh, J. K.; Doerge, R. W. Modifying the Schwarz Bayesian information criterion to locate multiple interacting quantitative trait loci. *Genetics* 2004, 167, 989-999.

Schwarz, G. Estimating the dimension of a model. *The annals of statistics* 1978, 6, 461-464. Lamaze, G.; Downing, R.; Langland, J.; Hwang, S. The new cold neutron depth profiling instrument at NIST. *Journal of radioanalytical and nuclear chemistry* 1992, 160, 315-325.

Ziegler, J. F.; Biersack, J. P.; Ziegler, M. D. SRIM, a version of the TRIM program. The *Stopping and Range of Ions in Matter* 2008.

Frisch, M. J.; Trucks, G. W.; Schlegel, H. B.; Scuseria, G. E.; Robb, M. A.; Cheeseman, J. R.; Scalmani, G.; Barone, V.; Petersson, G. A.; Nakatsuji, H.; Li, X.; Caricato, M.; Marenich, A. V.; Bloino, J.; Janesko, B. G.; Gomperts, R.; Mennucci, B.; Hratchian, H. P.; Ortiz, J. V.; Izmaylov, A. F.; Sonnenberg, J. L.; Williams; Ding, F.; Lipparini, F.; Egidi, F.; Goings, J.; Peng, B.; Petrone, A.; Henderson, T.; Ranasinghe, D.; Zakrzewski, V. G.; Gao, J.; Rega, N.; Zheng, G.; Liang, W.; Hada, M.; Ehara, M.; Toyota, K.; Fukuda, R.; Hasegawa, J.; Ishida, M.; Nakajima, T.; Honda, Y.; Kitao, O.; Nakai, H.; Vreven, T.; Throssell, K.; Montgomery Jr., J. A.; Peralta, J. E.; Ogliaro, F.; Bearpark, M. J.; Heyd, J. J.; Brothers, E. N.; Kudin, K. N.; Staroverov, V. N.; Keith, T. A.; Kobayashi, R.; Normand, J.; Raghavachari, K.; Rendell, A. P.; Burant, J. C.; Iyengar, S. S.; Tomasi, J.; Cossi, M.; Millam, J. M.; Klene, M.; Adamo, C.; Cammi, R.; Ochterski, J. W.; Martin, R. L.; Morokuma, K.; Farkas, O.; Foresman, J. B.; Fox, D. J. Wallingford, C T, 2016. Lee, C.; Yang, W.; Parr, R. G. Development of the Colle-Salvetti correlation-energy formula into a functional of the electron density. *Phys Rev B Condens Matter* 1988, 37, 785-789.

Becke, A. D. Density-functional exchange-energy approximation with correct asymptotic behavior. *Physical review A* 1988, 38, 3098.

Petersson, G. A.; Al Laham, M. A. A complete basis set model chemistry. II. Open-shell systems and the total energies of the first-row atoms. *The Journal of Chemical Physics* 1991, 94, 6081-6090.

Petersson, G. A.; Bennett, A.; Tensfeldt, T. G.; Al Laham, M. A.; Shirley, W. A.; Mantzaris, J. A complete basis set model chemistry. I. The total energies of closed-shell atoms and hydrides of the first-row elements. *The Journal of Chemical Physics* 1988, 89, 2193-2218.

Grimme, S.; Antony, J.; Ehrlich, S.; Krieg, H. A consistent and accurateab initio parametrization of density functional dispersion correction (DFT-D) for the 94 elements H-Pu. *The Journal of Chemical Physics* 2010, 132, 154104.

Grimme, S.; Ehrlich, S.; Goerigk, L. Effect of the damping function in dispersion corrected density functional theory. *Journal of Computational Chemistry* 2011, 32, 1456-1465.

Dunning, T. H. Gaussian basis sets for use in correlated molecular calculations. I. The atoms boron through neon and hydrogen. *The Journal of Chemical Physics* 1989, 90, 1007-1023.

Cramer, C. J. Essentials of Computational Chemistry: Theories and Models, John Wiley & Sons Ltd. New York 2002, 542.

Kresse, G.; Furthmuller, J. Efficient iterative schemes for ab initio total-energy calculations using a plane-wave basis set. *Physical review. B, Condensed matter* 1996, 54, 11169.

Kresse, G.; Furthmuller, J. Efficiency of ab-initio total energy calculations for metals and semiconductors using a plane-wave basis set. *Computational materials science* 1996, 6, 15-50.

Kresse, G.; Hafner, J. Ab initio molecular-dynamics simulation of the liquid-metal amorphous-semiconductor transition in germanium. *Physical Review B* 1994, 49, 14251.

Perdew, J. P.; Burke, K.; Ernzerhof, M. Generalized gradient approximation made simple. *Phys Rev Lett* 1996, 77, 3865-3868.

Burke, K.; Ernzerhof, M.; Perdew, J. P. Generalized Gradient Approximation Made Simple [Phys. Rev. Lett. 77, 3865 (1996)]. *Physical Review Letters* 1997, 78, 1396-1396.

Kresse, G.; Joubert, D. From ultrasoft pseudopotentials to the projector augmented-wave method. *Physical Review B* 1999, 59, 1758.

Grimme, S. Semiempirical GGA-type density functional constructed with a long-range dispersion correction. *Journal of computational chemistry* 2006, 27, 1787-1799.

Dudarev, S. L.; Botton, G. A.; Savrasov, S. Y.; Humphreys, C. J.; Sutton, A. P. Electron-energy-loss spectra and the structural stability of nickel oxide: An LSDA+U study. *Physical Review B* 1998, 57, 1505.

Kramer, D.; Ceder, G. Tailoring the morphology of $LiCoO_2$: a first principles study. *Chemistry of Materials* 2009, 21, 3799-3809.

Yang, X., et al., Improvement of the cycling performance of LiCoO2 with assistance of cross-linked PAN for lithium ion batteries. Journal of Alloys and Compounds, 2015. 639: p. 458-464.

Wang, Z., et al., Improving the cycling stability of LiCoO2 at 4.5V through co-modification by Mg doping and zirconium oxyfluoride coating. Ceramics International, 2015. 41(1): p. 469-474.

Shen, B., et al., Lithium cobalt oxides functionalized by conductive Al-doped ZnO coating as cathode for high-performance lithium ion batteries. Electrochimica Acta, 2017. 224: p. 96-104.

Choi, K., et al., Electrochemical performance and thermal stability of LiCoO2 cathodes surface-modified with a sputtered thin film of lithium phosphorus oxynitride. Journal of Power Sources, 2010. 195(24): p. 8317-8321.

Cao, J., et al., Polypyrrole-coated LiCoO2 nanocomposite with enhanced electrochemical properties at high voltage for lithium-ion batteries. Journal of Power Sources, 2015. 281: p. 49-55.

Chen, G., et al., On electrochemistry of Al2O3-coated LiCoO2 composite cathode with improved cycle stability. Ionics, 2016. 22(5): p. 629-636.

Zhao, F., et al., Vapor-assisted synthesis of Al2O3-coated LiCoO2 for high-voltage lithium ion batteries. Electrochimica Acta, 2015. 174: p. 384-390.

Zuo, D., Comparative Study of the Electrochemical Behaviors for LiCoO2 Electrode Coated with Two Different Al2O3 Coating Layer. International Journal of Electrochemical Science, 2017: p. 5044-5057.

Liang, D. D., et al., Spinel MgAl2O4 modification on LiCoO2 cathode materials with the combined advantages of MgO and Al2O3 modifications for high-voltage lithium-ion batteries. RSC Advances, 2017. 7(12): p. 6809-6817.

Yabuuchi, N., et al., Electrochemical properties of $LiCoO_2$ electrodes with latex binders on high-voltage exposure. Journal of the electrochemical society, 2015. 162(4): p. A538-A544.

Yang, Z., R. Li and Z. Deng, A deep study of the protection of Lithium Cobalt Oxide with polymer surface modification at 4.5 V high voltage. Scientific Reports, 2018. 8(1).

Wang, Z., et al., Synthesis of Li2MnO3-stabilized $LiCoO_2$ cathode material by spray-drying method and its high-voltage performance. Journal of Alloys and Compounds, 2015. 626: p. 228-233.

Han, B., et al., Understanding the Role of Temperature and Cathode Composition on Interface and Bulk: Optimizing Aluminum Oxide Coatings for Li-Ion Cathodes. ACS Applied Materials & Interfaces, 2017. 9(17): p. 14769-14778.

Bai, Y., et al., New concept of surface modification to LiCoO2. Journal of Power Sources, 2007. 174(1): p. 328-334.

Zhang, J., et al., Unraveling the multiple effects of Li2ZrO3 coating on the structural and electrochemical performances of LiCoO2 as high-voltage cathode materials. Electrochimica Acta, 2016. 209: p. 102-110.

Bai, Y., et al., Performance improvement of LiCoO2 by MgF2 surface modification and mechanism exploration. Electrochimica Acta, 2014. 134: p. 347-354.

Im, S. G. and K. K. Gleason, Systematic Control of the Electrical Conductivity of Poly(3,4-ethylenedioxythiophene) via Oxidative Chemical Vapor Deposition. Macromolecules, 2007. 40(18): p. 6552-6556.

Paxson, A. T., et al., Stable Dropwise Condensation for Enhancing Heat Transfer via the Initiated Chemical Vapor Deposition (iCVD) of Grafted Polymer Films. Advanced Materials, 2014. 26(3): p. 418-423.

Weppner, W. and R. A. Huggins, Determination of the kinetic parameters of mixed-conducting electrodes and application to the system Li3Sb. Journal of The Electrochemical Society, 1977. 124(10): p. 1569-1578.

Sun, L. et al. Realization of Ti Doping by Electrostatic Assembly to Improve the Stability of LiCoO2 Cycled to 4.5 V. Journal of The Electrochemical Society 166, A1793-A1798 (2019).

Manthiram, A.; Song, B.; Li, W. A Perspective on Nickel-Rich Layered Oxide Cathodes for Lithium-Ion Batteries. Energy Storage Mater. 2017, 6, 125-139.

Manthiram, A. An Outlook on Lithium Ion Battery Technology. ACS Cent. Sci. 2017, 3, 1063-1069.

Manthiram, A. Materials Challenges and Opportunities of Lithium Ion Batteries. J. Phys. Chem. Lett. 2011, 2, 176-184.

Zhang, J.; Su, L.; Li, Z.; Sun, Y.; Wu, N. The Evolution of Lithium-Ion Cell Thermal Safety with Aging Examined in a Battery Testing calorimeter. Batteries 2016, 2, 12.

Mao, F.; Guo, W.; Ma, J. Research Progress on Design Strategies, Synthesis and Performance of LiMn2O4-Based Cathodes. RSC Adv. 2015, 5, 105248-105258.

Hirayama, M.; Ido, H.; Kim, K.; Cho, W.; Tamura, K.; Mizuki, J.; Kanno, R. Dynamic Structural Changes at LiMn2O4/Electrolyte Interface during Lithium Battery Reaction. J. Am. Chem. Soc. 2010, 132, 15268-15276.

Shi, J.-L.; Qi, R.; Zhang, X.-D.; Wang, P.-F.; Fu, W.-G.; Yin, Y.-X.; Xu, J.; Wan, L.-J.; Guo, Y.-G. High-Thermal- and Air-Stability Cathode Material with Concentration-Gradient Buffer for Li-Ion Batteries. ACS Appl. Mater. Interfaces 2017, 9, 42829-42835.

Yano, A.; Shikano, M.; Ueda, A.; Sakaebe, H.; Ogumi, Z. LiCoO 2 Degradation Behavior in the High-Voltage Phase Transition Region and Improved Reversibility with Surface Coating. J. Electrochem. Soc. 2017, 164, A6116A6122.

Sun, Y.-K.; Yoon, C. S.; Myung, S.-T.; Belharouak, I.; Amine, K. Role of AlF[sub 3] Coating on LiCoO[sub 2] Particles during Cycling to Cutoff Voltage above 4.5 V. J. Electrochem. Soc. 2009, 156, A1005A1010.

Liu, J.; Reeja-Jayan, B.; Manthiram, A. Conductive Surface Modification with Aluminum of High Capacity Layered Li—[Li0.2Mn0.54Ni0.13Co0.13]O2 Cathodes. J. Phys. Chem. C 2010, 114, 9528-9533.

Liu, J.; Manthiram, A. Kinetics Study of the 5 V Spinel Cathode LiMn[sub 1.5]Ni[sub 0.5]O[sub 4] Before and After Surface Modifications. J. Electrochem. Soc. 2009, 156, A833.

Qi, R.; Shi, J.-L.; Zhang, X.-D.; Zeng, X.-X.; Yin, Y.-X.; Xu, J.; Chen, L.; Fu, W.-G.; Guo, Y.-G.; Wan, L.-J. Improving the Stability of LiNi0.80Co0.15A10.05O2 by AlPO4 Nanocoating for Lithium-Ion Batteries. Sci. China: Chem. 2017, 60, 1230-1235.

Ju, S. H.; Kang, I.-S.; Lee, Y.-S.; Shin, W.-K.; Kim, S.; Shin, K.; Kim, D.-W. Improvement of the Cycling Performance of LiNi0.6-Co0.2Mn0.2O2 Cathode Active Materials by a Dual-Conductive Polymer Coating. ACS Appl. Mater. Interfaces 2014, 6, 2546-2552.

Xu, K. Electrolytes and Interphases in Li-Ion Batteries and Beyond. Chem. Rev. 2014, 114, 11503-11618.

Wu, F.; Liu, J.; Li, L.; Zhang, X.; Luo, R.; Ye, Y.; Chen, R. Surface Modification of Li-Rich Cathode Materials for Lithium-Ion Batteries with a PEDOT:PSS Conducting Polymer. ACS Appl. Mater. Interfaces 2016, 8, 23095-23104.

Gao, X.-W.; Deng, Y.-F.; Wexler, D.; Chen, G.-H.; Chou, S.-L.; Liu, H.-K.; Shi, Z.-C.; Wang, J.-Z. Improving the Electrochemical Performance of the LiNi0.5Mn1.5O4 Spinel by Polypyrrole Coating as a Cathode Material for the Lithium-Ion Battery. J. Mater. Chem. A 2015, 3, 404-411.

Guan, D.; Wang, Y. Ultrathin Surface Coatings to Enhance Cycling Stability of LiMn2O4 Cathode in Lithium-Ion Batteries. Ionics 2013, 19, 1-8.

Reeja-Jayan, B.; Chen, N.; Lau, J.; Kattirtzi, J. A.; Moni, P.; Liu, A.; Miller, I. G.; Kayser, R.; Willard, A. P.; Dunn, B.; Gleason, K. K. A Group of Cyclic Siloxane and Silazane Polymer Films as Nanoscale Electrolytes for Microbattery Architectures. Macromolecules 2015, 48, 5222-5229.

Chen, N.; Reeja-Jayan, B.; Lau, J.; Moni, P.; Liu, A.; Dunn, B.; Gleason, K. K. Nanoscale, Conformal Polysiloxane Thin Film Electrolytes for Three-Dimensional Battery Architectures. Mater. Horiz. 2015, 2, 309-314.

Reeja-Jayan, B.; Kovacik, P.; Yang, R.; Sojoudi, H.; Ugur, A.; Kim, D. H.; Petruczok, C. D.; Wang, X.; Liu, A.; Gleason, K. K. A Route Towards Sustainability Through Engineered Polymeric Interfaces. Adv. Mater. Interfaces 2014, 1, 1400117.

Smith, P. M.; Su, L.; Gong, W.; Nakamura, N.; Reeja-Jayan, B.; Shen, S. Thermal Conductivity of Poly(3,4-ethylenedioxythiophene) Films Engineered by Oxidative Chemical Vapor Deposition (oCVD). RSC Adv. 2018, 8, 19348-19352.

Kim, D. K.; Muralidharan, P.; Lee, H.-W.; Ruffo, R.; Yang, Y.; Chan, C. K.; Peng, H.; Huggins, R. A.; Cui, Y. Spinel LiMn2O4 Nanorods as Lithium Ion Battery Cathodes. Nano Lett. 2008, 8, 3948-3952.

Tarascon, J. M.; Guyomard, D. The Li1+xMn2O4/C Rocking-Chair System: A Review. Electrochim. Acta 1993, 38, 1221-1231.

Petruczok, C. D.; Yang, R.; Gleason, K. K. Controllable Cross-Linking of Vapor-Deposited Polymer Thin Films and Impact on Material Properties. Macromolecules 2013, 46, 1832-1840.

Vidu, R.; Stroeve, P. Improvement of the Thermal Stability of Li-Ion Batteries by Polymer Coating of LiMn2O4. Ind. Eng. Chem. Res. 2004, 43, 3314-3324.

Infrared Tables (Short Summary of Common Absorption Frequencies). http://www.cpp.edu/?psbeauchamp/pdf/spec_ir_nmr_spectra_tables.pdf (accessed January 2018).

Aldalbahi, A.; Rahaman, M.; Almoiqli, M. A Strategy to Enhance the Electrode Performance of Novel Three-Dimensional PEDOT/RVC Composites by Electrochemical Deposition Method. Polymers 2017, 9, 157.

Feng, Z.-Q.; Wu, J.; Cho, W.; Leach, M. K.; Franz, E. W.; Naim, Y. I.; Gu, Z.-Z.; Corey, J. M.; Martin, D. C. Highly Aligned Poly(3,4-ethylene dioxythiophene) (PEDOT) Nano- and Microscale Fibers and Tubes. Polymer 2013, 54, 702-708.

Raman Band Correlation Table. http://www.utsc.utoronto.ca/?traceslab/raman%20correlation%20table.pdf, (accessed January 2018).

Im, S. G.; Gleason, K. K. Systematic Control of the Electrical Conductivity of Poly(3,4-ethylenedioxythiophene) via Oxidative Chemical Vapor Deposition. Macromolecules 2007, 40, 6552-6556.

Huang, J.; Li, Z.; Liaw, B. Y.; Zhang, J. Graphical Analysis of Electrochemical Impedance Spectroscopy Data in Bode and Nyquist Representations. J. Power Sources 2016, 309, 82-98.

Albertus, P.; Christensen, J.; Newman, J. Experiments on and Modeling of Positive Electrodes with Multiple Active Materials for Lithium-Ion Batteries. J. Electrochem. Soc. 2009, 156, A606A618.

Fang, S.; Jackson, D.; Dreibelbis, M. L.; Kuech, T. F.; Hamers, R. J. Anode-Originated SEI Migration Contributes to Formation of Cathode-Electrolyte Interphase Layer. J. Power Sources 2018, 373, 184-192.

Su, L.; Zhang, J.; Huang, J.; Ge, H.; Li, Z.; Xie, F.; Liaw, B. Y. Path Dependence of Lithium Ion Cells Aging under Storage Conditions. J. Power Sources 2016, 315, 35-46.

Zhan, C.; Wu, T.; Lu, J.; Amine, K. Dissolution, Migration, and Deposition of Transition Metal Ions in Li-ion Batteries Exemplified by Mn-Based Cathodes—A Critical Review. Energy Environ. Sci. 2018, 11, 243-257.

Thackeray, M. M.; Johnson, P. J.; de Picciotto, L. A.; Bruce, P. G.; Goodenough, J. B. Electrochemical Extraction of Lithium from LiMn2O4. Mater. Res. Bull. 1984, 19, 179-187.

Wang, L.-F.; Ou, C.-C.; Striebel, K. A.; Chen, J.-S. Study of Mn Dissolution from LiMn[sub 2]O[sub 4] Spinel Electrodes Using Rotating Ring-Disk Collection Experiments. J. Electrochem. Soc. 2003, 150, A905A911.

Jang, D. H. Dissolution of Spinel Oxides and Capacity Losses in 4 V Li/Li[sub x]Mn[sub 2]O[sub 4] Cells. J. Electrochem. Soc. 1996, 143, 2204-2211.

Peled, E. Film Forming Reaction at the Lithium/Electrolyte Interface. J. Power Sources 1983, 9, 253-266.

Jow, T. R.; Delp, S. A.; Allen, J. L.; Jones, J.-P.; Smart, M. C. Factors Limiting Li+Charge Transfer Kinetics in Li-Ion Batteries. J. Electrochem. Soc. 2018, 165, A361A367.

Hu, G.; Wang, X.; Chen, F.; Zhou, J.; Li, R.; Deng, Z. Study of the Electrochemical Performance of Spinel LiMn2O4 at High Temperature Based on the Polymer Modified Electrode. Electrochem. Commun. 2005, 7, 383-388.

Amatucci, G. G.; Blyr, A.; Sigala, C.; Alfonse, P.; Tarascon, J. M. Surface treatments of Li1+xMn2-xO4 spinels for improved elevated temperature performance. Solid State Ionics 1997, 104, 13-25.

Blyr, A.; Sigala, C.; Amatucci, G.; Guyomard, D.; Chabre, Y.; Tarascon, J.-M. Self-Discharge of LiMn[sub 2]O[sub 4]/C Li-Ion Cells in Their Discharged State. J. Electrochem. Soc. 1998, 145, 194-209.

Bai, Y.; Liu, N.; Liu, J.; Wang, Z.; Chen, L. Coating Material-Induced Acidic Electrolyte Improves LiCoO[sub 2] Performances. Electrochem. Solid-State Lett. 2006, 9, A552A556.

Nowak, S.; Winter, M. The Role of Cations on the Performance of Lithium Ion Batteries: A Quantitative Analytical Approach. Acc. Chem. Res. 2018, 51, 265-272.

Jin, Y.; Chen, Q.; Lessner, P. Thermal Stability Investigation of PEDOT Films from Chemical Oxidation and Prepolymerized Dispersion. Electrochemistry 2013, 81, 801-803.

Samba, R. Is the Enhanced Adhesion of PEDOT Thin Films on Electrodes Due to Sulfur—Gold Interaction?—An XPS Study. Open Surf. Sci. J. 2013, 5, 17-20.

Chastain, J.; King, R. C.; Moulder, J. Handbook of X-Ray Photoelectron Spectroscopy: A Reference Book of Standard Spectra for Identification and Interpretation of XPS Data; Physical Electronics Division, Perkin-Elmer Corporation: Eden Prairie Minn., 1992.

Di Castro, V.; Polzonetti, G. XPS Study of MnO Oxidation. J. Electron Spectrosc. Relat. Phenom. 1989, 48, 117-123.

TABLES

TABLE 1

| | *$R_O$/Ohm | $R_{SEI}$/Ohm | $R_{c11}$/Ohm | $R_{c12}$/Ohm |
|---|---|---|---|---|
| New-Pristine | 2.57 | 4.09 | 19.75 | 13.23 |
| Aged-Pristine | 4,05 | 23.53 | 57.19 | 64.48 |
| New-Coated | 3.21 | 1.75 | 16.02 | 11.38 |
| Aged-Coated | 3.56 | 16.09 | 21.34 | 58.58 |

*$R_0$ was obtained from the value at intersection between the EIS trajectory and the zero line of imaginary impedance.

TABLE 2

| | $k_1$ (*$10^{-3}$) | $k_2$ (*$10^{-2}$) |
|---|---|---|
| Pristine | 0.97 [0.87, 1.07] | 1.34 [1.26, 1.41] |
| PDVB coated | 1.18 [1.07, 1.29] | 1.41 [1.34, 1.49] |
| PEDOT coated | 0.73 [0.68, 0.78] | 1.04 [0.99, 1.08] |

TABLE 3

| | S (eV) | | | O 1s (eV) | Mn (eV) | | |
|---|---|---|---|---|---|---|---|
| | S 2p3/2 | S 2p1/2 | S-X | | Mn 2p3/2 | Mn 2p1/2 | Mn-Y |
| $LiMn_2O_4$ | / | / | / | 529.7  531.6 | 641.93 | 653.57 | / |
| PEDOT | 163.41 | 164.61 | / | 533.07 | / | / | / |
| PEDOT coated $LiMn_2O_4$ | 163.07 | 164.34 | 168.3 | 531.26 | 642.23 | 653.82 | 646.6 |

TABLE 4

| Parameter | Values |
|---|---|
| Substrate temperature (° C.) | 27.3 |
| Filament temperature (° C.) | 197.6 |
| Reactor pressure (Torr) | 0.7 |
| Initiator flow rate (sccm) | 2.6 |
| Monomer flow rate (sccm) | 2.7 |
| Argon flow rate (sccm) | 9.2 |
| *$P_m/P_{sat}$ | 0.3 |

*$P_m$ is the partial pressure of monomer inside chamber, $P_{sat}$ is the saturation pressure of monomer on the substrate. $P_m/P_{sat}$ can be viewed as a direct measure of monomer surface concentration on the substrate [1].

TABLE 5

| | Voltage (V) | | | |
|---|---|---|---|---|
| | 18 | 20 | 22 | 24 |
| Current (A) | 0.76 | 0.82 | 0.89 | 0.97 |
| Temperature (° C.) | 181.0 | 197.6 | 213.0 | 228.2 |

TABLE 6

| Point | Thickness/nm | Refractive index |
|---|---|---|
| 1 | 28.6 nm | 1.602 |
| 2 | 28.6 nm | 1.610 |
| 3 | 28.8 nm | 1.612 |

TABLE 7

| | $R_O$ | $R_{CEI}$ | $R_{ct}$ |
|---|---|---|---|
| Pristine | 2.8 | 47.5 | 232.0 |
| PEDOT coated | 3.0 | 16.9 | 112.5 |
| PDVB coated | 2.7 | 42.3 | 258.4 |
| Copolymer coated | 2.9 | 101.2 | 546.4 |

TABLE 8

| | Co 2p (eV) | | | | | |
|---|---|---|---|---|---|---|
| | 2p3/2 | 2p3/2* | 2p1/2 | 2p1/2* | NP1 | NP2 |
| $LiCoO_2$ | 780.61 | 781.48 | 795.45 | 797 | | |
| PDVB coated $LiCoO_2$ | 780.61 | 781.37 | 795.3 | 797.34 | | |
| Co-polymer coated $LiCoO_2$ | 780.53 | 781.51 | 795.23 | 796.89 | | |
| PEDOT coated $LiCoO_2$ | 781.72 | 784.78 | 797.31 | 803.43 | 784.78 | 787.14 |

TABLE 9

|  | S 2p (eV) | | | | O 1s (eV) | |
| --- | --- | --- | --- | --- | --- | --- |
|  | 2p3/2 | 2p1/2 | S-X | S-Y | Peak 1 | Peak 2 |
| LiCoO$_2$ | / | / | / | / | 532.23 | 530.00 |
| PEDOT | 163.89 | 165.06 | 165.99 |  | 533.44 | 533.47 |
| PEDOT coated LiCoO$_2$ | 163.42 | 164.7 | 167.86 | 168.96 | 531.76 | 832.44 |

TABLE 10

| Particle size (um) | Voltage range [V] | C-rate* | Capacity [mA h/g] (# of cycles) | Capacity fade (per cycle) | Ref. |
| --- | --- | --- | --- | --- | --- |
| 14 | 3.0-4.3 | 0.8 | 185 to 161 (60) | 0.22% | 1 |
| 12 | 3.0-4.5 | 1.1 | 180 to 116 (100) | 0.36% | 2 |
| 11.9 | 2.75-4.5 | 1.0 | 185 to 154 (50) | 0.34% | 3 |
| 10** | 3.0-4.5 | 0.2*** | 190 to 140 (60) | 0.44% | 4 |
| 10 | 3.0-4.5 | 0.5 | 188 to 157 (170) | 0.10% | 5 |
| 10 | 3.0-4.5 | 0.1*** | 190 to 85 (100) | 0.55% | 6 |
| 7.5 | 3.0-4.5 | 2.5 | 156 to 62 (180) | 0,33% | 7 |
| 7.5 | 3.0-4.5 | 0.5*** | 190 to 90 (50) | 1.05% | 8 |
| 5** | 3.0-4.5 | 1.1 | 180 to 70 (70) | 0.87% | 9 |
| 5** | 2.5-4.5 | 0.1 | 180 to 120 (50) | 0.67% | 10 |
| 3** | 3.0-4.5 | 0.3 | 180 to 44 (80) | 0.94% | 11 |
| 2 | 3.0-4.5 | 1.1 | 190 to 96 (100) | 0,49% | 12 |
| 2 | 3.0-4.5 | 0.1*** | 200 to 140 (30) | 1.00% | 13 |
| 1** | 3.0-4.5 | /*** | 175 to 87 (40) | 1.26% | 14 |
| 0.5** | 3.0-4.5 | 6.9 | 80 to 25 (100) | 0.75% | 15 |
| 0.3** | 3.0-4.5 | 0.4 | 175 to 115 (25) | 1.37% | 16 |

*C-rate is determined on 1 C corresponds to 145 mA/g.
**Particle size is not reported, and the value is estimated from SEM images.
***The specific current is not reported for the C-rate value, the value is utilized directly from the paper

TABLE 11

| Sample | Measured density (g/cm$^3$) | 68% CI (g/cm$^3$) | Literature value (g/cm$^3$) |
| --- | --- | --- | --- |
| PEDOT | 1.449 | 1.446-1.453 | 1.47$^{(ref13-15)}$ |
| PDVB | 0.96 | 0.948-0.972 | 1.06$^{(ref13)}$ |
| PPFDA | / | / | 1.91$^{(ref14)}$ |
| P(PFDA-co-DVB) | 1.279 | 1.266-1.281 | 1.39$^{(1)}$ |

Note:
$^{(1)}$The literature density value for P(PFDA-co-DVB) is calculated from the density of PDVB and PPFDA with the consideration of its composition. (1.06 × 61% + 1.91 × 39% = 1.39(g/cm$^3$))

TABLE 12

|  | R$_{CEI}$ | | R$_{ct}$ | |
| --- | --- | --- | --- | --- |
|  | Ea (eV) | A (ohm$^{-1}$) | Ea (eV) | A (ohm$^{-1}$) |
| LCO | 0.558 | 3.3E+08 | 0.500 | 4.0E+06 |
| PEDOT-LCO | 0.557 | 3.6E+08 | 0.552 | 5.7E+07 |
| PDVB-LCO | 0.411 | 6.5E+05 | 0.466 | 1.2E+06 |
| Copoly-LCO | 0.358 | 1.7E+04 | 0.473 | 3.3E+05 |

TABLE 13

| # of site, n (per monomer) | ρ [g/cm3] | M (monomer) [g/mol] | $c_{max}^{(2)}$ [mol/cm$^3$] |
| --- | --- | --- | --- |
| EDOT | 2 | 1.449 | 142 | 0.0204 |
| DVB | 2 | 0.96 | 130 | 0.0148 |
| Copoly | 2.4$^{(1)}$ | 1.279 | 281 | 0.0109 |

Note:
$^{(1)}$The number of Li$^+$ binding site for the copolymer is derived from its composition (39% of PDFA (3 binding sites) and 61% of DVB (2 binding sites))
$^{(2)}$The maximum Li$^+$ binding siteconcentration is overestimated because we do not consider the interactions between Li$^+$ when monomers form polymer chains, as suggested in FIG. 56. Fewer binding site per monomer is available when a oligomer is considered.

TABLE 14

| | No SiO$_x$ | | with SiO$_x$ (SLD range from 2 to 3) | |
| --- | --- | --- | --- | --- |
| Parameter Name | Si, Poly 1, Air | Si, Poly 1, Poly 2, Air | Si, SiO$_x$, Poly 1, Air | Si, SiO$_x$, Poly 1, Poly 2, Air |
| Number of parameters | 5 | 9 | 9 | 12 |
| $x^2$ | 1.608(72) | 1.58(11) | 1.56(11) | 1.49(5) |
| BIC | 180.7576449 | 190.2323609 | 188.3525609 | 191.2067479 |
| Background | 312(30)e-9 | 321(32)e-9 | 320(31)e-9 | 318(40)e-9 |
| Intensity | 0.9547(24) | 0.9552(23) | 0.9555(24) | 0.9553(25) |
| Si W/T | 0.0373(19) | 0.37(19) | 32(16) | 0.42(12) |
| SiOxW/T |  |  | 0.519(77) | 0.33(15) |
| SiOx SLD |  |  | 2.030(17) | 2.47(4) |
| SiOx_T |  |  | 48.2(71) | 80(15) |
| Poly 1 SLD | 2.4472(60) | 2.040(45) | 2.4349(79) | 2.4508(83) |
| Poly 1 T | 603.5(12) | 84(36) | 603.2(14) | 512(5) |
| Poly1 W/T |  | 0.35(15) |  | 0.1225(60) |
| Poly 2 SLD |  | 2.4411(72) |  | 0.529(30) |
| Poly 2 T |  | 605.3(43) |  | 31(11) |
| Poly:Air T | 57.07(35) | 57.04(37) | 56.82(30) | 29.26(70) |

TABLE 15

| Parameter Name | Si, Poly 1, Air | Si, Poly 1, Poly 2, Air | Si, Poly 1, Poly 2, Poly 3, Air | Si, SiO$_x$, Poly 1, Air | Si, SiO$_x$, Poly 1, Poly 2, Air | Si, SiO$_x$, Poly 1, Poly 2, Poly 3 Air |
| --- | --- | --- | --- | --- | --- | --- |
| Number of parameters | 6 | 9 | 12 | 9 | 12 | 15 |
| $x^2$ | 6.247(89) | 4.39(14) | 1.79(19) | 4.39(14) | 1.78(19) | 1.84(24) |
| BIC | 513.8509008 | 369.1273512 | 182.049802 | 369.1273512 | 181.3298016 | 193.422252 |
| Background | 256(26)e-9 | 266(26)e-9 | 239(28)e-9 | 267(27)e-9 | 240(28)e-9 | 237(29)e-9 |
| Intensity | 0.9891(39) | 0.9825(39) | 0.9878(40) | 0.9826(39) | 0.9879(40) | 0.9879(41) |
| Si W/T | 7.6(57)e-3 | 25(19)e-3 |  | 25(19)e-3 | 24(18)e-3 | 25(19)e-3 |
| SiOxW/T |  |  |  | 15(12)e-3 | 58(51)e-3 | 32(25)e-3 |
| SiOx SLD |  |  |  | 2.1732(81) | 2.2187(92) | 2.2184(95) |
| SiOx_T |  |  |  | 52.4(14) | 56.2(15) | 57.0(20) |
| Poly 1 W/T |  | 15(11)e-3 | 29(22)e-3 |  | 0.48(15) | 0.32(19) |
| Poly 1 SLD | 2.4289(78) | 2.1731(82) | 2.2191(95) | 2.4580(80) | 2.606(33) | 2.65(10) |
| Poly 1 T | 133.45(55) | 52.4(14) | 56.1(15) | 132.96(61) | 29.8(42) | 7.2(40) |
| Poly 2 SLD |  | 2.4578(79) | 2.606(32) |  | 2.388(11) | 2.552(49) |
| Poly2 W/T |  |  | 0.48(15) |  |  | 0.37(19) |

TABLE 15-continued

|  | Si, Poly 1, Air | Si, Poly 1, Poly 2, Air | Si, Poly 1, Poly 2, Poly 3, Air | Si, SiO$_x$, Poly 1, Air | Si, SiO$_x$, Poly 1, Poly 2, Air | Si, SiO$_x$, Poly 1, Poly 2, Poly 3 Air |
|---|---|---|---|---|---|---|
| Parameter Name |  |  |  |  |  |  |
| Poly 2 T |  | 132.95(61) | 29.9(41) |  | 99.8(35) | 27.4(43) |
| Poly 3 SLD |  |  | 2.388(11) |  |  | 2.389(11) |
| Poly 3 T |  |  | 99.7(34) |  |  | 94.2(56) |
| Poly:Air T | 11.39(16) | 11.43(15) | 11.01(18) | 11.43(15) | 11.08(40) | 11.03(19) |

TABLE 15

|  | No SiO$_x$ | | | with SiO$_x$ (SiO$_x$ ρ range from 2 to 3) | | |
|---|---|---|---|---|---|---|
| Parameter Name | Si, Poly 1, Air | Si, Poly 1, Poly 2, Air | Si, Poly 1, Poly 2, Poly 3, Air | Si, SiO$_x$, Poly 1, Air | Si, SiO$_x$, Poly 1, Poly 2, Air | Si, SiO$_x$, Poly 1, Poly 2, Poly 3 Air |
| Number of parameters | 6 | 9 | 12 | 9 | 12 | 15 |
| $x^2$ | 6.247(89) | 4.39(14) | 1.79(19) | 4.39(14) | 1.78(19) | 1.84(24) |
| BIC | 513.8509008 | 369.1273512 | 182.049802 | 369.1273512 | 181.3298016 | 193.422252 |
| Background | 256(26)e−9 | 266(26)e−9 | 239(28)e−9 | 267(27)e−9 | 240(28)e−9 | 237(29)e−9 |
| Intensity | 0.9891(39) | 0.9825(39) | 0.9878(40) | 0.9826(39) | 0.9879(40) | 0.9879(41) |
| Si W/T | 7.6(57)e−3 | 25(19)e−3 |  | 25(19)e−3 | 24(18)e−3 | 25(19)e−3 |
| SiOxW/T |  |  |  | 15(12)e−3 | 58(51)e−3 | 32(25)e−3 |
| SiOx SLD |  |  |  | 2.1732(81) | 2.2187(92) | 2.2184(95) |
| SiOx_T |  |  |  | 52.4(14) | 56.2(15) | 57.0(20) |
| Poly 1 W/T |  | 15(11)e−3 | 29(22)e−3 |  | 0.48(15) | 0.32(19) |
| Poly 1 SLD | 2.4289(78) | 2.1731(82) | 2.2191(95) | 2.4580(80) | 2.606(33) | 2.65(10) |
| Poly 1 T | 133.45(55) | 52.4(14) | 56.1(15) | 132.96(61) | 29.8(42) | 7.2(40) |
| Poly 2 SLD |  | 2.4578(79) | 2.606(32) |  | 2.388(11) | 2.552(49) |
| Poly2 W/T |  |  | 0.48(15) |  |  | 0.37(19) |
| Poly 2 T |  | 132.95(61) | 29.9(41) |  | 99.8(35) | 27.4(43) |
| Poly 3 SLD |  |  | 2.388(11) |  |  | 2.389(11) |
| Poly 3 T |  |  | 99.7(34) |  |  | 94.2(56) |
| Poly:Air T | 11.39(16) | 11.43(15) | 11.01(18) | 11.43(15) | 11.08(40) | 11.03(19) |

TABLE 17

| Sample | Chemical Formula | Measured neutron SLD for "bulk" polymer layer | Measures density (g/cm$^3$) | 68% CI (g/cm$^3$) | Literature value (g/cm$^3$) |
|---|---|---|---|---|---|
| PEDOT | 6C, 4H, 2O, 1S, 0.25Cl | 2.4472(60) | 1.449 | 1.445-1.453 | 1.47 |
| PDVB | 10C, 10H | 1.291(16) | 0.96 | 0.948-0.972 | 1.06 |
| PPFDA | 10C, 1H, 19F, 2O | / | / |  | 1.91 |
| P(PFDA-co-DVB) | 10C, 6.49H, 7.41F, 0.78O | 2.438(18) | 1.279 | 1.266-1.281 | / |

| Other layers | Neutron SLD |
|---|---|
| Si | 2.074 |
| SiO2 | 3.469 |

TABLE 18

| Particle size (um) | Voltage range [V] | C-rate* | Capacity [mA h/g] (# of cycles) | Capacity fade (per cycle) | Ref. |
|---|---|---|---|---|---|
| 14 | 3.0-4.3 | 0.8 | 185 to 161 (60) | 0.22% | 1 |
| 12 | 3.0-4.5 | 1.1 | 180 to 116 (100) | 0.36% | 2 |
| 11.9 | 2.75-4.5 | 1.0 | 185 to 154 (50) | 0.34% | 3 |
| 10** | 3.0-4.5 | 0.2*** | 190 to 140 (60) | 0.44% | 4 |
| 10 | 3.0-4.5 | 0.5 | 188 to 157 (170) | 0.10% | 5 |
| 10 | 3.0-4.5 | 0.1*** | 190 to 85 (100) | 0.55% | 6 |
| 7.5 | 3.0-4.5 | 2.5 | 156 to 62 (180) | 0.33% | 7 |
| 7.5 | 3.0-4.5 | 0.5*** | 190 to 90 (50) | 1.05% | 8 |
| 5** | 3.0-4.5 | 1.1 | 180 to 70 (70) | 0.87% | 9 |
| 5** | 2.5-4.5 | 0.1 | 180 to 120 (50) | 0.67% | 10 |
| 3** | 3.0-4.5 | 0.3 | 180 to 44 (80) | 0.94% | 11 |
| 2 | 3.0-4.5 | 1.1 | 190 to 96 (100) | 0,49% | 12 |
| 2 | 3.0-4.5 | 0.1*** | 200 to 140 (30) | 1.00% | 13 |
| 1** | 3.0-4.5 | /*** | 175 to 87 (40) | 1.26% | 14 |
| 0.5** | 3.0-4.5 | 6.9 | 80 to 25 (100) | 0.75% | 15 |
| 0.3** | 3.0-4.5 | 0.4 | 175 to 115 (25) | 1.37% | 16 |

TABLE 19

| | $\Delta E_{bind}$ (eV) | $\Delta E_{disp}$ (eV) | $\Delta E_{elec}$ (eV) | Surface Area ($\text{Å}^2$)[1] | Dispersion/Surface Area (eV/$\text{Å}^2$) |
|---|---|---|---|---|---|
| EDOT | −1.36 | −0.92 | −0.44 | 42 | −0.022 |
| DVB | −1.29 | −1.24 | −0.05 | 62 | −0.020 |

What is claimed is:

1. A method to form a coated cathode material, the method comprising:
   forming on an exterior surface of $LiMn_2O_4$ cathode active material particles, via oxidative chemical vapor deposition, an interfacial coating layer comprising poly(3,4 ethylenedioxythiophene) by (a) heating the $LiMn_2O_4$ cathode active material particles to a temperature from 70-130° C., (b) vaporizing 3,4-ethylenedioxythiophene monomer and $FeCl_3$ solid oxidant, and (c) reacting the vaporized 3,4-ethylenedioxythiophene monomer and vaporized solid $FeCl_3$ oxidant to form the interfacial coating layer on the exterior surface of the $LiMn_2O_4$ cathode active material particles in an oxidative chemical vapor deposition chamber having a pressure of 50 mTorr and the vaporized 3,4-ethylenedioxythiophene monomer having a flow rate of 1 sccm; and
   after forming the interfacial coating layer, rinsing the coated cathode material with an organic solvent to remove impurities from the interfacial layer coating, wherein the organic solvent is selected from the group consisting of methanol, isopropyl alcohol, acetone, and combinations.

2. A method to form a coated cathode material, the method comprising:
   forming on an exterior surface of cathode active material particles, via oxidative chemical vapor deposition, an interfacial coating layer comprising polymerized thiophenes by (a) heating the cathode active material particles to a temperature from 70-130° C., (b) vaporizing a thiophene-containing monomer and a solid oxidant, and (c) reacting the vaporized thiophene-containing monomer and vaporized solid oxidant to form the interfacial coating layer on the exterior surface of the cathode active material particles, wherein the interfacial coating layer has a thickness from 10-100 nm, and wherein the cathode active material particles have a diameter from 10 nm to 100 μm; and
   after forming the interfacial coating layer, rinsing the coated cathode material with an organic solvent to remove impurities from the interfacial layer coating, wherein the organic solvent is selected from the group consisting of methanol, isopropyl alcohol, acetone, and combinations thereof.

3. The method of claim 2, wherein reacting the vaporized thiophene-containing monomer and solid oxidant comprises reacting the vaporized thiophene-containing monomer and solid oxidant to form the interfacial layer coating on the exterior surface of the cathode active material in an oxidative chemical vapor deposition chamber.

4. The method of claim 3, wherein the oxidative chemical vapor deposition chamber has a pressure of 50 mTorr, the cathode active material is heated to a temperature of 130° C., the solid oxidant is heated to a temperature of 200° C., and the vaporized thiophene-containing monomer has a flow rate of 1 sccm.

5. The method of claim 2, wherein the cathode active material is $LiMn_2O_4$.

6. The method of claim 2, wherein the polymerized thiophenes is poly(3,4-ethylenedioxythiophene).

7. The method of claim 2, wherein the thiophene-containing monomer is 3,4-ethylenedioxythiophene.

8. The method of claim 2, wherein the solid oxidant is $FeCl_3$.

9. The method of claim 2, wherein the interfacial layer coating is not transparent.

10. The method of claim 2, wherein the interfacial layer coating covers at least 80% of the exterior surface of the cathode active material.

11. The method of claim 2, wherein the interfacial layer coating has a thickness variation less than 20%.

12. The method of claim 2, wherein forming, via oxidative chemical vapor deposition, the interfacial layer coating is solvent-free.

13. The method of claim 2, wherein reacting the vaporized thiophene-containing monomer and vaporized solid oxidant to form the interfacial layer coating on the exterior surface of the cathode active material forms oxide bonds and sulfide bonds between the polymerized thiophenes and cathode active material.

14. The method of claim 13, wherein the interfacial layer coating increases a cycling life of the coated cathode material by over 40% relative to a cathode material lacing the interfacial layer coating.

15. The method of claim 13, wherein the interfacial layer coating increases a specific capacity tested at 5° C. by at least 50% relative to a cathode material lacing the interfacial layer coating.

16. The method of claim 2, wherein the cathode active material is $LiMn_2O_4$, and the polymerized thiophenes is poly(3,4-ethylenedioxythiophene), and wherein reacting the vaporized thiophene-containing monomer and vaporized solid oxidant to form the interfacial layer coating on the exterior surface of the cathode active material forms oxide bonds and sulfide bonds between the —O— and —S— of the poly(3,4-ethylenedioxythiophene) and the —Mn of the $LiMn_2O_4$ sufficient to stabilize the —Mn of the $LiMn_2O_4$ and inhibit disproportionation of the —Mn during a battery cycling process.

* * * * *